US012316238B2

(12) United States Patent
Byers et al.

(10) Patent No.: US 12,316,238 B2
(45) Date of Patent: May 27, 2025

(54) AIR-COOLED POWER CONVERTER

(71) Applicant: Marel Power Solutions, Inc., Saline, MI (US)

(72) Inventors: Ian Byers, Northville, MI (US); Gary Miller, Caseville, MI (US); Stuart Wooters, Franklin, MI (US)

(73) Assignee: Marel Power Solutions, Inc., Plymouth, MI (US)

( * ) Notice: Subject to any disclaimer, the term of this patent is extended or adjusted under 35 U.S.C. 154(b) by 162 days.

(21) Appl. No.: 17/932,369

(22) Filed: Sep. 15, 2022

(65) Prior Publication Data

US 2023/0308026 A1 Sep. 28, 2023

Related U.S. Application Data

(60) Provisional application No. 63/312,580, filed on Feb. 22, 2022, provisional application No. 63/291,778, filed on Dec. 20, 2021, provisional application No. 63/291,091, filed on Dec. 17, 2021, provisional application No. 63/244,282, filed on Sep. 15, 2021.

(51) Int. Cl.

| | |
|---|---|
| ***H02P 27/08*** | (2006.01) |
| ***H02M 1/08*** | (2006.01) |
| ***H02M 7/00*** | (2006.01) |
| ***H02M 7/5395*** | (2006.01) |
| ***H05K 7/20*** | (2006.01) |

(52) U.S. Cl.

CPC ............. *H02M 7/003* (2013.01); *H02M 1/08* (2013.01); *H02M 7/5395* (2013.01); *H02P 27/08* (2013.01); *H05K 7/20336* (2013.01); *H05K 7/2039* (2013.01); *H05K 7/20936* (2013.01)

(58) Field of Classification Search

CPC ...... H02M 7/003; H02M 1/08; H02M 7/5395; H02P 27/08; H05K 7/20336; H05K 7/2039; H05K 7/20936

USPC .......................................................... 318/504

See application file for complete search history.

(56) References Cited

U.S. PATENT DOCUMENTS

| | | | |
|---|---|---|---|
| 7,916,480 | B2 | 3/2011 | Woody et al. |
| 9,532,489 | B2 | 12/2016 | Mabuchi et al. |
| 9,799,454 | B1 | 10/2017 | Jakoubovitch et al. |
| 9,865,398 | B2 | 1/2018 | Jakoubovitch et al. |
| 10,014,793 | B2 | 7/2018 | Mima et al. |
| 10,985,088 | B2 | 4/2021 | Mrad et al. |
| 10,985,089 | B2 | 4/2021 | Hart et al. |
| 11,121,059 | B2 | 9/2021 | Mrad et al. |

(Continued)

FOREIGN PATENT DOCUMENTS

EP 2328172 6/2011

OTHER PUBLICATIONS

International Search Report and Written Opinion of International Application No. PCT/US2022/076493, mailed Dec. 19, 2022. 12 pages.

(Continued)

*Primary Examiner* — Jorge L Carrasquillo

(57) ABSTRACT

A power converter that includes a bus bar, a transistor, and a heat-pipe. The transistor includes first and second terminals between which current is transmitted when the first transistor is activated, and a gate terminal for controlling the transistor. The terminal is thermally and electrically connected to the bus bar. The heat-pipe is thermally connected to the first bus bar.

19 Claims, 139 Drawing Sheets

(56) References Cited

U.S. PATENT DOCUMENTS

| | | | | |
|---|---|---|---|---|
| 11,276,622 | B2 | 3/2022 | Hart et al. | |
| 2011/0080711 | A1* | 4/2011 | Yesin | F28D 15/0233 165/104.33 |
| 2012/0043652 | A1* | 2/2012 | Ushijima | H05K 7/20936 257/E23.08 |
| 2013/0329365 | A1 | 12/2013 | Hosseini et al. | |
| 2015/0250074 | A1 | 9/2015 | Matsumoto et al. | |
| 2017/0186572 | A1 | 6/2017 | Kato et al. | |
| 2019/0006267 | A1 | 1/2019 | Harel | |
| 2019/0092175 | A1* | 3/2019 | Sainsaulieu | H01L 25/072 |
| 2020/0006197 | A1* | 1/2020 | Hart | H01L 23/36 |
| 2020/0227334 | A1* | 7/2020 | Hart | H01L 25/115 |
| 2021/0367516 | A1* | 11/2021 | Harel | H02M 7/53871 |

OTHER PUBLICATIONS

International Search Report and Written Opinion of International Application No. PCT/US2022/076487, mailed Jan. 19, 2023, 10 pages.

Marchesini et al., "Implementation and Switching Behavior of a PCB-DBC IGBT Module Based on the Power Chip-on-Chip 3D Concept", IEEE Transactions on Industry Applications, 2016 pp. (99), 10.1109/TIA.2016.2604379.hal-01373011, 9 pages.

L. Zhang, Design, Fabrication and Test of SiC MOSFET-Gate Driver Co-Packaged Power Module. Raleigh, NC, USA: North Carolina State Univ., 2015.

Texas Instruments Datasheet, MG341xR070 600-V 70-m? GaN with Integrated Driver and Protection, LMG3410R070, LMG3411R070, SNOSD10E—Apr. 2016—Revised Oct. 2018, www.ti.com, pp. 1-33.

* cited by examiner

211

247s

Top View

Bottom View

Side View

Back View

Bottom View

Side View

Back View

321

Side View

321

Back View

Top View

Top View

Bottom View Without Control PCB

504i

506i

Side View Without Fan

Bottom View Without Control PCB

Bottom View Without PCBs

Side View

Bottom View Without Control PCB

Bottom View Without Control PCB

Bottom View Without Control PCB

End View

Side View Without Fan

Side View Without Fan

AIR-COOLED POWER CONVERTER

RELATED APPLICATIONS

This application claims priority under USC Section 119 (e) to Provisional US Patent Application Nos.: 63/244,282, filed Sep. 15, 2021; 63/291,091, filed Dec. 17, 2021; 63/291,778, filed Dec. 20, 2021, and; 63/312,580, filed Feb. 22, 2022. All foregoing Provisional US Patent Applications in their entirety are incorporated herein by reference.

BACKGROUND

A power converter is a device for converting electrical power. An "inverter" is one type of power converter. Inverters convert direct current (DC) power into alternating current (AC) power. A "rectifier" is another type of power converter. Rectifiers convert AC power into DC power. DC/DC converters (e.g., buck, boost, or buck/boost converters) convert DC power of one voltage level into DC power of another voltage level. AC/AC converters (e.g., variable frequency drive controllers) convert AC power in one form into AC power in another form. Some AC/AC converters, which may include a DC link electrically connected between a rectifier and an inverter, convert input AC power of one frequency into output AC power of another frequency.

BRIEF DESCRIPTION OF THE DRAWINGS

The present technology may be better understood, and its numerous objects, features, and advantages made apparent to those skilled in the art by referencing the accompanying drawings.

FIGS. 2B-1 and 2B-2 are isometric and reverse isometric views of an example packaged half bridge.

FIG. 2B-3 illustrates the example packaged half bridge of FIGS. 2B-1 and 2B-2 with terminals electrically connected by a metal strap.

FIGS. 2C-1 and 2C-2 are isometric and reverse isometric views of an example packaged switch.

FIGS. 2D-1 and 2D-2 are isometric and reverse isometric views of an example packaged switch.

FIGS. 2E-1 and 2E-2 are isometric and reverse isometric views of an example packaged switch.

FIG. 3A-1 illustrates relevant components of one embodiment of the packaged switch shown in FIGS. 2A-1 and 2A-2.

FIG. 3A-2 illustrates the packaged switch shown in FIGS. 3A-1 when viewed from a side.

FIG. 3A-3 illustrates the packaged switch shown in FIGS. 3A-1 when viewed from the back.

FIG. 3A-4 illustrates relevant components of an example switch controller.

FIGS. 3A-5 and 3A-6 illustrate relevant components of example switches.

FIG. 3A-7 illustrates relevant components of an example gate driver.

FIGS. 3A-8 illustrates relevant components of an example packaged switch when viewed from the top.

FIG. 3A-9 illustrates packaged switch shown in FIG. 3A-8 when viewed from a side.

FIGS. 3B-1 illustrates relevant components of an example packaged switch when viewed from the top.

FIG. 3B-2 illustrates packaged switch shown in FIG. 3B-1 when viewed from a side.

FIG. 3B-3 illustrates the packaged switch shown in FIG. 3B-1 when viewed from the back.

FIG. 3C-1 illustrates relevant components of an example packaged switch when viewed from a side.

FIG. 3C-2 illustrates the packaged switch shown in FIG. 3C-1 when viewed from the back.

FIG. 3D-1 illustrates relevant components of an example packaged switch when viewed from a side.

FIG. 3D-2 illustrates the packaged switch shown in FIG. 3D-1 when viewed from the back.

FIG. 3E-1 illustrates relevant components of one embodiment of the packaged switch shown in FIGS. 2C-1 and 2C-2.

FIG. 3E-2 illustrates the packaged switch shown in FIG. 3E-1 when viewed from the back.

FIG. 3F-1 illustrates relevant components of an example packaged switch when viewed from a side.

FIG. 3F-2 illustrates the packaged switch shown in FIG. 3F-1 when viewed from the back.

FIG. 3G-1 illustrates relevant components of an example switch module when viewed from the top.

FIG. 3G-2 illustrates the switch module shown in FIG. 3G-1 when viewed from a side.

FIG. 3G-3 illustrates relevant components of the switch module shown in FIG. 3G-1 when viewed from the back.

FIG. 3H-1 illustrates relevant components of an example switch module when viewed from the top.

FIG. 3H-2 illustrates the switch module shown in FIG. 3H-1 when viewed from a side.

FIG. 3H-3 illustrates the switch module shown in FIG. 3H-1 when viewed from the back.

FIG. 3I-1 illustrates relevant components of an example switch module when viewed from the top.

FIG. 3I-2 illustrates the switch module shown in FIG. 3I-1 when viewed from a side.

FIG. 3I-3 illustrates the switch module shown in FIG. 3I-1 when viewed from the back.

FIG. 3J-1 illustrates relevant components of an example switch module when viewed from the top.

FIG. 3J-2 illustrates the switch module shown in FIG. 3J-1 when viewed from a side.

FIG. 3J-3 illustrates the switch module shown in FIG. 3J-1 when viewed from the back.

FIG. 3K-1 illustrates relevant components of an example switch module when viewed from the top.

FIG. 3K-2 illustrates a bottom view of the switch module shown in FIG. 3K-1.

FIG. 3K-3 illustrates the switch module shown in FIG. 3K-1 when viewed from a side.

FIG. 3K-4 illustrates the switch module shown in FIG. 3K-1 when viewed from the back.

FIG. 3L-1 illustrates relevant components of an example switch module when viewed from the top.

FIG. 3L-2 illustrates a bottom view of the switch module shown in FIG. 3L-1.

FIG. 3L-3 illustrates the switch module shown in FIG. 3L-1 when viewed from a side.

FIG. 3L-4 illustrates the switch module shown in FIG. 3L-1 when viewed from the back.

FIG. 3M-1 illustrates relevant components of an example switch module when viewed from the top.

FIG. 3M-2 illustrates a bottom view of the switch module shown in FIG. 3M-1.

FIG. 3M-3 illustrates the switch module shown in FIG. 3M-1 when viewed from a side.

FIG. 3M-4 illustrates the switch module shown in FIG. 3M-1 when viewed from the back.

FIG. 3N-1 illustrates relevant components of an example switch module when viewed from the top.

FIG. 3N-2 illustrates a bottom view of the switch module shown in FIG. 3L-1.

FIG. 3N-3 illustrates the switch module shown in FIG. 3N-1 when viewed from a side.

FIG. 3N-4 illustrates the switch module shown in FIG. 3N-1 when viewed from the back.

FIGS. 3P-1-3P-9 illustrate components of example switch modules that can be employed in packaged switch of FIG. 2D-1 or 2E-1.

FIGS. 3P-10 and 3P-11 illustrate components of an example switch module.

FIG. 4A-1 illustrates relevant components of one embodiment of the packaged half bridge shown in FIGS. 2B-1 and 2B-2 when viewed from a side.

FIG. 4A-2 illustrates the packaged half bridge shown in FIG. 4A-1 when viewed from the back.

FIG. 4B-1 illustrates relevant components of an example packaged half bridge when viewed from a side.

FIG. 4B-2 illustrates the packaged half bridge shown in FIG. 4B-1 when viewed from the back.

FIG. 4B-3 illustrates the packaged half bridge shown in FIG. 4B-1 with opaque case and when viewed from the top.

FIG. 4C-1 illustrates relevant components of an example packaged half bridge when viewed from a side.

FIG. 4C-2 illustrates the packaged half bridge shown in FIG. 4C-1 when viewed from the back.

FIG. 4C-3 illustrates the packaged half bridge shown in FIG. 4C-1 with opaque case and when viewed from the top.

FIG. 4D-1 illustrates relevant components of an example packaged half bridge when viewed from a side.

FIG. 4D-2 illustrates the packaged half bridge shown in FIG. 4D-1 and when viewed from the back.

FIG. 4D-3 illustrates the packaged half bridge shown in FIG. 4D-1 with opaque case and when viewed from the top.

FIG. 4E-1 illustrates relevant components of an example packaged half bridge and when viewed from a side.

FIG. 4E-2 illustrates the packaged half bridge shown in FIG. 4E-1 when viewed from the back.

FIG. 4E-3 illustrates the packaged half bridge shown in FIG. 4E-1 with opaque case and when viewed from the top.

FIG. 4F-1 illustrates relevant components of an example packaged half bridge when viewed from a side.

FIG. 4F-2 illustrates the packaged half bridge shown in FIG. 4F-1 with opaque case and when viewed from the top.

FIG. 4G-1 illustrates relevant components of one embodiment of the packaged half bridge shown in FIGS. 2B-1 and 2B-2 when viewed from a side.

FIG. 4G-2 illustrates the packaged half bridge shown in FIG. 4G-1 when viewed from the back.

FIG. 4H-1 illustrates relevant components of an example packaged half bridge when viewed from a side.

FIG. 4H-2 illustrates the packaged half bridge shown in FIG. 4H-1 when viewed from the back.

FIG. 5A-1 illustrates relevant components of an example air-cooled inverter system when viewed from an end.

FIG. 5A-2 illustrates the air-cooled inverter system of FIG. 5A-1 when viewed from the bottom.

FIGS. 5A-3 and 5A-4 illustrate the air-cooled inverter system of FIG. 5A-1 when viewed from the sides.

FIG. 5A-5 illustrates the air-cooled inverter system of FIG. 5A-1 when viewed from the top.

FIG. 5A-6 shows cut-out and cross-sectional views of example heat-pipes.

FIG. 5A-7 illustrates relevant components of an example air-cooled inverter system when viewed from an end.

FIG. 5A-8 illustrates the air-cooled inverter system of FIG. 5A-7 when viewed from the bottom.

FIGS. 5A-9 illustrates electrically isolated heat-fins used in the inverter system of FIG. 5A-7.

FIGS. 5A-10 illustrates relevant components of an example air-cooled rectifier system when viewed from the bottom.

FIG. 5A-11 illustrates the air-cooled rectifier system of FIG. 5A-10 when viewed from an end.

FIG. 5B-1 illustrates relevant components of an example air-cooled inverter system when viewed from an end.

FIG. 5B-2 illustrates the air-cooled inverter system of FIG. 5B-1 when viewed from the bottom.

FIGS. 5B-3 and 5B-4 illustrate the air-cooled inverter system of FIG. 5B-1 when viewed from the sides.

FIGS. 5B-5 illustrates example signals and voltages provided to or received from the air-cooled inverter system of FIG. 5B-1.

FIG. 5A-6 illustrates relevant components of an example air-cooled rectifier system when viewed from an end.

FIGS. 5B-7 illustrates the air-cooled rectifier system of FIG. 5A-10 when viewed from the bottom.

FIG. 5C-1 illustrates relevant components of an example air-cooled inverter system when viewed from an end.

FIG. 5C-2 illustrates the air-cooled inverter system of FIG. 5C-1 when viewed from the bottom.

FIGS. 5C-3 and 5C-4 illustrate the air-cooled inverter system of FIG. 5C-1 when viewed from the sides.

FIG. 5D-1 illustrates relevant components of an example air-cooled inverter system when viewed from an end.

FIG. 5D-2 illustrates the air-cooled inverter system of FIG. 5D-1 when viewed from the bottom.

FIGS. 5D-3 and 5D-4 illustrate the air-cooled inverter system of FIG. 5A-1 when viewed from the sides.

FIG. 5D-5 illustrates relevant components of an example air-cooled rectifier system when viewed from an end.

FIGS. 5D-6 illustrates the air-cooled rectifier system of FIG. 5D-5 when viewed from the bottom.

FIG. 5E-1 illustrates relevant components of an example air-cooled inverter system when viewed from an end.

FIG. 5E-2 illustrates the air-cooled inverter system of FIG. 5E-1 when viewed from the bottom.

FIGS. 5E-3 and 5E-4 illustrate the air-cooled inverter system of FIG. 5E-1 when viewed from the sides.

FIGS. 5E-5 and 5E-6 illustrate relevant components of an air-cooled rectifier system when viewed from an end and bottom.

FIG. 5F-1 illustrates relevant components of an example air-cooled inverter system when viewed from an end.

FIG. 5F-2 illustrates the air-cooled inverter system of FIG. 5F-1 when viewed from the bottom.

FIG. 5F-3 illustrates relevant components of an air-cooled rectifier system when viewed from an end.

FIG. 5F-4 illustrates the air-cooled rectifier system of FIG. 5F-3 when viewed from the bottom.

FIG. 5F-5 is a bottom view of an example passive rectifier.

FIG. 5F-6 illustrates relevant components of an example air-cooled inverter system when viewed from an end.

FIG. 5F-7 illustrates the air-cooled inverter system of FIG. 5F-1 when viewed from the bottom.

FIG. 5G-1 illustrates relevant components of an air-cooled rectifier system when viewed from the bottom.

FIG. 5G-2 illustrates the air-cooled rectifier system of FIG. 5G-1 when viewed from a side.

FIG. 5G-3 illustrates relevant components of an air-cooled rectifier system when viewed from the bottom.

FIG. 5G-4 illustrates the air-cooled rectifier system of FIG. 5G-3 when viewed from a side.

FIG. 5H-1 illustrates relevant components of an example air-cooled inverter system when viewed from the bottom.

FIG. 5H-2 illustrates relevant components of the air-cooled inverter system shown in FIG. 5H-1 when viewed from an end.

FIG. 5I-1 illustrates relevant components of an example air-cooled inverter system when viewed from an end.

FIG. 5I-2 illustrates the air-cooled inverter system of FIG. 5I-1 when viewed from the bottom.

FIGS. 5I-3 and 5I-4 illustrate relevant components of an air-cooled rectifier system of when viewed from the bottom and an end.

FIGS. 5J-1-5J-5 illustrate end, bottom, and side views of an example variable frequency driver controller.

FIG. 5K illustrates a bottom view of an example power converter.

FIG. 5L illustrates a bottom view of an example power converter.

FIG. 5M illustrates a bottom view of an example power converter.

FIG. 5N illustrates a bottom view of an example power converter.

FIG. **5*o*** illustrates a bottom view of an example power converter.

The use of the same reference symbols in different figures indicates similar or identical items. In most instances a reference symbol in the text without a letter and/or number after it refers to any or all the elements in the figures bearing that reference symbol. For example, reference symbol "204" refers to 204, 204L, 204H, 204L-1, etc., and reference symbol "204L" refers to 204L, 204L-1, etc.

DETAILED DESCRIPTION

Power converters include inverters, rectifiers, etc. The present disclosure will be described primarily with reference to inverters and rectifiers, it being understood the present disclosure can find application in other types of power converters.

Inverters and rectifiers of this disclosure may be bidirectional. Bidirectional inverters can convert DC power into AC power while operating in the forward direction and convert AC power into DC power while operating in reverse direction. Similarly bidirectional rectifiers can convert AC power into DC power while operating in the forward direction and convert DC power into AC power while operating in reverse direction.

Inverters and rectifiers vary in design. For example, inverters and rectifiers may have one, two, three, or more phases. Generally, each phase includes a "high-side switch" electrically connected to a "low-side switch." Switches conduct current when turned on (i.e., activated).

Figure 1A:
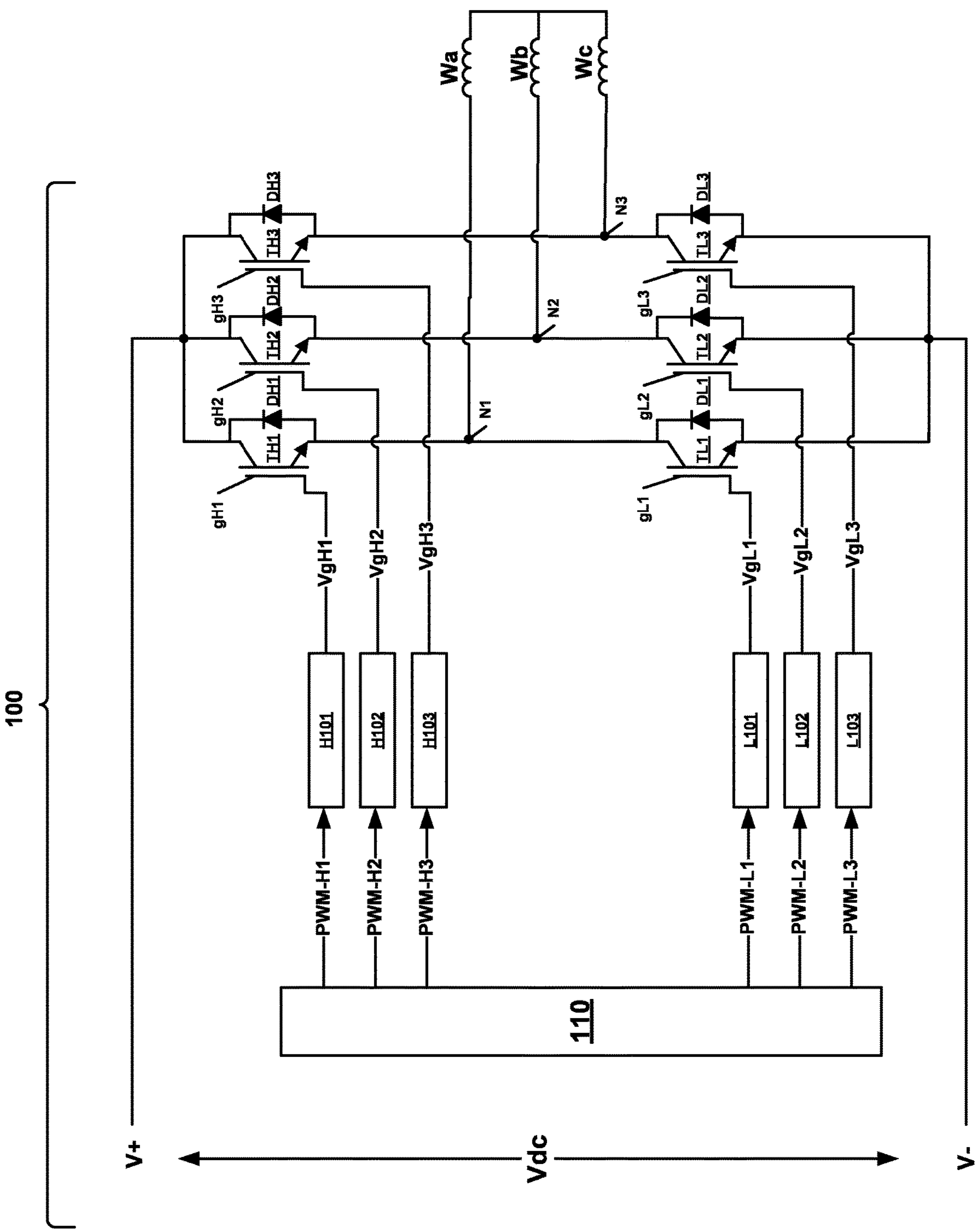
FIG. 1A illustrates relevant components of an example three-phase inverter.

FIG. 1A illustrates relevant components of a three-phase inverter 100 that could be used for converting DC power from a battery into three-phase AC power for use by an electric motor. Each phase includes a high-side switch connected to a low-side switch. Each high-side switch includes an insulated-gate bipolar transistor (IGBT) THx connected in parallel with diode DHx, and each low-side switch includes an IGBT TLx connected in parallel with diode DLx.

High-side IGBTs TH1-TH3 are connected in series with low-side IGBTs TL1-TL3, respectively, via nodes N1-N3, respectively, which in turn are connected to respective terminals of inductive elements Wa-Wc. For purposes of explanation only, inductive elements Wa-Wc take form in stator windings of a synchronous or asynchronous electric motor of an electric vehicle (EV).

The collectors of TH1-TH3 and the cathodes of DH1-DH3 are connected to each other, and to a V+ input terminal, while the emitters of TL1-TL3 and the anodes of diodes DL1-DL3 are connected to each other, and to a V− input terminal. DC voltage Vdc is received between the V+ and V− input terminals from a battery or other DC power source.

High-side IGBTs TH1-TH3 and low-side IGBTs TL1-TL3 are controlled by microcontroller 110 through gate drivers H101-H103 and L101-L103, respectively. A gate driver is a circuit that accepts a low-power input signal from a device (e.g., a microcontroller) and produces a corresponding high-power output signal that is needed to activate a power transistor.

Control of the IGBTs is relatively simple. High-side gate drivers H101-H103 and low-side gate drivers L101-L103 receive driver control signals (e.g., pulse width modulation signals PWM-H1-PWM-H3 and PWM-L1-PWM-L3) from microcontroller 110. High-side gate drivers H101-H103 activate high-side IGBTs TH1-TH3, respectively, by asserting high-power, gate control signals VgH1-VgH3, respectively, when PWM-H1-PWM-H3 signals, respectively, are asserted. Low-side gate drivers L101-L103 activate low-side IGBTs TL1-TL3, respectively, by asserting high-power, gate control signals VgL1-VgL3, respectively, when PWM-L1-PWM-L3 signals, respectively, are asserted. Each of the IGBTs TH1-TH3 and TL1-TL3 conducts current to or from a connected stator winding W when activated.

Figure 1B:
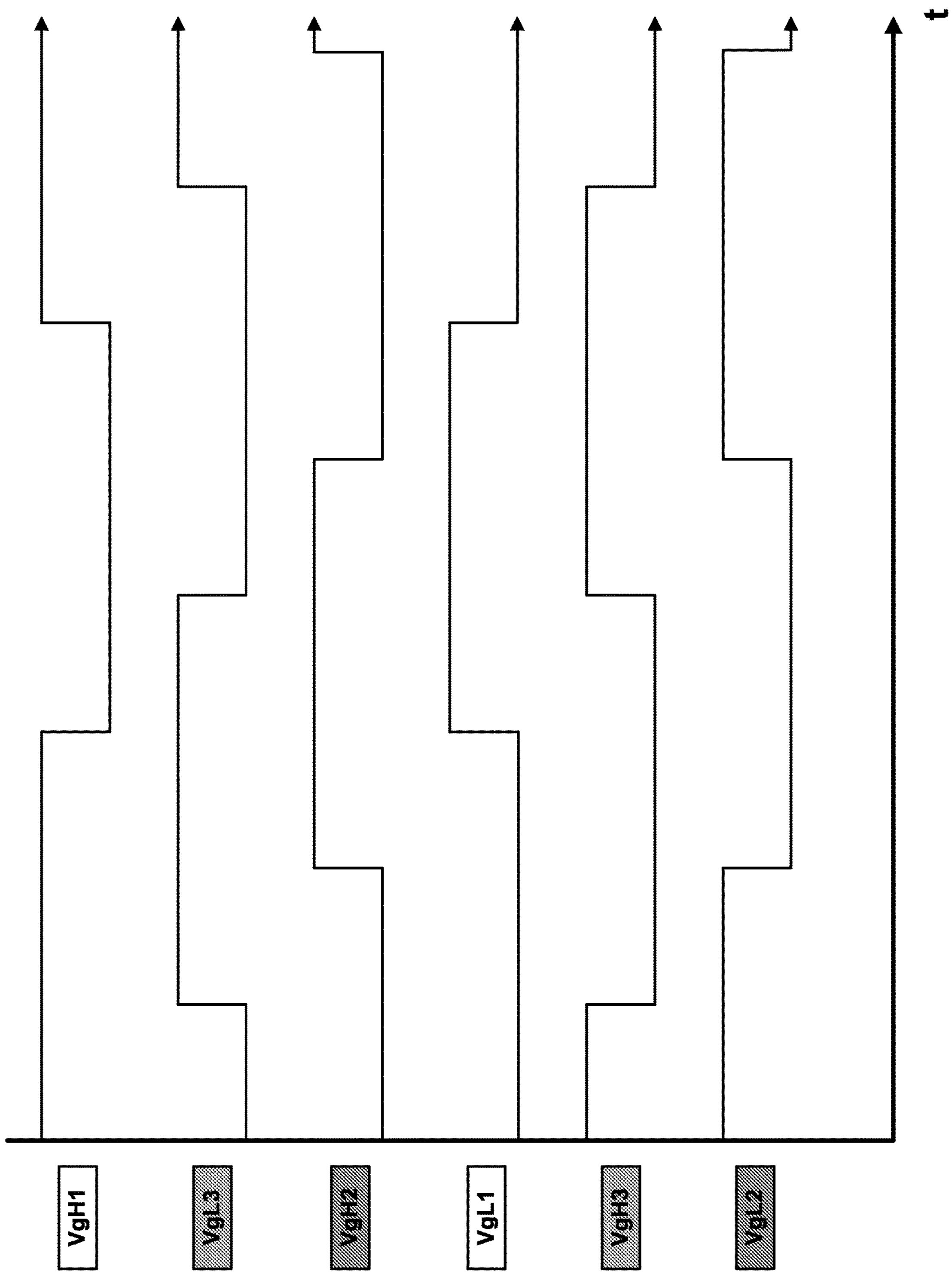
FIG. 1B is a timing diagram that shows example gate control signals.

Through coordinated activation of high-side and low-side IGBTs, the direction of current flow in stator windings can be continuously and regularly switched, so that current travels into or out of a winding. FIG. 1B illustrates an example timing diagram for gate control signals VgH1-VgH3 and VgL1-VgL3. This timing diagram is provided only to facilitate a basic understanding of inverter control. In practice, more complicated timing patterns are used to control inverters.

Microcontroller 110 controls high-side IGBTs TH1-TH3 and low-side IGBTs TL1-TL3 via PWM-H1-PWM-H3 and PWM-L1-PWM-L3 signals, respectively. Microcontrollers, such as microcontroller 110, and other similar data processing devices may include a central processing unit (CPU), memory that stores instructions executable by the CPU, and peripherals such as timers, input/output (I/O) ports, etc. Microcontroller 110 generates the PWM-H1-PWM-H3 and PWM-L1-PWM-L3 signals based on CPU executable instructions stored in memory. Gate drivers H101-H103 generate the VgH1-VgH3 signals based on the PWM-H1-PWM-H3 signals, and gate drivers L101-L103 generate the VgL1-VgL3 signals based on the PWM-L1-PWM-L3 signals. Microcontroller 110 can adjust the duty cycle and/or period of the pulse width modulation (PWM) signals in accordance with instructions stored in memory.

Figure 1C:
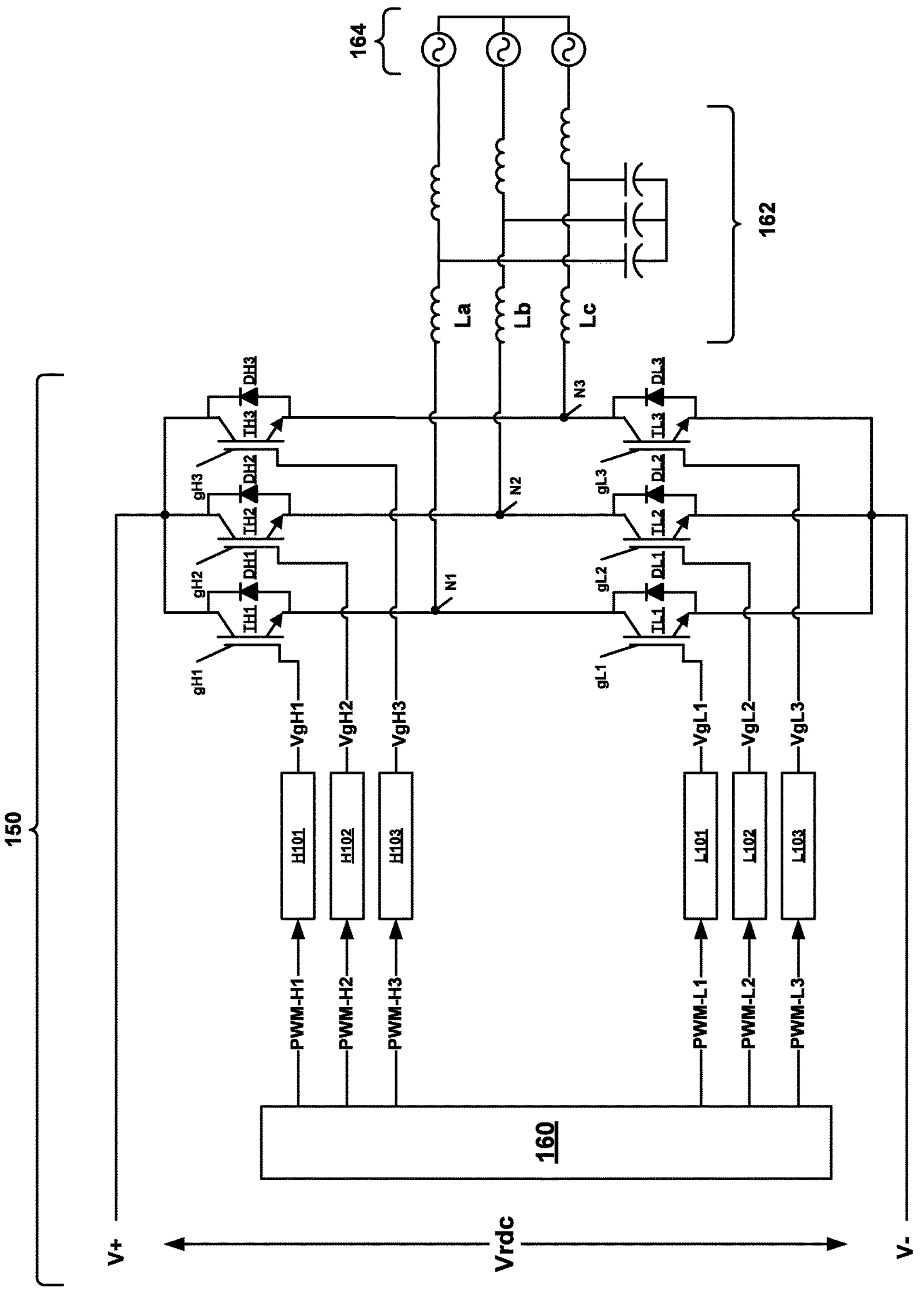
FIG. 1C illustrates relevant components of an example three-phase rectifier.

FIG. 1C illustrates relevant components of a three-phase rectifier 150 that could be used for converting three-phase AC power from a power distribution grid into DC power for charging an EV battery. Inverter 100 and rectifier 150 are substantially similar. Like inverter 100, each phase of rectifier 150 includes a high-side switch connected to a low-side switch. Each high-side switch includes IGBT THx connected in parallel with diode DHx, and each low-side switch includes an IGBT TLx connected in parallel with diode DLx. High-side IGBTs TH1-TH3 are connected in series with low-side IGBTs TL1-TL3, respectively, via nodes N1-N3, respectively, which in turn are connected to respective terminals of inductive elements La-Lc, respectively. For purposes of explanation only, inductive elements La-Lc take form in inductors of an LCL filter 162, which in turn is coupled to a three-phase AC power source 164.

The collectors of TH1-TH3 and the cathodes of DH1-DH3 are connected to each other, and to a V+ output terminal, while the emitters of TL1-TL3 and the anodes of diodes DL1-DL3 are connected to each other, and to a V− output terminal.

High-side IGBTs TH1-TH3 and low-side IGBTs TL1-TL3 are controlled by rectifier controller 160 via gate drivers H101-H103 and L101-L103, respectively. Through coordinated activation of high-side and low-side IGBTs, rectifier 150 provides a rectified DC voltage Vrdc at output terminals V+ and V−, which in turn can be connected to an isolated DC/DC converter or other device that may employ one or more aspects of the present disclosure. Although not shown, a filter can be connected between the output terminals V+ and V− to smooth Vrdc before it is provided to another device such as an isolated DC/DC converter.

While inverter 100 and rectifier 150 are similar, at least one difference exists. Rectifier 150 includes controller 160, which may include a phase-lock loop (PLL) and other components for synchronizing the control of high-side IGBTs TH1-TH3 and low-side IGBTs TL-1-TL-3 to the frequency (e.g., 60 Hertz) of the three-phase AC input power provided by source 164. Controller 160 may also include a CPU and a memory that stores CPU executable instructions that can be substantially different from the CPU executable instructions stored in memory of microcontroller 110 of inverter 100. Like microcontroller 110, controller 160 generates PWM-H1-PWM-H3 and PWM-L1-PWM-L3 signals. Gate drivers H101-H103 generate the VgH1-VgH3 signals based on the PWM-H1-PWM-H3 signals, and gate drivers L101-L103 generate the VgL1-VgL3 signals based on the PWM-L1-PWM-L3 signals. Controller 160 can adjust the duty cycle and/or period of the PWM signals.

EVs, DC fast charging stations, variable frequency drive controllers for industrial machines (e.g., industrial pumps, fans, compressors, etc.), electric vertical take-off and landing (eVTOL) aircraft, etc., employ power converters that are large and heavy. There is a need for smaller and lighter power converters with high power density (i.e., power/volume). For example, the October 2017 "Electrical and Electronics Technical Team (EETT) Roadmap" published in part by the US Department of Energy, sets 100 kW/L as the 2025 power density target for EV inverters. The 2017 EETT Roadmap states, "To meet the 2025 EETT R&D target, the power density must be increased by more than 800 percent compared to 2015 EETT R&D technical targets, and 450 percent compared to current on-road technology."

Power converters in general and their power transistors, can run very hot. Cooling systems are often needed to cool power converters. Cooling systems often include expensive electro-mechanical pumps that circulate a cooling liquid between a converter and a radiator where heat is exchanged. Unfortunately, electro-mechanical pumps can fail. Also, electro-mechanical pumps draw power from batteries in vehicles such as EVs and eVTOLs, which reduces their overall range. Liquid cooling systems also require tubes that fluidly connect the electro-mechanical pump, the converter, and the radiator. These tubes can clog or leak, which can lead to converter shutdown if enough cooling liquid leaks out of the system or liquid flow is obstructed. Further, the electro-mechanical pumps and tubes add weight, volume, cost and complexity to systems in which they are employed such as EVs, eVTOLs, DC fast charging stations, etc.

"Air-cooled converters" including "air-cooled inverters" and "air-cooled rectifiers" are disclosed. The present disclosure will be described primarily with reference to air-cooled inverters and air-cooled rectifiers, it being understood the present disclosure can find application in other types of air-cooled power converters such as "air-cooled DC/DC converters" or "air-cooled AC/AC converters."

Air-cooled inverters (hereinafter also referred to as air-cooled inverter systems) and air-cooled rectifiers (hereinafter also referred to as air-cooled rectifier systems) use heat-pipes to indirectly cool power transistors. The power density of a disclosed air-cooled inverter can meet or possibly exceed the target of 100 kW/L that is set forth in the 2017 EETT Roadmap mentioned above.

"Switch modules" are disclosed. Switch modules include "power stacks." A power stack may include a "switch" that is electrically and thermally connected to and sandwiched between metal conductors called "die substrates" and "die clips." A switch includes one, two or more power transistors.

Switch modules may also include "switch controllers." Switch controllers control respective switches (i.e., activate or deactivate switches). When activated, switches conduct current between their two current terminals. Switch controllers may perform other functions such as monitoring switches for fault conditions (e.g., an electrical short between current terminals). Switch modules may include one or more additional components such as resistors, capacitors, diodes, current sensor circuits, temperature sensor circuits, voltage sensor circuits, voltage regulators, etc.

"Packaged switch modules" are disclosed. Packaged switch modules may contain one or more switch modules. Packaged switch modules can be used in air-cooled inverters and air-cooled rectifiers of this disclosure, it being understood that packaged switch modules can be used in a variety of other applications such as air-cooled DC/DC converters or air-cooled AC/AC converters.

A packaged switch module that contains just one switch module is called a "packaged switch."

A packaged switch module that contains two switch modules is called a "packaged half bridge." Switches may or may not be electrically connected inside a packaged half bridge.

Packaged Switches and Packaged Half Bridges

Packaged switches and packaged half bridges can be essentially cubic shaped with six sides: top, bottom, front, back, left, and right. Some packaged switches may conform to aspects of an industry standard package such as the TO-247 package.

Figures 1, 2A:
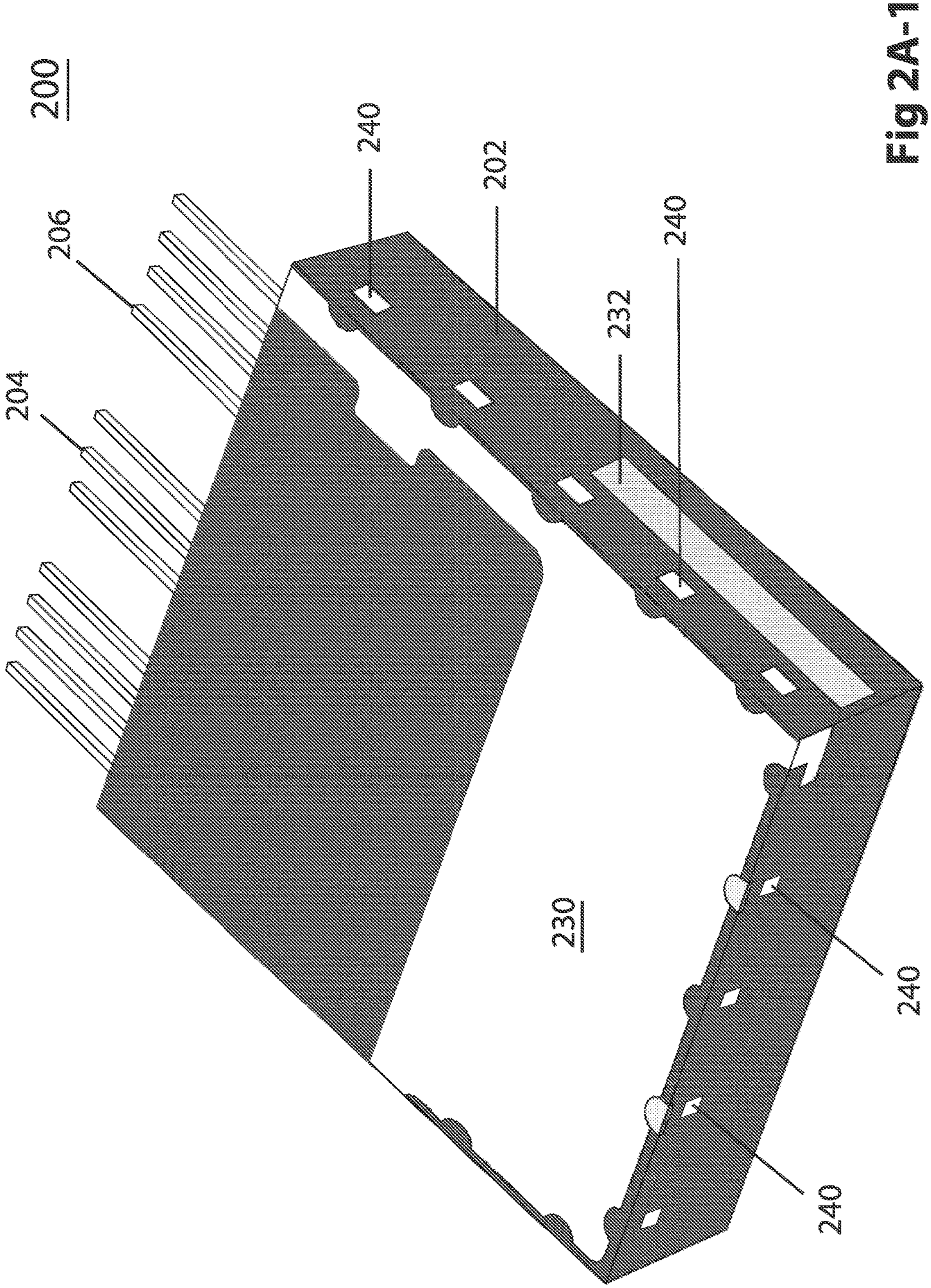
FIGS. 2A-1 and 2A-2 are isometric and reverse isometric views of an example packaged switch.
Figures 2, 2A:
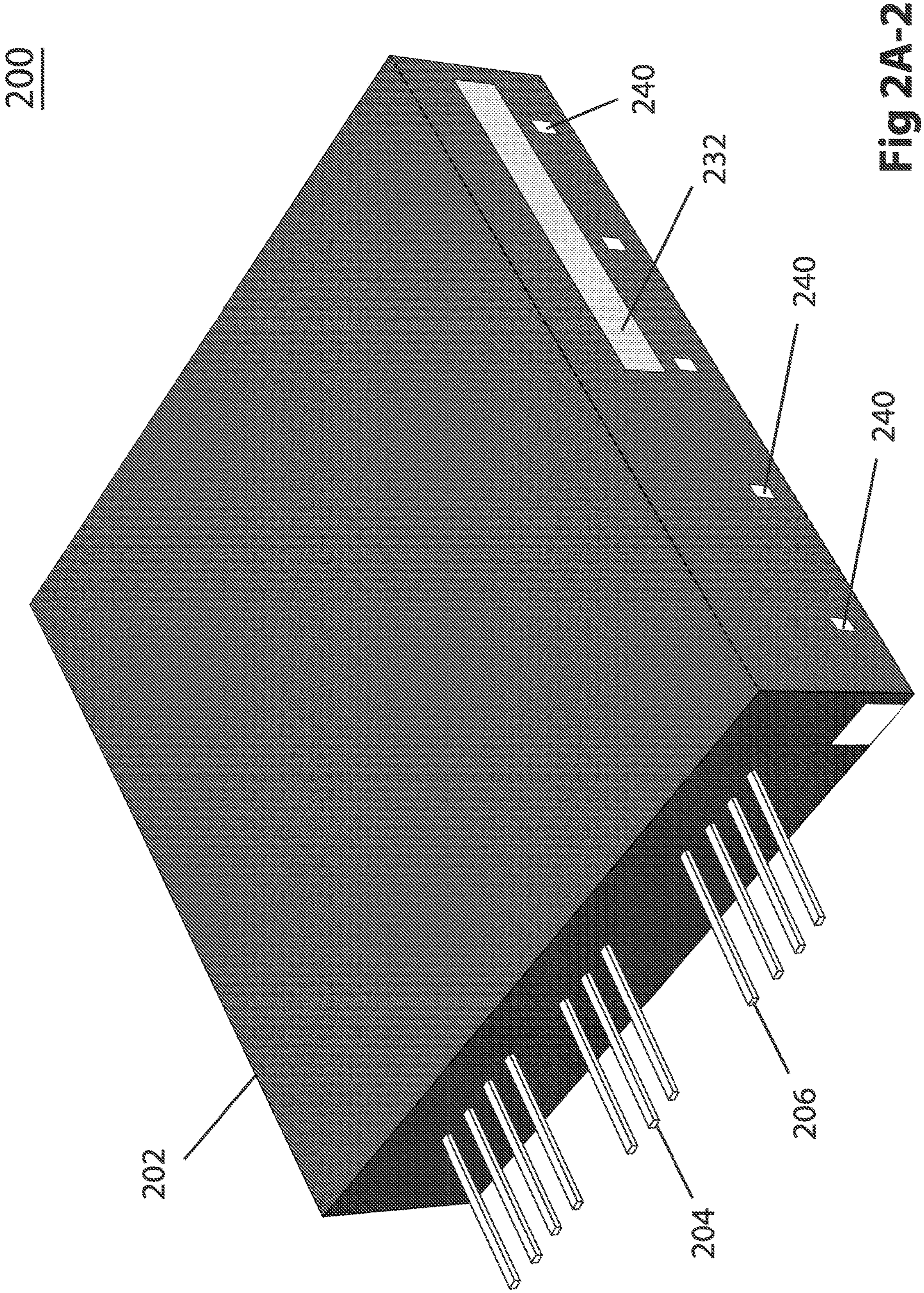
Figures 1, 2B:
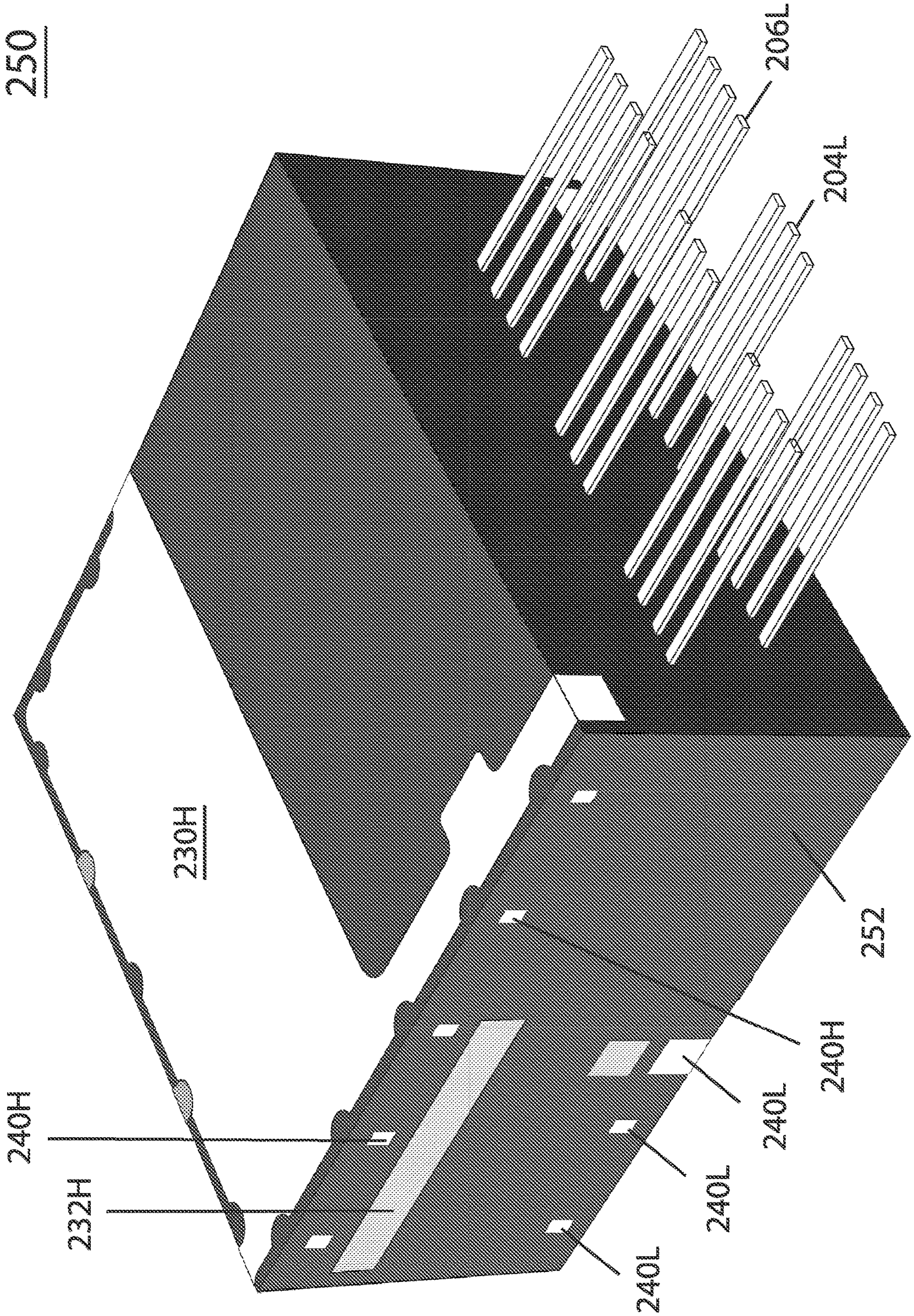
Figures 2, 2B:
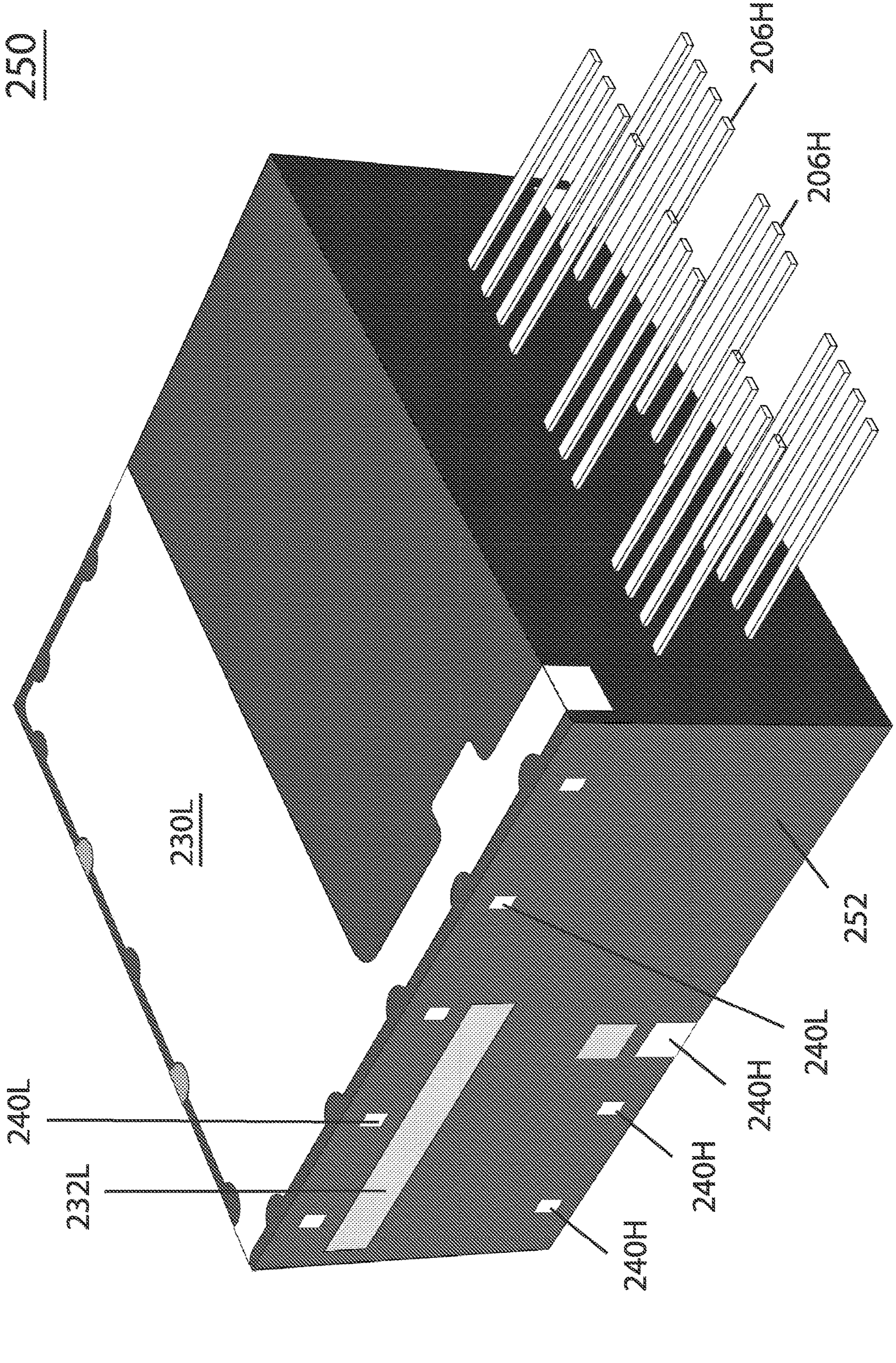
Figures 2, 2B, 3:
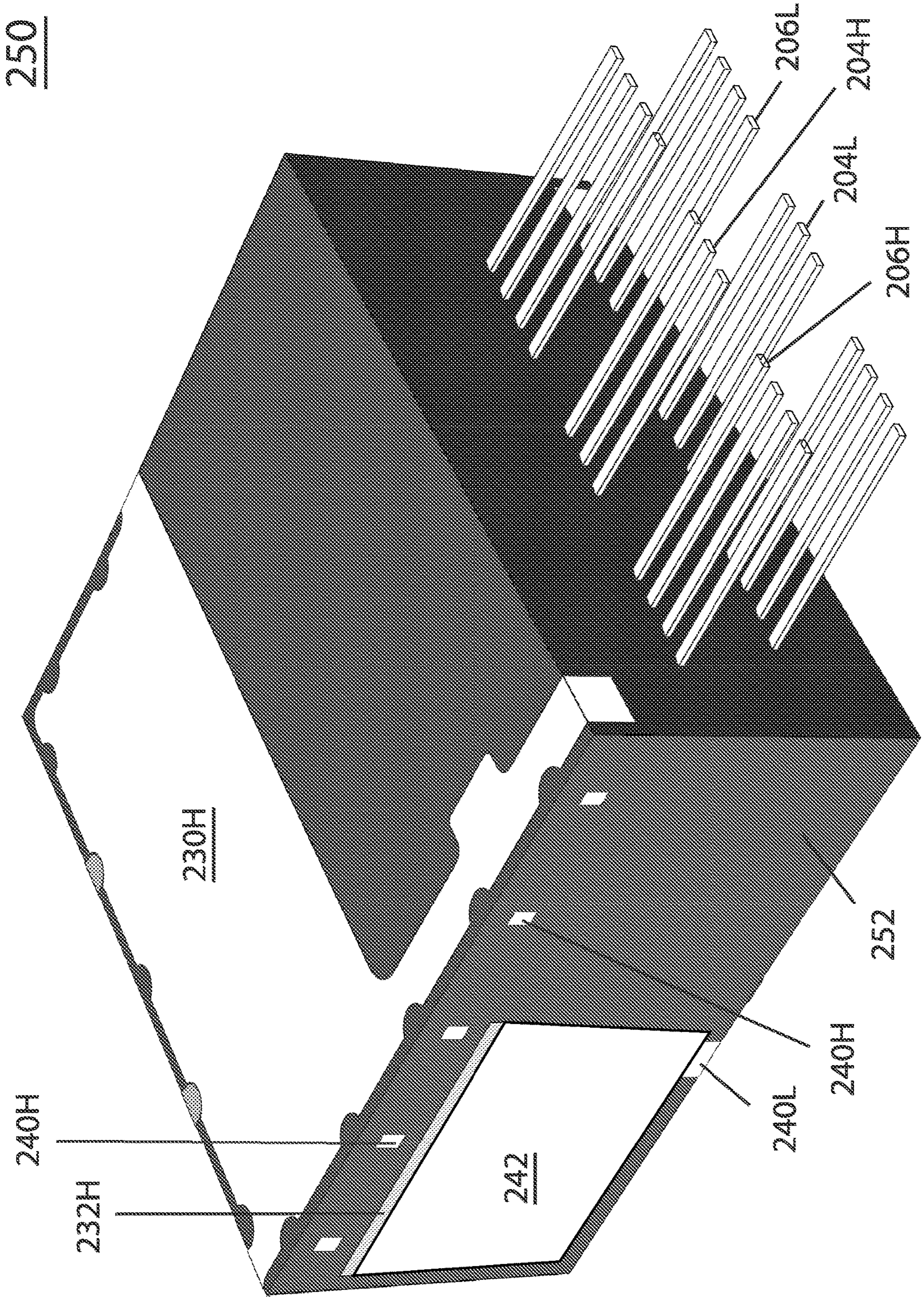
Figures 1, 2C:
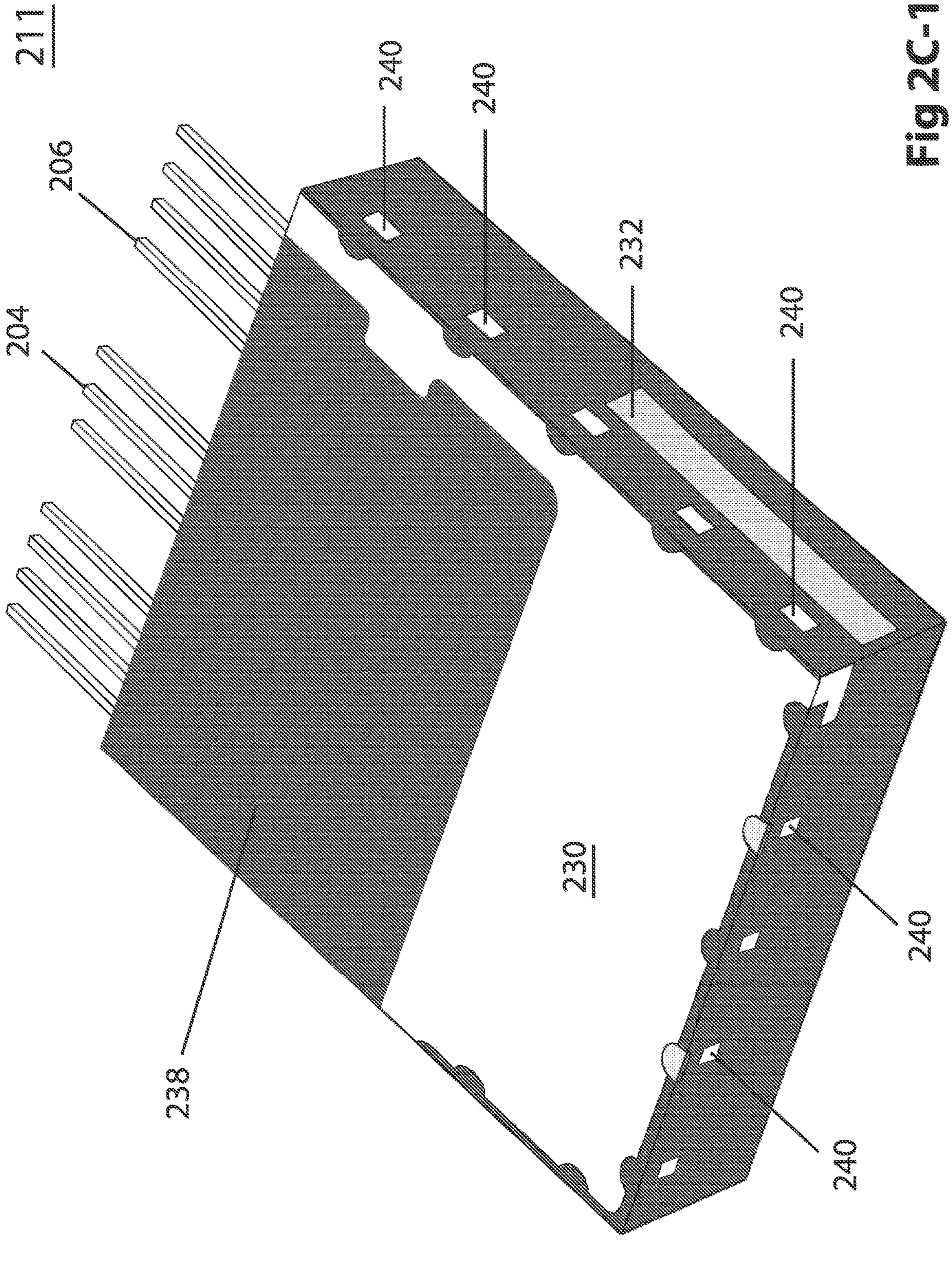
Figures 2, 2C:
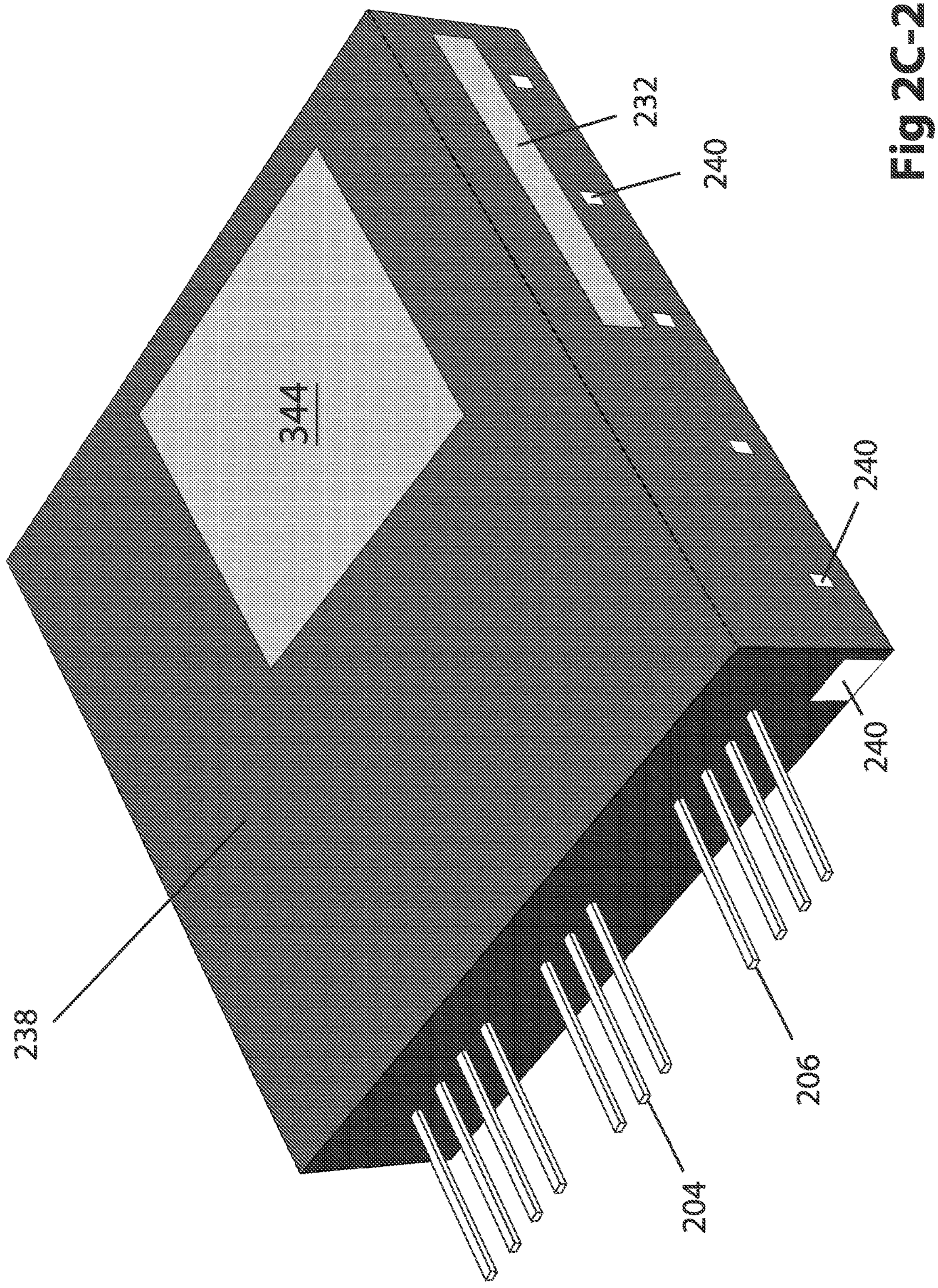
Figures 1, 2D:
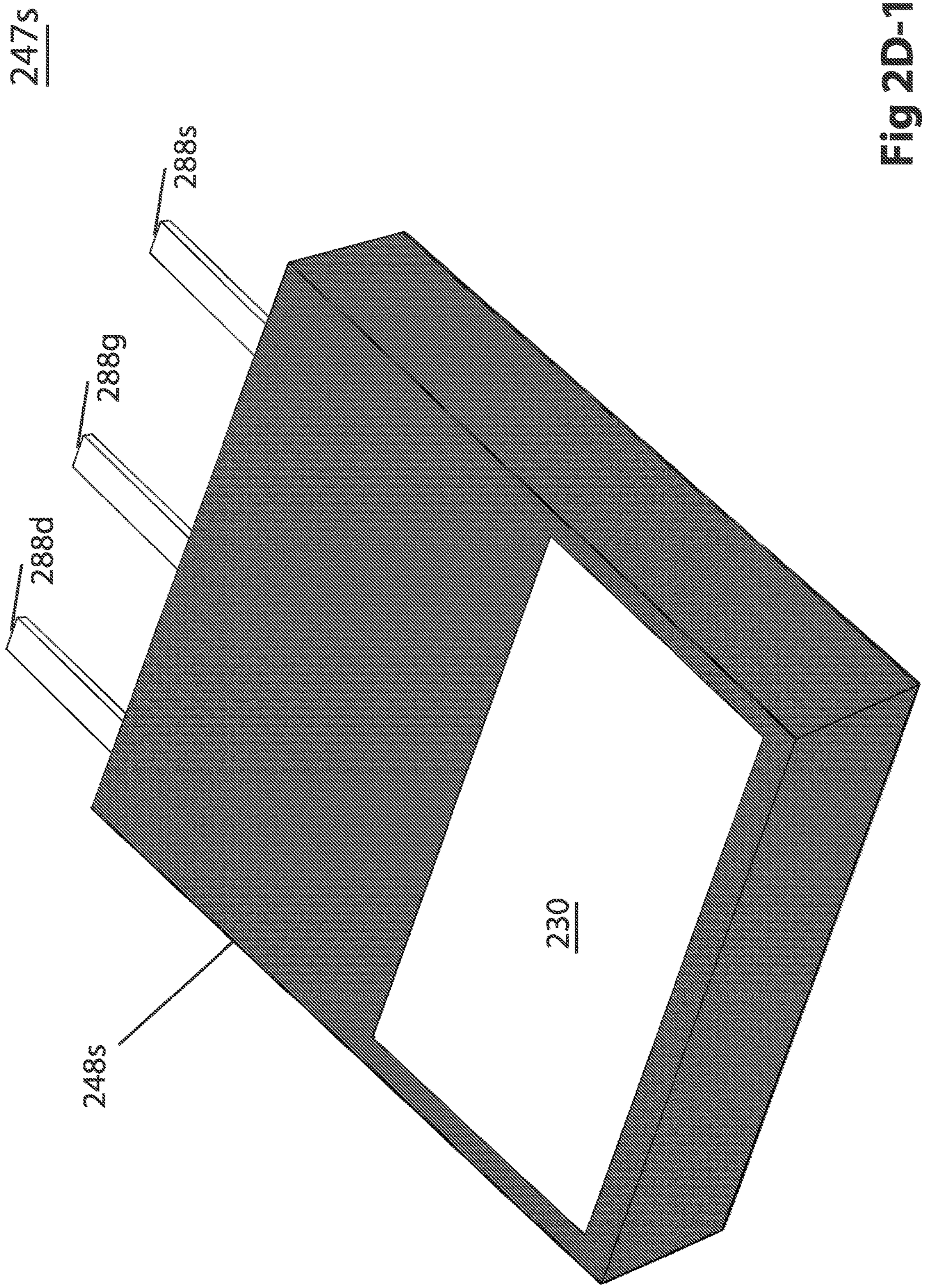
Figures 2, 2D:
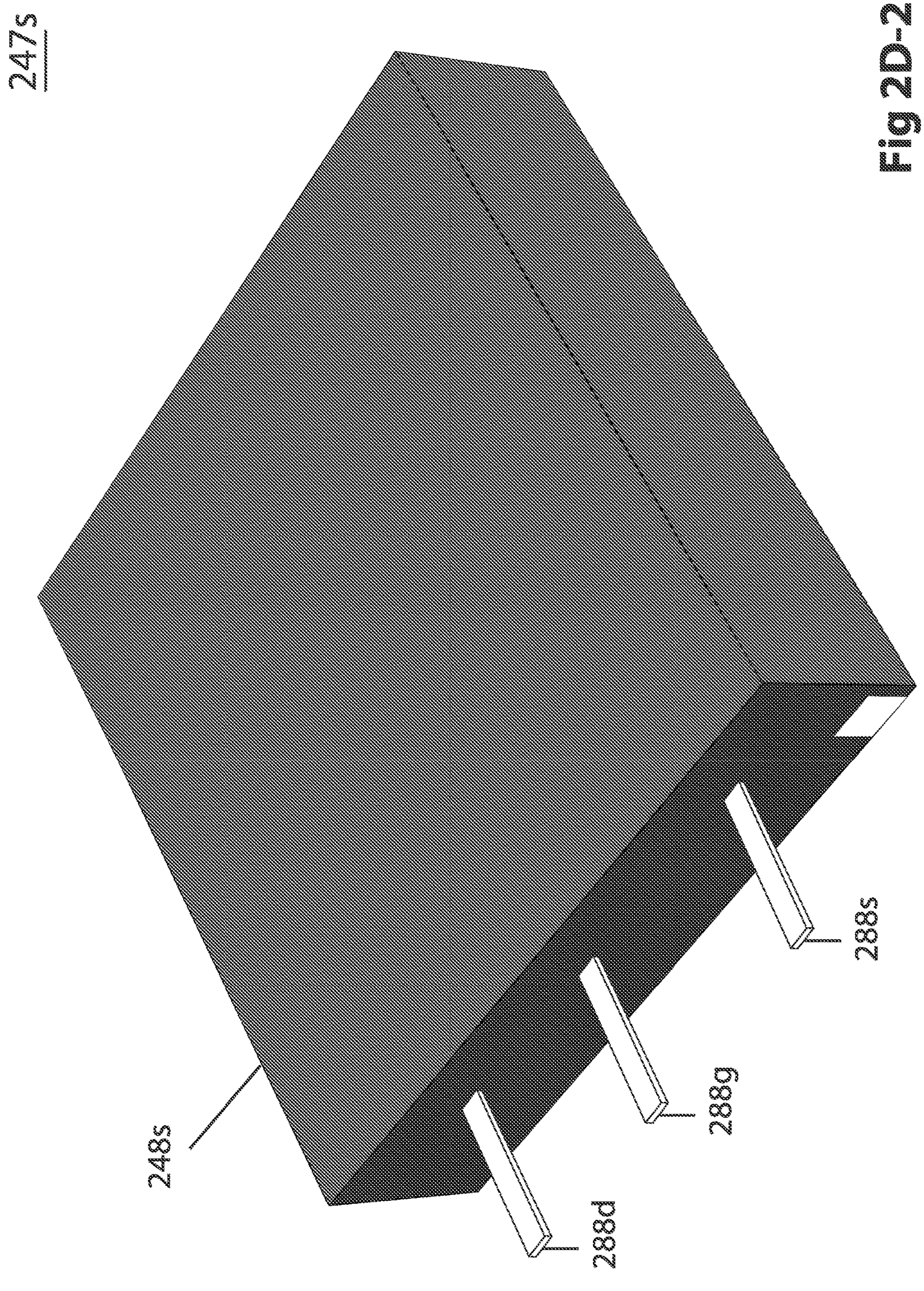
Figures 1, 2E:
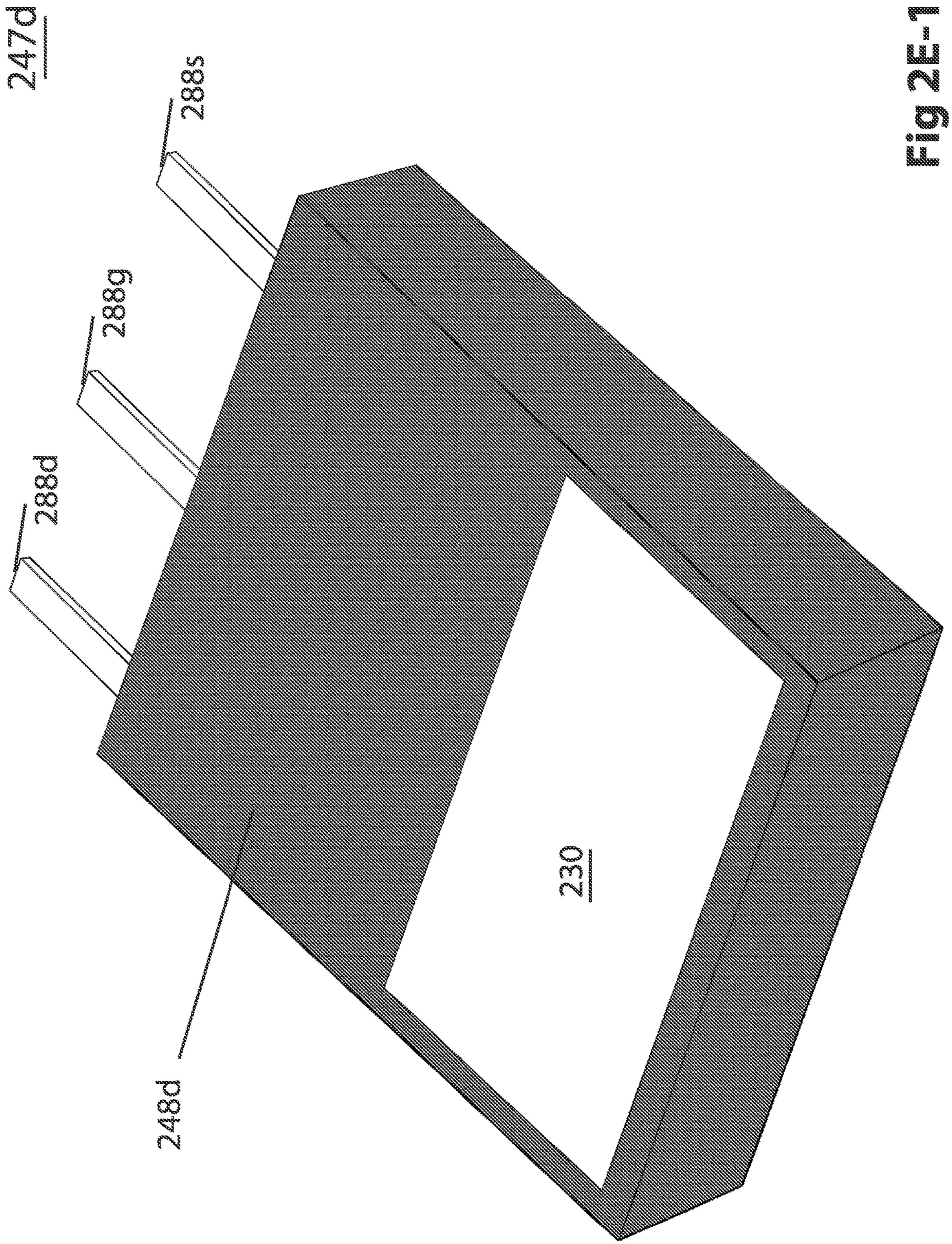
Figures 2, 2E:
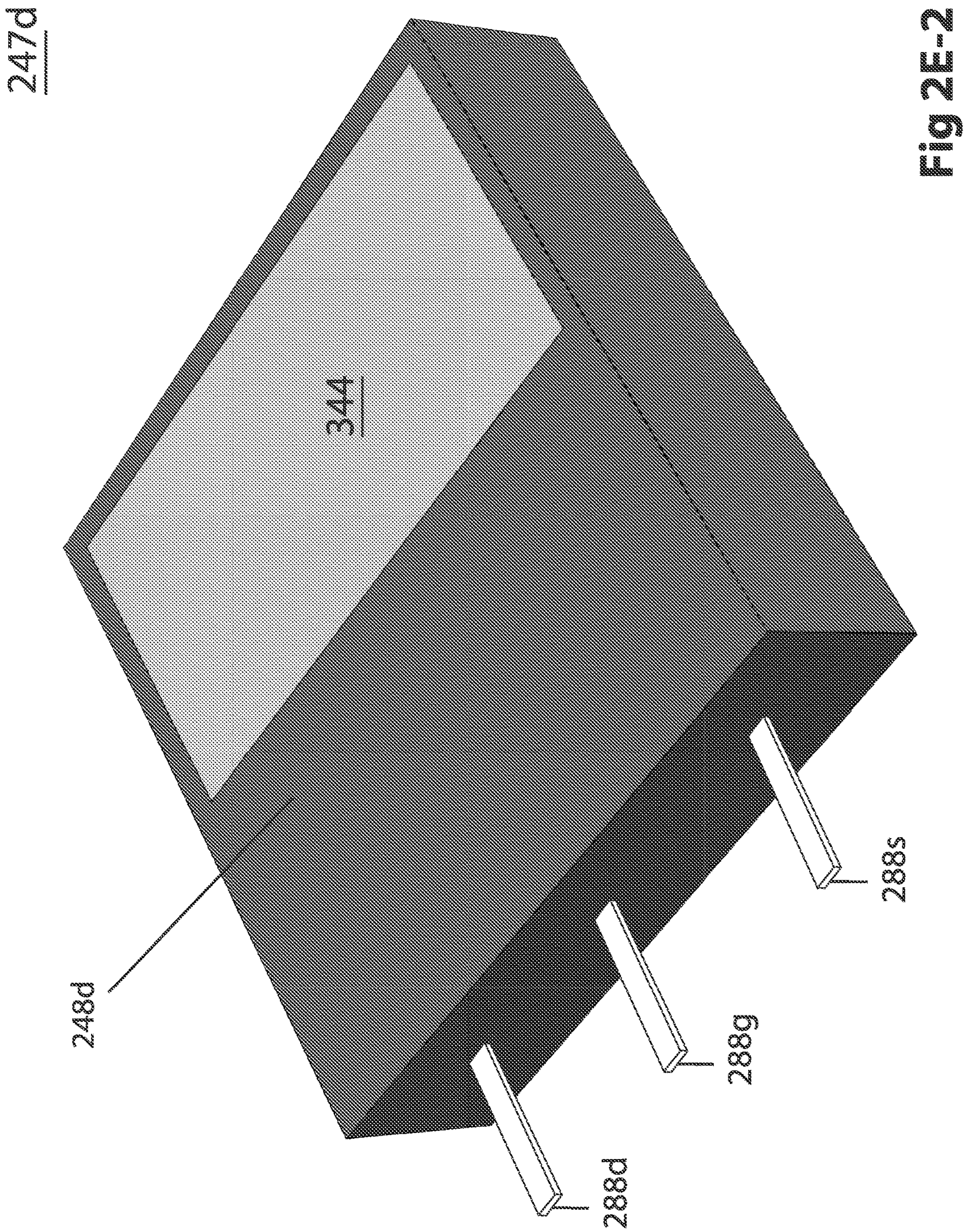

FIGS. 2A-1 and 2A-2 are isometric and reverse isometric views of an example packaged switch 200. FIGS. 2B-1 and 2B-2 are isometric and reverse isometric views of an example packaged half bridge 250. FIGS. 2C-1 and 2C-2 are isometric and reverse isometric views of an example packaged switch 211. FIGS. 2D-1 and 2D-2 are isometric and reverse isometric views of an example packaged switch 247*s*. FIGS. 2E-1 and 2E-2 are isometric and reverse isometric views of an example packaged switch 247*d*. Packaged switches 247*s* and 247*d* are examples that may conform to one or more aspects of the TO-247 packaging standard.

Cases

Packaged switches and packaged half bridges may have cases. FIGS. 2A-1 and 2A-2 show packaged switch 200 with example case 202. FIGS. 2B-1 and 2B-2 show packaged half bridge 250 with example case 252. FIGS. 2C-1 and 2C-2 show packaged switch 211 with example case 238. FIGS. 2D-1 and 2D-2 show packaged switch 247*s* with example case 248*s*. FIGS. 2E-1 and 2E-2 packaged switch 247*d* with example case 248*d*.

Cases isolate, protect and/or support switch module components such as power stacks. Cases can be made of glass, plastic, ceramic, etc. For the purpose of explanation only, cases are presumed to be made of plastic such as a mold compound like epoxy resin. Modem mold compounds have evolved into complex formulations that contain as many as 20 distinct raw materials. Fillers such as alumina can be added to increase a mold compound's thermal conductivity, which in turn may help cool switch module components including power stacks or gate drivers. Cases can be formed using any one of many different types of packaging techniques including transfer molding.

Packaged switches and packaged half bridges can have small form factors. For example, the case of packaged switch 200 or packaged switch 211 can measure 25×25×6 mm, the cases of packaged switches 247*s* and 247*d* can measure 16×21×5 mm, and the case of packaged half bridge 250 can measure 25×25×12 mm. The sizes (e.g., 25×25×6 mm) and shapes (e.g., cubic) of cases for many packaged switches of this disclosure may be substantially similar. Likewise, the sizes (e.g., 25×25×12 mm) and shapes (e.g., cubic) of cases for most packaged half bridges of this disclosure may be substantially similar. FIGS. 2A-1-2E-2 show cases that are effectively cubic in shape. Shapes other than that shown in the figures may be more conducive to transfer molding. External surfaces of the example cases are substantially flat in most embodiments. The sizes or shapes of packaged switches or packaged half bridges should not be limited to that shown or described in this disclosure.

Switch Modules

Traces and Leads

Switch modules contain traces and/or leads. Traces and leads are conductors consisting of a length of metal that electrically connect two locations. Traces have flat surfaces and are typically formed on rigid printed circuit boards (PCBs), flexible PCBs, direct bond copper (DBC) substrates, etc. Leads are generally thicker than traces. Leads can be attached (e.g., soldered) to traces, die clips, die substrates, etc. Leads can be cylindrical-shaped "pins," or leads can have a square or rectangle shaped cross-section. For purposes of explanation only, leads have square or rectangular cross-sections. Leads can be machined from thin sheets of metal.

A DBC substrate can be composed of a ceramic tile (commonly alumina) with a sheet of copper bonded to both sides by a high-temperature oxidation process (the copper and substrate can be heated to a carefully controlled temperature in an atmosphere of nitrogen containing about 30 ppm of oxygen; under these conditions, a copper-oxygen eutectic forms that bonds successfully both to copper and the oxides used as substrates). The top copper layer can be pre-formed prior to firing or chemically etched using PCB technology to form traces, while the bottom copper layer is usually kept plain. DBCs may have thermal advantages over rigid PCBs when employed in switch modules. For example, heat generated by a switch controller can be dissipated through a DBC upon which the controller is mounted.

PCBs have flat conductive traces that can be etched from one or more thin sheet layers of metal laminated onto and/or between sheet layers of a non-conductive substrate. Metal vias extending through non-conductive substrate layers can electrically connect traces at different levels. Switch modules may include rigid PCBs, it being understood switch modules can be made with DBC substrates or other similar devices. Although not shown in FIGS. 2A-1-2E-2, packaged switches 200 and 211, and packaged half bridge 250 contain one or more rigid PCBs upon which switch module components are mounted, it being understood that DBCs can be used in alternative embodiments. Packaged switches 247*s* and 247*d* lack a PCB or DBC substrate.

Traces of PCBs can carry signals (e.g., PWM signals, gate control signals, serial peripheral interface (SPI) signals, etc.) or voltages (e.g., DC supply voltages). For example, traces of a PCB may carry signals or voltages in electrical connections between internal components (e.g., between a switch controller and a switch) of a switch module, or in electrical connections between internal components (e.g., a switch controller) and components external to the switch module (e.g., a microcontroller).

Leads can carry signals or supply voltages. Each of the example packaged switches and packaged half bridges shown in FIGS. 2A-1, 2B-1, and 2C-1 has at least one set of "connector-leads" (e.g., connector-leads 204 and 206) with ends that are attached (e.g., soldered) to respective traces of a rigid PCB or a DBC (not shown). These connector-leads extend laterally from cases 202, 252, and 238 as shown. These connector-leads may be part of a "connector" that is external to the packaged switch or packaged half bridge. The connector in turn can be attached to an external PCB that may include a microcontroller, gate driver, and/or other components. Each of the example packaged switches shown in FIGS. 2D-1 and 2E-1 has a set of three connector-leads 288. These connector-leads extend laterally from cases 248*s* and 248*d* as shown. These connector-leads may be part of a connector that is external to the packaged switch. The connector in turn can be attached to an external PCB that may include a gate driver, voltage regulator and/or other components.

Connector-leads can carry current, signals or voltages in electrical connections between components internal to a switch module and components external to the switch module. For example, connector-lead 204 in FIG. 2A-2 can convey a low-power PWM signal in an electrical connection between a microcontroller on a control PCB and a component (e.g., a switch controller) internal to packaged switch 200, while connector-lead 206 can convey a supply voltage in an electrical connection between a power management integrated circuit (PMIC) on the control PCB and the same internal component or a different component internal to packaged switch 200. Packaged half bridge 250 (FIGS. 2B-1-2B-3) has similar connector-leads 204L, 204H, 206L and 206H. FIGS. 2D-1 and 2E-1 show connector-leads 288*g*, 288*s*, and 288*d*. Although not shown in FIGS. 2D-1 and 2E-1 connector-leads 288*g*, 288*s*, and 288*d* are electrically connected to one or more gates, one or more first current terminals, and one or more second current terminals, respectively, of a switch inside packaged switches 247*s* and 247*d*. Connector-leads 288*d* and 288*s* can carry substantial current (e.g., 400 A). Connector-leads 288 are coplanar in FIGS. 2D-1 and 2E-1. In an alternative embodiment one or more connector-leads 288 may be contained in different planes.

Packaged switches and packaged half bridges may include additional leads or conductors (e.g., bond wires) that carry signals (e.g., a gate control signal) or voltages in connections between components (e.g., a gate driver and a switch) of a switch module. For example, a switch module may include a bent lead that carries a gate signal in a connection between a gate driver and a switch. A flexible PCB can be used to transmit a gate signal in a connection between a gate driver and a switch in another embodiment.

Power Stacks

Switch modules include power stacks, each of which includes a switch attached between a first metal conductor called a die substrate and second metal conductor called a die clip. Die substrates and die clips are more fully described below. For purposes of explanation only, a switch module has only one power stack.

A switch includes one or more power transistors (e.g., IGBTs, metal-oxide field effect transistors (MOSFETs), etc.). A power transistor has two current terminals (collector and emitter in an IGBT, source and drain in a MOSFET, etc.) between which current can flow when the transistor is activated, and a control or gate terminal. Multiple power transistors in a switch may be connected in parallel and controlled by a common signal at their gates in one embodiment, or the gates of parallel connected power transistors in a switch may be controlled by independent signals in another embodiment.

Power transistors or power diodes are vertically structured semiconductor dies in one embodiment of this disclosure. These power transistor dies have a trench-like structure with a first, substantially flat current terminal (e.g., a drain or an emitter) in a bottom surface of the die, and a second, substantially flat current terminal (e.g., a source or a collector) and a substantially flat gate terminal, both of which are in a top surface of the die. The top and bottom surfaces face opposite directions. The cathode and anode of a vertically structured power diode can be similarly configured on oppositely facing top and bottom surfaces of a die.

A switch can transmit high levels of current without failure depending on the size (e.g., gate width and length), type (e.g., MOSFET), semiconductor material (e.g., GaN), and number (e.g., six) of power transistors in the switch. A power transistor can transmit high levels of current at high switching speeds (e.g., up to 100 kHz for Si IGBTs, up to 500 kHz for SiC MOSFETS, up to 1.0 GHz for GaN MOSFETs, etc.). When thermally connected to and cooled by heat sinks or bus bars that also act as heat sinks, power transistors can transmit more current at higher switching speeds without failure.

Die Substrates and Die Clips

Switches are sandwiched between die substrates and die clips. A first current terminal (e.g., collector or drain) and a second current terminal (e.g., emitter or source) of each switch transistor are connected (e.g., sintered, soldered, brazed, etc.) to a die substrate and a die clip, respectively. The gate of each transistor in a switch can be controlled by a signal from a switch controller. The signal can be carried to the gate by an electrical connection that includes a wire, ribbon, lead, trace, etc., or a serially connected combination thereof.

A die substrate or a die clip can be machined or stamped from a sheet of layered or composite materials that have high thermal conductivity and low electrical resistance. The sheet may consist of alternating layers of copper (Cu) and molybdenum (Mo). For example, a layer of molybdenum may be sandwiched between layers of copper. The copper outer layer has high thermal conductivity and efficient heat spreading qualities. The molybdenum layer inserted between copper layers can improve the sheet's coefficient of thermal expansion. The sheet may also include a layer of nickel formed on the outer layer(s) (e.g., outer layer(s) of copper). Further, an additional (e.g., bright silver or dull (i.e., matte) silver) layer may be formed (e.g., plated) on the outer layer(s) of nickel. A device such as a switch can be attached (e.g., sintered) to the surface of the layer that contains the additional (e.g. matte silver) material. For example, a switch can be sintered to the sheet of layered or composite materials using, for example, a silver sintering paste. The thickness of the example interleaved thin, flat layers of molybdenum and copper may be chosen to enhance the electrical, thermal and/or mechanical connection between the device when attached (e.g., sintered). Sheets of composite materials (mixtures of: copper and molybdenum; copper and tungsten; copper and diamond; etc.) that have modified electrical conductivity, thermal conductivity and coefficient of thermal expansion may also be used to form die substrates or die clips. A die substrate or die clip can be formed by joining (e.g., sintering, soldering, brazing, etc.) two electrically and thermally conductive work pieces. A die substrate or die clip can be formed using metal or composite 3-D printing in still another embodiment. Die substrates and die clips of this disclosure should lack a dielectric element.

Die substrates and die clips have terminals or pads through which current and/or heat can be transmitted. A die substrate has at least one terminal through which substantial heat and current can be transmitted into or out of a packaged switch or packaged half bridge. The die substrate may have one or more side-terminals through which substantial current can be transmitted into or out of the packaged switch or packaged half bridge. These side-terminals may also transmit some heat out of packaged switches or packaged half bridges, but their primary purpose is to transmit current.

A die clip has at least one terminal through which substantial current can be transmitted. In most instances, current is transmitted into or out of a packaged switch or packaged half bridge through this die clip terminal. A die clip may have an additional terminal through which substantial heat is transmitted out of a packaged switch. In still other embodiments, a die clip may be similar in structure to a die substrate and include a terminal through which substantial heat and current can be transmitted into or out of a packaged switch.

Die substrate terminals, die substrate side-terminals, and die clip terminals may have substantially flat surfaces that are substantially flush or coplanar with case surfaces of the packaged switches or packaged half bridges in which they are contained. In other embodiments, die substrate terminals, die substrate side-terminals, and die clip terminals may have flat surfaces that are parallel to and recessed below case surfaces, or they may be parallel to and protrude above case surfaces. Some die clip terminals may not be exposed through the case of a packaged half bridge. Some die substrate or die clip terminals may take form in connector-leads (e.g., connector-lead **288*d* in FIG. 2D-1**) that extend perpendicularly from the case surfaces of packaged switches or packaged half bridges.

FIGS. 2A-1-2E-2 show example die substrate terminals 230 through which substantial heat and substantial current can be transmitted into or out of the packaged switches or packaged half bridges in which they are contained.

FIGS. 2A-1, 2A-2, 2B-1, 2B-2, 2C-1, and 2C-2 show example die clip terminals 232 through which substantial current can be transmitted into or out of the packaged switches or packaged half bridges in which they are contained. FIG. 2D-1 shows example die clip terminal (connector-lead **288*d*) through which substantial current can be transmitted into or out of packaged switch 247*s*. FIGS. 2C-2** and 2E-2 shows example die clip terminals 344 through which substantial heat and/or current can be transmitted out of packaged switches in which they are contained.

FIGS. 2A-1, 2B-1, and 2C-1 show example die substrate side-terminals 240. In some embodiments a metal strap electrically connects a die substrate of one power stack to a die clip in another power stack. FIG. 2B-3 shows an example metal strap 242 that electrically connects high-side die clip terminal 232H to low-side die substrate side-terminals 240L. FIG. 2B-3 shows metal strap 242 is external to packaged half bridge 250. In another embodiment, metal strap 242 may be internal to the packaged half bridge.

The size and shape of die substrate terminals, die substrate side-terminals, metal straps, and die clip terminals should not be limited to that shown in the figures. In other words, the metal straps and terminals may take different forms, shapes, and sizes.

FIGS. 2A-1, 2C-1, 2D-1 and 2E-1 show die substrate terminals 230 with rectangular-shaped, substantially flat surfaces that are substantially flush with substantially flat case surfaces of packaged switches 200, 211, 247*s*, and 247*d*, respectively. FIGS. 2A-1 and 2C-1 also show die substrate side-terminals 240 with substantially flat surfaces that are substantially flush with substantially flat case surfaces of packaged switches 200 and 211, respectively. FIGS. 2A-1 and 2C-1 show die clip terminals 232 with rectangular-shaped, substantially flat surfaces that are substantially flush with substantially flat case surfaces of packaged switches 200 and 211, respectively. The rectangular-shaped, substantially flat die clip terminal 232 of the packaged switches of FIGS. 2A-1 and 2C-1 can be replaced with a connector-lead with rectangular-shaped cross section that extends from the back surface thereof. Packaged switches 211 and 247*d* have die clip terminals 344 with a rectangular-shaped, substantially flat surface that is substantially flush with a substantially flat bottom case surface as shown in FIGS. 2C-2 and 2E-2. FIGS. 2D-1 and 2E-1 show a die clip terminal 288*d* that takes form in a connector-lead with a rectangular-shaped cross section that extends laterally from the case of packaged switches 247*s* and 247*d*.

FIGS. 2B-1, 2B-2, and 2B-3 show die substrate terminals 230L and 230H with rectangular-shaped, substantially flat surfaces that are substantially flush with substantially flat case surfaces of packaged half bridge 250. FIGS. 2B-1, 2B-2, and 2B-3 show die clip terminals 232L and 232H with rectangular-shaped, substantially flat case that are substantially flush with substantially flat surfaces of packaged half bridge 250. In another embodiment, the rectangular-shaped, substantially flat die clip terminals 232L and 232H can be replaced with connector-leads with rectangular-shaped cross sections that extend from the back of the packaged half bridge 250 of FIGS. 2B-1, 2B-2 and 2B-3. Or the rectangular-shaped, substantially flat die clip terminal 232L of the packaged half bridge of FIG. 2B-2 can be replaced with a connector-lead with rectangular-shaped cross section that extends from the back surface thereof. FIGS. 2B-1-2B-3 show die substrate side-terminals 240H of a high side die substrate and die substrate side-terminals 240L of a low side die substrate, all with substantially flat surfaces that are substantially flush with substantially flat case surfaces of packaged half bridge 250.

In alternative embodiments, flat surfaces of die substrate terminals 230, die clip terminals 232, die clip terminals 344 and/or die substrate side-terminals 240, may be in planes that are parallel to and above or below planes that contain substantially flat surfaces of cases such as cases 202, 211, or 250.

In some embodiments, current can enter a packaged switch or packaged half bridge through a die substrate terminal, and then exit through a die clip terminal, or current can flow through a packaged switch or packaged half bridge in the reverse direction. To illustrate, current can enter packaged switch 200, 211, or 247 through die substrate terminal 230 of a die substrate, flow-through the die substrate, an activated switch, a die clip, and then exit the packaged switch 200, 211 or 247 via die clip terminal 232, 288*d* or 344 of the die clip, or current can flow in the reverse direction. Current can enter a packaged switch through a die substrate side-terminal of a die substrate, and subsequently exit the packaged switch through a die substrate terminal of the same die substrate, or current can flow through a packaged switch in the reverse direction. For example, current can enter packaged switch 200 or 211 through a die substrate side-terminal 240 of a die substrate, flow-through the die substrate, and then exit the packaged switch 200 or 211 through die substrate terminal 230 of the die substrate; or current can flow in the reverse direction.

Current can enter packaged half bridge 250 of FIG. 2B-1 through high-side die substrate terminal 230H of a high-side die substrate, flow-through the high-side die substrate, an activated high-side switch, a high-side die clip, and then exit the packaged half bridge 250 through a high-side die clip terminal 232H of the high-side die clip; or current can flow in the reverse direction. Current can enter packaged half bridge 250 of FIG. 2B-2 through low-side die substrate terminal 230L of a low-side die substrate, flow-through the low-side die substrate, an activated low-side switch, a low-side die clip, and then exit the packaged half bridge 250 through low-side die clip terminal 232L of the low-side die clip; or current can flow in the reverse direction. FIG. 2B-3 shows metal strap 242. Current can enter packaged half bridge 250 of FIG. 2B-3 through a high-side die substrate terminal 230H of a high-side die substrate, flow-through the high-side die substrate, an activated high-side switch, a high-side die clip, a high-side die clip terminal 232H of the high-side die clip, metal strap 242 that electrically connects the high-side die clip terminal 232H to one or more low-side die substrate side-terminals 240L of a low-side die substrate, the one or more low-side die substrate terminals 240L, the low-side die substrate, and then exit the packaged half bridge through a low-side die substrate terminal 230L of the low-side die substrate; or current can flow in the reverse direction.

A die clip terminal, or a die substrate terminal may include one or more recesses that can mate with similarly shaped extensions of an external device (e.g., a metal strap, a phase bus bar, a V+ bus bar, a V− bus bar, etc., all of which are more fully described below) to facilitate better electrical, thermal and/or mechanical connection therebetween.

Die substrates and die clips can transmit substantial current and heat to or from their connected switches. Die substrate terminals, die substrate side-terminals, and die clip terminals can transmit substantial current and/or heat into or out of a packaged switch or packaged half bridge. For example, a die substrate can have a die substrate terminal 230 with a width of 24 mm and a length of 11.2 mm, which is connected to a device external to the packaged switch or packaged half bridge such as a V+ bus bar. This die substrate can transmit 400 A or more of current between its connected switch and the external device. A die clip can have a die clip terminal 232 with a width of 6 mm and a length of 11 mm, which can be connected to a device external to the packaged switch or packaged half bridge such as a V− bus bar. This die clip can transmit 400 A or more of current between its connected switch and the external device. A metal strap (e.g., metal strap 242) can transmit 400 A or more of current when connected between a die clip and a die substrate. A die clip terminal 288*d* can transmit 400 A or more of current into or out of a packaged switch.

Switches can get hot, especially when they conduct high current at high switching speed due to conduction and switching losses. A die substrate, depending on its dimensions, can conduct large amounts of heat out of a packaged switch or packaged half bridge through its die substrate terminal. For example, die substrate terminal 230 having a width of 24 mm and a length of 11.2 mm can transmit anywhere between zero and 750 W or more of heat. In other words, a die substrate terminal 230 can transmit 10, 20, 50, 100, 300, 750 W or more of power. A die substrate can be thick (e.g., 0.1 mm-6.0 mm thick when measured between the die substrate terminal and its attached switch), and the thicker it is, the more thermal capacitance it provides, which can be important for absorbing a sudden increase in heat produced by an attached switch. Die substrates can transmit even more heat out of packaged switches or packaged half bridges when their terminals are thermally connected to heat sinks or bus bars that also act as heat sinks.

Like die substrates, a die clip can be thick (e.g., 0.1 mm-8.0 mm thick when measured between a surface attached to a switch and an oppositely facing surface), and the thicker it is, the more thermal capacitance it provides. In one embodiment as noted above, a die clip may have a first terminal for conducting current into or out of a packaged switch, and a second terminal for conducting heat and/or current into or out of the packaged switch. Packaged switch 211 of FIGS. 2C-1 and 2C-2 has a die clip terminal 232 for conducting current into or out of the packaged switch, and a second terminal 344 for conducting heat and/or current into or out of the packaged switch. Packaged switch 247*d* of FIGS. 2E-1 and 2E-2 has a die clip terminal 344 for conducting substantial current and heat into or out of the packaged switch. With length and width like the length and width of die substrate terminal 230, die clip terminal 344 of packaged switches 211 and 247*d* can transmit anywhere between zero and 750 W or more of heat. In other words, a die clip terminal 344 can transmit 10, 20, 50, 100, 300, 750 W or more of power. Die clip terminal 344 can transmit even more heat out of a packaged switch when it is thermally connected to a heat sink or bus bar that also acts as a heat sink. In another embodiment as noted above, a die clip may have a single terminal for conducting high levels of heat (e.g., 10, 20, 50, 100, 300-750 W or more) and current (e.g., 400 A or more). The single terminal can transmit even more heat out of a packaged switch when the terminal is thermally connected to a heat sink or bus bars that also act as heat sinks.

Returning to FIGS. 1A and 1C, prior inverters or rectifiers use one or more bond wires for carrying current to or from a current terminal of the IGBTs. These bond wires are prone to failure when they experience fast and large-scale temperature cycling. The failure can be attributed to relatively high current density and low thermal capacity in the wires themselves or in the bond connections between the wires and current terminals. The wires or the bond connections often crack or fracture during temperature cycling. Bond-wire lift off may also occur. In contrast current density is lower and thermal capacity is higher in die clips and die substrates. Current density is lower in the connections (e.g., sinter connections) between switch terminals and die clips or die substrates. As a result, failures are less likely to occur. Die substrates and die clips provide additional advantages over bond wires, such as lower parasitic parameters, as will be described below. Low parasitic parameters can enhance operational aspects of packaged switches and packaged half bridges.

In general, a pair of components can be mechanically, electrically, and/or thermally connected, attached, joined, etc., together. A connection, attachment or joint can conduct heat, current, or both between components. A connection, attachment or joint between a pair of components can be direct so that surfaces of the components contact each other. Direct contact can be achieved by pressing (i.e., "press-fitting") the components against each other using mechanical structures such as clamps or bolts, or the connection, attachment or joint between a pair of components can be indirect via an electrically and/or thermally conductive material (e.g., solder, silver, conductive adhesive, thermal interface material (TIM), etc.), one or more additional components (e.g., die substrate, die clip, wire, ribbon, lead, trace, etc.), or a combination of one or more additional components, and electrically and/or thermally conductive joint material, etc.

Materials such as solder that connects, attaches, or joins components may expand at different rates when heated compared to the expansion rates of the components themselves. When components and the material heat up, the different expansion rates can cause cracks in the material that connects, attaches, or joins the components. The cracks can adversely affect the thermal and/or electrical conduction properties of the connection, attachment or joint between the components. Ideally the coefficient of thermal expansion (CTE) of, for example, sinter, conductive-adhesive or solder that connects, attaches, or joins components, should be as close as possible to the CTE for the components to reduce the chances of cracking or the development of other flaws.

Example Packaged Switches

Packaged Switches 200 and 201

Figures 1, 3A:
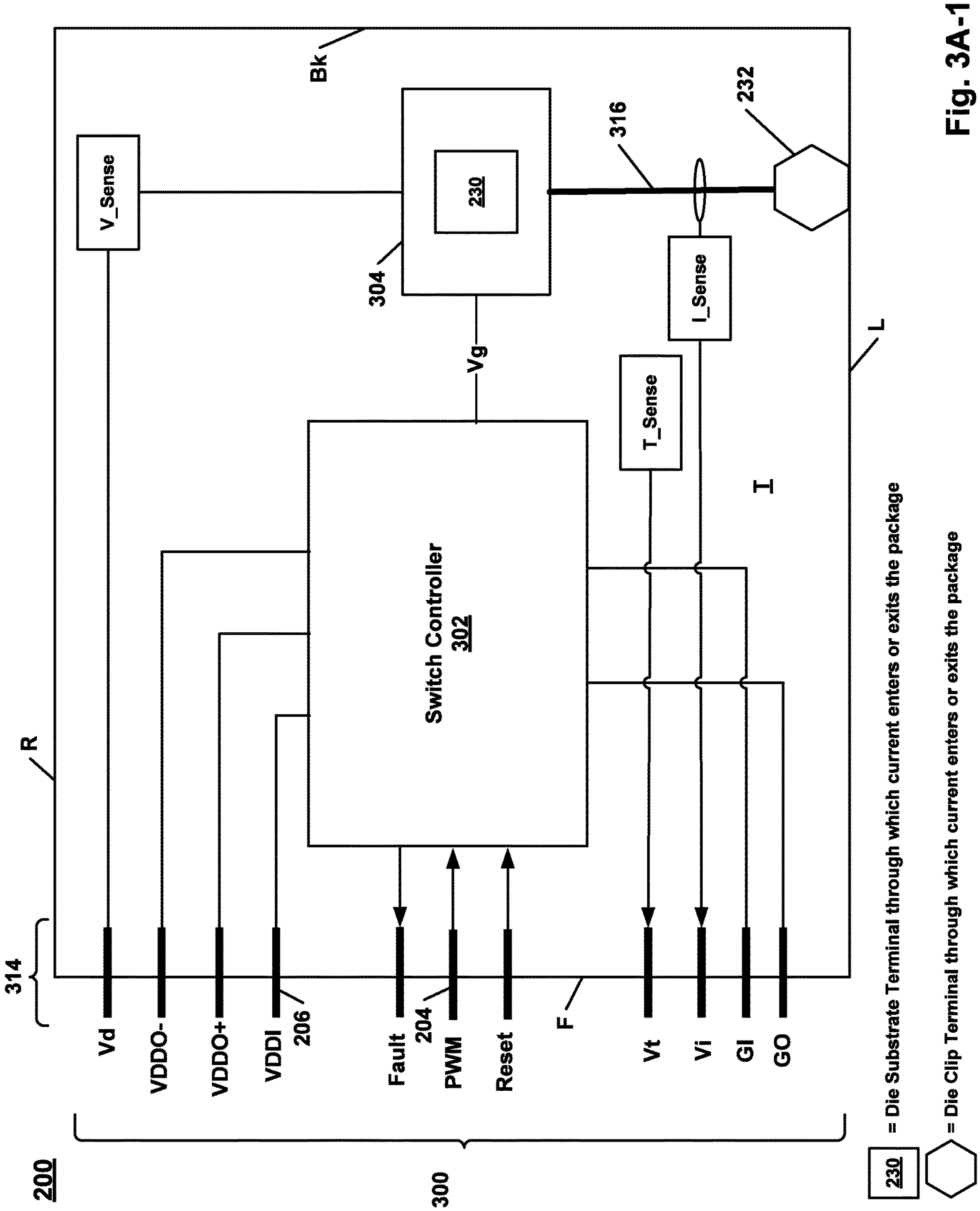
Figures 2, 3A:
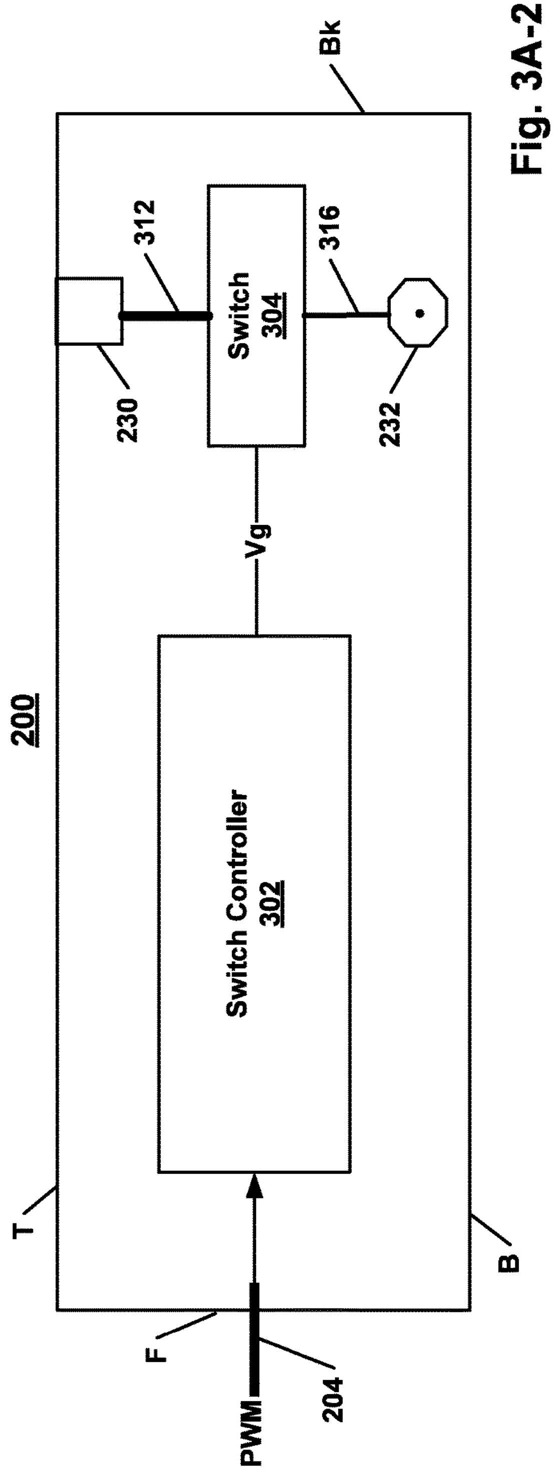
Figures 3, 3A:
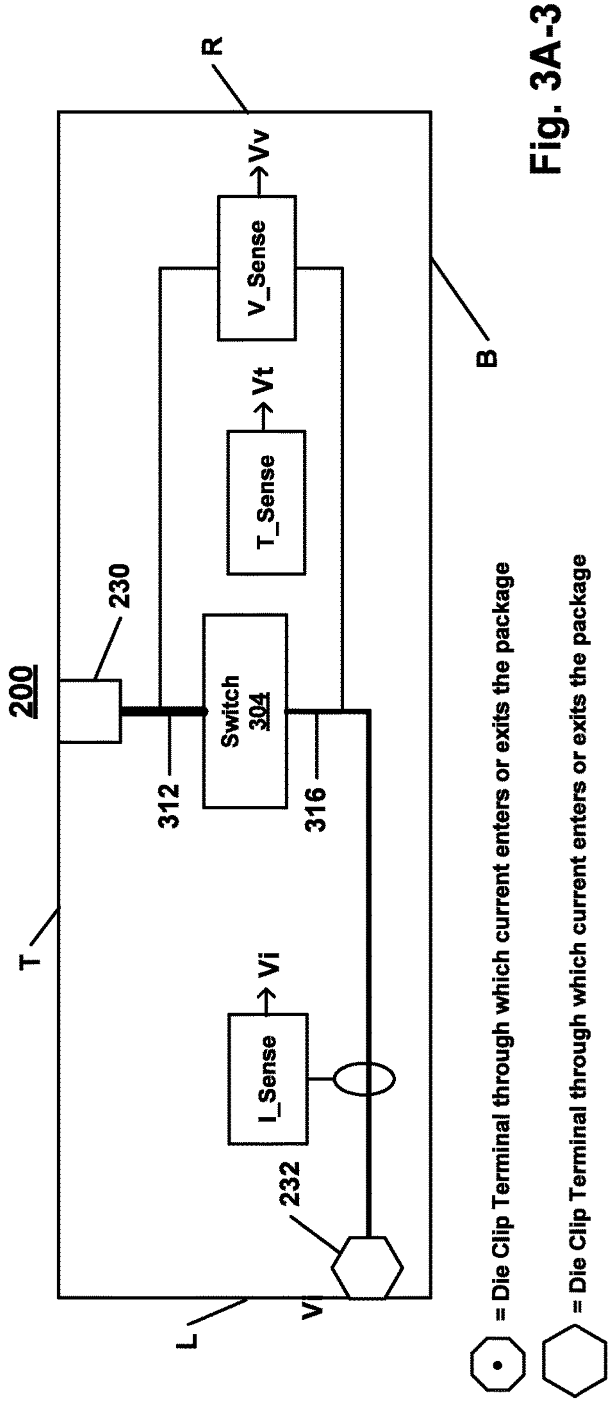

With continued reference to FIGS. 2A-1 and 2A-2, FIGS. 3A-1-3A-3 are quasi-schematic diagrams of packaged switch 200, which includes an example switch module 300. Packaged switch 200 is shown in FIGS. 3A-1-3A-3 with a transparent case 202 to enable a better understanding of switch module components, their interaction, and their relative position.

FIGS. 3A-1, 3A-2 and 3A-3 show relative positions of switch module components when packaged switch 200 is viewed from the top, side and back, respectively. Switch module 300 includes a rigid PCB upon which components can be mounted and electrically connected.

Connector-leads (e.g., 204 and 206) may be attached to traces on a switch module's rigid PCB before or after the switch module is encased in plastic in a transfer molding process or other process. The connector-leads shown in FIGS. 2A-1-2C-2 are attached to traces of rigid PCBs before formation of plastic cases 202, 252, and 238. In other embodiments, portions of traces at a front portion of the rigid PCB can be shielded during the transfer molding process. Connector-leads can then be attached to the traces at the front of the rigid PCB after the molding process. For purposes of explanation, connector-leads are considered part of the switch modules to which they are attached.

Switch module 300 in FIG. 3A-1 includes a set 314 of example connector-leads. More particularly, set 314 includes eleven connector-leads, including connector-leads 204 and 206, that can be used for carrying signals and voltages between switch module components and components external to the switch module such as a microcontroller or a PMIC. In the embodiments shown, connector-leads in a set 314 are coplanar, it being understood the present disclosure should not be limited thereto. The number of connector-leads in set 314 should not be limited to eleven. Fewer or more connector-leads can be employed depending upon the design of the switch module.

Switch module 300 includes a switch controller 302 that controls switch 304 based on a low-power, PWM signal received from a microcontroller or similar processor-based device through connector-lead 204. Switch 304 is electrically and thermally connected to and positioned between die substrate 312 and die clip 316, all of which are symbolized in FIG. 3A-1, 3A-2, or 3A-3. A die substrate or a die clip can conduct large current (e.g., 400 A or more) into or out of a packaged switch or packaged half bridge.

Switch 304 generates heat. Die substrates and die clips can transmit heat out of a packaged switch or packaged half bridge. Die substrate 312 is represented by a thicker line in the figures, including FIGS. 3A-2 and 3A-3, to indicate that it is configured to conduct more heat out of a packaged switch or packaged half bridge then die clip 316.

Switch module 300 includes a temperature sensor circuit T_Sense for sensing temperature near switch 304, a current sensor circuit I_Sense for sensing current transmitted by switch 304, and a voltage sensor circuit V_Sense for sensing the voltage across switch 304. Switch modules may contain fewer or more components than that shown in the figures of this disclosure. For example, a switch module may contain a voltage regulator that provides a supply voltage to one or more of the sensor circuits T_Sense, I_Sense, and V_Sense.

FIGS. 3A-1, 3A-2 and 3A-3, show relative positioning of switch module components with respect to each other. Switch controller 302 is positioned near the front F of packaged switch 200 as seen in FIG. 3A-2, while the power stack consisting of the switch 304, die substrate 312 and die clip 316, is positioned near the back Bk of packaged switch 200. Die substrate 312, switch 304, and die clip 316 are vertically stacked between the top T and bottom B as seen in FIGS. 3A-2 and 3A-3. In one sense, stacking first and second components means the first and second components are contained in first and second planes, respectively, which are separated, but parallel to each other. The first component in the first plane may be directly above the second component in the second plane, or the first component may be laterally offset in the first plane so that the second component is not directly beneath the first component.

For ease of illustration and understanding, die substrate terminal 230 is represented as a square in most figures. Depending on the view, die clip terminal 232 is represented as a hexagon or as an octagon. In the top and back views of FIGS. 3A-1 and 3A-3, respectively, die clip terminal 232 is represented as a hexagon. In the side view of FIG. 3A-2, die clip terminal 232 is represented as an octagon. The same die substrate terminal and die clip terminal symbolism is used in other figures.

Die substrate terminal 230 is positioned in FIGS. 3A-2 and 3A-3 to indicate that it is flush with the top surface of packaged switch 200 and die clip terminal 232 is positioned in FIGS. 3A-1 and 3A-3 to indicate that it is flush with the left side surface of packaged switch 200. Die clip terminal 232 is drawn with a center dot in FIG. 3A-2 to indicate that current enters or exits packaged switch 200 through its left side.

Figures 3, 3A, 4:
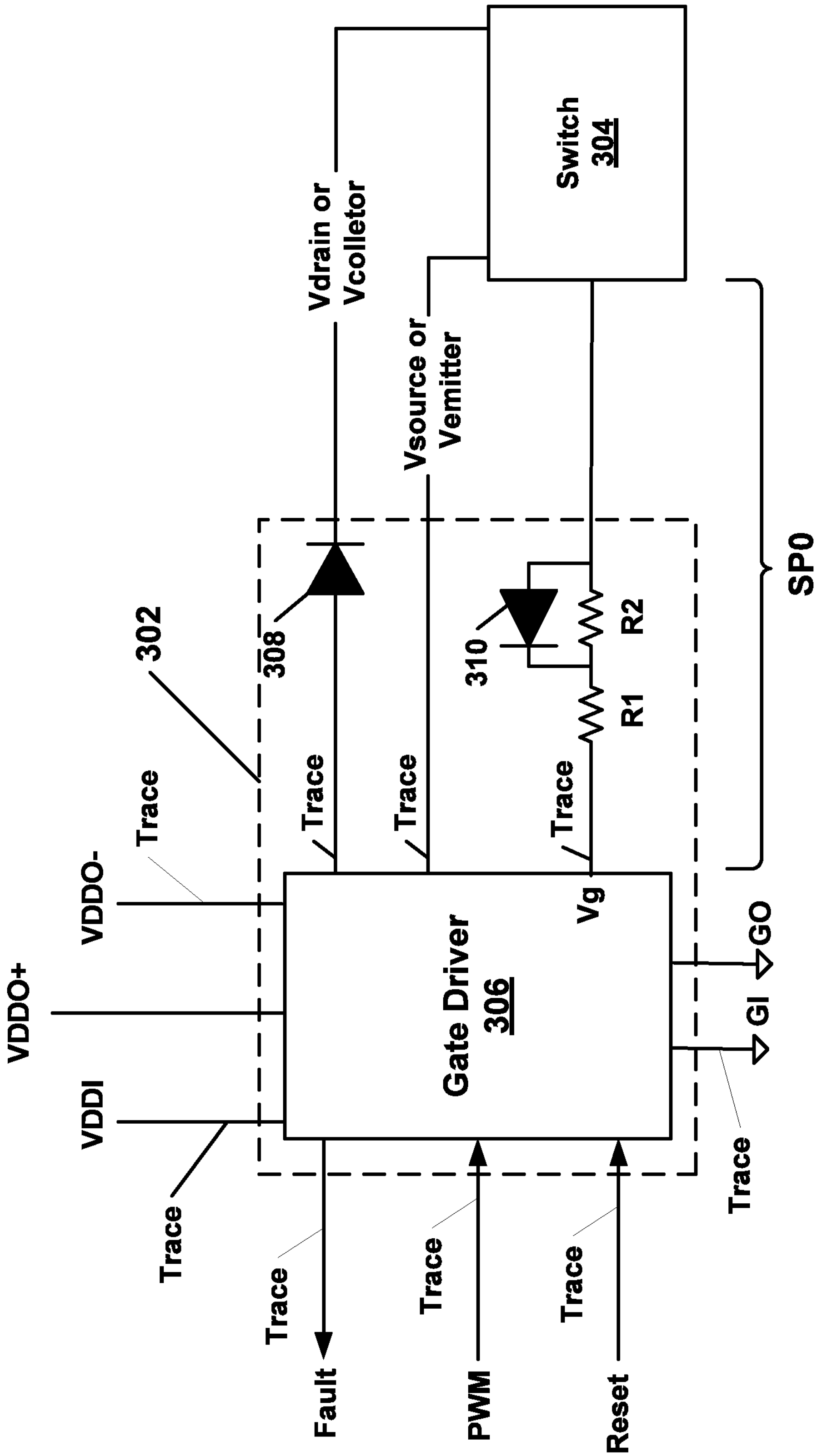
Figures 3, 3A, 4, 5, 6:
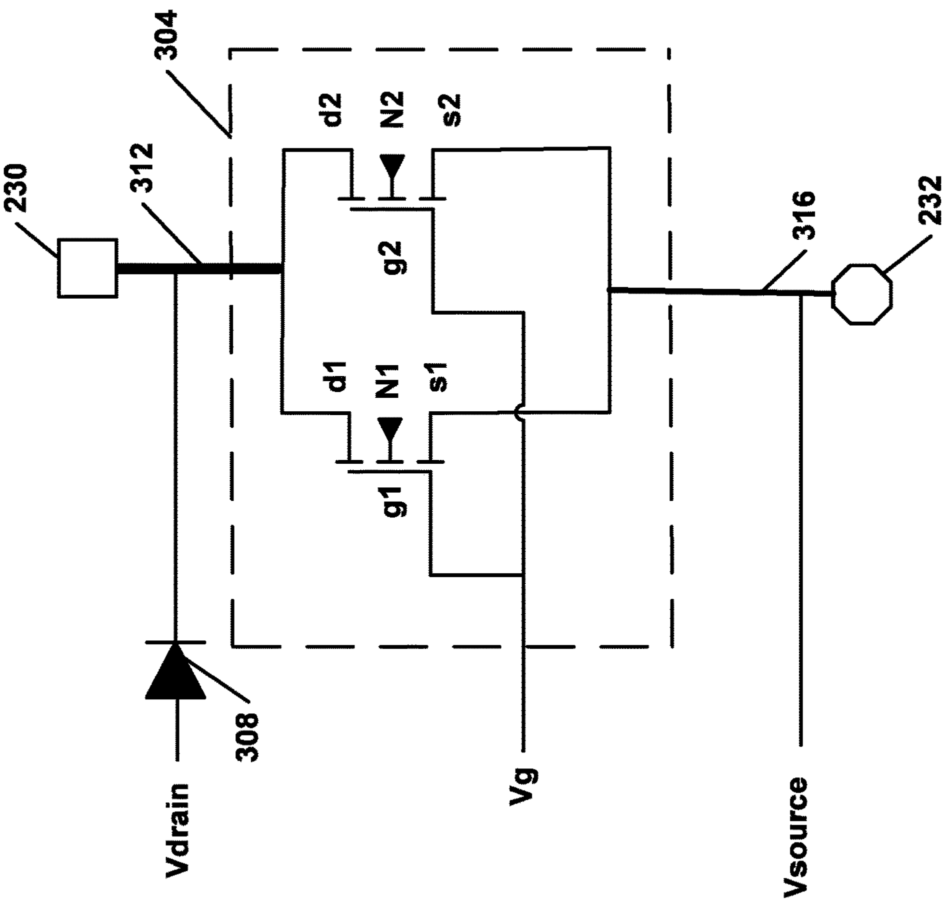
Figures 3, 3A, 4, 5:
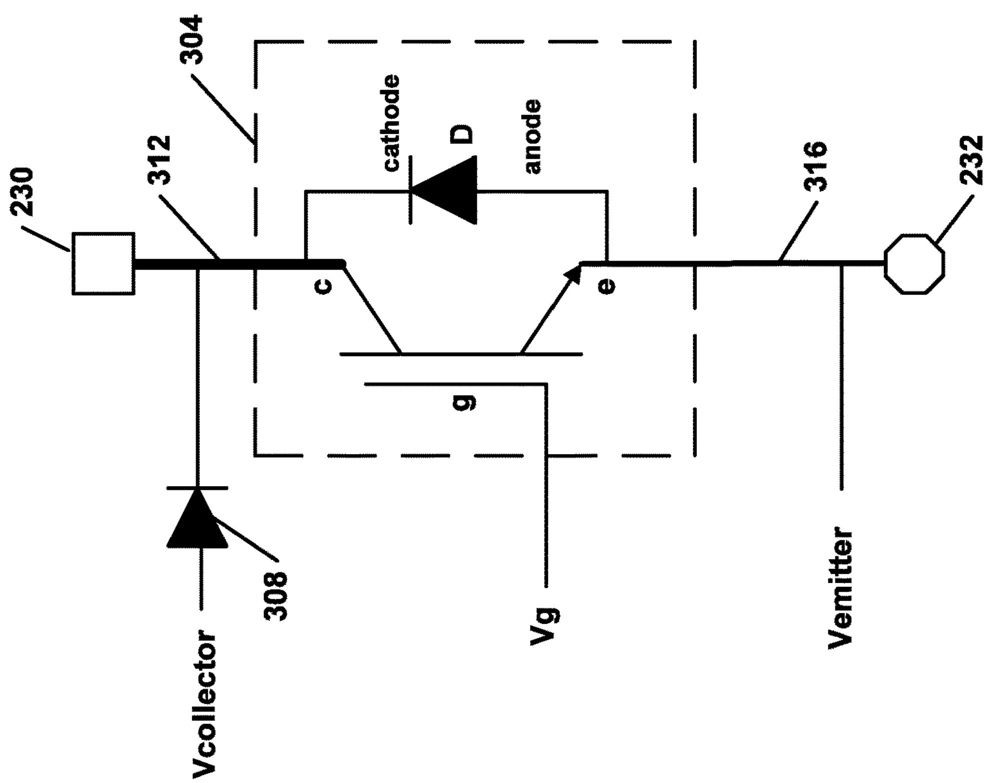
Figures 3, 3A, 4, 5, 6, 7:
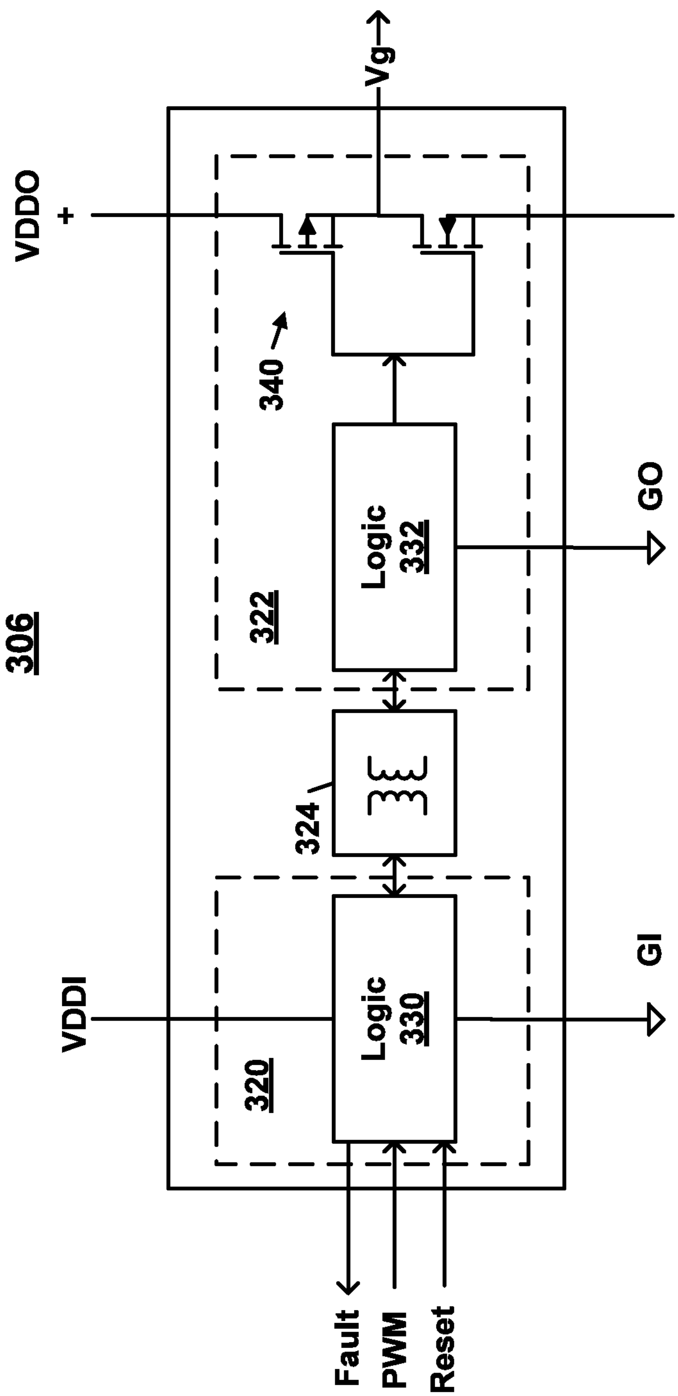
Figures 3, 3A, 4, 5, 6, 7, 8:
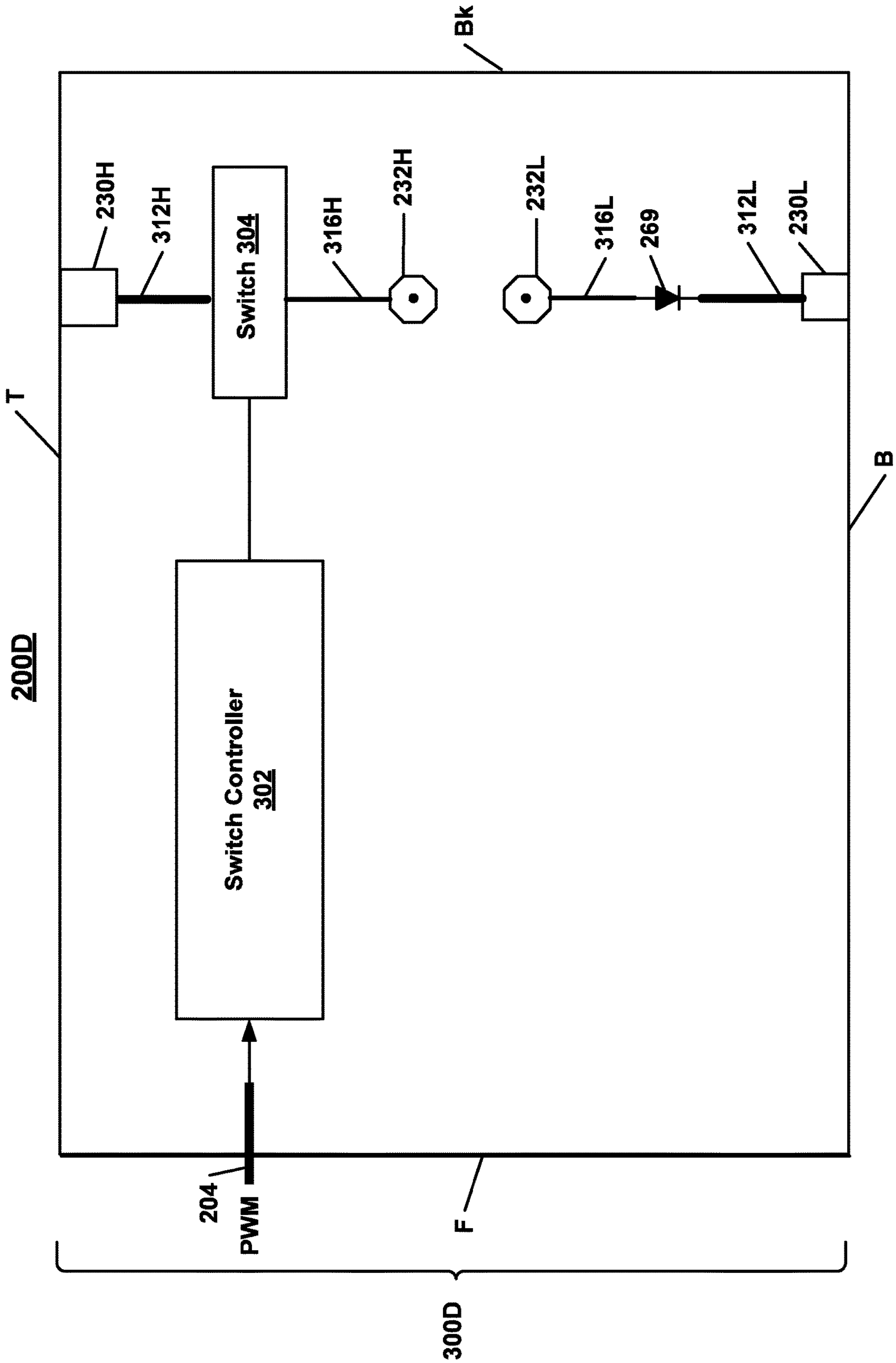
Figures 3, 3A, 4, 5, 6, 7, 8, 9:
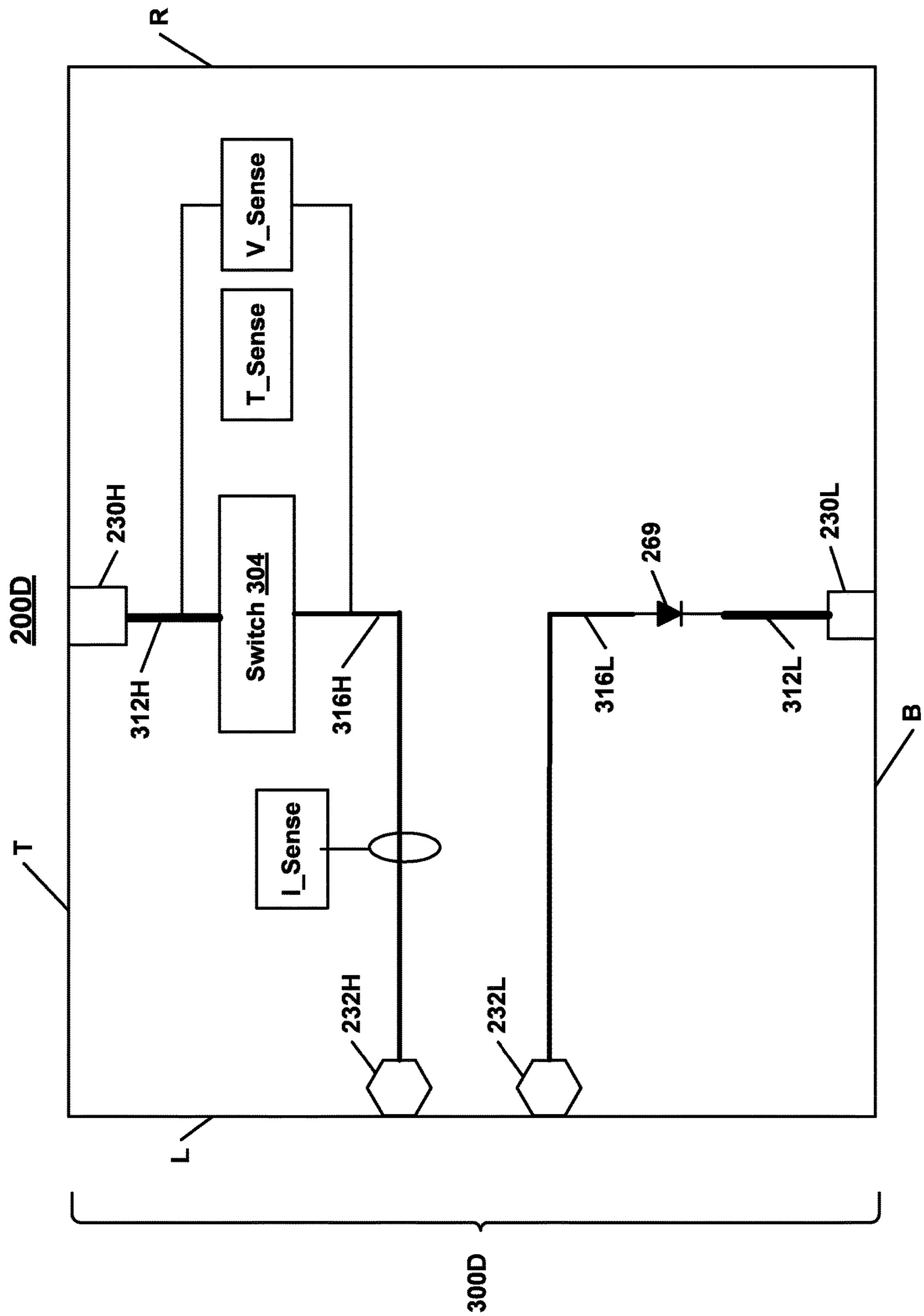
Figures 1, 3B:
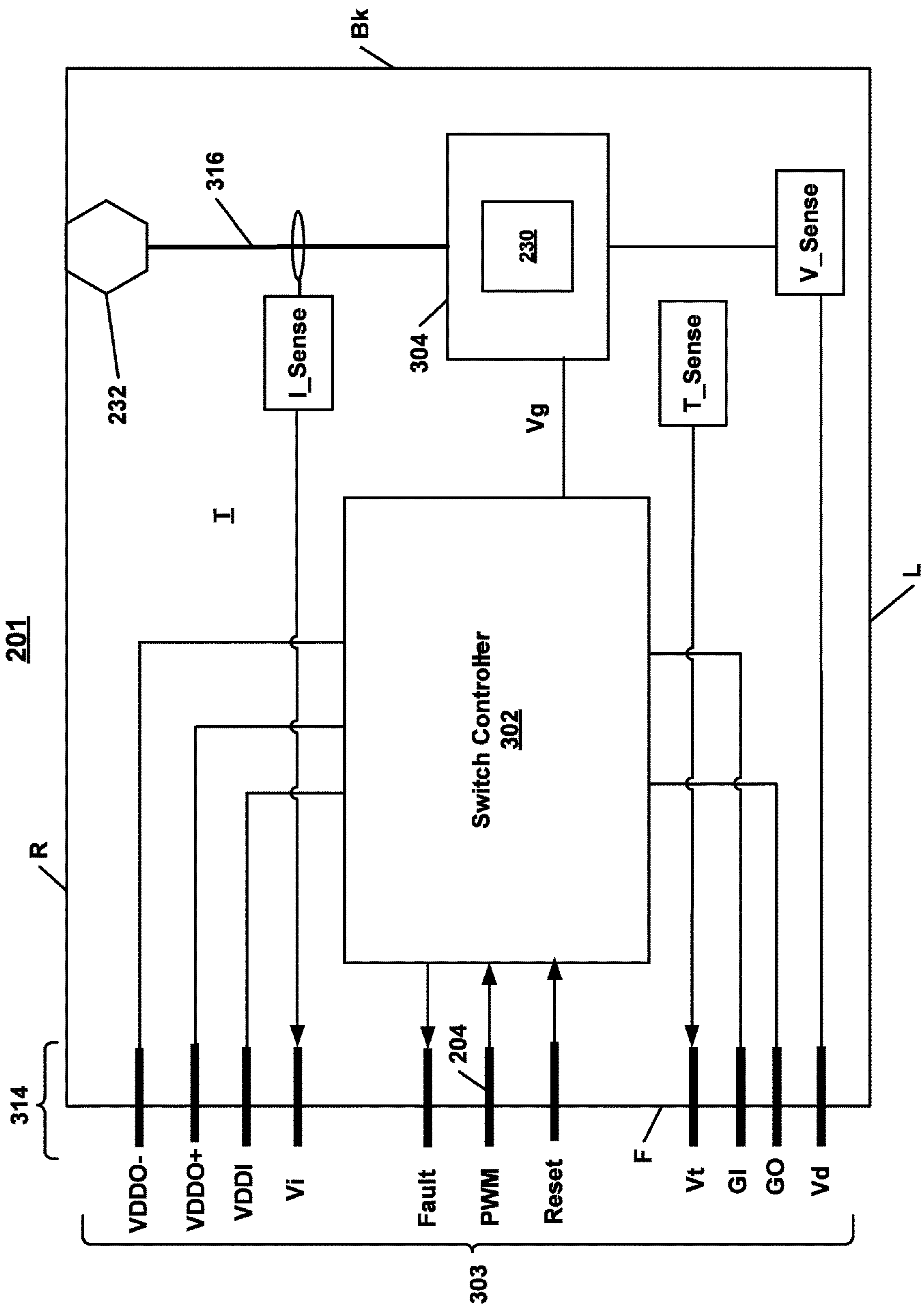
Figures 2, 3B:
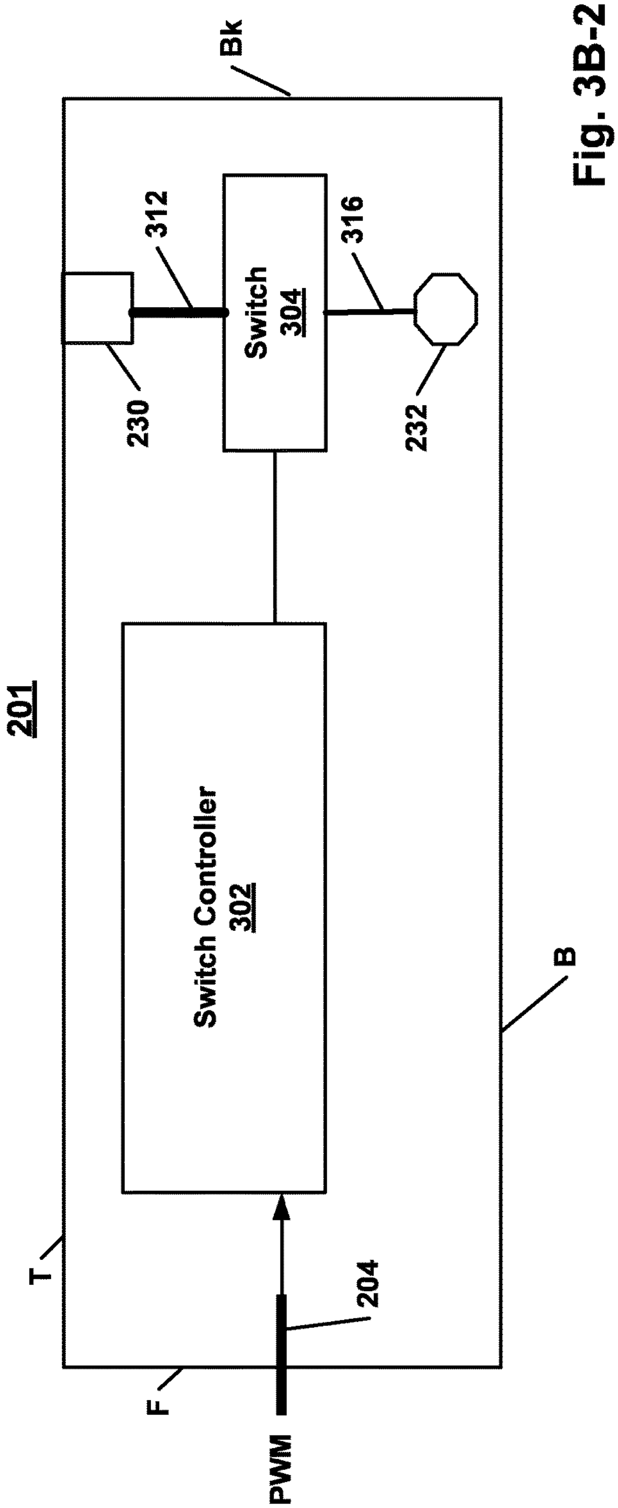
Figures 3, 3B:
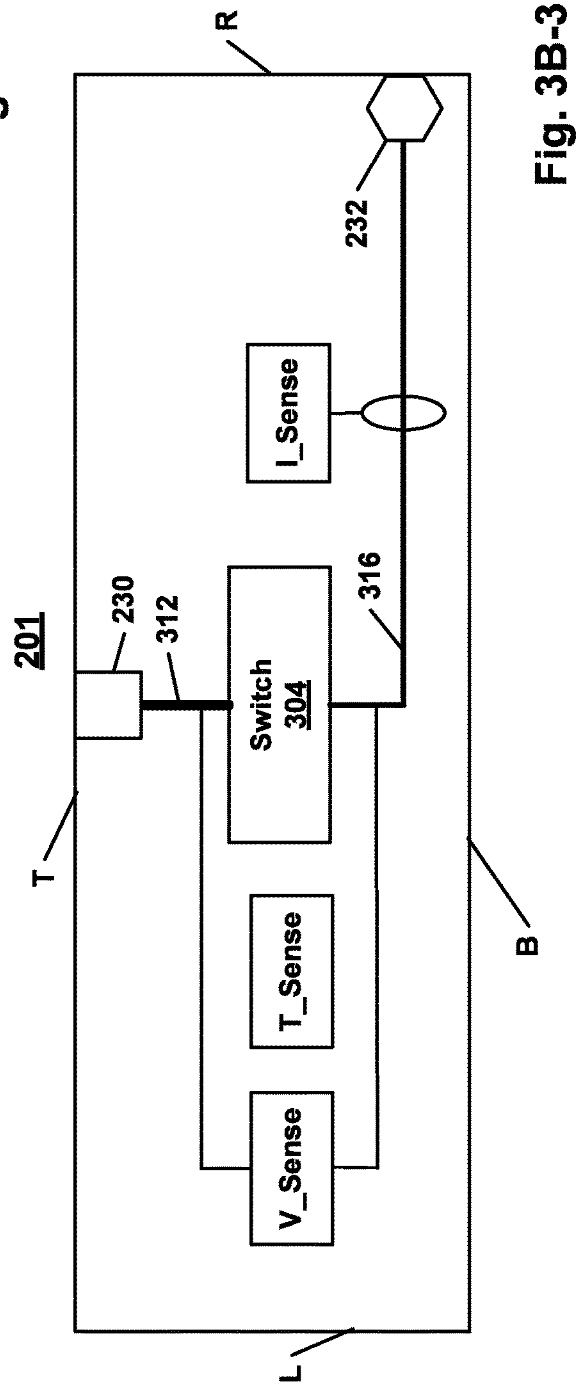

FIGS. 3B-1, 3B-2 and 3B-3 show relevant components of another packaged switch 201, which is like packaged switch 200, but with die clip terminal 232 positioned to indicate that it is flush with the right-side surface. Die clip terminal 232 in FIG. 3B-2 is drawn without a center dot to indicate that current enters or exits from the right side of packaged switch 201. It is noted again that die substrate terminals or die clip terminals may include a flat surface that is recessed below the case surface of a packaged or packaged half bridge, or the die substrate terminals or die clip terminals may include a flat surface that protrudes above the case surface of a packaged or packaged half bridge in other embodiments.

Example Switch Controller 302

FIG. 3A-4 is a schematic diagram that shows components of an example switch controller 302, which can be employed in most switch modules of this disclosure. Switch controller 302 includes gate driver 306, resistors R1 and R2, and diodes 308 and 310. Switch controller components can be electrically connected to traces on a rigid PCB. For example, PCB traces can be part of electrical paths that provide the voltage difference (e.g., Vdrain−Vsource, or Vcollector−Vemitter) across the current terminals of switch 304 to gate driver 306. This voltage difference can be used by gate driver 306 to monitor switch 304 for fault conditions. A switch controller may contain fewer or more components than that shown in FIG. 3A-4.

FIG. 3A-4 shows switch 304, but not the die substrate and die clip between which switch 304 is sandwiched. Diode 308 is electrically connected between the die substrate and gate driver 306, gate driver 306 is electrically connected to the die clip, and Vg, the output of gate driver 306, is electrically connected to the gate(s) of switch 304 through resistors R1 and R2.

Gate drivers of prior inverters and rectifiers, such as gate drivers H101-H103 and L101-L103 of FIGS. 1A and 1C, are mounted on a control PCB and remotely located from the power transistors (e.g., IGBTs THx) they control. Long signal paths carry gate control signals Vg from the gate drivers on the control PCB to respective power transistors. These long signal paths have large parasitic parameters (e.g., resistance, inductance and/or capacitance), which in turn can increase switching loss, power consumption, signal delay, and/or reduce switching speed. Also, signals transmitted on long signal paths are more susceptible to noise. In contrast, switch controller 302 (FIG. 3A-4), which contains gate driver 306, is contained inside a packaged switch (or packaged half bridge) and positioned near switch 304. Signal path SPO, which may be 10 mm or less, connects a control signal output of gate driver 306 to the gate(s) of switch 304. For example signal path SPO can be 9, 7, 5, 3 mm or less. A shorter signal path reduces parasitic resistance, parasitic inductance, parasitic capacitance, signal delay, signal degradation due to noise, and/or other problems associated with gate drivers mounted on the control PCBs mentioned above. Due to the proximity of gate driver 306 to switch 304, the rise and fall time of Vg at the gate may be shorter. Gate driver 306 may consume less power while driving a gate of switch 304, and gate driver 306 can more quickly drive the gate. Because gate driver 306 is closer to switch 304, the speed at which switch 304 can be switched may be faster when compared to the speed of a switch that is driven by a gate driver that is remotely located on a control PCB.

Example Switches 304

In general, a switch includes one, two or more power transistors such as an IGBT, MOSFET, JFET, BJT, etc. A switch may include additional components such as diodes. The transistors and/or additional components in switch 304 can be made from any one of many different types of semiconductor materials such as Si, SiC, GaN, GaO, cubic boron arsenide, etc. The power transistors in a switch 304 can be different types. For example, a switch 304 may include one or more SiC MOSFETS, and one or more GaN MOSFETS, all connected in parallel, or a switch 304 may include one or more MOSFETs, and one or more IGBTs, all connected in parallel.

FIGS. 3A-5 and 3A-6 are schematic diagrams of example switches 304, which can be employed in switch modules of this disclosure. In FIG. 3A-5, switch 304 includes a power IGBT connected in parallel with power diode D. The collector c and diode cathode are attached to a die substrate (e.g., die substrate 312) using any one of many different attachment technologies (e.g., sintering, soldering, transient liquid phase bonding, conductive adhesion process, etc.), and the emitter e and diode anode are attached to a die clip (e.g., die clip 316) using any one of the many different attachment technologies. An IGBT may have one emitter, but several substantially flat emitter terminals or pads. Each of the emitter terminals or pads can be attached to a corresponding flat surface of a die clip. An IGBT may have one collector, but several substantially flat collector terminals or pads. Each of the collector terminals or pads can be attached to a corresponding flat surface of a die substrate.

In FIG. 3A-6, switch 304 includes power MOSFETS (e.g., SiC MOSFETS, GaN MOSFETS or MOSFETS made from other materials such as GaO) N1 and N2 that are coupled in parallel. The drains d of MOSFETs N1 and N2 are attached (e.g., sintered, soldered, transient liquid phase bonded, conductive adhesion process, etc.) to a die substrate (e.g., die substrate 312), and the sources s are attached (e.g., sintered, soldered, transient liquid phase bonded, etc.) to a die clip (e.g., die clip 316). A MOSFET may have one source, but several substantially flat source terminals or pads, each of which can be attached to a corresponding flat surface of a die clip. A MOSFET may have one drain, but several substantially flat drain terminals or pads. Each of the drain terminals can be attached to a corresponding flat surface of a die substrate. Each gate g of switch 304 is controlled by a high-current, gate control signal Vg from gate driver 306.

Referencing FIGS. 3A-4-3A-6, gate driver 306 controls one or more transistors of switch 304 based on a PWM signal it receives from a microcontroller in one embodiment. Gate driver 306 activates the one or more transistors through gate voltage Vg when the PWM is asserted. In another embodiment, gate driver 306 may take form in a multi-transistor gate driver that is capable of independently controlling separate transistors in switch 304 based on a PWM signal. For example, in response to receiving a PWM signal, the multi-transistor gate driver can generate intentionally staggered gate control voltages V1*g* and V2*g* (not shown) that control respective gates of transistors N1 and N2 of switch 304 in FIG. 3A-6. In this example, the rising edge of V1*g* can lead the rising edge of V2*g*, and/or the falling edge of V1*g* can lead the falling edge of V2*g*, or; the rising edge of V1*g* can lead the rising edge of V2*g*, and/or the falling edge of V2*g* can lead the falling edge of V1*g*. V2*g* may be an intentionally delayed version of V1*g*, or vice-versa. The delayed signal can be created by a device such as a buffer or a set of series connected buffers, which has V1*g* as an input and V2*g* as an output, or vice-versa.

Example Leads and Traces

Example PCB traces are symbolically shown in figures of this disclosure. Example PCB traces electrically connect to components of a switch module. For instance, in FIG. 3A-4, a PCB trace connects gate driver 306 and resistor R1. Traces can also be used in electrical connections between components (e.g., gate driver 306) of a switch module and components (e.g., a microcontroller) external to the packaged switch or packaged half bridge. Some components of a switch module may be connected through a series combination of leads, wires, traces, metal ribbons or other conductors. For example, a trace of a flexible flat cable (i.e., a flexible PCB), a bond wire, or a bent lead may be used in an electrical connection resistor R2 and a gate g of switch 304. Several PCB traces are not shown in FIG. 3A-1 for ease of illustration.

One or more individual switch module components (e.g., one or more of gate driver 306, I_Sense, T_Sense, V_Sense, etc.) may take form in packaged devices. Packaged devices may have their own leads that are connected (e.g., soldered) to traces of a switch module PCB. For example, gate driver 306 (FIG. 3A-4) may take form in a packaged semiconductor die. The packaged gate driver can have leads that are soldered to traces of a switch module PCB. I_Sense, V_Sense or T_Sense may also take form in packaged semiconductor dies. These packaged devices may also have leads that are connected to traces of a switch module PCB. Resistors R1 and R2, and diodes 308 and 310 can be packaged devices with leads connected to traces of a switch module PCB. Alternatively, one or more individual switch module components (e.g., one or more of gate driver 306, I_Sense, T_Sense, V_Sense, etc.) may take form in bare semiconductor dies (i.e., no package) with pads that can be wire bonded to traces of a switch module PCB. In this disclosure, some switch modules components (e.g., gate driver 306, I_Sense, T_Sense, and/or V_Sense) are presumed to take form in bare die that are mounted on a switch module PCB, and have pads that are wire bonded to traces of the switch module PCB, it being understood the present disclosure should not be limited thereto.

Example Die Substrate and Die Clip Terminals

Power stacks are created by electrically and thermally connecting switches between die clips and die substrates. A first current terminal (e.g., collector, drain, etc.) of each transistor in a switch can be sintered to a die substrate using a layer of highly conductive sintering material such as silver, copper, or other material. No dielectric exists between a switch and a die substrate terminal of the connected die substrate. A second current terminal (e.g., emitter, source, etc.) of each transistor in a switch can be sintered to a die clip through a layer of highly conductive sintering material such as silver, copper or other material. No dielectric exists between a switch and a die clip terminal of the connected die clip. Accordingly, no dielectric exists between a die substrate terminal and a die clip terminal in a power stack.

Die substrate terminals are configured for direct or indirect electrical and/or thermal connection to devices. A die substrate terminal can be electrically and/or thermally connected to a surface of a heat sink, a bus bar, or a bus bar that also acts as a heat sink. For example, a die substrate terminal can be electrically and/or thermally connected to a "V+ bus bar," which in turn is electrically connected to a V+ terminal of an inverter system or rectifier system, which in turn can be electrically connected to a battery, fuel cell, DC/DC converter, etc. A die substrate terminal can be electrically and/or thermally connected to a "V− bus bar," which in turn is electrically connected to a V− terminal of an inverter system or rectifier system, which in turn can be electrically connected to a battery, fuel cell, DC/DC converter, etc. A die substrate terminal can be electrically and/or thermally connected to an AC bus bar, which is also called a "phase bus bar," that in turn is electrically connected to an AC terminal of an inverter system or rectifier system, which in turn can be connected to a terminal of a stator winding W of a motor, an inductor L of a filter, or other device. In general, a bus bar is a metal element that distributes high current (e.g., 400 A or more). The material composition (e.g., copper, aluminum, etc.) and cross-sectional size of a bus bar, or elements thereof, determines the maximum amount of current that can be safely carried, and the parasitic parameters thereof. Bus bars with wider cross-sectional areas can have lower parasitic parameters. A bus bar can take one of many different configurations depending on the design of the inverter or rectifier system in which it is used. A bus bar may be assembled from several components.

A heat sink may have one or more channels, each of which can receive a heat-pipe as will be more fully described below. A bus bar may also act as a heat sink, which may have one or more channels, each of which can receive a heat-pipe as will be more fully described below. A typical heat-pipe consists of a sealed tube made of a metal such as copper or aluminum. One or more layers of thermally conductive dielectric can be formed on a heat-pipe's inner and/or outer surfaces. The dielectric on the outer surfaces electrically insulates the metal heat-pipes from heat sinks or bus bars in which they are received. In another embodiment no dielectric exists between metal heat-pipes and the heat sink or bus bar in which they are received. In this alternative embodiment, outer surfaces of the metal heat-pipes are both electrically and thermally connected to the heatsinks or bus bars in which they are received. Heat-pipes can be formed from other thermally conductive materials.

In general, heat sinks or bus bars can be made (e.g., extruded, 3D printed, etc.) in whole or in parts from a conductive metal like copper or aluminum, and can have different shapes, sizes, and dimensions (e.g., length, width, height, etc.) to accommodate differences in inverter or rectifier design. Bus bars or heat sinks can be formed by attaching (e.g., soldering, sintering, etc.) two extruded metal halves together after heat-pipes, with or without an outer dielectric layer, are placed therebetween. Before attachment, a thin layer of thermal paste (also called thermal compound, thermal grease, thermal interface material (TIM), thermal gel, heat paste, heat sink compound, heat sink paste or CPU grease) can be applied to a heat-pipe, to eliminate air gaps or spaces from the interface between the heat-pipe and the resulting heat sink or bus bar. A heat sink or bus bar can be formed by casting aluminum, copper, or other material around heat-pipes. Casting is a process in which a liquid metal is delivered into a mold that contains a negative impression (i.e., a three-dimensional negative image) of the intended shape. Heat-pipes with or without an outer dielectric surface, can be received in the mold before liquid metal is delivered. In still another embodiment, the heat sink or bus bar in which the heat-pipe with dielectric layer is received, is heated so that metal of the heat sink or bus bar reflows to eliminate air gaps or spaces in the interface between the heat-pipe dielectric layer and heat sink or bus. In other embodiments, a thin layer of metal can be formed on the dielectric layer on metal heat-pipes to facilitate better thermal connection to the bus bar or heat sink.

A heat sink or bus bar that also acts as a heat sink may include flat surfaces that can be press-fitted, soldered, sintered, or connected in another manner to die substrate terminals or die clip terminals to secure an electrical and thermal connection between them. A press-fit connection can reduce or eliminate problems related to differences in CTE described above.

Referencing FIGS. 2A-1 and 2C-1, example die substrate terminals 230 have rectangular-shaped flat surfaces that are exposed through the tops of cases in packaged switches 200 and 211. Packaged half bridge 250 of FIGS. 2B-1-2B-3 has similar die substrate terminals 230H and 230L. The dimensions (e.g., width and length) of the exposed terminal 230 are configured to transmit substantial current and heat. In one embodiment, die substrate terminal 230 is parallel to, but oppositely facing (i.e., 180 degrees) at least one flat surface of die substrate 312 (not shown) to which a first current terminal (e.g., collector, drain, etc.) is sintered. A die substrate may have small side-terminals (e.g., side-terminals 240 shown in FIGS. 2B-1) that extend through a left or right-side surface of a packaged switch or packaged half bridge. Current can enter or exit the packaged switch or packaged half bridge through these die substrate side-terminals. A metal strap can electrically connect the side-terminals of a die substrate in one packaged switch to a die clip terminal in another packaged switch. A metal side strap can electrically connect die clip terminals in a packaged half bridge, or a metal strap can electrically connect the side-terminals of a die substrate of one switch module in a packaged half bridge to a die clip terminal in another switch module of the packaged half bridge. FIG. 2B-3 illustrates example metal strap 242 that electrically connects side-terminals 240L to die clip terminal 232H in packaged switch 250. Metal straps should be configured to transmit substantial current (e.g., 400 A or higher) between components such as terminals 240L and 232H in FIG. 2B-3.

In addition to being connected to die substrates, switches 304 are electrically and thermally connected to die clips, which have one or more die clip terminals. Die clip terminals can be configured for direct or indirect electrical and/or thermal connection to a device external to the packaged switch or packaged half bridge. A die clip terminal can be electrically and/or thermally connected to a surface of heat sink, a bus bar or a bus bar that also acts as a heat sink. A die clip terminal (e.g., die clip terminal 232 of packaged switch 200) can be electrically and/or thermally connected to a V− bus bar. A die clip terminal (e.g., die clip terminal 344 of packaged switch 211 of FIG. 2C-2) can be electrically and/or thermally connected to a bus bar that also acts as a heat sink. A die clip terminal can be electrically and/or thermally connected to a phase bus bar. A die clip terminal can be electrically connected to a metal strap like metal strap 242 shown in FIG. 2B-3.

Referencing FIGS. 2A-1 and 2C-1, each of the example die clip terminals 232 has a rectangular-shaped, substantially flat surface area that is exposed through the case of its packaged switch. A die clip terminal 232 can be electrically connected to a metal strap, which in turn can be connected to a side-terminal of a die substrate. Packaged half bridge 250 of FIGS. 2B-1 and 2B-2 have similar die clip terminals 232H and 232L. The dimensions (e.g., width and length) of the exposed terminal 232 is configured to transmit substantial current. The die clips of example packaged switch 211 and packaged switch **247*d* of FIGS. 2C-2 and 2E-2, respectively, have additional, flat surfaced terminals 344** through which heat can be transmitted.

Example Gate Driver 306 and Other Switch Module Components

A gate driver of a switch module can receive signals from a microcontroller or similar processor-based device(s). For example, gate driver 306 of FIG. 3A-4 can receive a low-power PWM driver control signal like one of the PWM signals described with reference to FIG. 1A. In addition, gate driver 306 may receive a low power Reset signal from the microcontroller or other device. Gate driver 306 can activate switch 304 in response to the assertion of the pulse width modulation (PWM) signal it receives by asserting high-current, gate control signal Vg, after it receives an asserted Reset signal. Ideally the length of signal path SPO between the output of gate driver 306 and the gate(s) of switch 304 should be reduced as much as possible to mitigate adverse effects on gate control signal Vg from parasitic inductance, parasitic capacitance, noise, etc.

A gate driver can also transmit signals to a microcontroller or similar processor-based device. For example, gate driver 306 can disable switch 304 (i.e., maintain the switch in a deactivated state) and assert the Fault signal when a fault, such as excessive current conduction through or unusually low voltage across switch 304 when it should be deactivated, is detected. A microcontroller or similar processor device can receive and process the Fault signal. Other switch module components such as the I_Sense circuit and the T_Sense circuit can transmit signals representative of current flow through switch 304 and temperature at a position near switch 304 (e.g., 1-10 mm or less), respectively. The signal output of T_Sense may be a more accurate representation of the temperature if T_Sense is closer to the switch. A voltage sense circuit V-Sense, if added, can likewise transmit a signal representative of the voltage across the current terminals of switch 304. The microcontroller or similar processor-based device can receive and process the signals provided by these components. For example, the microcontroller can compare a signal representative of temperature to a first threshold value and alter the frequency or duty cycle of the PWM control signal provided to gate driver 306 if the threshold value is exceeded, or the microcontroller may continuously de-assert the PWM control signal provided to gate driver 306 if the threshold value is exceeded, which in turn continuously deactivates switch 304.

FIG. 3A-7 illustrates an example gate driver 306, which includes low-voltage, input stage 320 in data communication with high-voltage, output stage 322 through galvanic isolation circuit 324. Galvanic isolation is used where two or more circuits must communicate, but their grounds are at different potentials. Galvanic isolation circuits may employ a transformer, capacitor, optical coupler, or other device to achieve isolation between circuits. For purposes of explanation only, galvanic isolation circuit 324 employs a transformer device to implement galvanic isolation. The low-voltage, input stage 320 is coupled to receive a first supply voltage VDDI and a first ground GI via respective PCB traces and includes a logic circuit 330 that receives the PWM and Reset signals via respective PCB traces. The high-voltage, output stage 322 is coupled to receive a second supply voltage VDDO+, a third supply voltage VDDO− and second ground GO via respective PCB traces and includes a logic circuit 332 that receives a control signal from logic circuit 330 via galvanic isolation circuit 324. High-voltage output stage 322 also includes a buffer 340 that is controlled by an output signal from logic circuit 332. Buffer 340 asserts Vg when the control signal output of isolation circuit 324 is asserted. Other types of gate drivers 306 are contemplated.

I_Sense generates a voltage signal Vi with a magnitude that is proportional to current flow such as current flow through a switch 304. I_Sense may include an inductive current sensor that measures a magnetic field created by the current flow through switch 304, in general, and through a die clip in particular. The inductive current sensor is galvanically isolated from switch 304. Example die clip 316 includes horizontal and vertical portions. I_Sense circuit can measure current flow through a narrowed portion (not shown) of the horizontal portion of die clip 316. I_Sense conditions the signal output of the inductive current sensor for subsequent use by a microcontroller. T_Sense may include a thermistor that can generate a voltage signal Vt with a magnitude that is proportional to the temperature at location near switch 304. A thermistor is a type of resistor whose resistance is dependent on temperature; the relationship between resistance and temperature is linear. T_Sense conditions the signal output of the thermistor for use by a microcontroller. The thermistor is galvanically isolated from switch 304. V_Sense can generate a voltage signal Vv that is proportional to the voltage between current terminals of a switch.

Analog signals Vi, Vv and Vt from the I_Sense, V_Sense and T_Sense circuits, respectively, can be transmitted to a microcontroller for subsequent conversion into digital equivalents. Connector-leads at the front of a packaged switch or packaged half bridge can be used to transmit signals, including Vi, Vv, Vt and Fault signals, between respective switch module components on the switch module PCB, and the microcontroller mounted on a control PCB. The connector-leads can also be used to transmit other signals (e.g., PWM and Reset) and voltages (e.g., VDDI, VDDO+, GI, etc.) between a control PCB and a packaged switch or packaged half bridge.

A microcontroller on a control PCB board can process the digital equivalents of signals (e.g., Fault, Vi, Vv, and Vt) it receives in accordance with instructions stored in memory. The microcontroller can adjust the duty cycle and/or period of driver control signals PWM based on the digital equivalents of Vi, Vv, Vt and/or other signals.

Packaged Switch 200D

A packaged switch may include a diode in addition to a switch. FIGS. 3A-8 and 3A-9 are quasi-schematic diagrams of an example packaged switch 200D, which includes a diode that can be electrically connected in series with switch 304. The diode can be electrically connected in series with the switch via an external metal strap (not shown).

Packaged switch 200D is shown in FIGS. 3A-8 and 3A-9 with a transparent case to enable a better understanding of switch module components, their interaction, and their relative position. The dimensions of packaged switch 200D may be substantially similar to packaged half bridge 250 shown in FIGS. 2B-1-2B-3.

Packaged switch 200D includes a switch module 300D, which includes components of switch module 300 shown in FIG. 3A-1 and a diode stack that has one or more diodes 269 attached (e.g., sintered) between a die clip 316L and a die substrate 312L.

FIGS. 3A-8 and 3A-9 show relative positions of switch module components when packaged switch 200D is viewed from a side and back, respectively. Switch module 300D includes connector-leads (only connector-lead 204 is shown in FIG. 3A-8) for transmitting signals and voltages between switch module components and external components such as a microcontroller and a PMIC. Switch module 300D includes a switch controller 302 that controls switch 304 based on a low-power, PWM signal and/or other signals received from a microcontroller or similar processor-based device. Switch 304 is electrically and thermally connected to and positioned between die substrate 312H and die clip 316H, all of which are symbolized.

As shown in FIG. 3A-9, switch module 300D includes a temperature sensor circuit T_Sense for sensing temperature near switch 304, a current sensor circuit I_Sense for sensing current transmitted by switch 304, and a voltage sensor circuit V_Sense for sensing the voltage across a switch 304. The switch modules may contain fewer or more components.

FIGS. 3A-8 and 3A-9 show relative positioning of switch module components with respect to each other. Switch controller 302 is positioned near the front F and top of packaged switch 200D as seen in FIG. 3A-8. The power stack consisting of the switch 304, die substrate 312H and die clip 316H is positioned near the top T and back Bk of packaged switch 200D. Die substrate 312H, switch 304, and die clip 316H are vertically stacked between the top T and bottom B as seen in FIGS. 3A-8 and 3A-9. The diode stack consisting of diode 269, die clip 316L and die substrate 312L is positioned near the bottom B and back Bk of packaged switch 200D. Die substrate 312L, diode 269, and die clip 316L are vertically stacked between the top T and bottom B as seen in FIGS. 3A-8 and 3A-9. The power stack and the diode stack can be mounted on oppositely facing surfaces of a rigid PCB (not shown). The power stack, diode stack and rigid PCB can be vertically stacked between the top T and bottom B.

Die substrate terminals 230H and 230L are positioned in FIGS. 3A-8 and 3A-9 to indicate that they are flush with the top and bottom surfaces of packaged switch 200D. Die clip terminals 232H and 232L are positioned in FIGS. 3A-8 and 3A-9 to indicate that they are flush with the left side surface of packaged switch 200D.

FIGS. 3A-8 and 3A-9 show diode 269 electrically isolated from switch 304. Although not shown, a metal strap for electrically connecting die clip terminals 232L and 232H can be added before or after formation of packaged switch module 200D's case.

FIGS. 3A-8 and 3A-9 show the anode of diode 269 attached to die clip 316L and the cathode attached to die substrate 312L. In an alternative embodiment of packaged switch 200D, the cathode of diode 269 can be attached to die clip 316L, and the anode can be attached to die substrate 312L.

Packaged Switch 203

Figures 1, 3C:
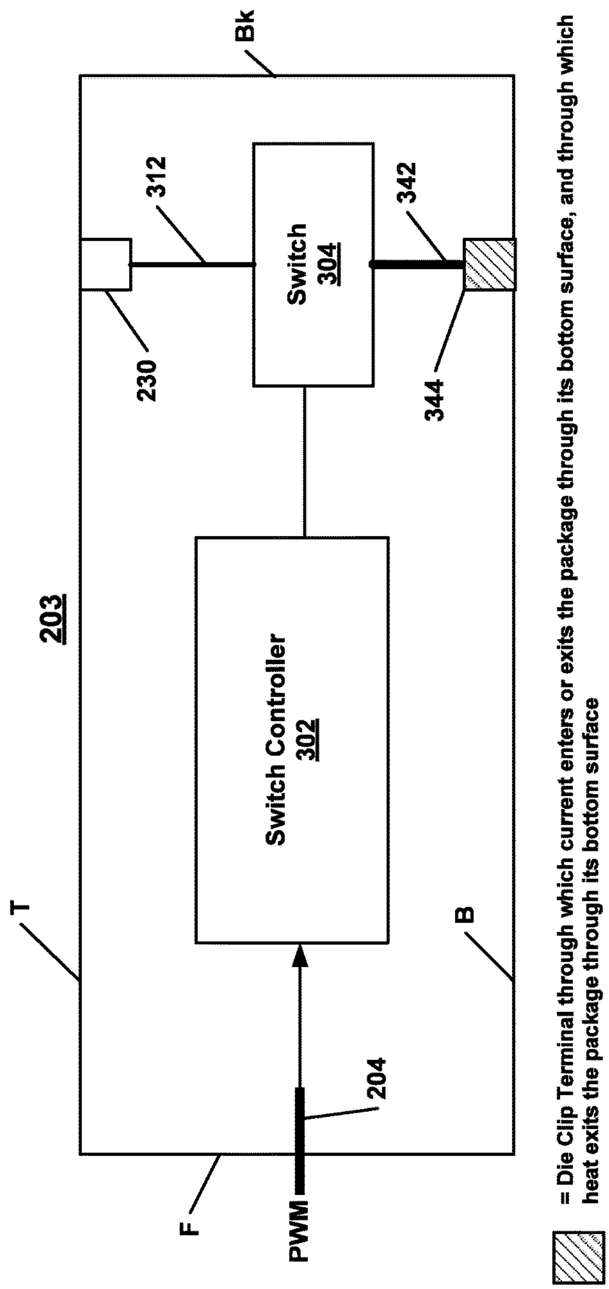
Figures 2, 3C:
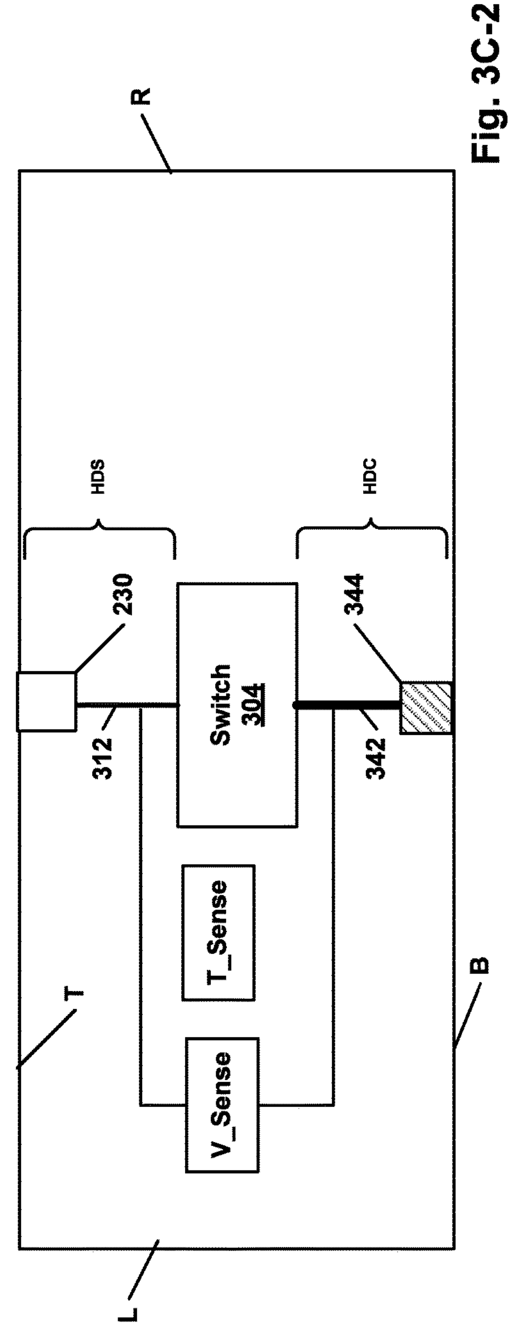

Packaged switches 200 and 201 enable single-side cooling of switches 304. FIGS. 3C-1 and 3C-2 are quasi-schematic diagrams that show relevant components of another packaged switch 203, which enables double-side cooling of switch 304. Packaged switch 203 is similar in many ways to packaged switch 200 and contains many components thereof. Packaged switch 203 includes a switch module, which in turn includes a rigid PCB upon which components can be mounted. The PCB may be C-shaped to enable double-side cooling of switch 304. An example C-shaped PCB is disclosed later in this document. Packaged switch 203 is shown with a transparent case to enable a better understanding of components, their interaction, and their relative placement in the switch module.

FIGS. 3C-1 and 3C-2 show relative positions of components of packaged switch 203 when seen from the side and back, respectively. Packaged switch 203 includes a switch 304 that is controlled by switch controller 302. Switch 304 is connected (e.g., sintered) to and placed between die substrate 312 and die clip 342, which includes die clip terminal 344. In other words, the first and second current terminals of switch 304 are attached to die substrate 312 and die clip 342, respectively.

Die substrate 312 and die clip 342, including die clip terminal 344, are shown symbolically. Both die substrate 312 and die clip 342 are represented by thick lines to indicate they are configured to transmit substantial current and substantial heat. Die substrate 312 and die clip 342 can be similar, with substantially similar terminals 230 and 344, respectively. Die clip 342 may need pedestals (more fully described below) for engaging emitter or drain terminals, or pads thereof, of switch 304. The height HDC of die clip 342 may be greater than the height HDS of die substrate 312 so that die clip terminal 344 is substantially flush with the bottom surface of packaged switch 203. The shape and form of die clip 342 and its terminal 344 is substantially different from die clip 316 and its terminal 232 (FIGS. 3B-2 and 3B-3).

FIGS. 3C-1 and 3C-2 illustrate relative positioning of certain components with respect to each other. Die substrate 312, switch 304, and die clip 342 are vertically stacked as shown between the top T and bottom B of packaged switch 203. Switch controller 302 is positioned near the front F of packaged switch 203, while switch 304 is positioned near the back Bk. Die substrate terminal 230 is positioned in the figures to indicate that it is flush with the top surface of packaged switch 203, and die clip terminal 344 is likewise positioned to indicate that it is flush with the bottom surface.

Packaged Switch 205

Figures 1, 3D:
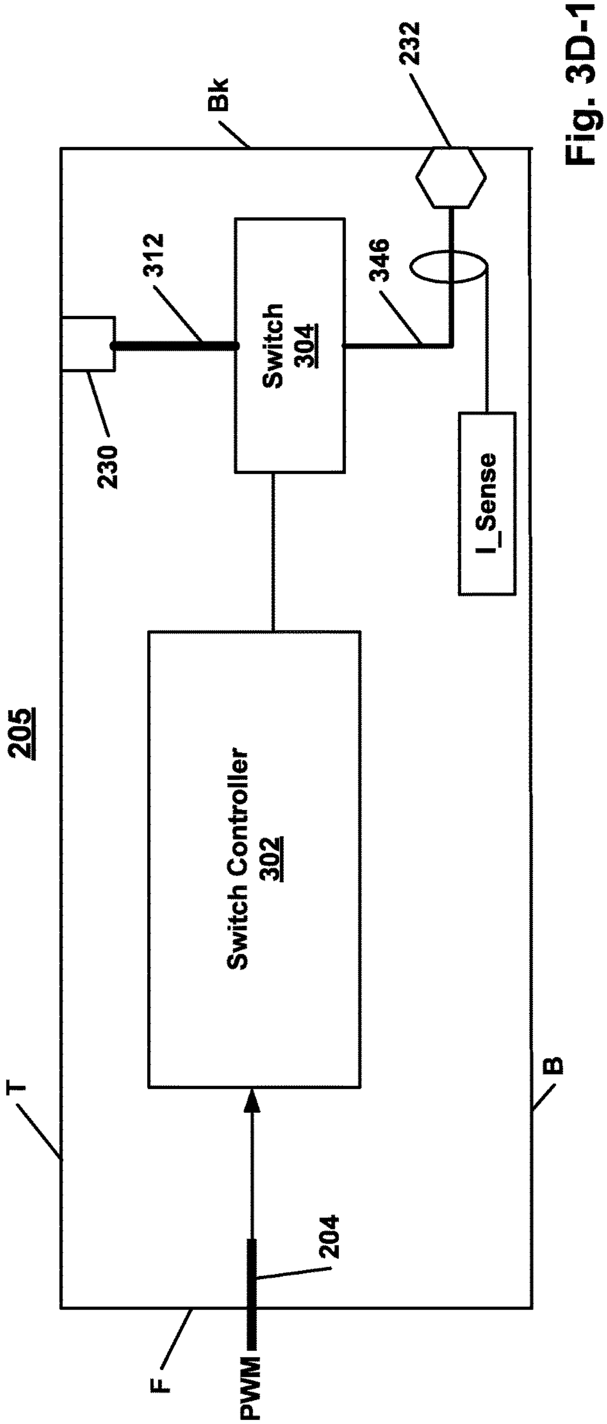
Figures 2, 3D:
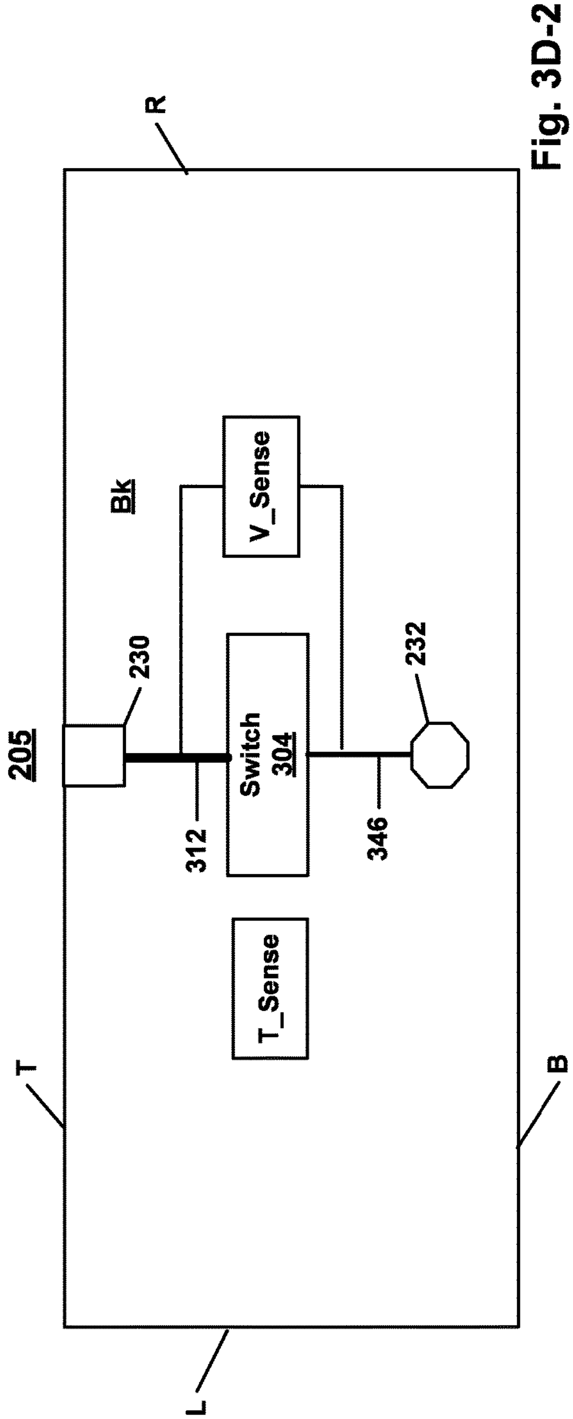

FIGS. 3D-1 and 3D-2 are quasi-schematic diagrams that show relevant components of example packaged switch 205. Packaged switch 205, which is shown with a transparent case, is like packaged switch 200 and contains many components thereof. Packaged switch 205 may include a switch module, which in turn includes a rigid PCB upon which components can be mounted.

FIGS. 3D-1 and 3D-2 show relative positions of certain components of packaged switch 205 as seen from the side and back, respectively. Like packaged switch 200, packaged switch 205 includes a switch 304 that is controlled by switch controller 302. Switch 304 is connected (e.g., sintered) to and between die substrate 312 and die clip 346, which includes a die clip terminal 232. More particularly, the first and second current terminals of switch 304 are connected to die substrate 312 and die clip 346, respectively. Die substrate 312, die clip 346 and their terminals are shown symbolically.

FIGS. 3D-1 and 3D-2 illustrate relative positioning of certain components with respect to each other. Die substrate 312, switch 304, and die clip 346 are vertically stacked as shown between the top T and bottom B of packaged switch 205. Switch controller 302 is positioned near the front F of packaged switch 205, while switch 304 is positioned near the back Bk. Die substrate terminal 230 is positioned to indicate that it is flush with the top surface of packaged switch 205, and die clip terminal 232 is positioned in FIG. 3D-1 to indicate that it is flush with the back surface. In another embodiment, die clip terminal 232 is replaced with a lead that extends laterally from the back surface Bk. Either way die clip 346 is represented by a thinner line to indicate that it is primarily configured to transmit current and not heat.

Packaged Switch 211

Figures 1, 3E:
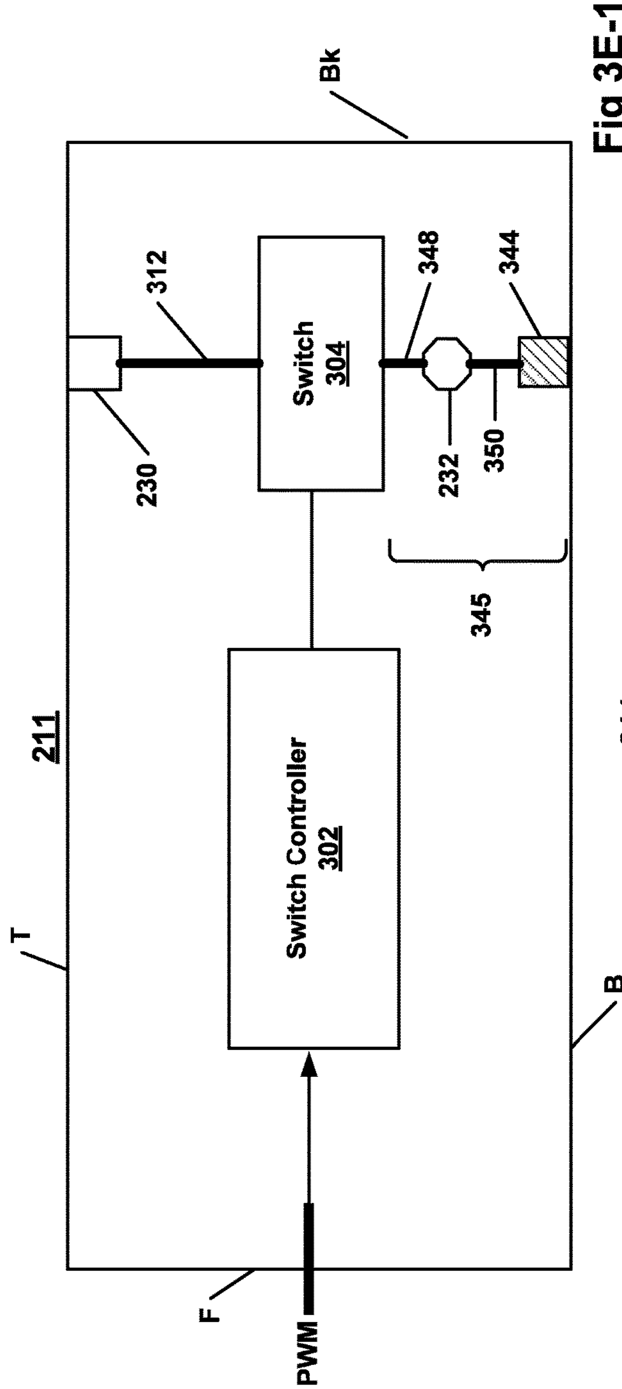
Figures 2, 3E:
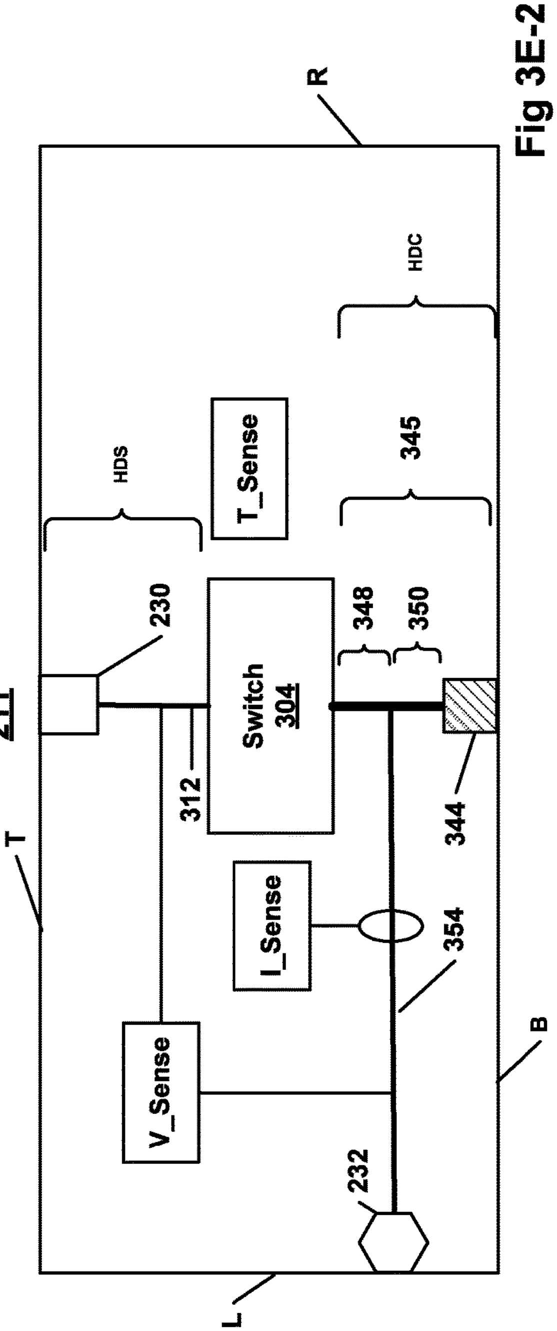

Referencing FIGS. 2C-1 and 2C-2, FIGS. 3E-1 and 3E-2 are quasi-schematic diagrams that show several components of example packaged switch 211. FIGS. 3E-1 and 3E-2 show relative positions of switch components when packaged switch 211, which is shown with transparent case, is viewed from the side and back, respectively. Like packaged switch 203, packaged switch 211 enables double-side cooling of switch 304. Packaged switch 211 may include a switch module, which in turn includes a rigid PCB upon which components can be mounted.

FIGS. 3E-1 and 3E-2 show relative positions of certain components of packaged switch 211 as seen from the side and back, respectively. Like packaged switch 200, packaged switch 211 includes a switch 304 that is controlled by switch controller 302. Switch 304 is connected (e.g., sintered) between die substrate 312 and die clip 345, which includes two die clip terminals 232 and 344. The first and second current terminals of switch 304 are sintered to die substrate 312 and die clip 345, respectively.

Die clip 345 and its terminals 232 and 344, are shown symbolically. Die clip 345 includes first and second portions 348 and 350, and a third portion 354 that extends perpendicularly to the first and second portions as shown. The third portion 354 is drawn thinner to indicate it is configured primarily to transmit current, while first and second portions 348 and 350 are drawn thicker to indicate they are both configured to transmit substantial current and heat. However, second portion 350 will conduct only heat if it is connected to an electrically isolated device like an electrically isolated heat sink. FIG. 3E-2 shows a current sensor circuit I_Sense for sensing current transmitted through third portion 354.

FIGS. 3E-1 and 3E-2 illustrate relative positioning of certain components with respect to each other. Die substrate 312, switch 304, and die clip 345 are vertically stacked as shown between the top T and bottom B of packaged switch 211. Switch controller 302 is positioned near the front F of packaged switch 211. Switch 304 is positioned near the back Bk. Die substrate terminal 230 is positioned to indicate that it is flush with the top surface of packaged switch 211. Die clip terminal 232 is positioned in FIG. 3E-2 to indicate that it is flush with the left side surface, and die clip terminal 344 is positioned to indicate that it is flush with the bottom surface. The height HDC of die clip 345 may be greater than the height HDS of die substrate 312 so that die clip terminal 344 is substantially flush with the bottom surface of packaged switch 211. In another embodiment, die clip 345 is replaced with a die clip that has a terminal, which takes form in a lead that extends laterally from the back surface Bk.

Packaged Switch 209

Figures 1, 3F:
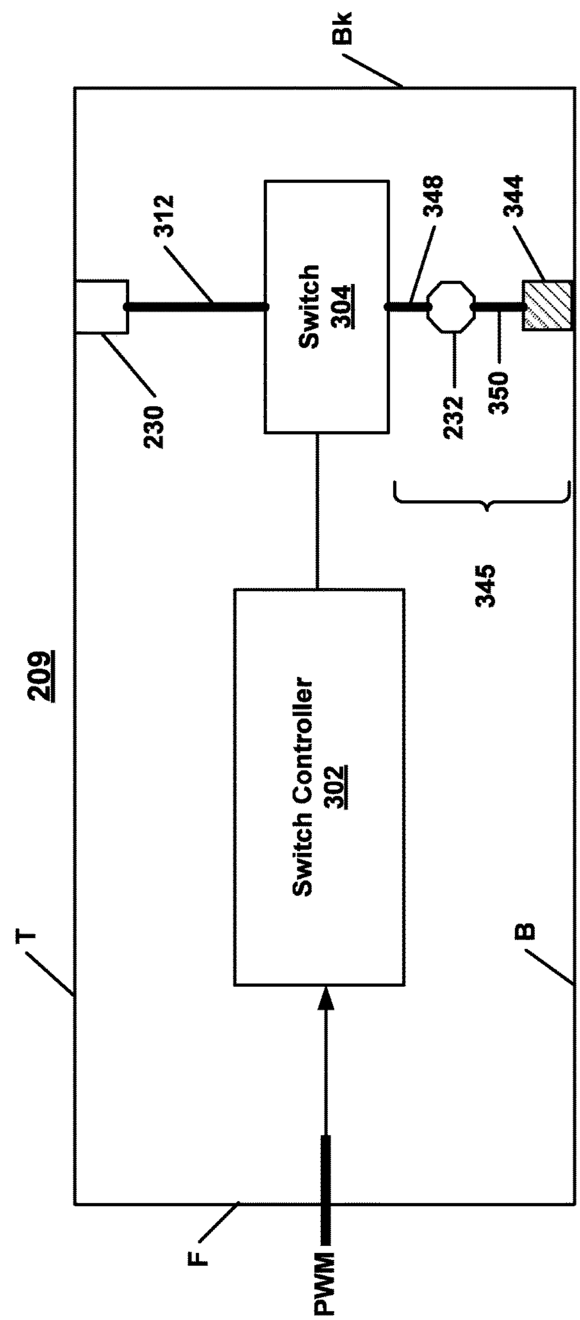
Figures 2, 3F:
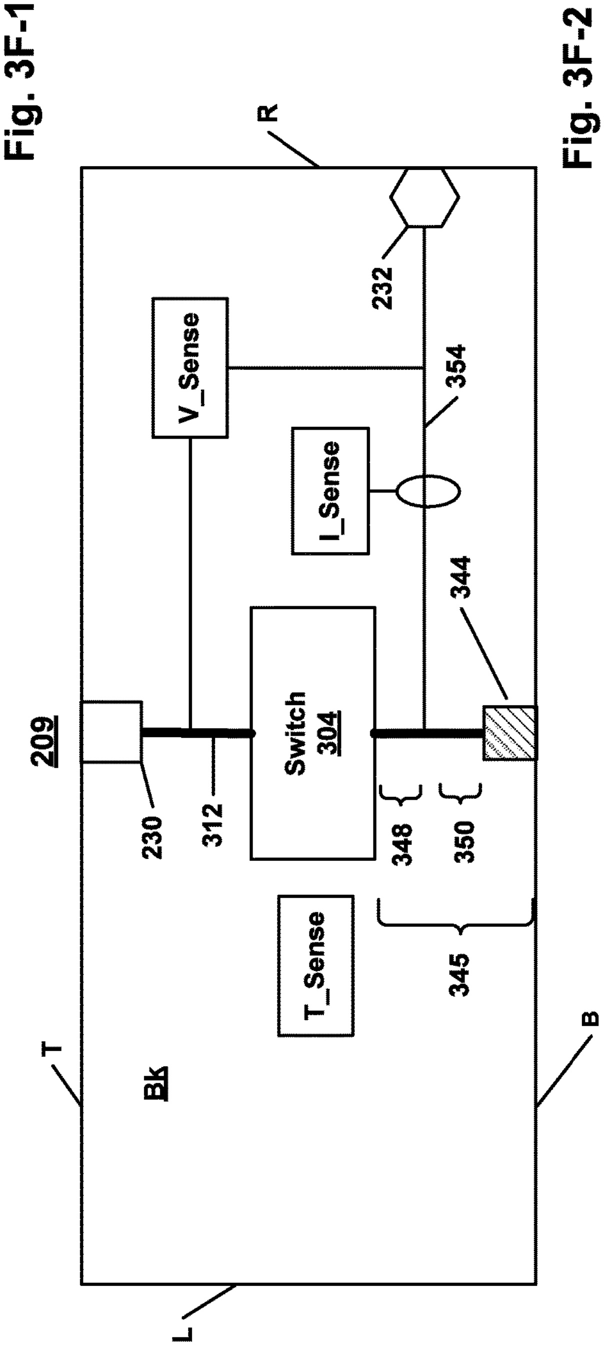

FIGS. 3F-1 and 3F-2 are quasi-schematic diagrams that show relevant components of another packaged switch 209. FIGS. 3F-1 and 3F-2 show relative positions of certain components of packaged switch 209, which is shown with a transparent case, as seen from the side and back, respectively. Packaged switches 211 and 209 are substantially alike. The positioning of die clip terminals is one significant difference between the two. Die clip terminal 232 in packaged switch 211 is positioned to indicate it is flush with the left side surface, while die clip terminal 232 in packaged switch 209 is flush with the right-side surface as shown in FIG. 3F-2.

Example Switch Modules

Switch module components (e.g., gate driver 306, resistor R1, diode 308, I_Sense circuit, T_Sense circuit, power stack, etc.) in packaged switches or in packaged half bridges, can be mounted on a rigid PCB, and electrically connected by traces thereon. Packaged switch modules 200 and 211 are examples in which switch modules are mounted on a rigid PCB. In other packaged switch modules, rigid PCBs are not employed. Packaged switch modules **247*s* and 247*d*** are examples that lack a rigid PCB. In some packaged half bridges, the components of high side and low side switch modules may be mounted on separate PCBs, or on opposite sides of the same PCB.

A power stack (i.e., a switch that is sandwiched between a die substrate and die clip) can be supported on a switch module PCB using mechanical structures such as metal posts, pedestals, etc. The mechanical structures can provide space between the power stack and the PCB. In addition to providing support, the mechanical structures can electrically connect die clips and/or die substrates to respective traces on the PCB. For example, one end of a mechanical support structure can be attached (e.g., soldered) to a die substrate or die clip, while the other end can be attached (e.g., soldered) to a trace or pad on the PCB.

After the power stack is connected to the PCB, the mechanical support structure can hold the power stacks in place as the power stack and PCB with mounted components are substantially encased in a liquid mold compound (e.g., liquid epoxy resin) using, for example, a transfer molding process. The liquid mold compound can flow into the space that separates the die clip from the die substrate. After it hardens, the mold compound provides further structural support to firmly hold the power stack and PCB together. The hardened mold compound, which is a dielectric, can also provide some thermal conductivity between the die substrate and the die clip. In some embodiments, some or all of the PCB with mounted switch module components, including the power stack, are not encased. However, for purposes of explanation, the remaining disclosure will presume that switch modules are substantially encased in plastic unless otherwise noted.

Switch Module 300

Figures 1, 3G:
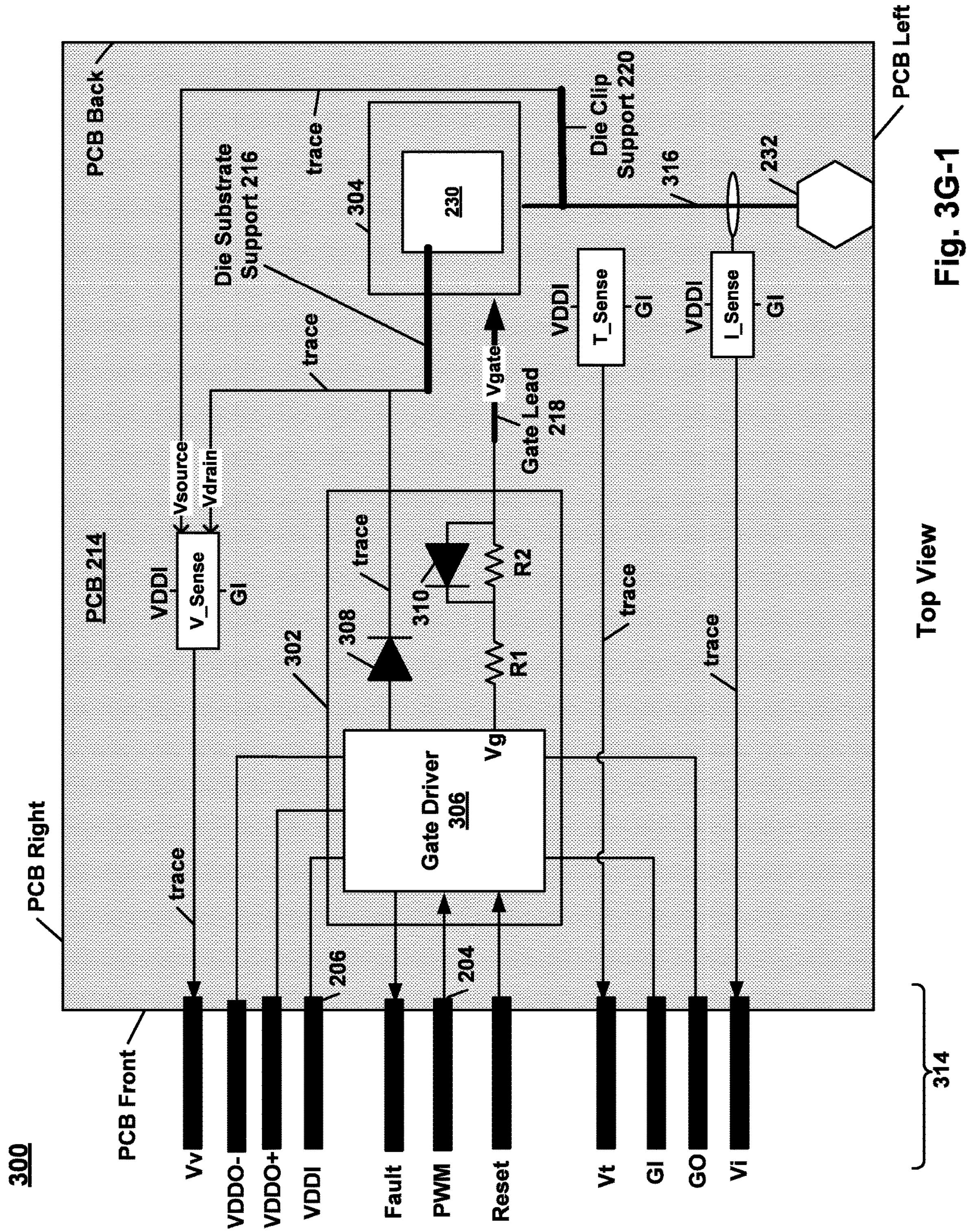
Figures 2, 3G:
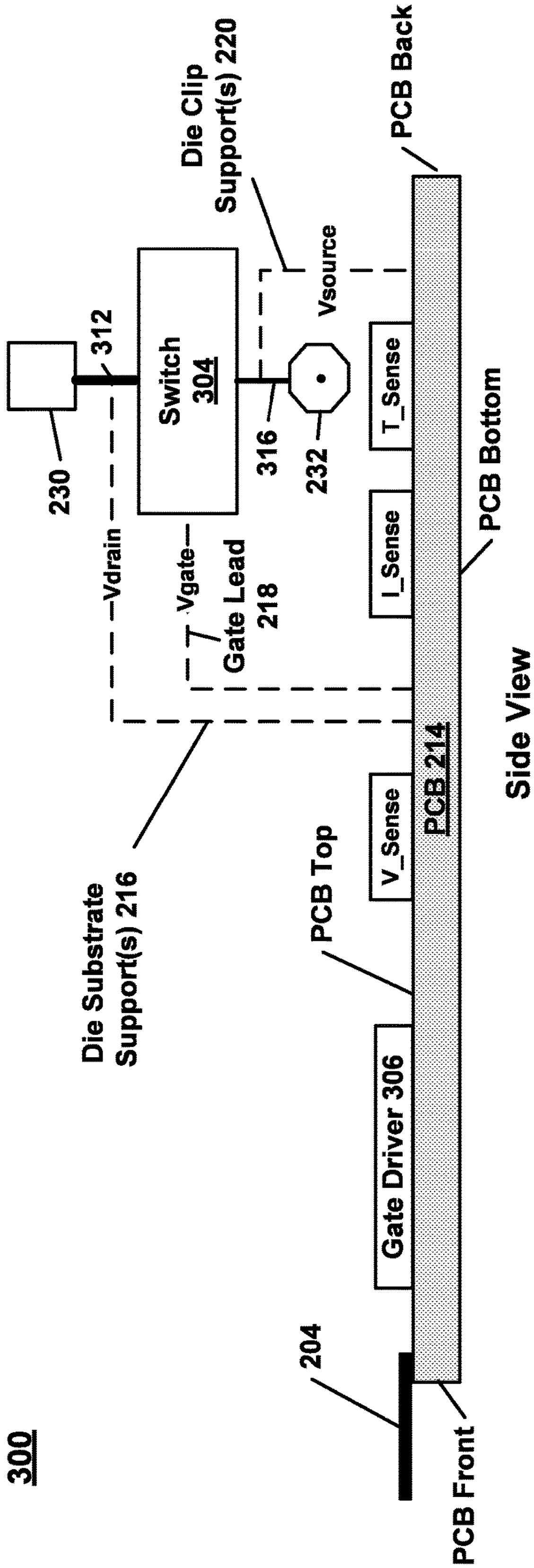
Figures 3, 3G:
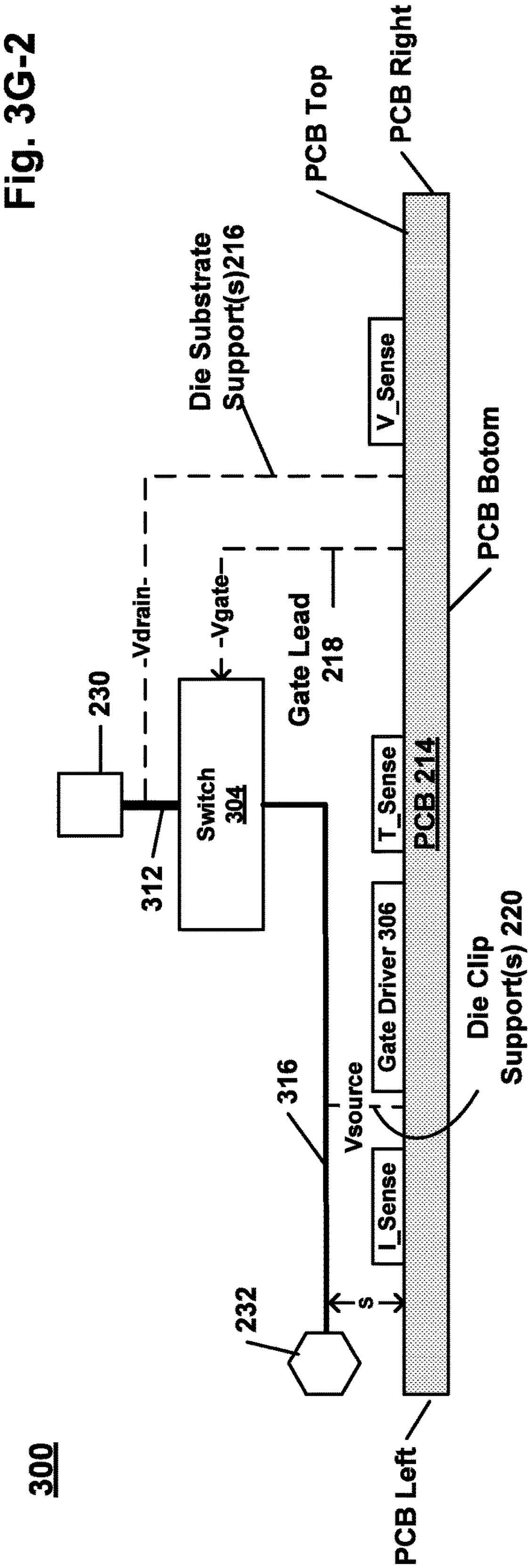

FIGS. 3G-1-3G-3 are quasi-schematic diagrams that show relevant components of an example switch module 300 that can be employed in packaged switch 200 of FIGS. 3A-1-3A-3. Relevant components of switch module 300 are seen from the top, side and back in FIGS. 3G-1-3G-3, respectively.

Switch module 300 includes rigid PCB 214. Metal traces, which are symbolically shown, are formed on PCB 214. Switch module 300 components, including gate driver 306, temperature sensor T_Sense, current sensor I_Sense and voltage sensor V_Sense, are mounted on PCB 214 and electrically connected to traces thereon. V_Sense generates a voltage signal Vv based on the voltage between the current terminals of switch 304. A voltage divider may be mounted on PCB 214 and electrically connected between V_Sense and the current terminals in order to reduce the voltage input to V_Sense.

Switch module 300 includes a set 314 of connector-leads, including connector-leads 204 and 206. First ends of these connector-leads are connected (e.g., soldered) to respective traces so that the connector-leads extend laterally from PCB 214 as shown in FIGS. 3G-1 and 3G-2. FIG. 3G-2 shows only connector-lead 204 but illustrates how it and other connector-leads of set 314 extend laterally from PCB 214 and are contained in a plane that is parallel to a plane that contains traces of the PCB 214. The second, opposite ends of the connector-leads can be received in a connector (not shown) that is external to the packaged switch (e.g., packaged switch 200) or packaged half bridge (e.g., packaged half bridge 250) in which switch module 300 is contained.

Gate driver 306 is attached to PCB 214 near the front. T_Sense and I_Sense are positioned between PCB 214 and the power stack, which consists of switch 304 sandwiched between die substrate 312 and die clip 316. The power stack is supported on PCB 214 and positioned near the back. For purposes of explanation, switch 304 consists of two SiC MOSFETS in this embodiment.

Switch module 300 includes one or more die substrate supports, and one or more die clip supports. The supports fasten the power stack to PCB 214. The supports hold the power stack firmly above PCB 214. One or more die substrate supports fasten the die substrate 312 to PCB 214, and one or more die clip supports fasten die clip 316 to PCB 214. Supports are shown symbolically in FIGS. 3G-1-3G-3. FIGS. 3G-1-3G-3 show a single die substrate support 216 and a single die clip support 220, it being understood that additional die substrate supports and die clip supports can be employed.

PCB based switch modules like switch module 300 can be encased in plastic such as a mold compound, which provides additional structural support between the power stack and the PCB. In an alternative embodiment a power stack with attached supports may be substantially encased in mold compound before it is mounted to a PCB. Die clip and die substrate supports extend from the case material so that ends of the supports can be connected (e.g., soldered) to traces of a PCB including PCB 214. Thereafter, the PCB with mounted components and encased power stack, can be collectively encased in mold compound material, which may be a different type of mold compound that was used to encase the power stack. For example, a mold compound that includes alumina may be used to encase the power stack, while a mold compound that does not include alumina is used to encase the combination of PCB with mounted components and encased power stack. In an alternative embodiment, switch modules are not encased in a mold compound. In still another embodiment, switch modules may be only conformal coated.

Each of the die clip or die substrate supports may have a circular, square, or rectangular cross-sectional shape, but other cross-sectional shapes are contemplated. The supports can be formed from conductive metal such as copper. In addition to providing mechanical support, die substrate support 216 can be part of the electrical connection between die substrate 312, gate driver 306 and V_Sense, and die clip support 220 can be part of the electrical connection between die clip 316, gate driver 306 and V_Sense.

Each support 216 or 220 may extend laterally between opposite ends. One end of die substrate support 216 may include a substantially flat surface that is connected (e.g., soldered) to a trace on PCB 214, while the other end may include a substantially flat surface that is connected (e.g., soldered, laser welding, etc.) to die substrate 312. Die substrate support 216 may extend perpendicularly from the trace to which it is connected. In addition to supporting die substrate 312, die substrate support 216 provides Vdrain, the voltage at the drains of switch 304, to V_Sense and gate driver 306 via the trace to which die substrate support 216 is connected. One end of die clip support 220 may include a substantially flat surface that is connected (e.g., soldered) to a trace on PCB 214, while the other end may include a substantially flat surface that is connected (e.g., soldered) to die clip 316. Die clip support 220 may extend perpendicularly from the trace to which it is connected. In addition to supporting die clip 316, die clip support 220 provides Vsource, the voltage at sources of switch 304, to V_Sense and gate driver 306. Die substrate support 216 and die clip support 220 may be attached to die substrate 312 and die clip 316, respectively, after switch 304 is connected (e.g., sintered) to die substrate 312 and die clip 316, and before die substrate support 216 and die clip support 220 are connected (e.g., soldered) to respective traces on PCB 214.

Supports 216 and 220 should be long enough to create sufficient separation S (see FIG. 3G-3) between die clip 316 and PCB 214 to fit T_Sense and I_Sense between PCB 214 and die clip 316. The number of supports 216 and 220, or other support structure, can be reduced or eliminated in an alternative embodiment in which T_Sense and/or I_Sense engage and support die clip 316. However, an electrically insulating adhesive may be needed to securely attach die clip 316 to the tops of T_Sense and/or I_Sense. In this alternative embodiment, at least one conductor such as a post, lead, bond wire, etc., may be needed to establish an electrical connection between V_Sense, the die substrate, and the gate driver 306 via diode 308 (not shown). At least one conductor, such as a post, lead or bond wire, may be needed to establish an electrical connection between V_Sense, gate driver 306 and the die clip.

Switch module 300 also includes a gate lead 218, which may take form in a flat lead that includes two end portions integrally connected by a middle portion. The first end portion may be connected (e.g., soldered) to a trace of PCB 214, which in turn is connected to an output of gate driver 306 via resistors R1 and R2. The second end portion may be connected to die substrate 312 through an intervening, electrically insulating material so that gate lead 218 is isolated from die substrate 312. The flat surface of the second end portion that faces opposite the die substrate 312 may provide an area where one or more wires may be bonded. The other ends of the one or more bond wires can be attached to a gate of a transistor of switch 304. Switch 304 may contain multiple transistors. The second end portion of gate lead 218 can be widened to accommodate multiple bond wires that connect gate lead 218 to the gates of the multiple transistors. Switch 304 is contained in a plane that is vertically separated from a plane that contains traces of PCB. Bends between the middle portion of gate lead 218 and end portions can accommodate the separation between the two planes. Gate lead 218 may be attached to die substrate 312 before or after switch 304 is attached (e.g., sintered) to die substrate 312 and/or die clip 316. Alternatively, a flexible PCB or bond wire may be used instead of a lead to electrically connect gate driver 306 to switch 304. A second gate lead could be added in an embodiment in which a multi-transistor gate driver is employed. Gate lead 218 and the second gate lead can carry gate control voltages Vg1 and Vg2 (not shown), respectively, provided by the multi-transistor gate driver. Gate lead 218 and the second gate lead should be in respective electrical paths between respective outputs of the multi-transistor gate driver and respective gates of respective transistors of switch 304. The second gate lead could be like gate lead 218 described above.

Figures 1, 3H:
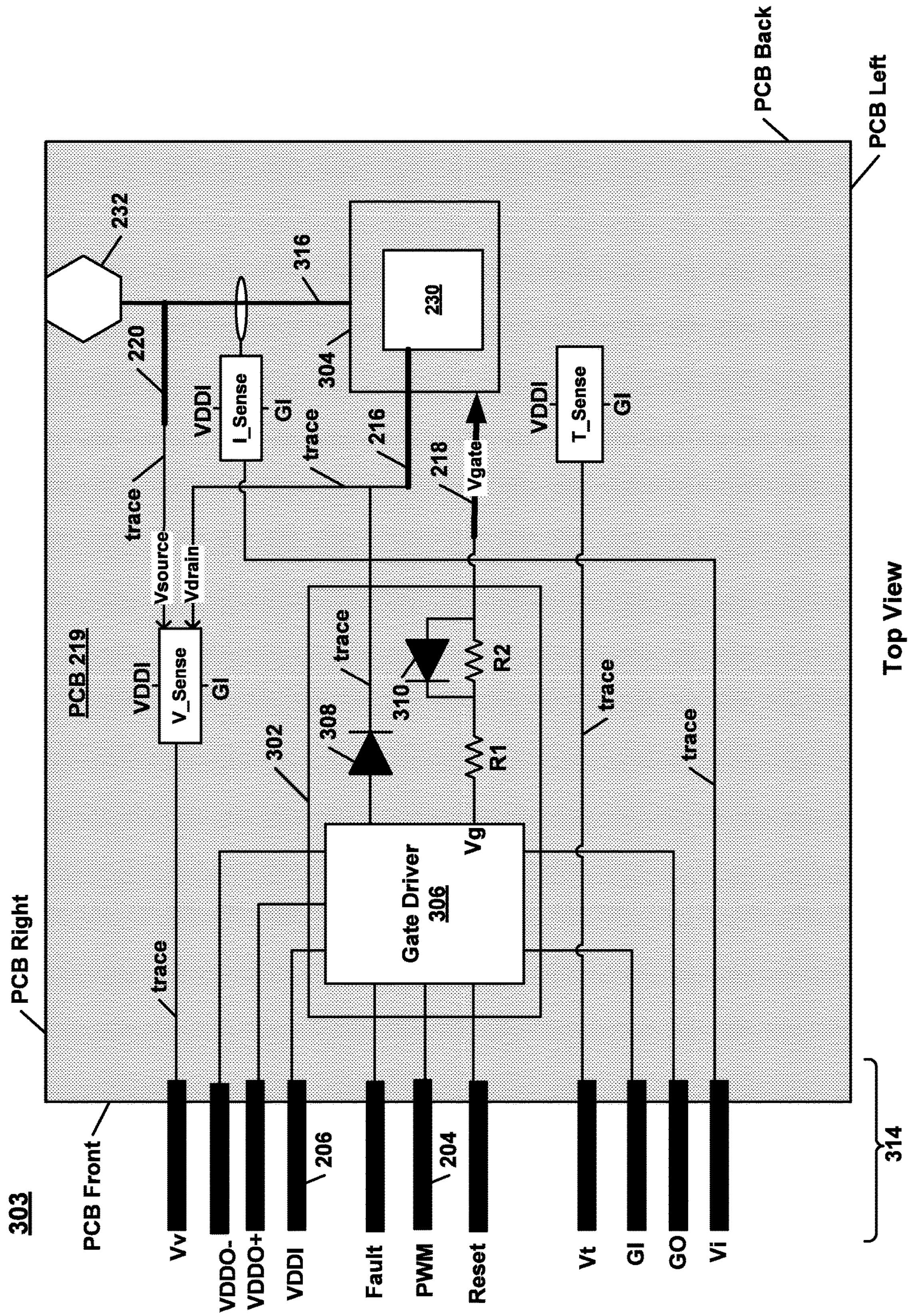
Figures 2, 3H:
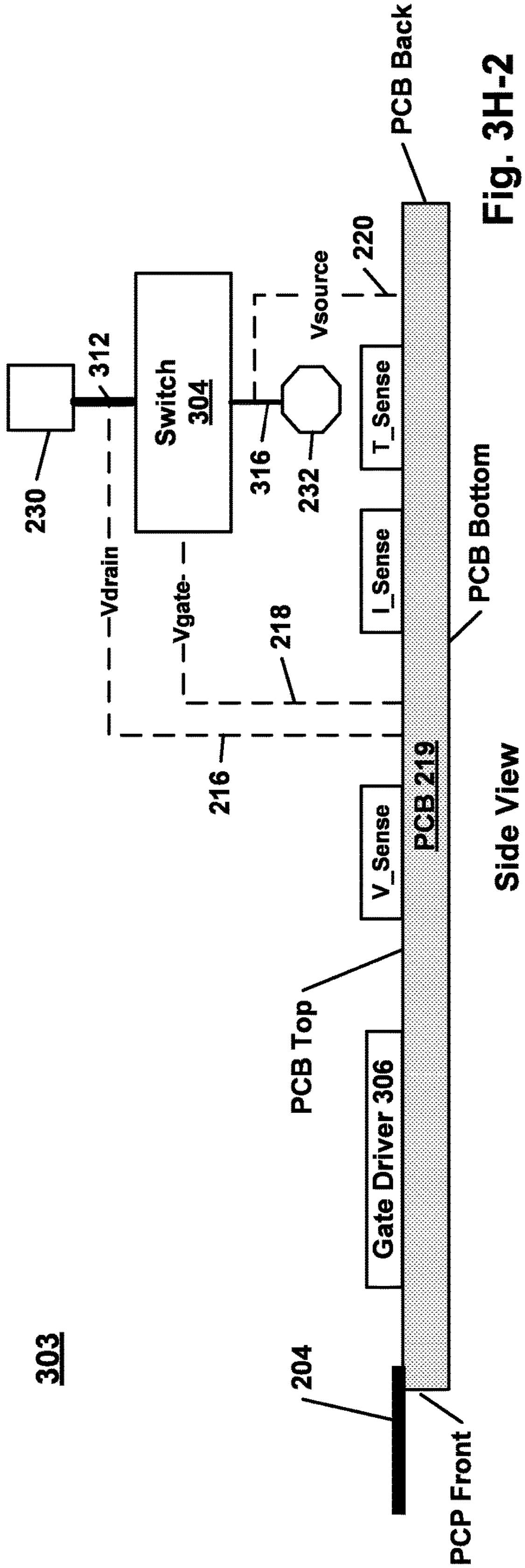
Figures 3, 3H:
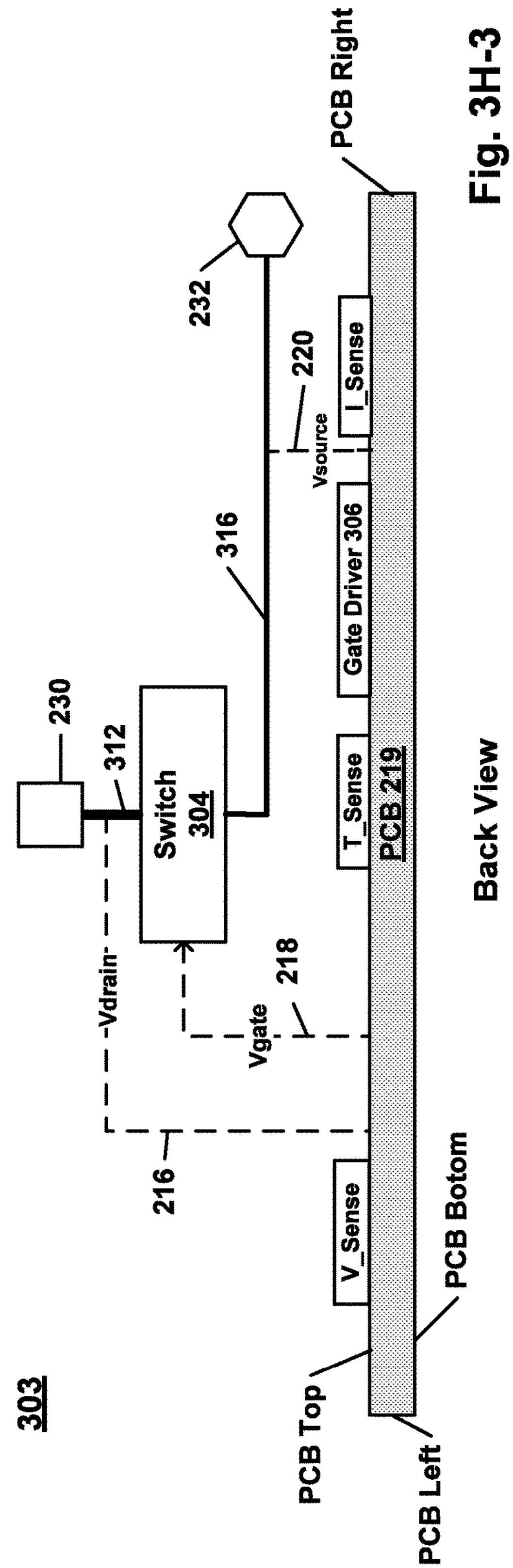
Figures 1, 3I:
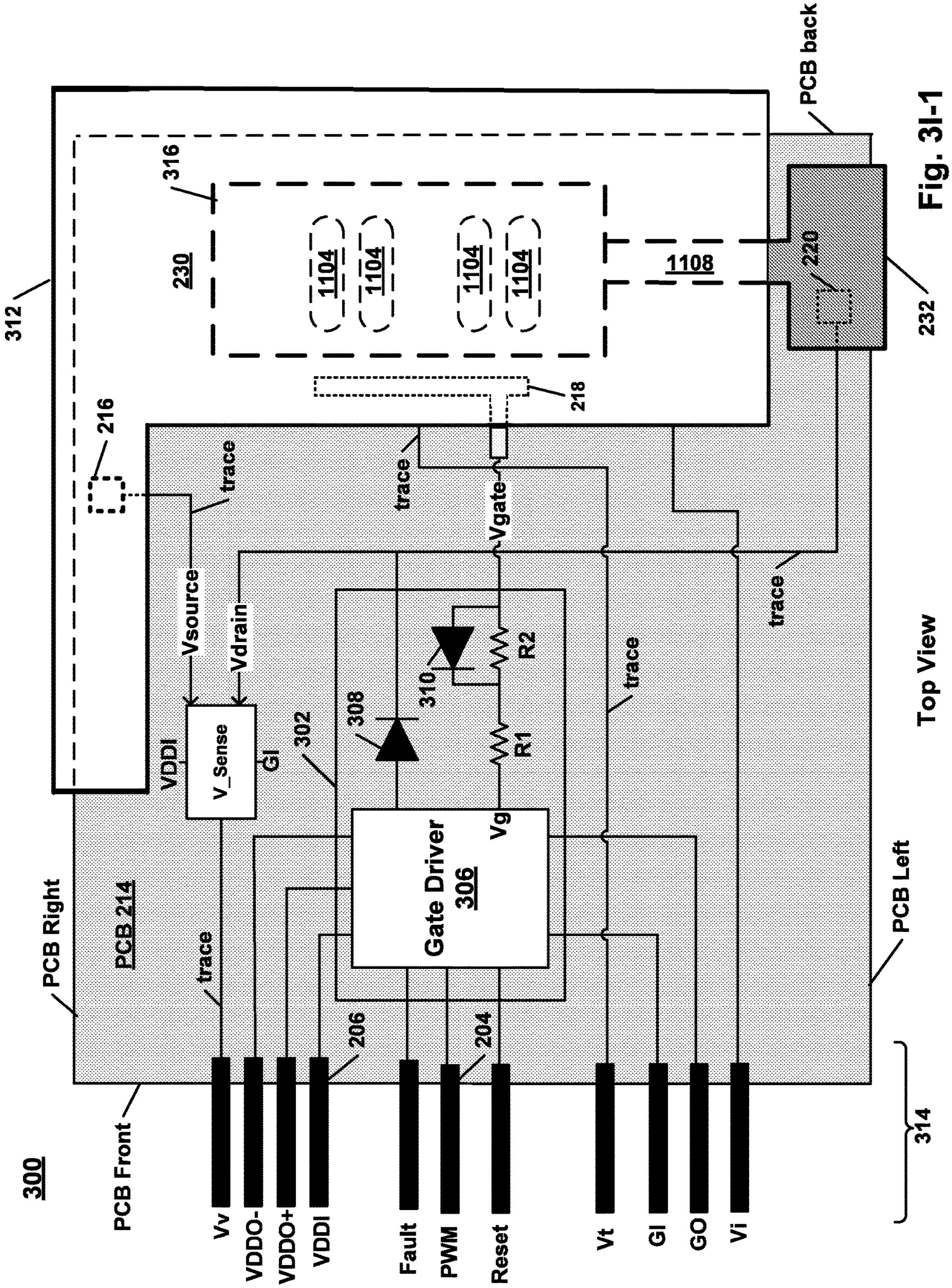
Figures 2, 3I:
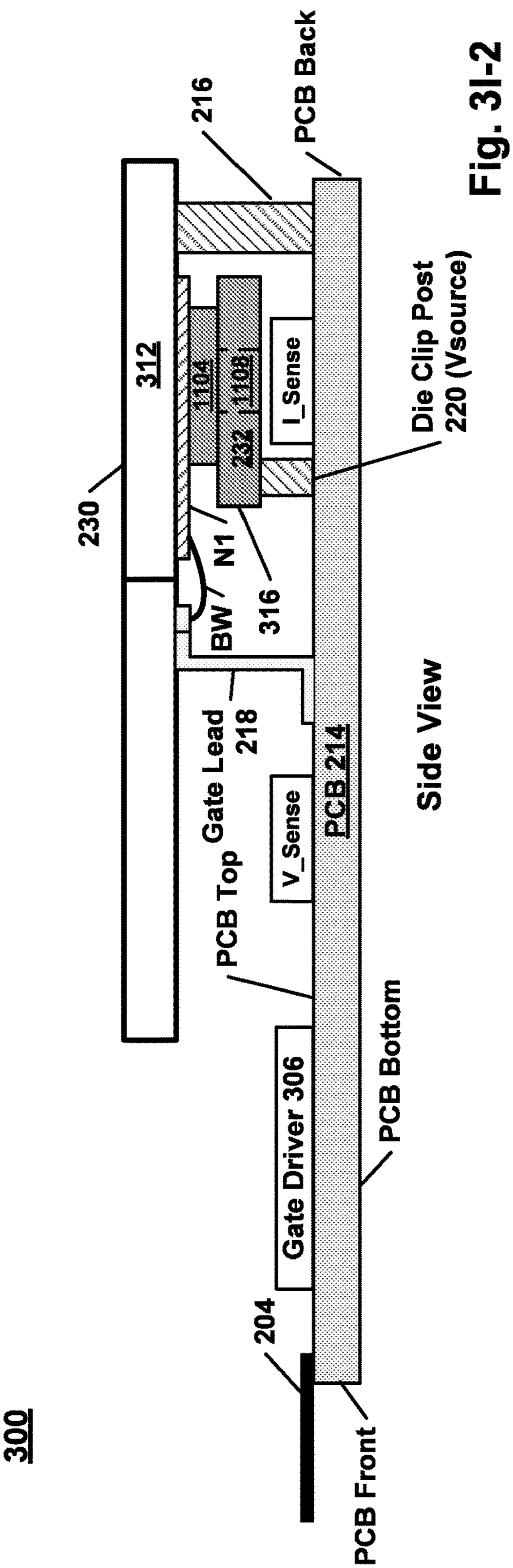
Figures 3, 3I:
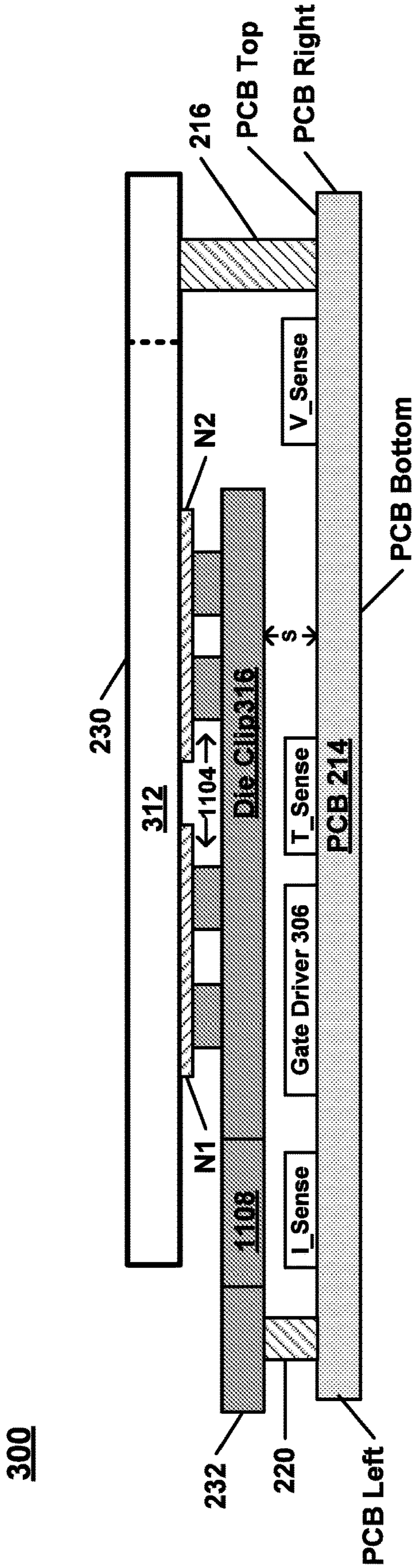

FIGS. 3I-1-3I-3 illustrate one embodiment of the switch module 300 shown in FIGS. 3G-1-3G-3 when seen from the top, side and back. This switch module 300 includes example supports 216 and 220 that take form in metal posts or pedestals. FIGS. 3I-1-3I-3 also illustrate example die substrate 312 and example die clip 316 that can be formed from thin sheets (e.g., 0.1 mm-2.0 mm) of composite or layered materials as described above. FIGS. 3I-1-3I-3 show top, side, and back views of example die substrate 312 that is formed from a thin sheet of layered materials. FIGS. 3I-1-3I-3 also show top, side, and back views of example die clip 316 formed from a thin sheet of composite or layered. In one embodiment die substrate 312 shown in FIGS. 3I-1-3I-3 is shaped substantially like the die substrate 312 shown in FIGS. **9*a*-9*c* of U.S. patent application Ser. No. 17/191,805. In one embodiment die clip 316 shown in FIGS. 3I-1-3I-3 is shaped substantially like the die clip 316 shown in FIGS. 11*a*-11*c* and 11*e*** of U.S. patent application Ser. No. 17/191,805.

A switch 304 (FIG. 3I-3) consisting of a pair of SiC MOSFETs N1 and N2, is attached (e.g., sintered) between example die substrate 312 and example die clip 316. Die substrate 312 has oppositely facing, substantially flat surfaces. Drain terminals of the SiC MOSFETs N1 and N2 can be attached (e.g., sintered) to one surface, while the oppositely facing surface of example die substrate 312 contains die substrate terminal 230.

Die clip 316 includes pedestals 1104 that can be formed using a punch press or similar tool. Pedestals 1104 should have uniform thickness and extend perpendicularly from a surface of die clip 316, as shown, with a length that can be half the thickness, or less, of die clip 316. The end surfaces of pedestals 1104 can be sintered to source terminals of the SiC MOSFETs N1 and N2. The end surfaces of pedestals 1104 should be substantially flat with a shape (e.g., substantially rectangular) and size (e.g., 1 mm×4 mm) that is substantially like, but slightly smaller than the surfaces of the source terminals. This ensures that pedestals 1104 do not contact the SiC MOSFETS N1 and N2 outside the areas occupied by the source terminals. A wide end surface of pedestals 1104 should more evenly distribute any mechanical stress applied to SiC MSOFETs N1 and N2, thereby reducing the risk of fracture. The distribution of mechanical stress may be important in embodiments in which a packaged switch or packaged half bridge are "press-packed" against a heat sink, a bus bar, a bus bar that also acts as a heat sink, or other structure. The size and shape of the end surfaces of pedestals 1104 also reduces the chance that unwanted hot spots are created by concentrated current flow through narrow point connections to the source terminals, as would be the case if bond wires were used instead of a die clip. Moreover, the cross-sectional area (e.g., 25 $mm^2$, 16 $mm^2$, 8 $mm^2$, 6 $mm^2$, 4 $mm^2$, 2 $mm^2$, or more or less) of pedestals 1104 may reduce parasitic inductance and resistance, especially when compared to the parasitic inductance and resistance of bond wires. Die clip 316 includes a substantially flat surface that forms die clip terminal 232. Further, die clip 316 includes a narrowed portion 1108 below which an I_Sense circuit can be positioned for measuring current flow to or from switch 304.

Referencing FIGS. 3I-1-3I-3, example switch module 300 includes one die substrate post 216, one die clip post 220, and one gate lead 218. For ease of illustration, lead 218 is not shown in FIG. 3I-3. The posts support the power stack on PCB 214. In another embodiment, several die substrate posts support the die substrate 312, and several die clip posts support die clip 316. Each of the posts may have a circular, square, or rectangular cross-sectional shape, and other shapes are contemplated. The posts can be formed from conductive metal such as copper. In addition to providing mechanical support, die substrate post 216 is part of the electrical connection between die substrate 312 on one side, and V_Sense and gate driver 306 on the other side, and die clip post 220 is part of the electrical connection between die clip 316 on one side, and gate driver 306 and V_Sense on the other side.

Each example post 216 or post 220 extends laterally between two ends. One end of example die substrate post 216 may include a substantially flat surface that is connected (e.g., soldered) to a trace on PCB 214, while the other end may include a substantially flat surface that is connected (e.g., soldered) to die substrate 312. Example die substrate post 216 may extend perpendicularly from the trace to which it is connected. In addition to supporting die substrate 312, example die substrate post 216 provides Vdrain, the voltage at the drains of switch 304, to V_Sense and gate driver 306 via the trace to which it is attached. One end of example die clip post 220 may include a substantially flat surface that is connected (e.g., soldered) to a trace on PCB 214, while the other end may include a substantially flat surface that is connected (e.g., soldered) to die clip 316. Example die clip post 220 may extend perpendicularly from the trace to which it is connected. In addition to supporting die clip 316, example die clip post 220 provides Vsource, the voltage at sources of switch 304, to V_Sense and gate driver 306. Vsource may be provided to V_Sense through a voltage divider. Example die substrate post 216 and example die clip post 220 may be attached to die substrate 312 and die clip 316, respectively, after switch 304 is connected (e.g., sintered) to die substrate 312 and die clip 316, and before die substrate post 216 and die clip post 220 are connected (e.g., soldered) to respective traces on PCB 214.

Example gate lead 218 in FIGS. 3I-1 and 3I-2 can formed from a thin sheet of metal with first and second extensions that are integrally connected and perpendicular to each other. The first extension of gate lead 218 includes two end portions integrally connected by a middle portion. Two right angle joints connect the two end portions to the middle portion. The first end portion may be connected (e.g., soldered) to a trace of PCB 214, which in turn is connected to an output of gate driver 306. The second end portion is connected to the second extension, which in turn is connected to die substrate 312 via an electrically insulating material (not shown). A bond wire BW connects the second extension of gate lead 218 to a gate (not shown) of MOSFET N1 in the figure. A similar bond wire connects the second extension of gate lead 218 to the gate of the other MOSFET N2. In an alternative embodiment, a flex PCB can be used in the connection between the gate driver and the gate instead of a rigid gate lead 218 formed from a thin sheet of metal.

Switch Module 303

Figures 1, 3J:
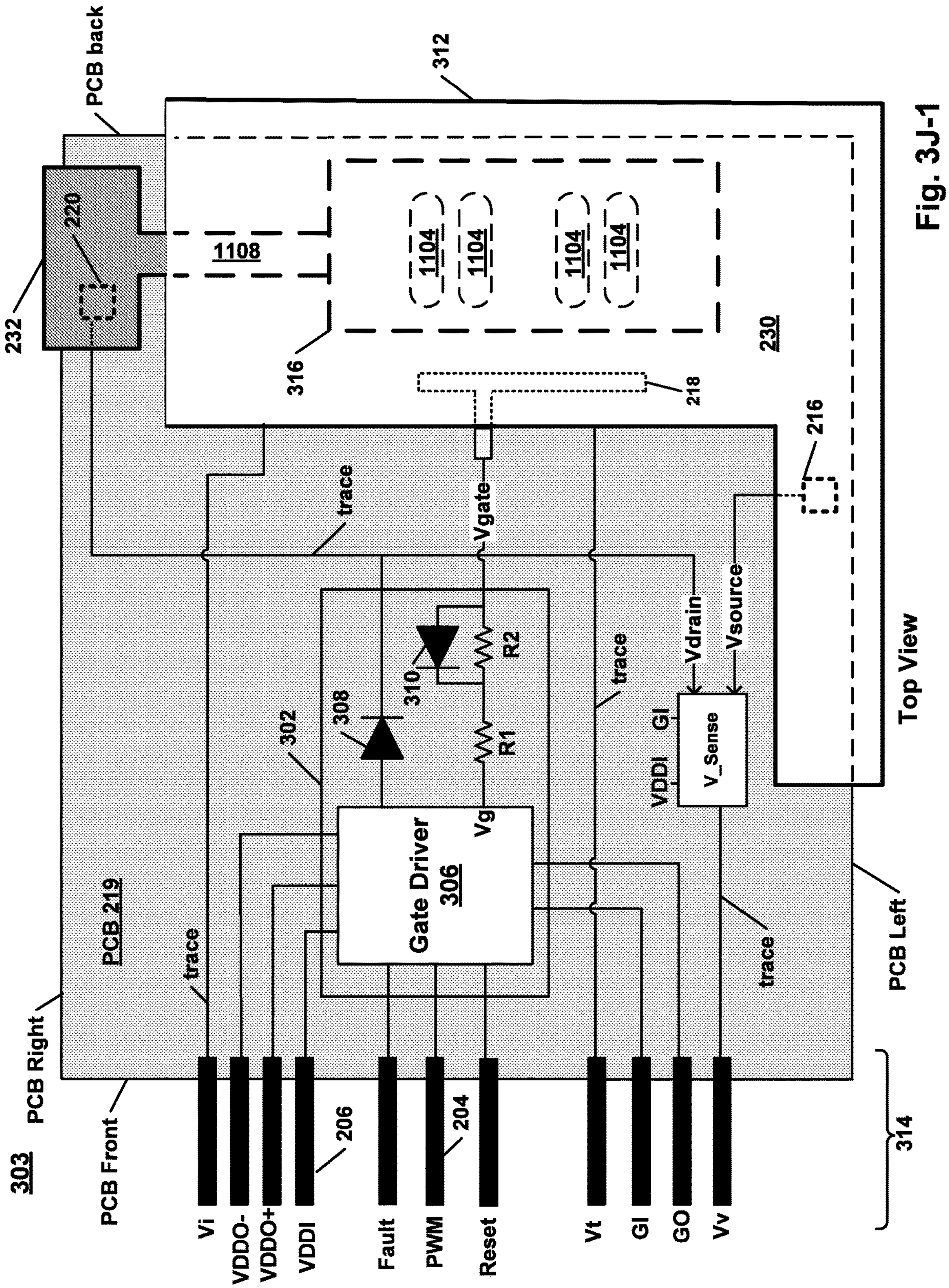
Figures 2, 3J:
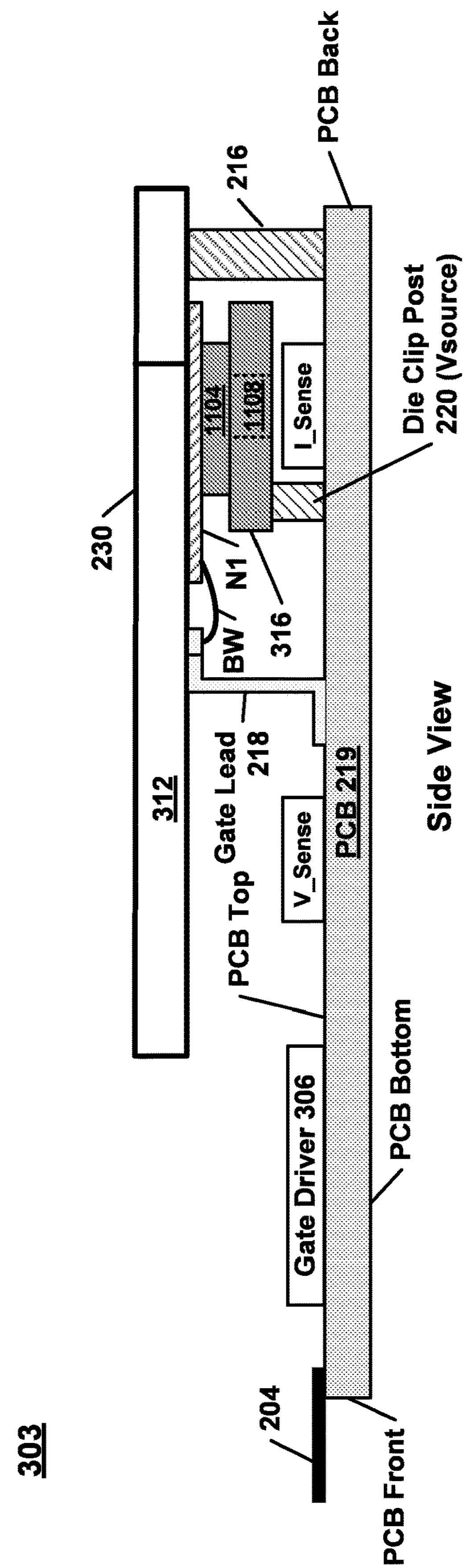
Figures 3, 3J:
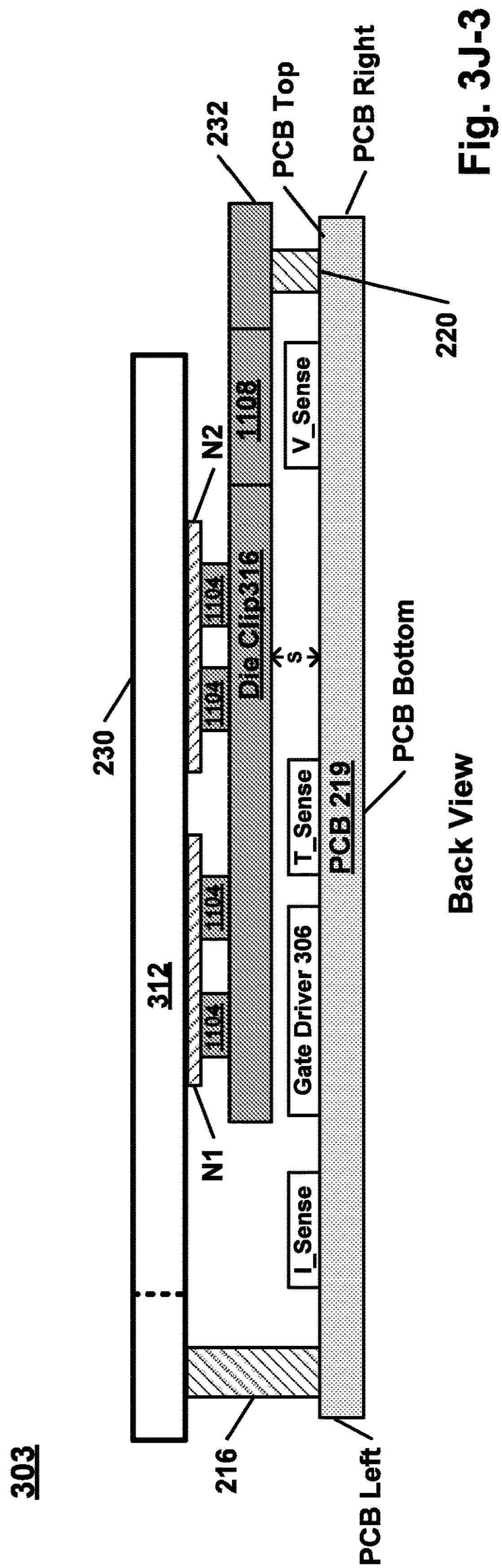

FIGS. 3H-1-3H-3 show an example of switch module 303 that can be employed in the packaged switch 201 of FIGS. 3B-1-3B-3. Switch module 303 of FIGS. 3H-1-3H-3 is like switch module 300 shown in FIGS. 3G-1-3G-3, but with die clip terminal 232 positioned near the right side of rigid PCB 219. FIGS. 3J-1-3J-3 show an embodiment of the switch module 303 shown in FIGS. 3H-1-3H-3. Switch module 303 of FIGS. 3J-1-3J-3 is like the switch module 300 of FIGS. 3I-1-3I-3, but with die clip terminal 232 positioned near the right side of rigid PCB 219.

Switch Module 305

Switch modules 300 and 303 enable single-side cooling of their switches 304. FIGS. 3K-1-3K-4 illustrate an example switch module 305 that enables double-side cooling of switch 304 consisting of MOSFETs N1 and N2. Components of switch module 305 are connected to each other through traces on a rigid PCB 221. Switch module 305 can be used in example packaged switch 211 shown in FIGS. 2C-1, 2C-2, 3E-1 and 3E-2.

With reference to FIGS. 3K-1-3K-4, switch module 305 is like switch module 300 shown in FIGS. 3I-1-3I-3. Several significant differences exist. For example, die clip 316 of switch module 300 is replaced by example die clip 345, which has two die clip terminals 232 and 344. PCB 214 is replaced by PCB 221, which is C-shaped to accommodate double-side cooling of switch 304. Further, while T_Sense is mounted to PCB 221, it is not positioned underneath switch 304. Additional differences may exist between switch modules 300 and 305.

Like module 300, switch module 305 includes supports 216 and 220 that take form in metal posts or pedestals, which support the power stack on PCB 221. The power stack consists of switch 304 sandwiched between example die substrate 312 and example die clip 345.

FIGS. 3K-1-3K-4 show top, bottom, side and back views of example die substrate 312 and example die clip 345.

Example die substrate 312 can be formed from a thin sheet (e.g., 0.1 mm-2.0 mm) of composite or layered materials that includes a layer of molybdenum between layers of copper. In one embodiment, example die clip 345 can be formed by attaching (e.g., sintering, soldering, etc.) a cubic-shaped portion 350 made of copper or other metal to die clip 316 (See, e.g., FIGS. 3J-1 and 3J-2). More particularly, a rectangular-shaped, substantially flat surface of the cubic-shaped portion 350 can be attached to a substantially flat surface of die clip 316 (FIGS. 3J-1 and 3J-2) that is opposite the surface attached to switch 304, which consists of MOSFETs N1 and N2. The oppositely facing flat surface of cubic-shaped portion 350 contains die clip terminal 344. In another embodiment, die clip 345 may be machined from a solid work piece of metal such as copper, or 3-D printed.

A switch 304 consisting of a pair of SiC MOSFETs N1 and N2, is attached (e.g., sintered) between example die substrate 312 and example die clip 345. Die substrate 312 has oppositely facing, substantially flat surfaces. Drain terminals of the SiC MOSFETs N1 and N2 can be attached (e.g., sintered) to one surface, while the oppositely facing surface of die substrate 312 contains die substrate terminal 230. As noted above, each switch of a power stack may include multiple transistors connected in parallel between a die clip and a die substrate. The parallel connection enables higher current flow through the switch when activated or turned on.

Die clip 345 includes a substantially flat surface that forms die clip terminal 232. Die clip 345 includes pedestals 1104 that extend perpendicularly from the surface of die clip 345 as shown. The end surfaces of pedestals 1104 can be sintered to respective source terminals of the SiC MOSFETs N1 and N2. The end surfaces of pedestals 1104 should be substantially flat with a shape (e.g., substantially rectangular) and size (e.g., 2.5 mm×4 mm) that is substantially like, but slightly smaller than the surfaces of the source terminals to which they are attached. This ensures that pedestals 1104 do not contact the SiC MOSFETS N1 and N2 outside the areas occupied by the source terminals. A wider end surface of pedestals 1104 should more evenly distribute any mechanical stress applied to SiC MOSFETs N1 and N2, thereby reducing the risk of fracture. The distribution of mechanical stress may be important in embodiments in which packaged switches or packaged half bridges with switch module 305 are pressed against a bus bar, heat sink, or other structure. The size and shape of the end surfaces of pedestals 1104 also reduces the chance that unwanted hot spots are created due to concentrated current flow through narrow point connections to the source terminals, as would be the case if bond wires were used instead of a die clip. A wide cross-sectional area (e.g., 25 $mm^2$, 16 $mm^2$, 8 $mm^2$, 6 $mm^2$, 4 $mm^2$, 2 $mm^2$, or more or less) of pedestals 1104 reduces the density of the current flow, which may reduce parasitic inductance and resistance especially when compared to the parasitic inductance and resistance of bond wires if they were used instead of a die clip with pedestals 1104. Further, wider cross-sectional areas and wider end surfaces of pedestals 1104 enables die clip 345 to conduct more heat out of the power stack via die clip terminal 344. The rate at which heat is conducted out of the power stack can be increased when die clip terminal 344 is thermally connected to a heat sink or bus bar that also acts as a heat sink. Lastly, the die clip includes a narrowed portion 1108 below which I_Sense circuit can be positioned for measuring current flow to or from a switch 304.

Switch module 305 includes one or more die substrate posts, one or more die clip posts, and a gate lead. The posts can support the power stack above PCB 221. In one embodiment, one or more die substrate posts support the die substrate 312, and one or more die clip posts support die clip 345. Each of the posts may have a circular, square, or rectangular cross-sectional shape, but other shapes are contemplated. The posts can be formed from conductive metal such as copper. Referencing FIGS. 3K-1-3K-4, example switch module 305 includes one example die substrate post 216, one example die clip post 220, and an example gate lead 218. In addition to providing mechanical support, die substrate post 216 is part of the electrical connection between die substrate 312 on one side, and V_Sense and gate driver 306 on the other side, and die clip post 220 is part of the electrical connection between die clip 345 on one side, and gate driver 306 and V_Sense on the other side.

Each example post 216 or post 220 extends laterally between two ends. One end of die substrate post 216 may include a substantially flat surface that is connected (e.g., soldered) to a trace on PCB 221, while the other end may include a substantially flat surface that is connected (e.g., soldered) to die substrate 312. Die substrate post 216 may extend perpendicularly from the trace to which it is connected. In addition to supporting die substrate 312, die substrate post 216 provides Vdrain, the voltage at the drains of switch 304, to V_Sense and gate driver 306 via the trace to which it is attached. One end of die clip post 220 may include a substantially flat surface that is connected (e.g., soldered) to a trace on PCB 221, while the other end may include a substantially flat surface that is connected (e.g., soldered) to die clip 345. Die clip post 220 may extend perpendicularly from the trace to which it is connected. In addition to supporting die clip 345, die clip post 220 provides Vsource, the voltage at sources of switch 304, to V_Sense and gate driver 306 via the trace to which it is attached. Die substrate post 216 and die clip post 220 may be attached to die substrate 312 and die clip 316, respectively, after switch 304 is connected (e.g., sintered) to die substrate 312 and die clip 345, and before die substrate post 216 and die clip post 220 are connected (e.g., soldered) to respective traces on PCB 221.

Posts 216 and 220 should be long enough to create enough separation S (FIG. 3K-4) between die clip 345 and PCB 221 so that I_Sense can be positioned between PCB 221 and narrowed portion 1108 of example die clip 345.

Figures 1, 3K:
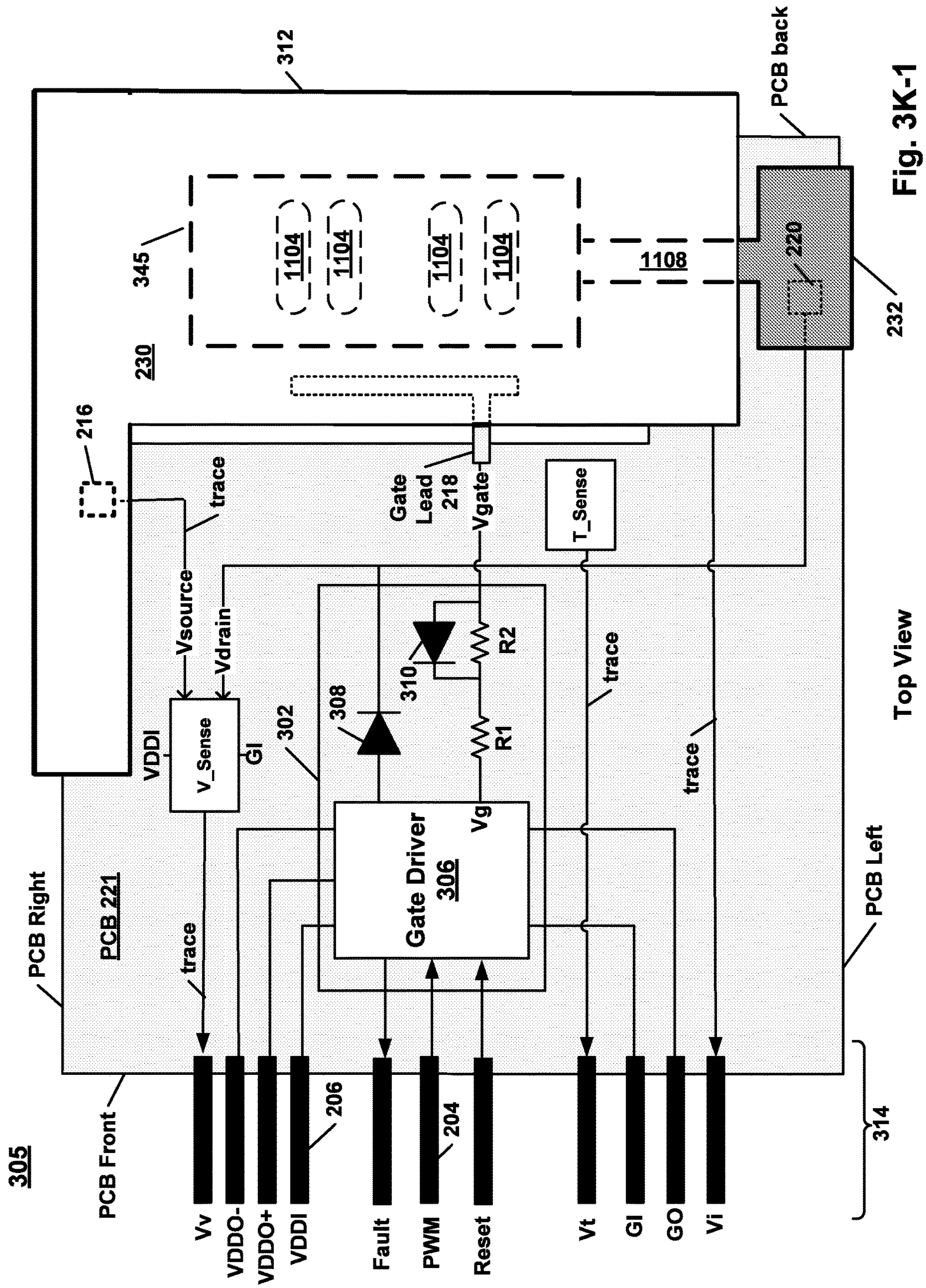
Figures 2, 3K:
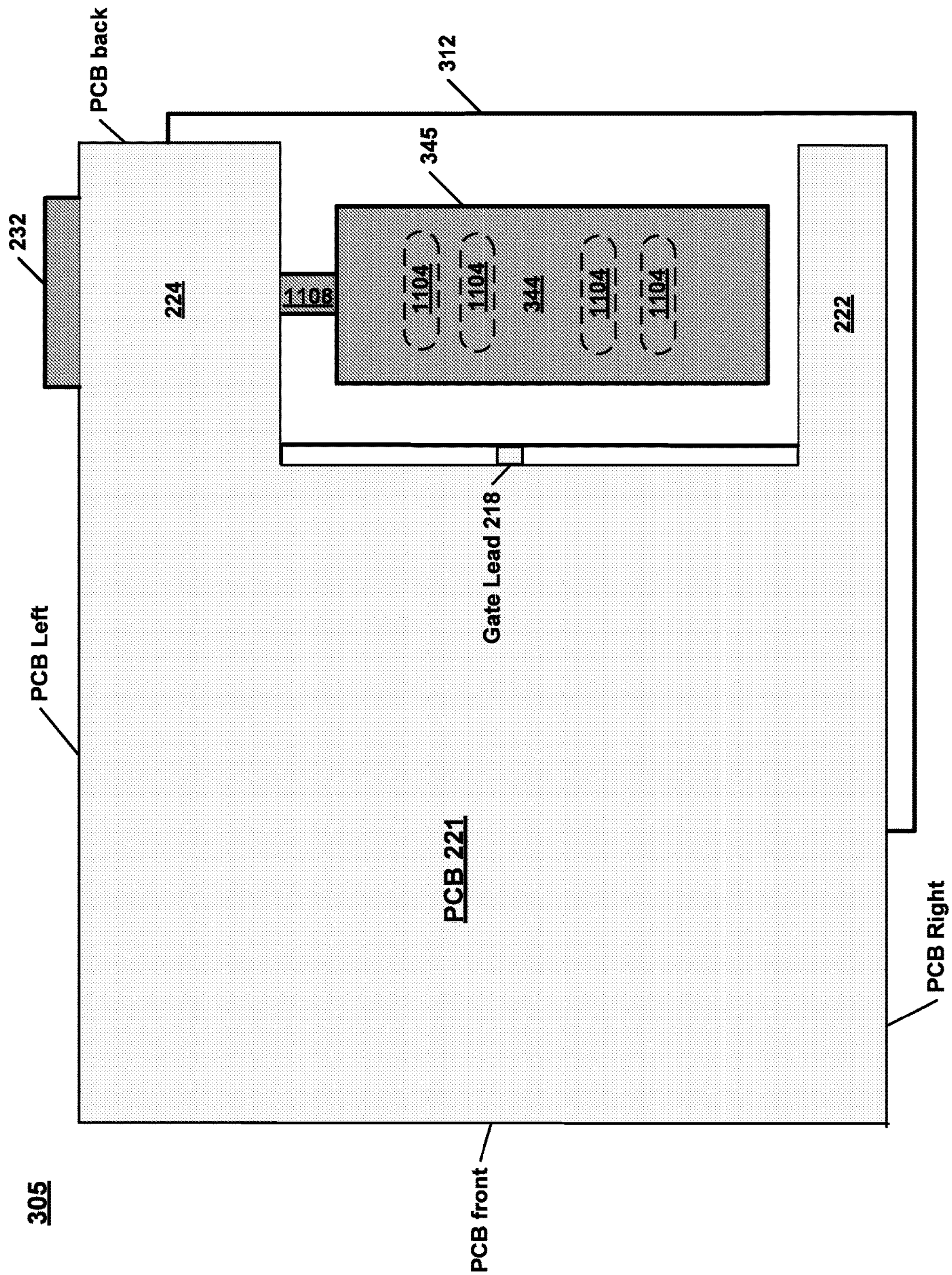
Figures 3, 3K:
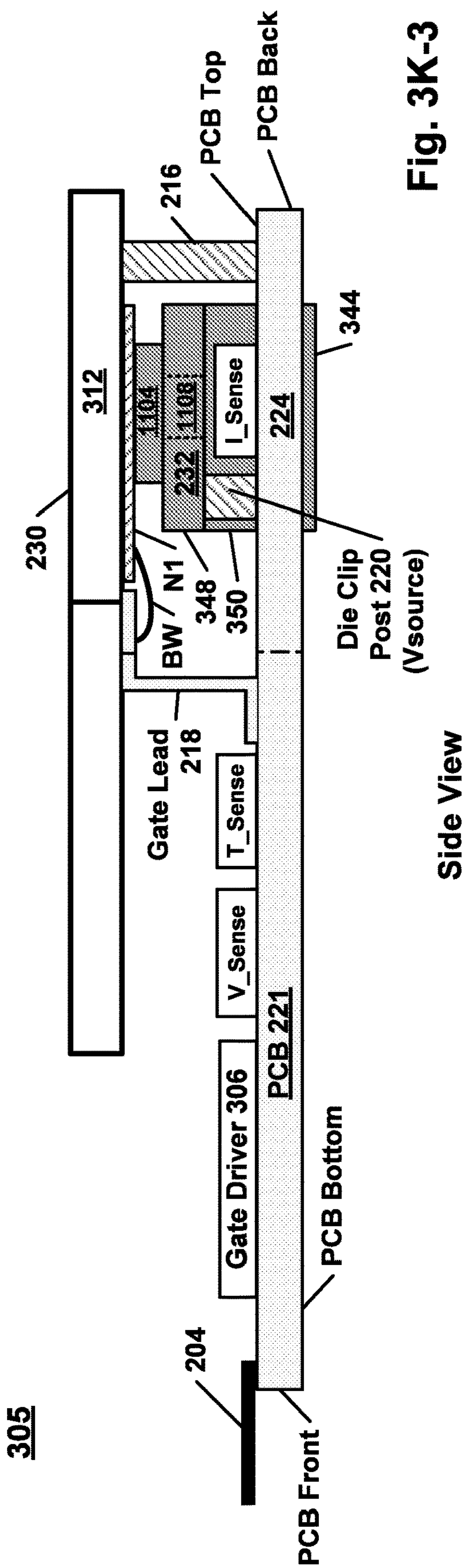
Figures 3, 3K, 4:
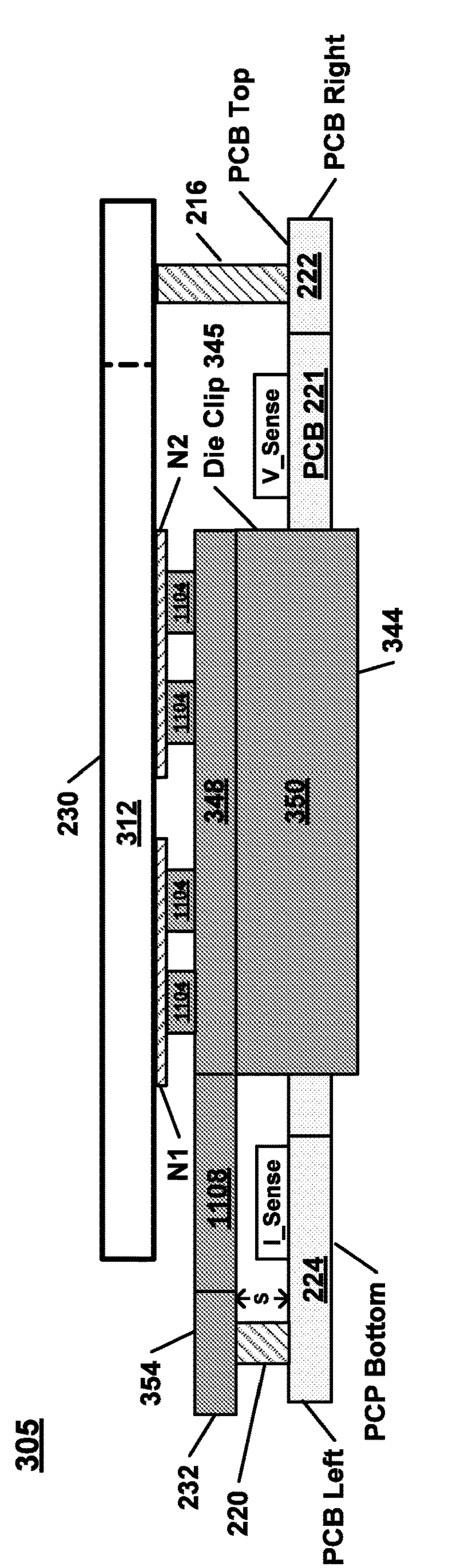
Figures 1, 3L:
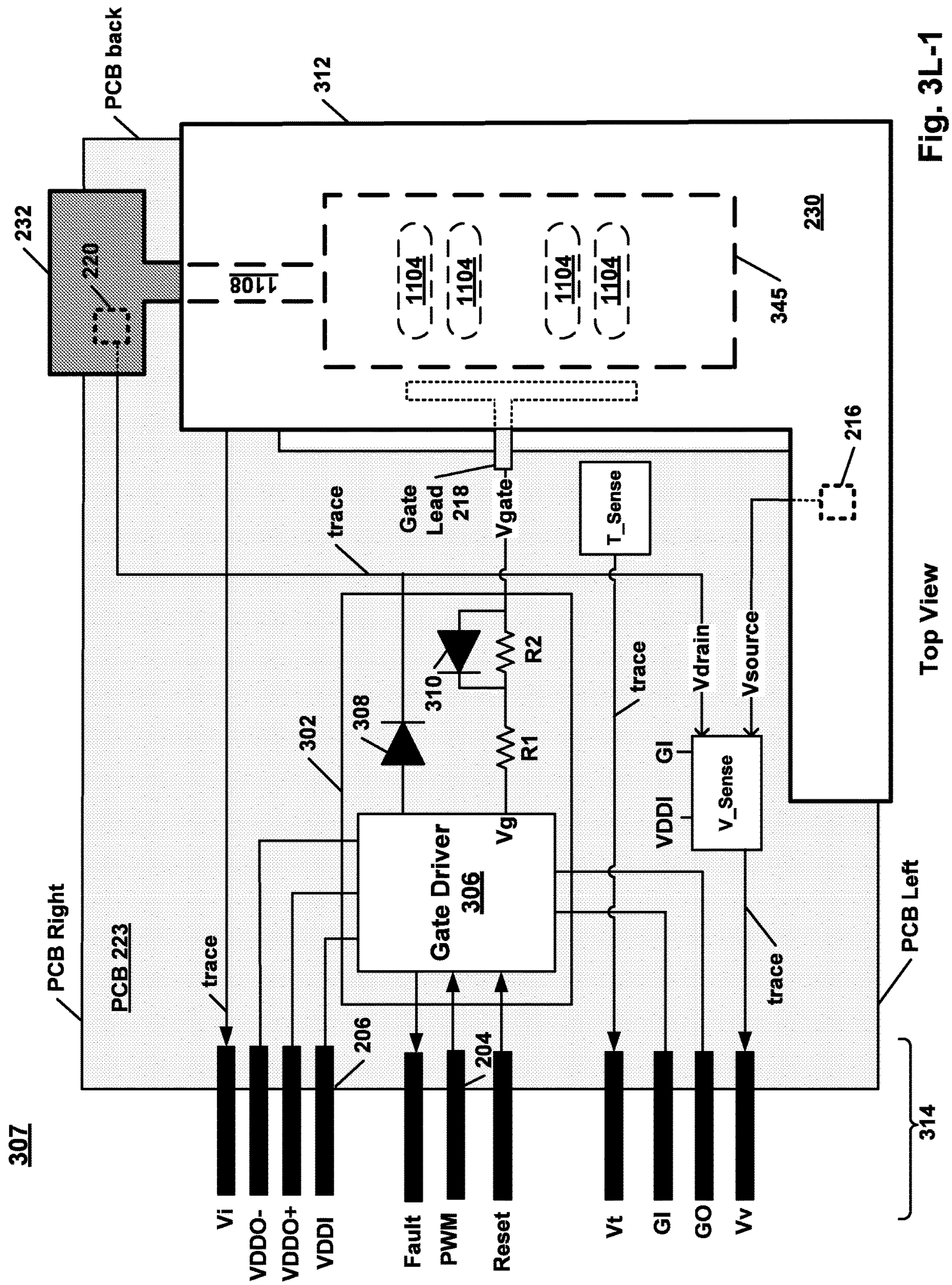
Figures 2, 3L:
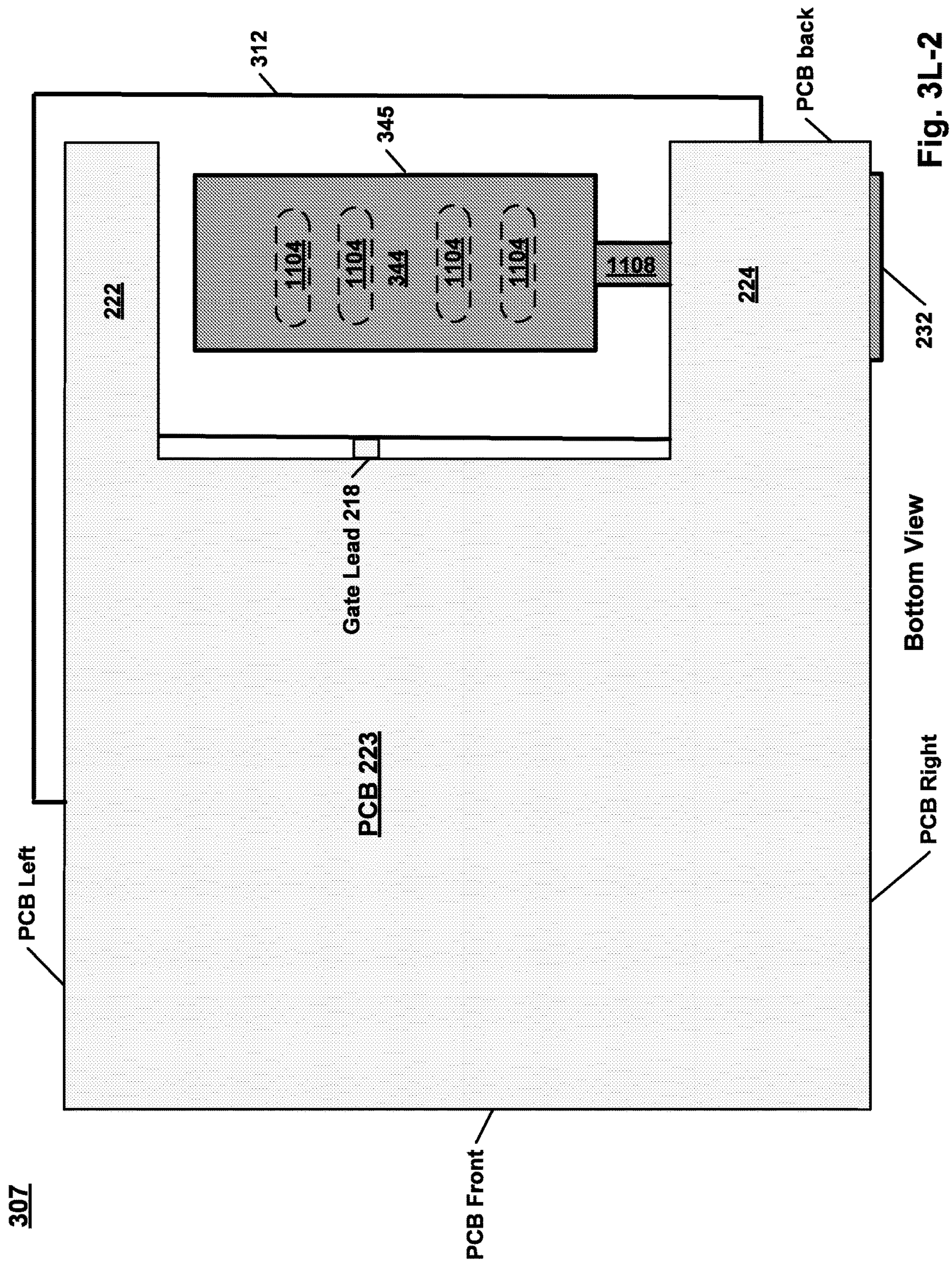
Figures 3, 3L:
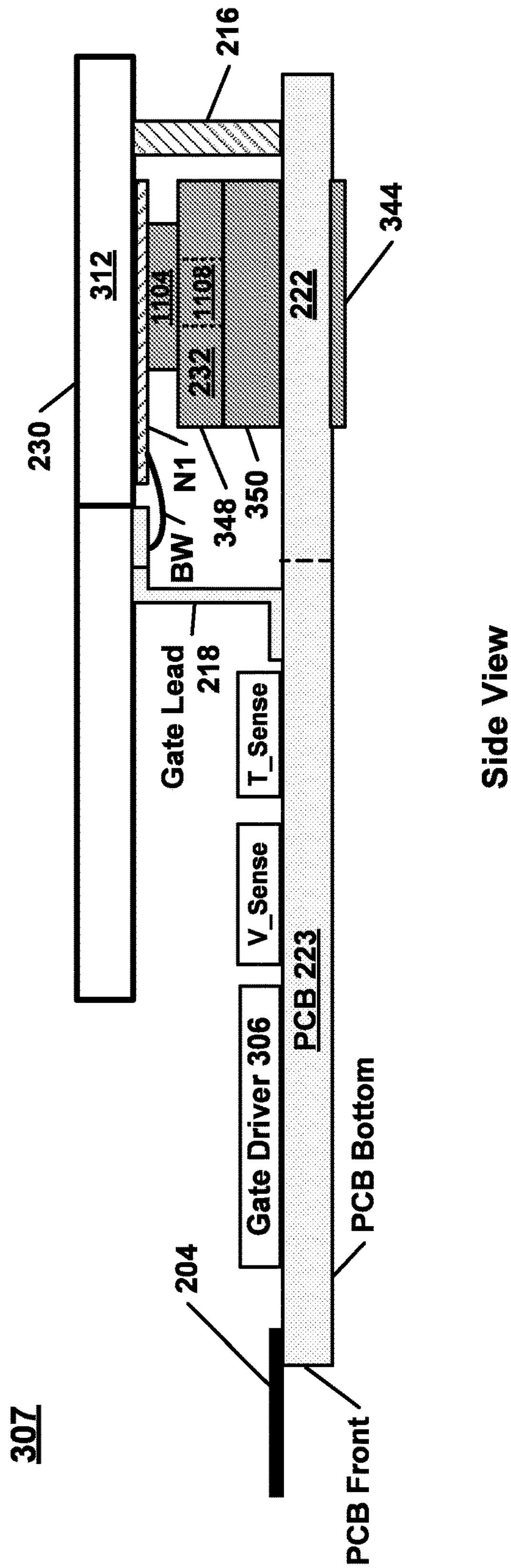
Figures 3, 3L, 4:
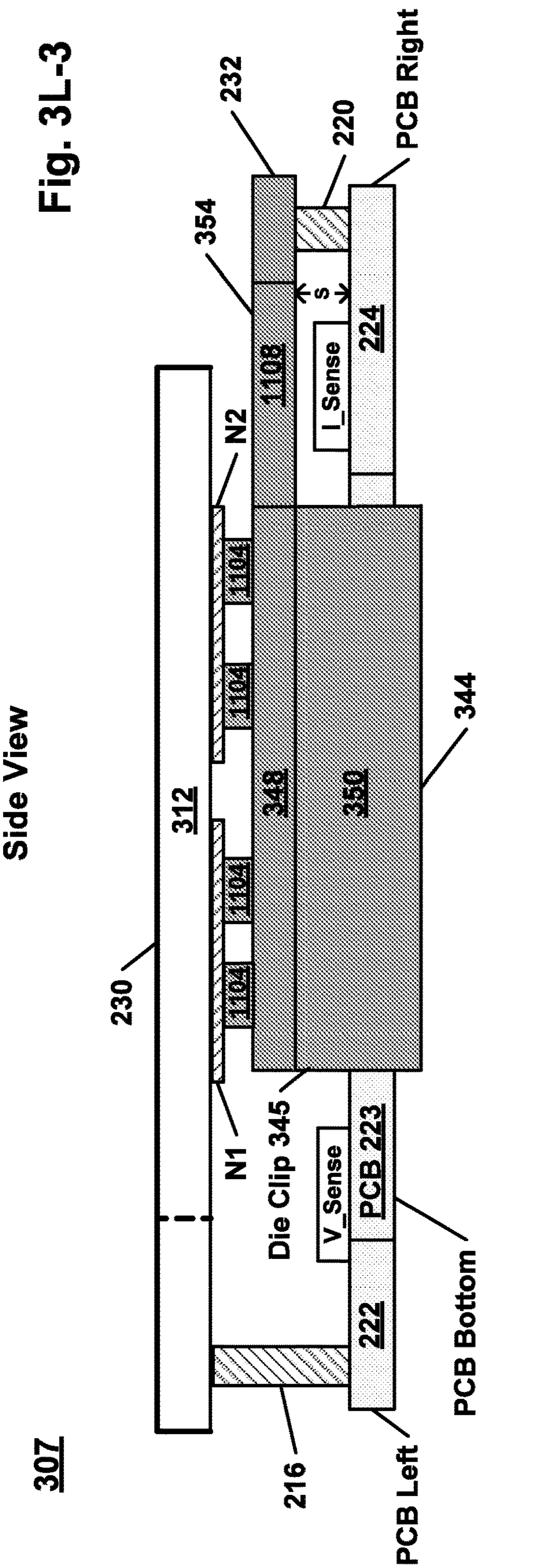
Figures 1, 3M:
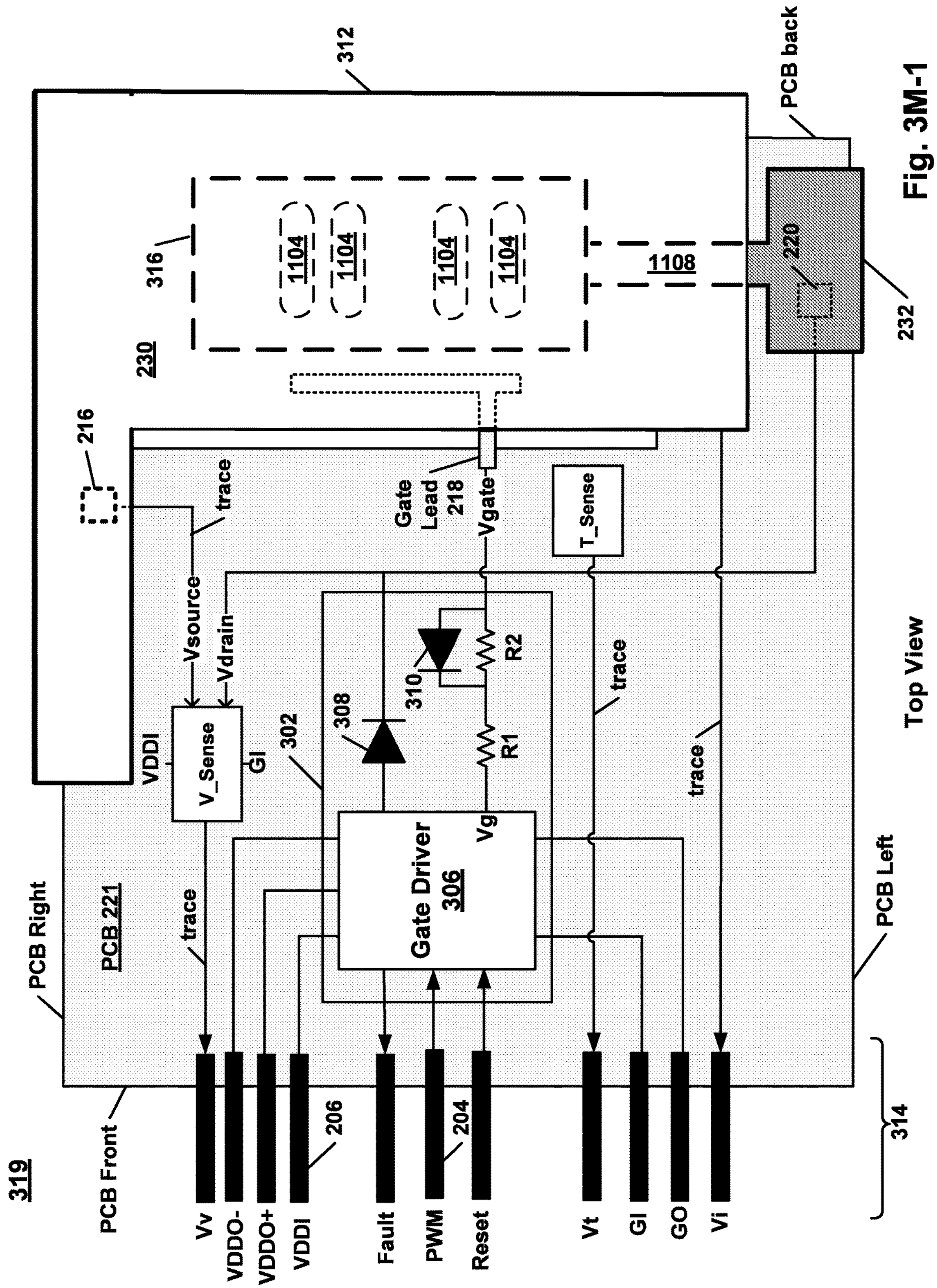
Figures 2, 3M:
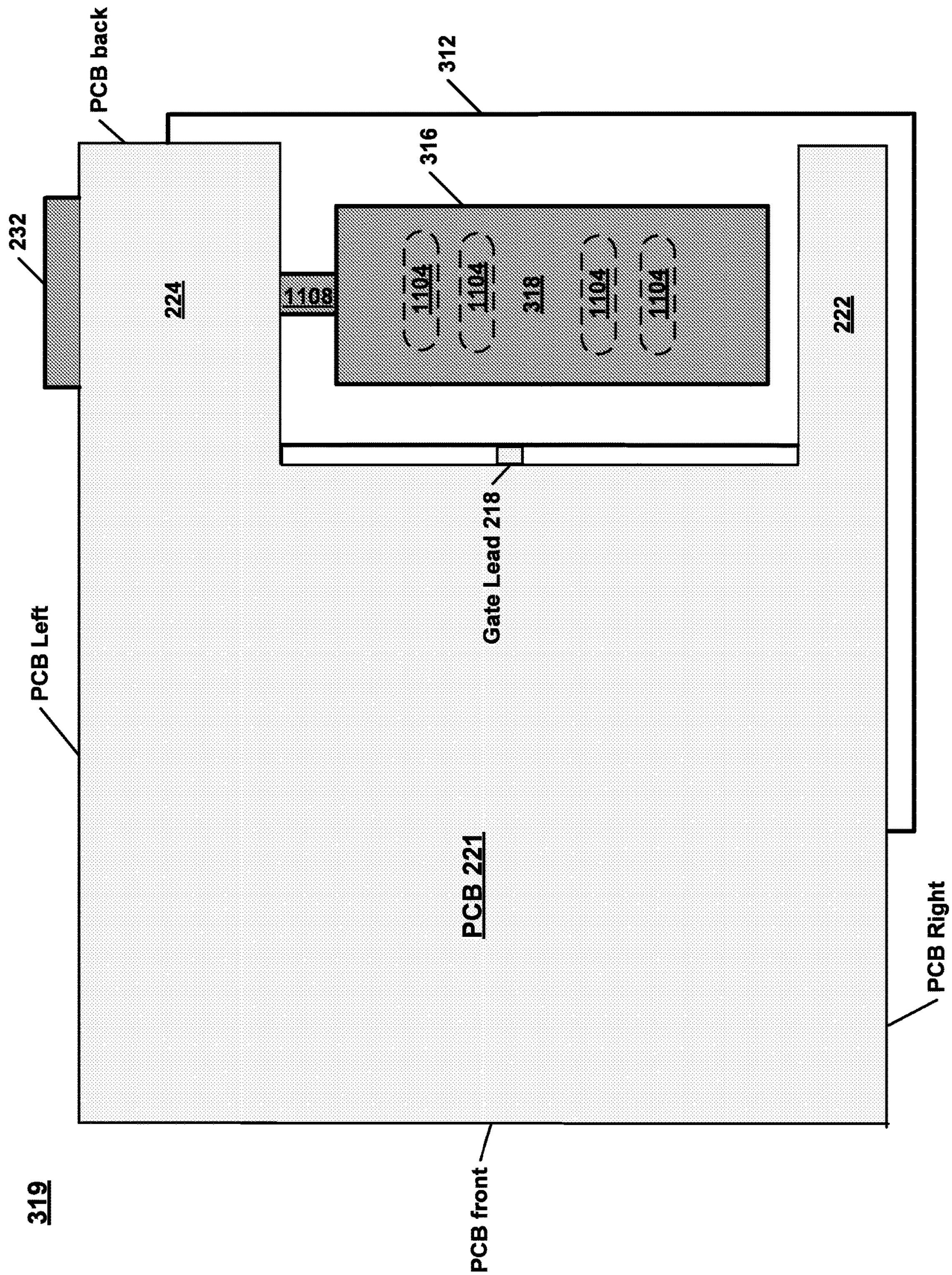
Figures 3, 3M:
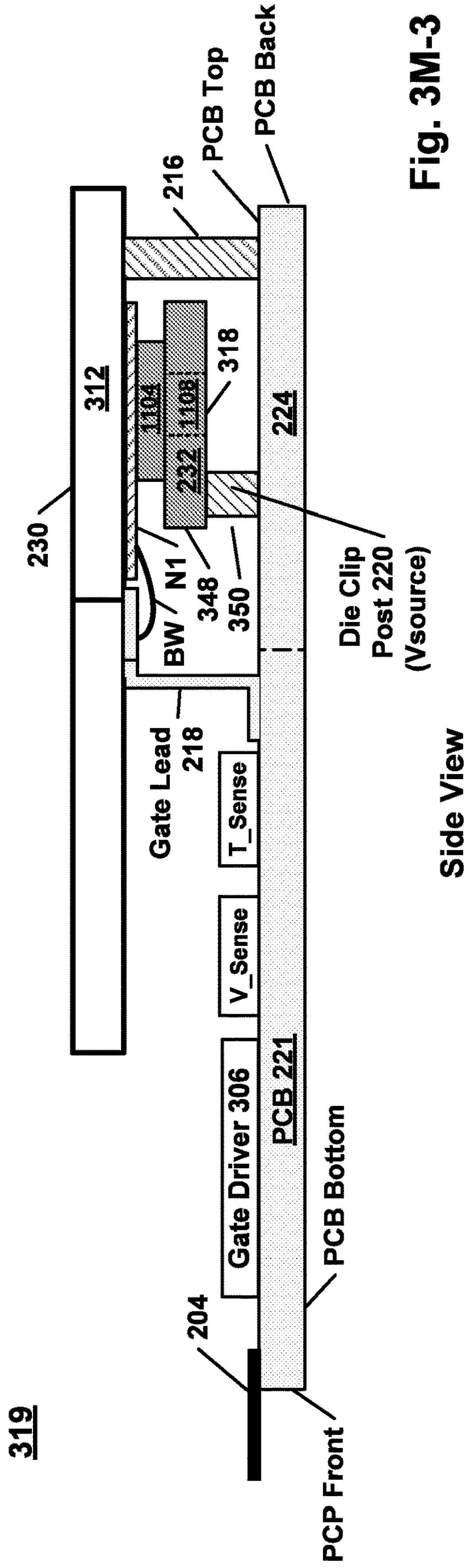
Figures 3, 3M, 4:
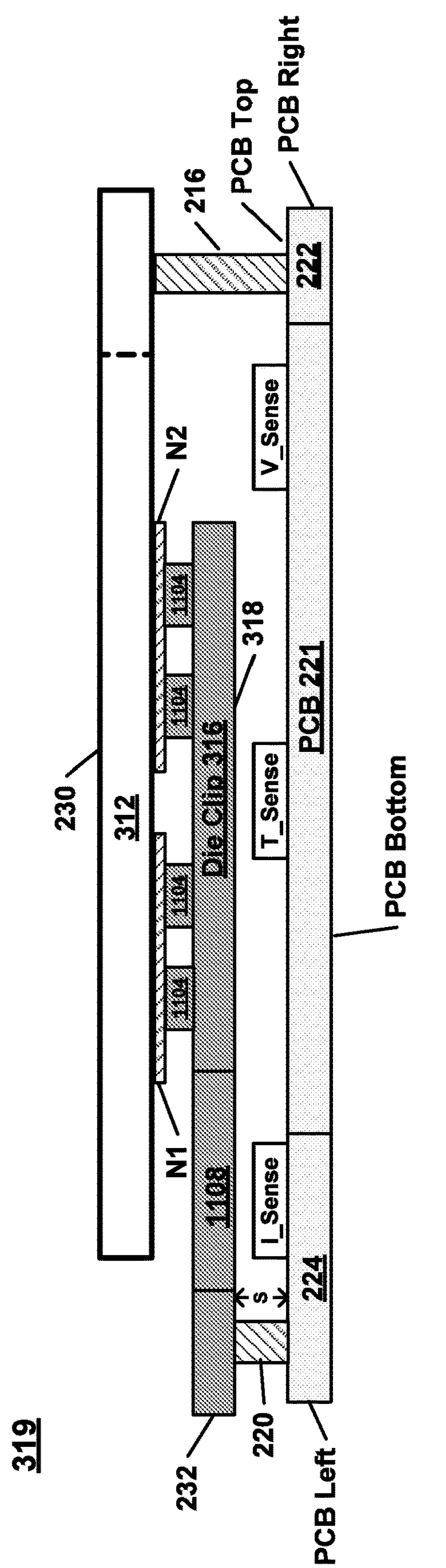
Figures 1, 3N:
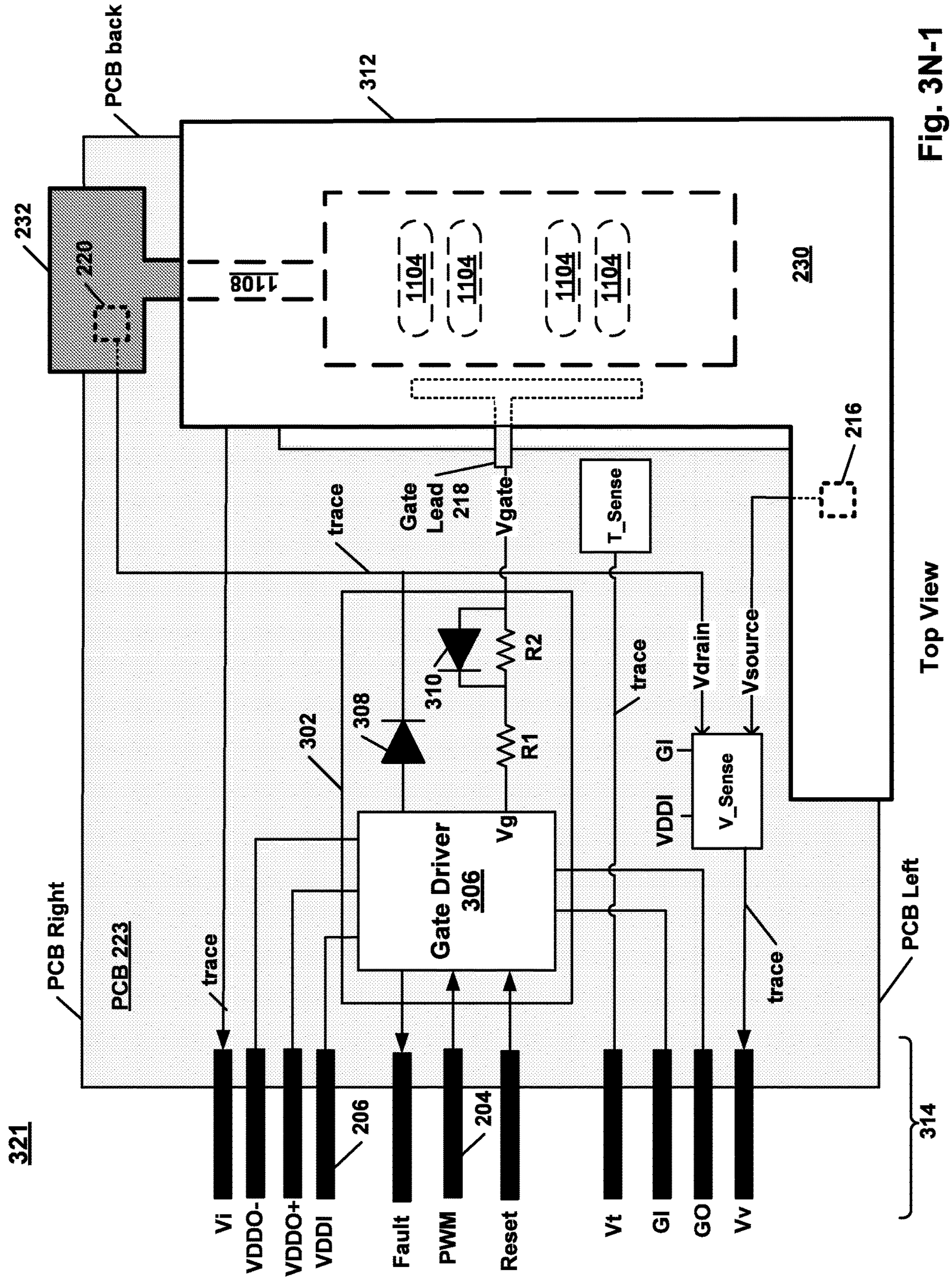
Figures 2, 3N:
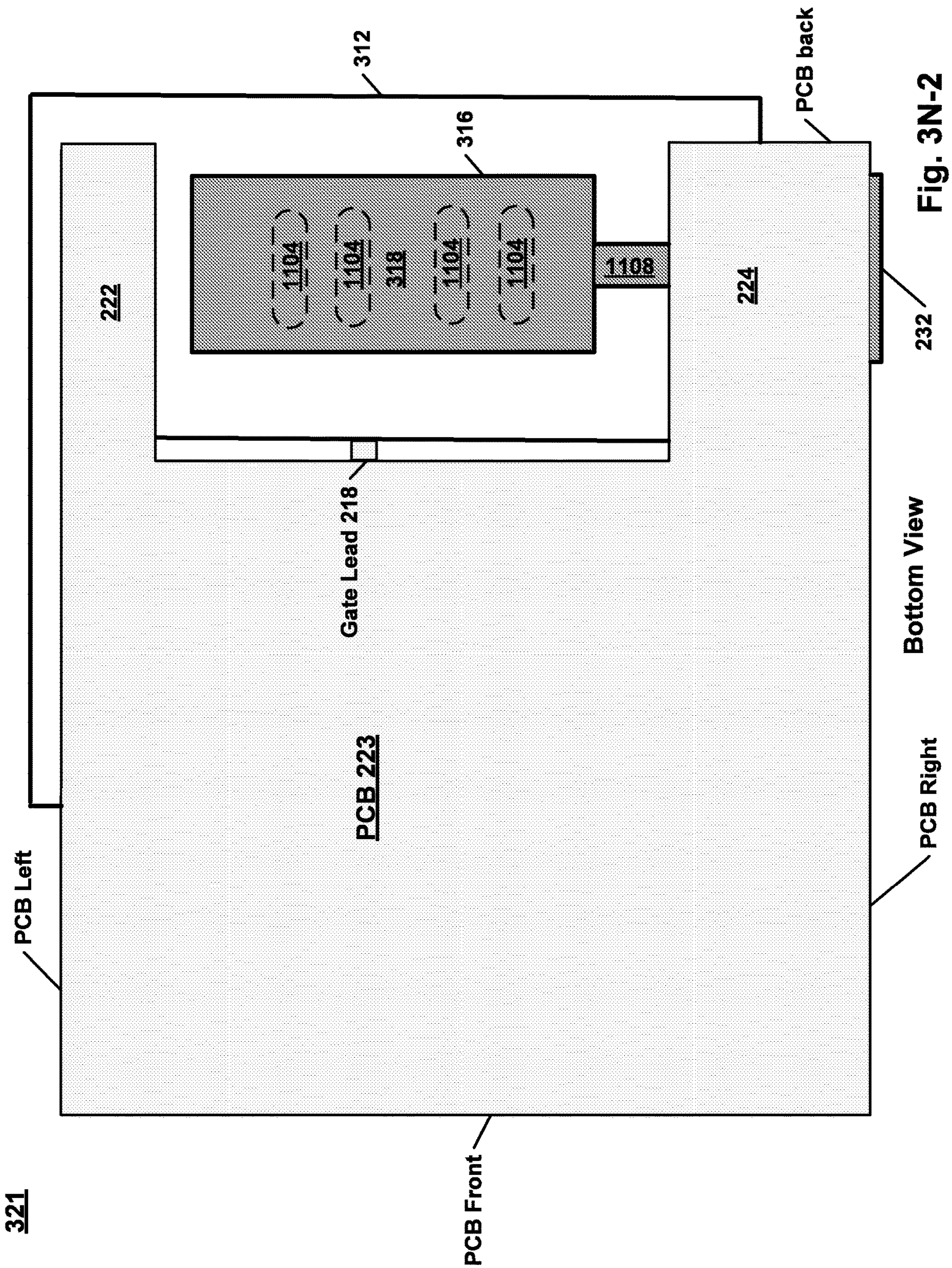
Figures 3, 3N:
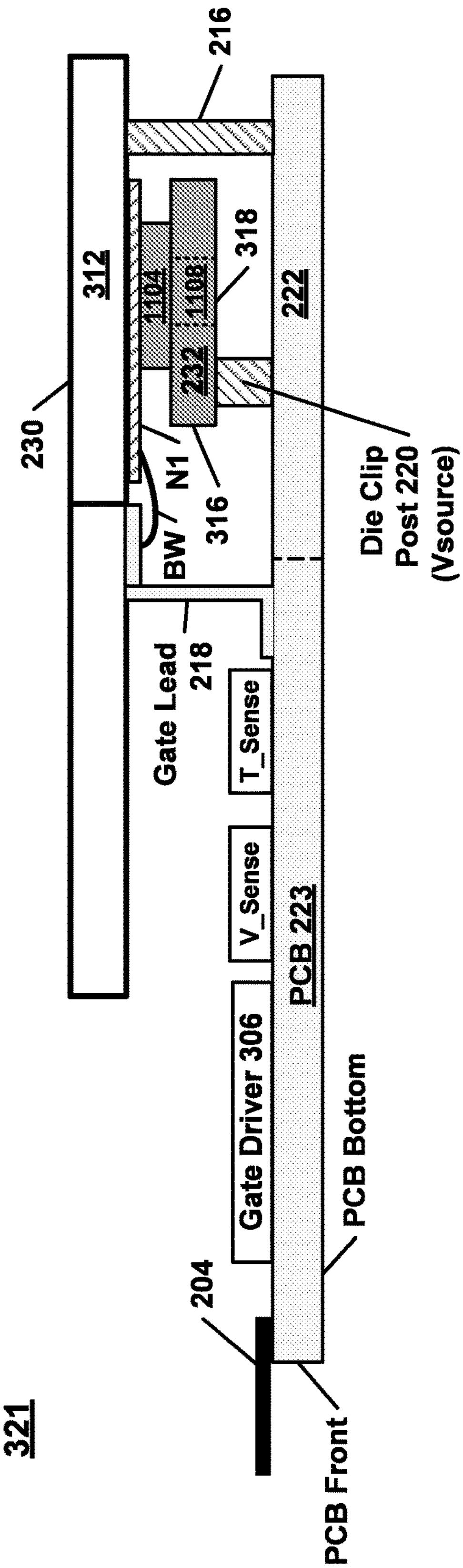
Figures 3, 3N, 4:
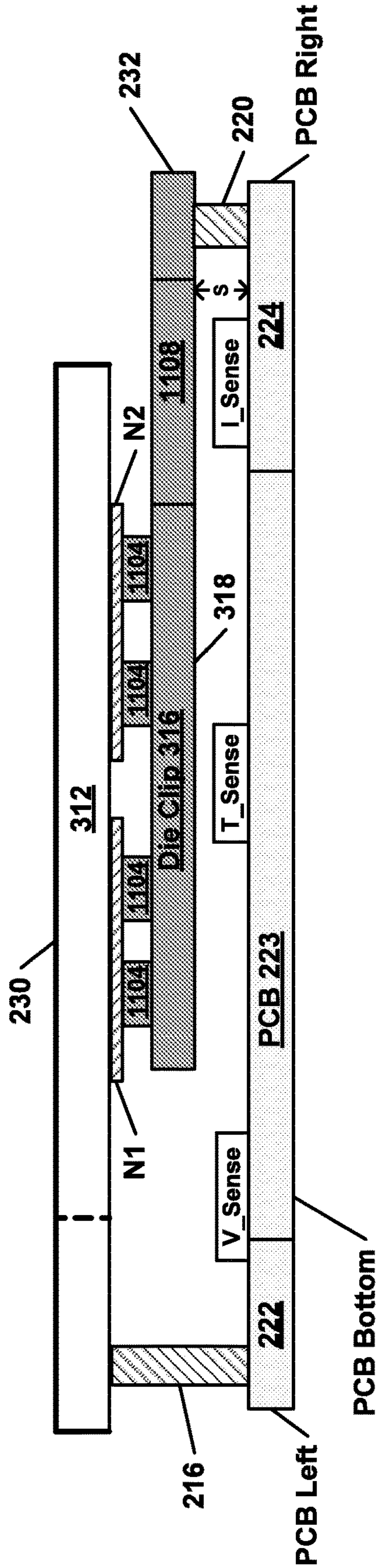

Example gate lead 218 in FIGS. 3K-1-3K-3 can be formed from a thin sheet of metal with first and second extensions that are integrally connected and perpendicular to each other. The first extension includes two end portions integrally connected by a middle portion. The first extension includes two right angle joints that connect the two end portions to the middle portion. The first end portion may be connected (e.g., soldered) to a trace of PCB 221, which in turn is connected to an output of gate driver 306. The second end portion is connected to the second extension, which in turn is connected to die substrate 312 via an electrically insulating material (not shown). A bond wire BW connects the second extension of gate lead 218 to a gate (not shown) of MOSFET N1 in the figure. A similar bond wire connects the second extension of gate lead 218 to the gate of the other MOSFET N2.

As seen in FIG. 3K-2, PCB 221 has a shape that supports the power stack while exposing die clip terminal 344 through the case of a packaged switch in which it is contained, such as packaged switch 211, so that die clip terminal 344 can be thermally and/or electrically connected to a heat sink or a bus bar that also acts as a heat sink. PCB 221 includes extensions 222 and 224. In the embodiment shown, example die clip support 220 is connected to a trace on extension 224.

Switch Module 307

FIGS. 3L-1-3L-4 shows another switch module 307, which is like switch module 305, but with die clip terminal 232 positioned near the right side of rigid PCB 223. Switch module 307 enables double-side cooling of switch 304 consisting of MOSFETs N1 and N2. Switch module 307 can be used in a packaged switch 209 of FIGS. 3F-1 and 3F-2.

Switch Modules 319 and 321

FIGS. 3K-1-3K-4, and FIGS. 3L-1-3L-4 illustrate switch modules 305 and 307, respectively, that are configured for double-side cooling of switch 304 consisting of MOSFETs N1 and N2. These switch modules have a die clip terminal 344. When encased to create packaged switches, die clip terminal 344 may protrude from the plastic case so that it can be press-fitted against a bus bar or heat sink.

FIGS. 3M-1-3M-4, and FIGS. 3N-1-3N-4 illustrate alternative switch modules that are configured for double-side cooling of switch 304. FIGS. 3M-1-3M-4 show top, bottom, side and back views of example switch module 319, and FIGS. 3N-1-3N-4 show top, bottom, side and back views of example switch module 321.

Switch modules 319 and 321 are substantially like switch modules 305 and 307, respectively. One significant difference exists; die clips 345 are replaced with die clips 316, each of which includes a surface that contains a die clip terminal 318, which can be electrically and thermally connected to a bus bar or heat sink. Switch modules 319 and 321 can be encased in plastic using, for example, transfer molding to create a packaged switch module with die clip terminal 318 recessed below the plastic case. Pedestals of a bus bar or heat sink can extend through an opening of the plastic case so that flat surfaces of these pedestals can be press-fitted, sintered, or connected by other means to corresponding surfaces of die clip terminals 318. The connection between a pedestal and die clip terminal 318 allows heat and/or current to flow between switch 304 and the connected heat sink or bus bar that also acts as a heat sink. Before switch modules 319 and 321 are encased in plastic, recesses in die clip 316 that were formed when pedestals 1104 are punched out can be filled with an electrically and thermally conductive material, as noted below, to enhance heat and electric current flow between switch 304 and the bus bar or heat sink to which the switch is connected via die clip 316 and terminal 318.

Switch Module 376

Some packaged switches, such as packaged switches 247*s* and 247*d* shown in FIGS. 2D-1 and 2E-1, respectively, have switch modules that lack a switch controller and certain other components such as V_Sense, I_Sense, and V_Sense. With continuing reference to FIGS. 2D-1 and 2E-1, FIGS. 3P-1-3P-11 illustrate an assembly of components to form example switch modules that can be employed in packaged switch 247*d* or 247*s*.

Figures 1, 3P:
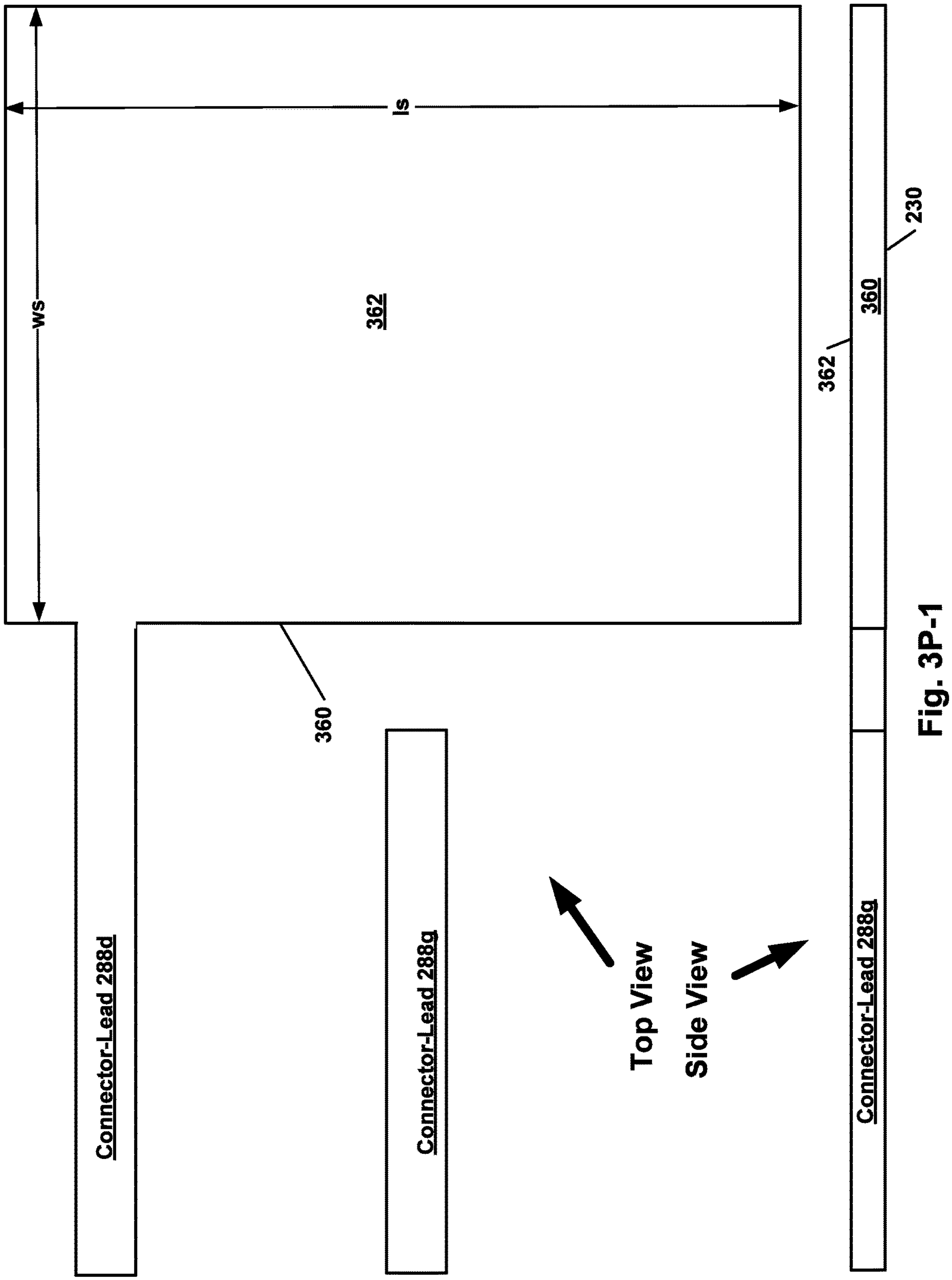
Figures 2, 3P:
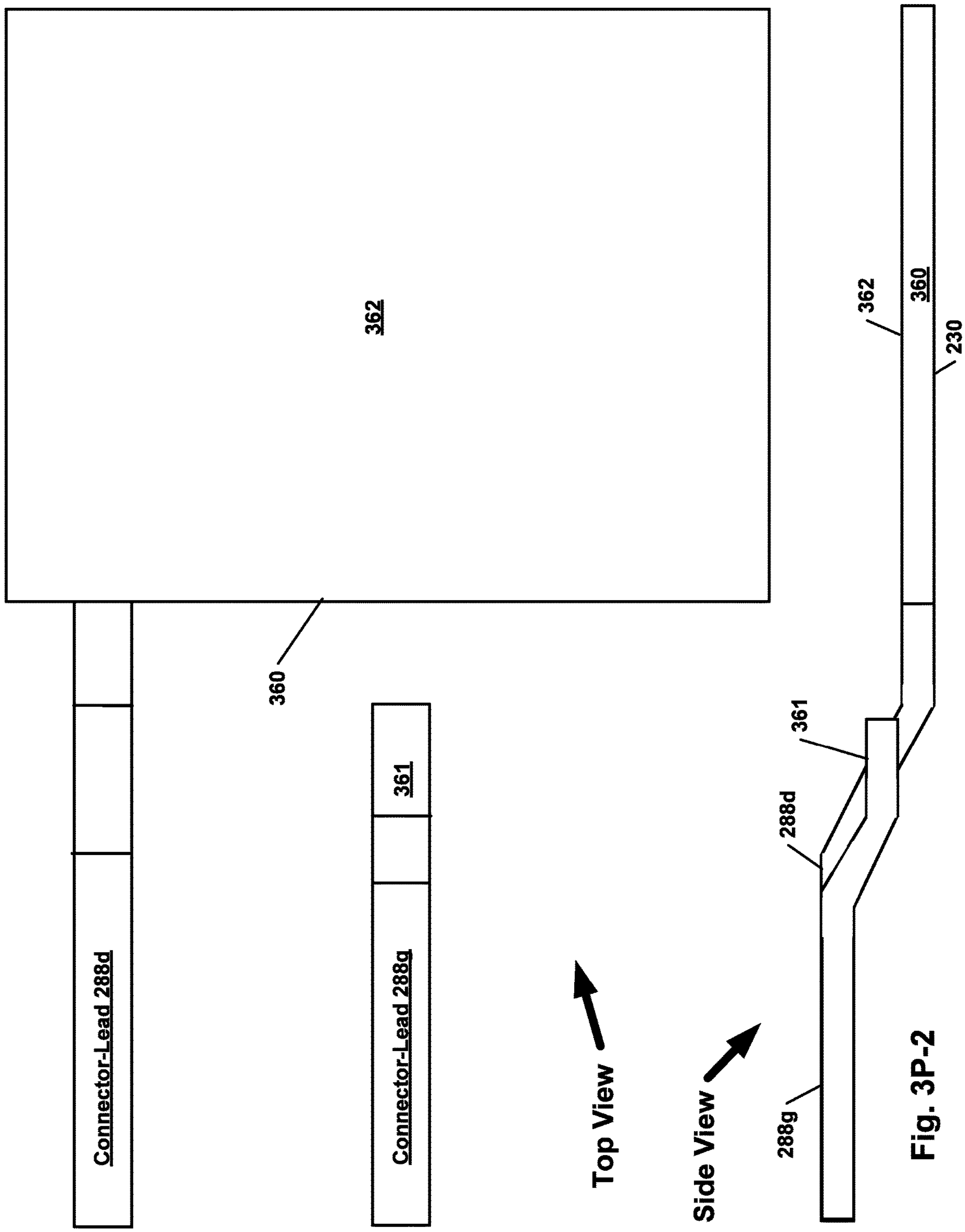
Figures 3, 3P:
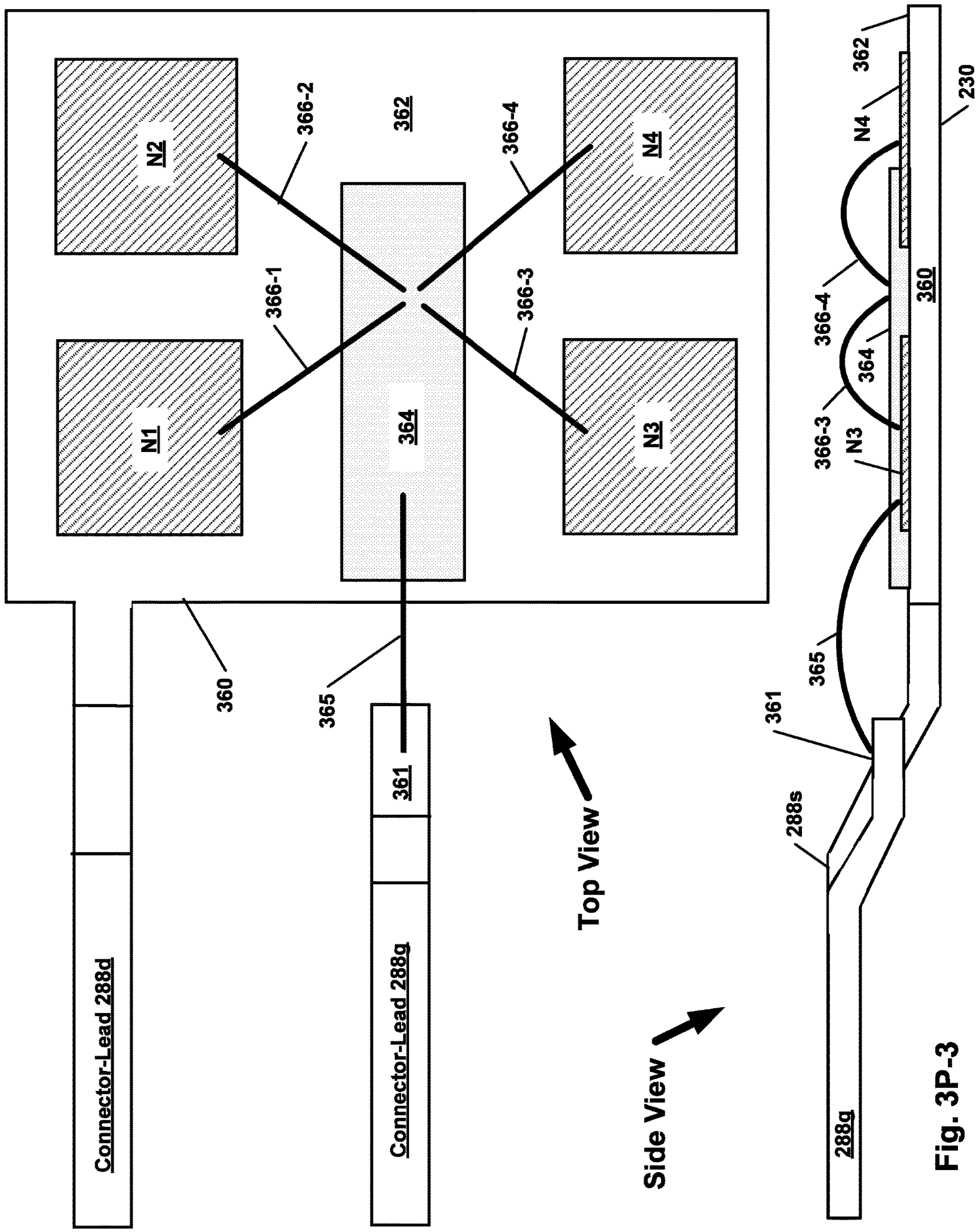
Figures 3, 3P, 4:
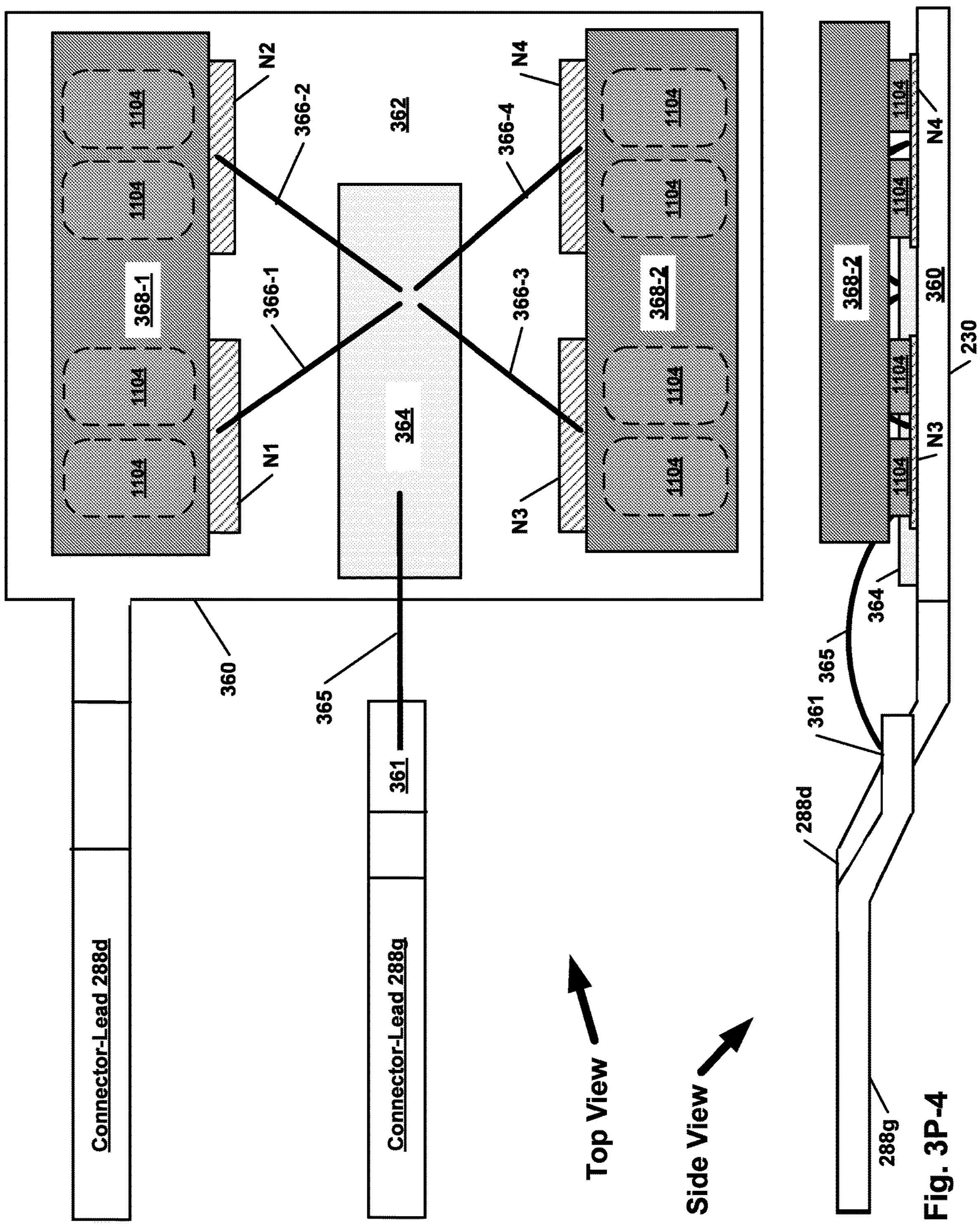
Figures 3, 3P, 4, 5:
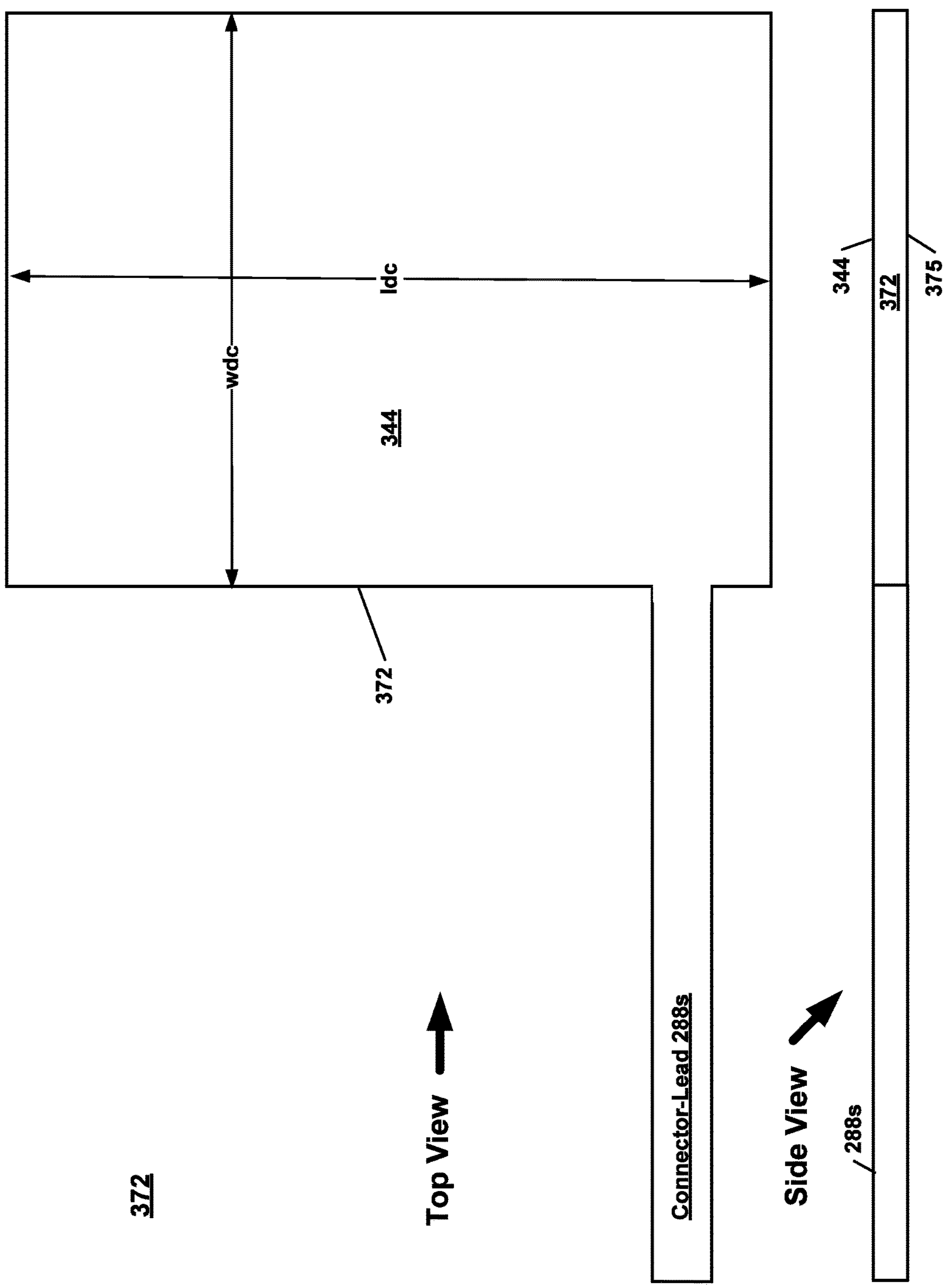
Figures 3, 3P, 4, 5, 6:
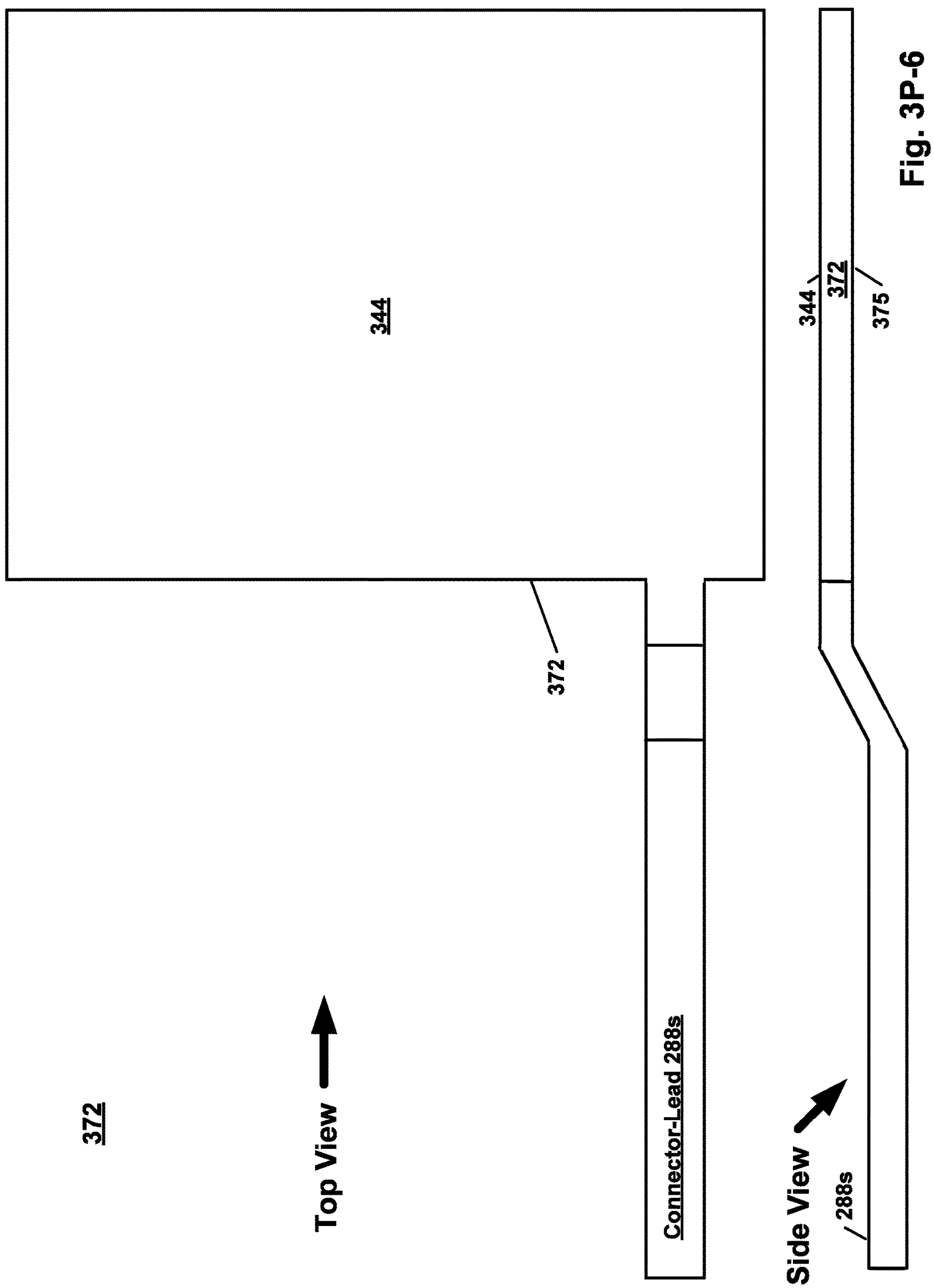
Figures 3, 3P, 4, 5, 6, 7:
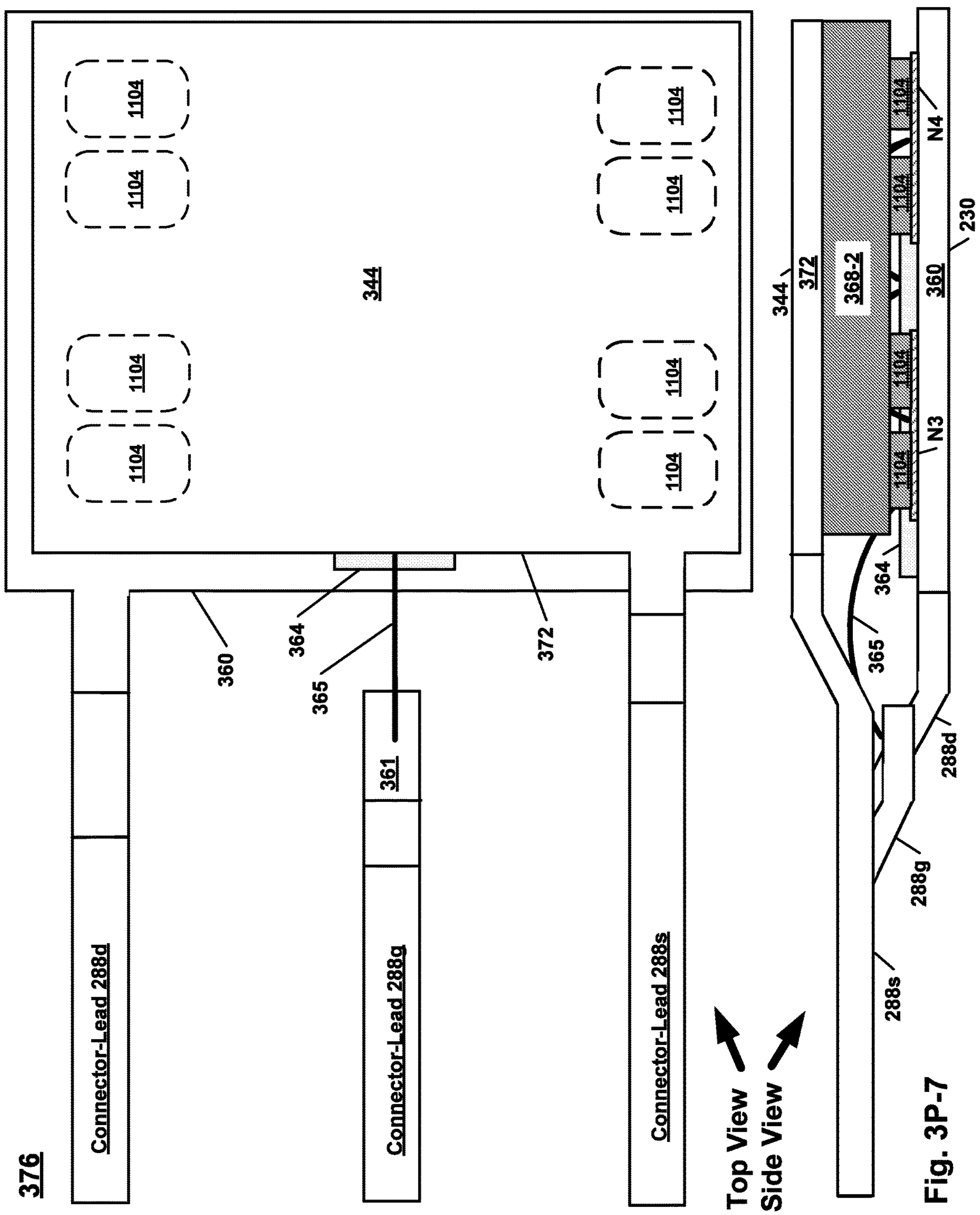
Figures 3, 3P, 4, 5, 6, 7, 8:
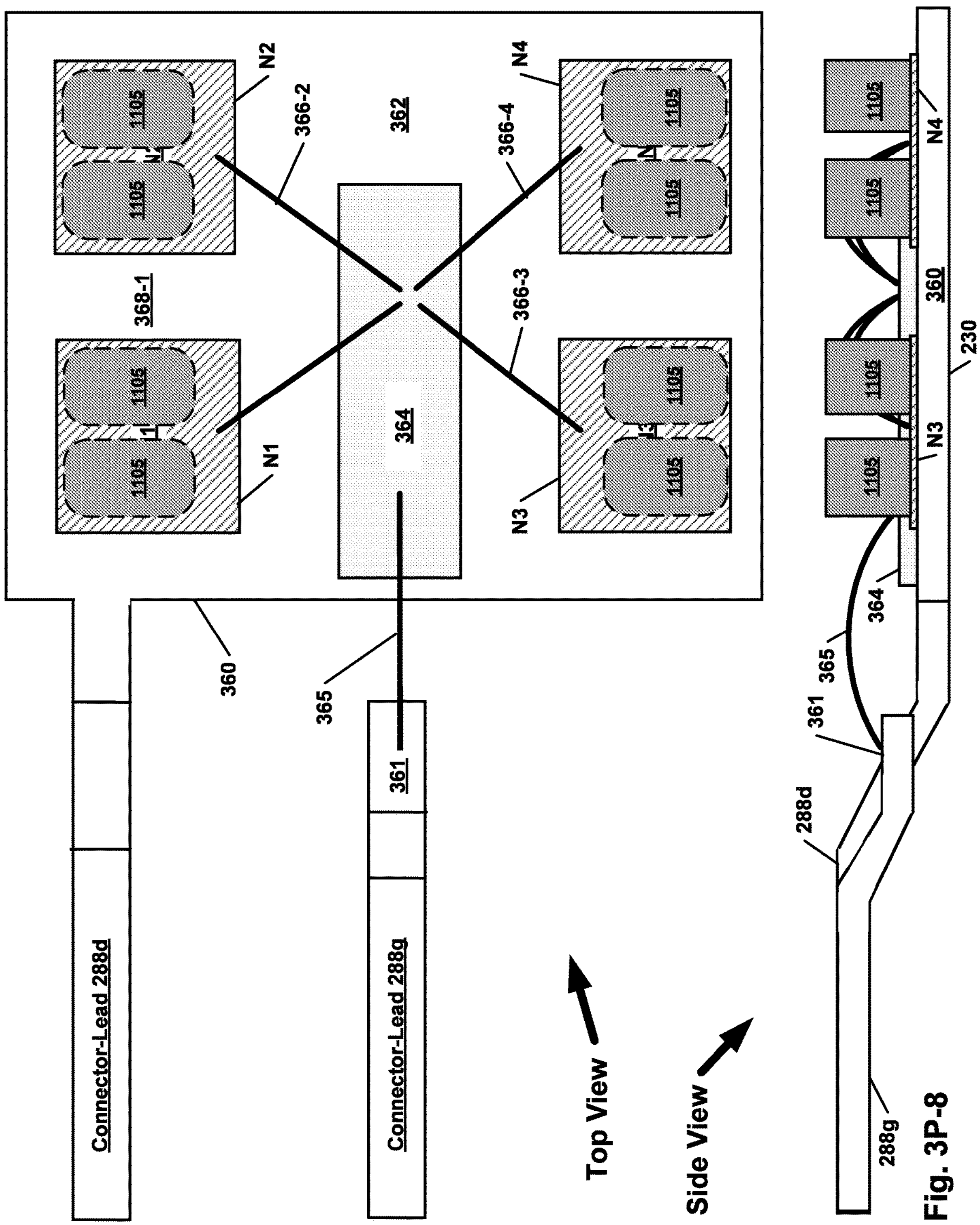
Figures 3, 3P, 4, 5, 6, 7, 8, 9:
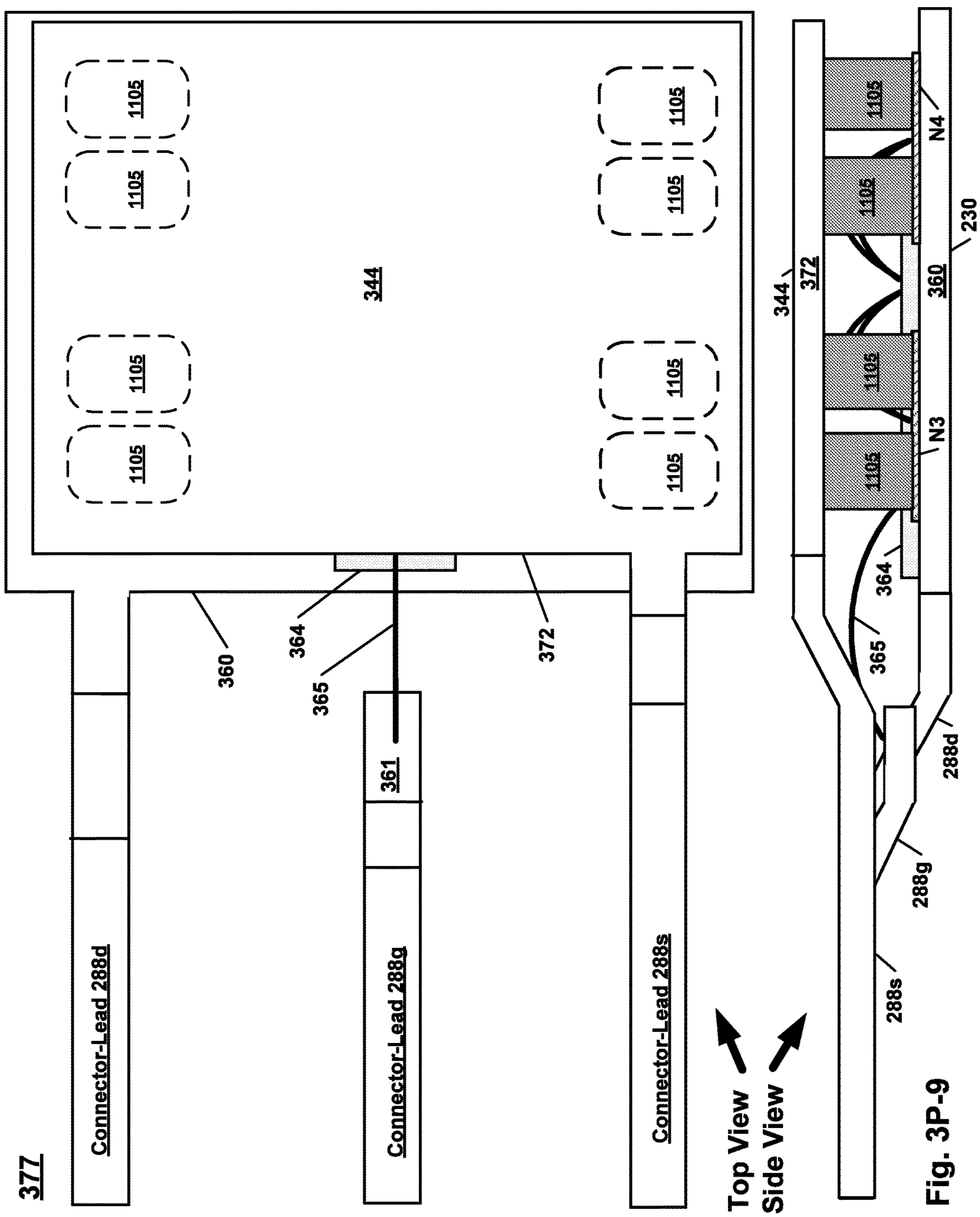
Figures 3, 3P, 4, 5, 6, 7, 8, 9, 10:
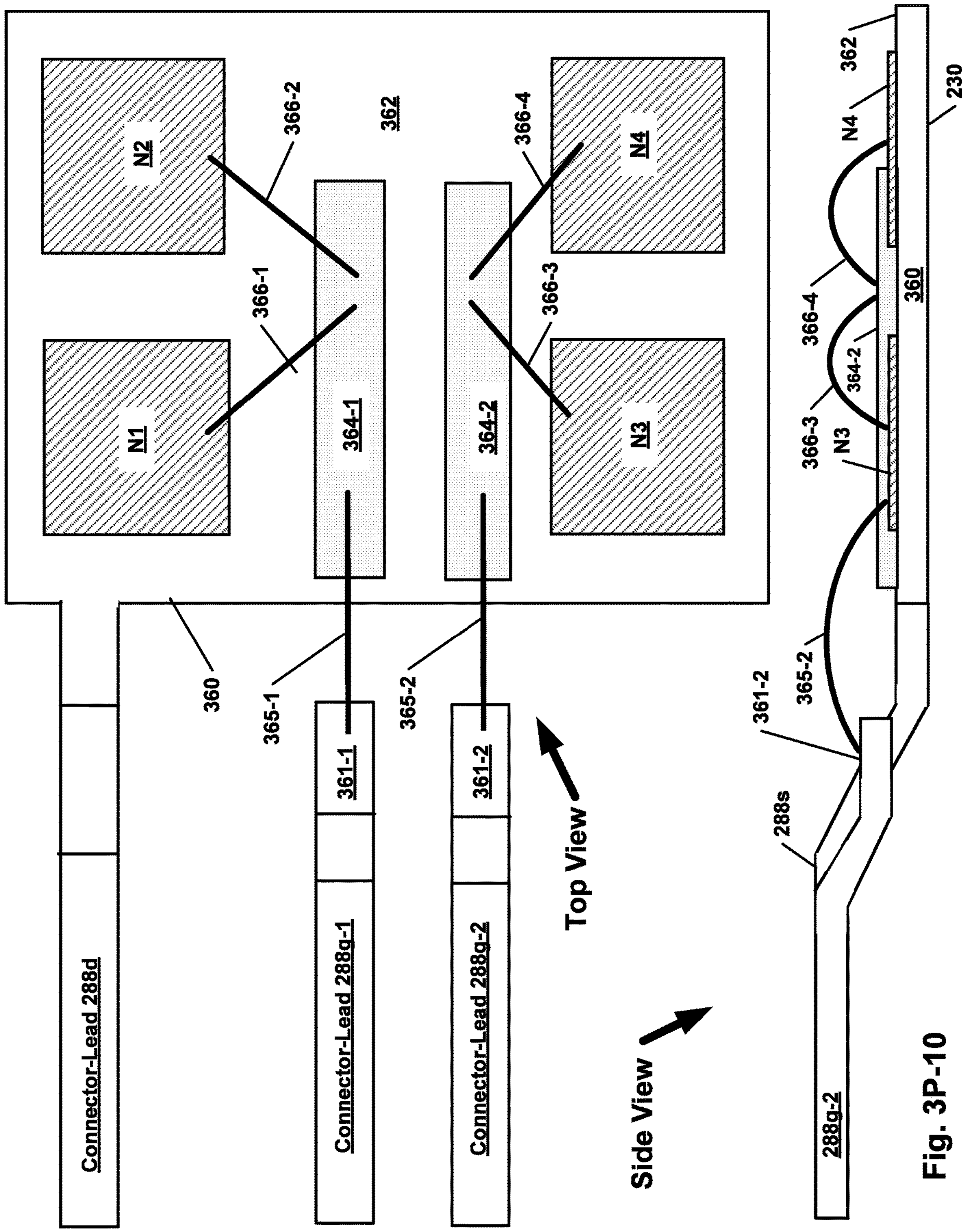
Figures 3, 3P, 4, 5, 6, 7, 8, 9, 10, 11:
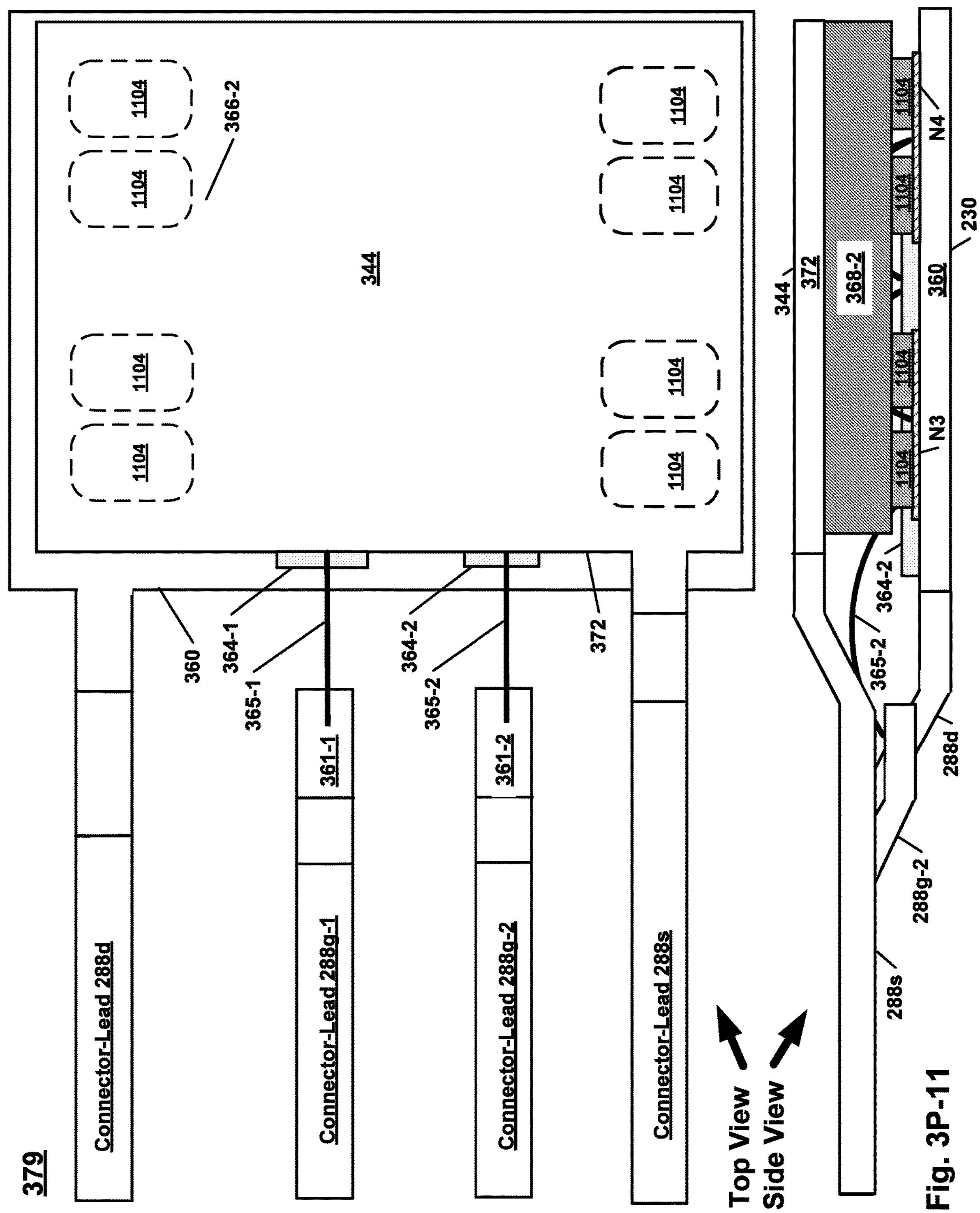

FIG. 3P-1 shows top and side views of an example die substrate 360 and an example connector-lead 288*g*, each of which can be formed (e.g., stamped, cut, etc.) from a thin sheet (e.g., 0.1 mm-2.0 mm) of composite or layered materials that include a thin layer of molybdenum between thin layers of copper. Connector-lead 288*d* is integrally connected to die substrate 360. In another embodiment, connector-lead 288*s* can be attached (e.g., soldered) to die substrate 360. Die substrate 360 includes oppositely facing, substantially flat surfaces, one of which is designated 362 while the other contains die substrate terminal 230. In one embodiment, die substrate 360 has a width ws=13.5 mm, and a length ls=16.5 mm. In one embodiment, gate connector lead 288*g* has a width wgl=1.2 mm, and length lgl=20 mm. Connector-lead 288*g* is contained in the same plane as connector-lead 288*d* in FIG. 3P-1. Both connector-lead 288*g* and die clip 360 are presumed to be 1.0 mm thick. Connector-leads 288*d* and 288*g* are similarly shaped in FIG. 3P-1. FIG. 3P-2 shows connector-leads 288*d* and 288*g* after they are bent. Bond pad 361 provides a surface area where a bond wire can electrically connect connector-lead 288*g* to a gate lead more fully described below.

FIG. 3P-3 shows the structures of FIG. 3P-2 after an example switch, gate lead 364, bond wire 365, and bond wires 366 are added. The example switch is attached to flat surface 362 and includes four transistors (e.g., SiC MOSFETs) N1-N4, it being understood the fewer or more transistors can be employed in alternative embodiments. First current terminals (e.g., drains) of each of the transistors N1-N4 can be soldered, brazed, sintered, or attached using another method to surface 362 of die substrate 360. Thin gate lead 364, which can be formed of a conductive metal such as copper, can also be attached to surface 362 through an electrically insulating layer (not shown). Bond wires 366 of substantially equal length electrically connect gate lead 364 to respective gates (not shown) of N1-N4. In an alternative embodiment multiple sets of equal length bond wires connect gate-lead 364 to respective gates, each set having two or more bond wires. Connector-lead 288*g* is electrically connected to gate lead 364 through bond wire 365, one end of which is attached to bond pad 361. In an alternative embodiment multiple bond wires 365 connect gate lead 364 to bond pad 361.

FIG. 3P-4 show the structure of FIG. 3P-3 after bridges 368 are added. Bridges 368 can be formed from materials that are conducive to forming strong sintering connections to transistors N1-N4 and to a die clip. Bridges 368 can include pedestals, such as pedestals 1104. Flat ends of pedestals 1104 can be soldered, welded, sintered, or attached using a different method to second current terminals (e.g., sources) of transistors N1-N4. For purposes of explanation only, each of the transistors N1-N4 have a pair of second current terminals, it being understood that transistors may have fewer or more than two current terminals. The flat ends of pedestals 1104 may be plated with a material that enhances a sintering connection to the second current terminals of transistors N1-N4. Bridges 368 can be electrically and thermally attached (e.g., sintered) to a die clip as will more fully described below.

Example bridges 368 can be formed (e.g., stamped, cut, etc.) from a thin sheet (e.g., 0.1 mm-8.0 mm) of metal (e.g., copper), composite, or layered materials (e.g., a layer of molybdenum between layers of copper). In another embodiment, bridges 368 can be 3D printed, extruded, etc. Pedestals 1104 may be formed using a punch press or other tool. If punch pressed, the voids left behind can be filled with an electrically and thermally conductive material to create a substantially flat surface that can be attached to a die clip. Alternatively, pedestals 1104 can be soldered, brazed, sintered, or attached to bridge 368 using another method.

Pedestals 1104 should have uniform thickness, and they should extend perpendicularly from a bottom surface of bridge 368 as shown with a length that can be half the thickness, or less, of bridge 368. The end surfaces of pedestals 1104 can be sintered to respective second current terminals of the transistors N1-N4. The end surfaces of pedestals 1104 should be substantially flat with a shape (e.g., substantially rectangular) and size (e.g., 2.5 mm×4 mm) that are substantially like, but slightly smaller than shape and size of the substantially flat surfaces of respective second current terminals to which they are electrically and thermally attached. This ensures that pedestals 1104 do not contact transistors N1-N4 outside the areas occupied by the second current terminals. Also, wide-end surface of pedestals 1104 should more evenly distribute any mechanical stress, thereby reducing risk of transistor fracture.

FIG. 3P-5 shows top and side views of an example die clip 372 and an example connector-lead 288*s* which can be formed (e.g., stamped, cut, etc.) from a thin sheet (e.g., 0.1 mm-2.0 mm) of composite or layered materials. Connector-lead 288*s* is integrally connected to die clip 372. In another embodiment, connector-lead 288*s* can be attached (e.g., soldered) to die clip 372. FIG. 3P-6 shows die clip 372 after connector-lead 288*s* is bent. Die clip 372 includes oppositely facing, substantially flat surfaces 344 and 375. Surface 344 defines die a clip terminal that is configured for thermal and electrical connection to a device such as a bus bar as will be more fully described below. In one embodiment, die clip 372 has a width wdc=7 mm, and a length ldc=17 mm.

FIG. 3P-7 show top and views of the structure (i.e., switch module 376) shown in FIG. 3P-4 after example die clip 372 of FIG. 3P-6 is attached to bridges 368. Specifically flat surface 375 of die clip 372 can be soldered, welded, sintered, or attached by another method to bridges 368. Surface 375 may be plated with a material that enhances a sintered connection to bridges 368.

After die clip 372 is attached to bridges 368, a case can be formed around switch module 376 using, for example, transfer molding, to create for example packaged switch 247*s* shown in FIGS. 2D-1 and 2D-2. Or a case can be formed around switch module 376 to create packaged switch 247*d* shown in FIGS. 2E-1 and 2E-2.

In FIG. 3P-4, bridges 368 were added to the structure shown in FIG. 3P-3 to enable an electrical and thermal connection to die clip 372 as shown in FIG. 3P-7. In another embodiment pedestals can be added to the structure shown in FIG. 3P-3 to enable an electrical and thermal connection to die clip 372. FIG. 3P-8 show the structure of FIG. 3P-3 after pedestals 1105 made of a metal (e.g., copper), composite or layered materials are added. Except for the height, which may be greater, pedestals 1105 of FIG. 3P-8 may are substantially similar in size and construction to pedestals 1104 shown in FIG. 3P-4. Flat ends of pedestals 1105 can be soldered, welded, sintered, or attached using a different method to second current terminals (e.g., sources) of transistors N1-N4. The flat ends of pedestals 1105 can be plated with a material to enhance a sintering connection to the second current terminals of transistors N1-N4. Opposite flat ends of pedestals can be electrically and thermally attached (e.g., sintered) to die clip 372 as will more fully described below. The opposite ends of pedestals 1105 can be plated with a material to enhance a sintering connection to die clip 372. FIG. 3P-9 show top and side views of the structure (i.e., switch module 377) shown in FIG. 3P-8 after example die clip 372 of FIG. 3P-6 is attached to pedestals 1104. Specifically flat surface 375 of die clip 372 can be soldered, welded, sintered, or attached by another method to pedestals 1105 Surface 375 may be plated with a material that enhances a sintered connection to pedestals 1105

In FIG. 3P-3 the gates of transistors N1-N4 are electrically connected to gate lead 364. In an alternative embodiment, gates of transistors in a switch can be electrically connected to separate gate leads. FIG. 3P-10 shows a pair of gate leads 364-1 and 364-2 attached to the surface 362 of the die substrate 360 in FIG. 3P-2 through electrically insulating layers (not shown). Gate leads 364-1 and 364-2 are thinner than gate lead 364. Otherwise, gate leads 364-1 and 364-2 are substantially like gate lead 364. FIG. 3P-10 also shows a pair connector-leads 288*g*-1 and 288*g*-2 that are electrically connected to gate leads 364-1 and 364-2, respectively, by bond wires 365-1 and 365-2, respectively. Connector-leads 288-1 and 288-2 are substantially like connector-lead 288. Bond wires 366-1 and 366-2 of substantially equal length electrically connect gate lead 364-1 to respective gates (not shown) of N1 and N2. Bond wires 366-3 and 366-4 of substantially equal length electrically connect gate lead 364-2 to respective gates (not shown) of N3 and N4. Bridges 368 and die clip 372 can be added to the structure shown in FIG. 3P-10 to create switch module 379 shown in FIG. 3P-11.

Example Packaged Half Bridges

Packaged Half Bridge 250

In general, packaged half bridges may include a pair of switch modules such as a pair of switch modules 300. The pairs in a packaged half bridge need not be identical. For example, a packaged half bridge may contain a switch module 300 and a switch module 303.

Figures 1, 4A:
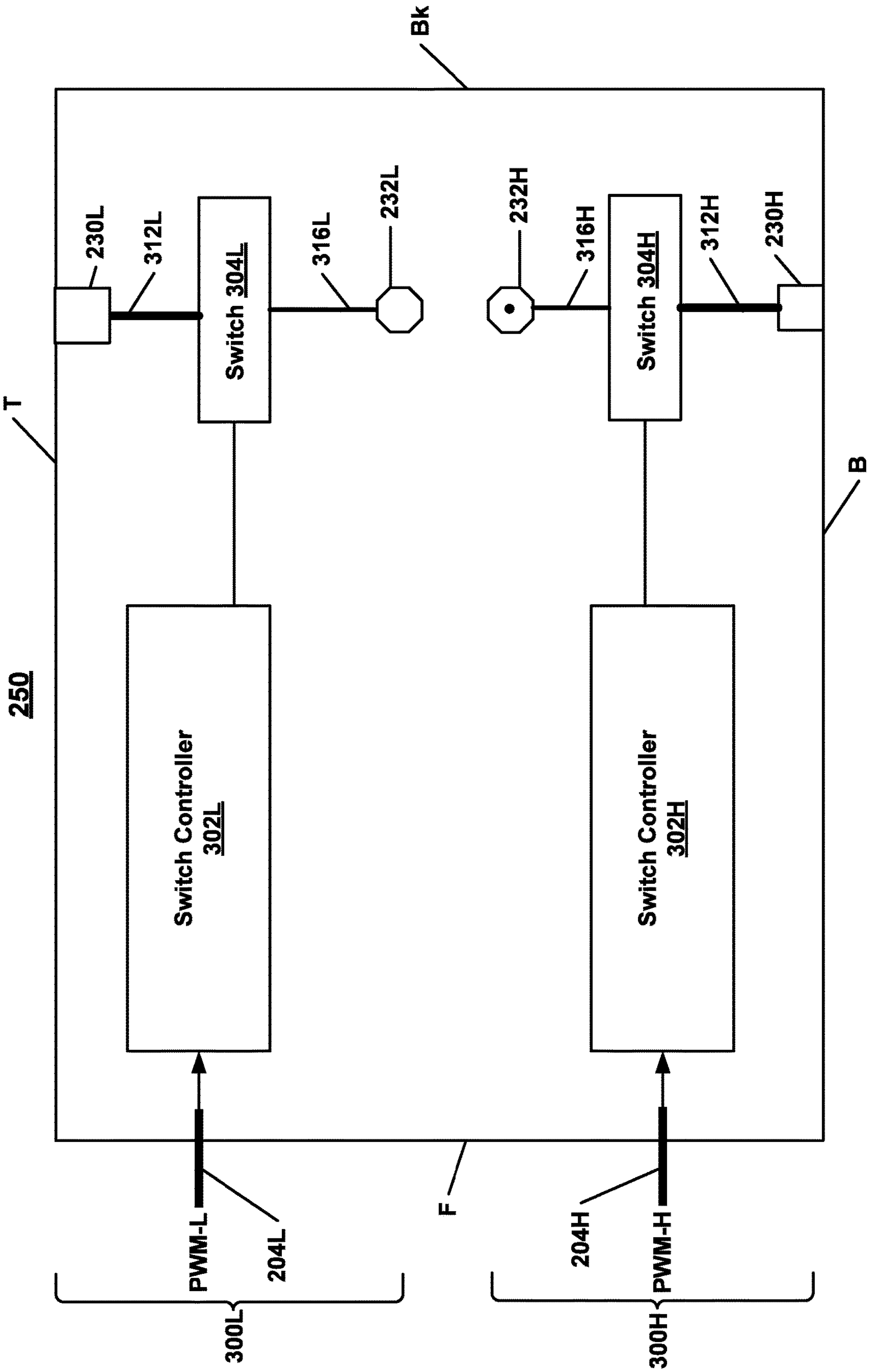
Figures 2, 4A:
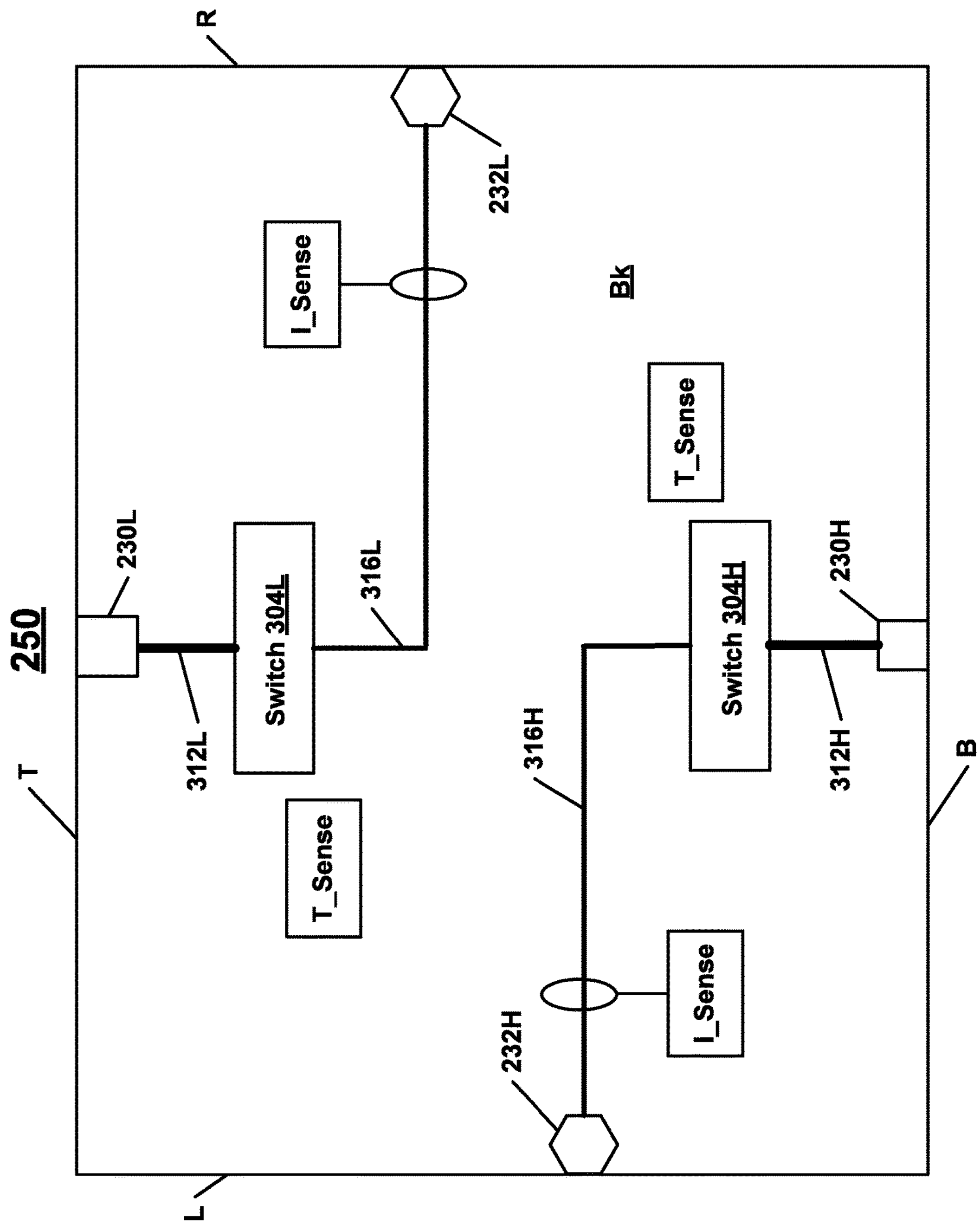

With continuing reference to FIGS. 2B-1-2B-3, FIGS. 4A-1-4A-3 are quasi-schematic diagrams of example packaged half bridge 250 that show several components thereof. Packaged switch 250 is shown in FIGS. 4A-1 and 4A-2 with transparent case 252 to enable a better understanding of switch module components, their interaction, and their relative placement. FIGS. 4A-1 and 4A-2 show relative positions of certain components of packaged half bridge 250 when looking from the side and back, respectively.

Packaged half bridge 250 contains two switch modules 300 of FIG. 3A-1, 3G-1, or 3I-1. More particularly packaged half bridge 250 includes high-side switch module 300H and low-side switch module 300L. The switch modules are facing away from each other inside packaged half bridge 250; high-side switch module 300H is flipped relative to low-side switch module 300L and positioned below it before the combination is substantially encased in a mold compound such as epoxy resin using, for example, transfer molding. In an alternative embodiment components of high-side module 300H are connected to traces provided on one side of a rigid PCB, while components of low-side module 300L are connected to traces provided on the opposite facing side of the rigid PCB.

FIGS. 4A-1 and 4A-2 illustrate relative positioning of certain components of half bridge 250 with respect to each other. Die substrates 312, switches 304, and die clips 316 are vertically stacked as shown between the top T and bottom B. Switch controllers 302 are likewise vertically stacked as shown between the top T and bottom B. Switch controllers 302 are positioned near the front F of packaged half bridge 250, while the power stacks, which include switches 304, are positioned near the back Bk. Die substrate terminals 230L and 230H are accessible through the top and bottom surfaces, respectively, of packaged half bridge 250, and die clip terminals 232H and 232L are accessible through the left and right-side surfaces, respectively, of packaged half bridge 250. Die substrate terminals 230L and 230H are positioned in the figures to indicate they are flush with the top T and bottom B surfaces, respectively, and die clip terminals 232L and 232H are positioned in FIG. 4A-2 to indicate they are flush with the right R and left L side surfaces, respectively. For ease of illustration, side-terminals 242 are not shown.

High-side switch 304H is electrically and thermally connected to high-side die substrate 312H, which has die substrate terminal 230H for making an electrical and/or thermal connection to a device external to packaged half bridge 250. For example, terminal 230H can be electrically and/or thermally connected to a V+ bus bar. High-side switch 304H is also electrically and thermally connected to high-side die clip 316H, which has terminal 232H for making an electrical and/or thermal connection to a device external to packaged half bridge 250. For example, terminal 232H can be electrically and/or thermally connected to a surface of a C-shaped phase bus bar. Low-side switch 304L is electrically and thermally connected to low-side die substrate 312L, which has terminal 230L for making an electrical and/or thermal connection to a device external to packaged half bridge 250. For example, the low-side die substrate terminal 230L can be electrically and/or thermally connected to the same C-shaped conductor phase bus bar to which high-side die clip terminal 232H is connected, or low-side die substrate terminal 230L can be electrically and/or thermally connected to a heat sink. Low-side switch 304L is electrically and thermally connected to die clip 316L, which has terminal 232L for making an electrical and/or thermal connection to a device external to the packaged half bridge 250. For example, terminal 232L can be electrically and/or thermally connected to a V− bus bar.

The high-side switch 304H and low-side switch 304L of a packaged half bridge are presumed to be substantially identical in the illustrated embodiments. In another embodiment, switches 304H and 304L may be substantially different. For example, the high-side switch 304H may take form in one or more MOSFETS, while the low-side switch 304L may take form in one or more JFETs, or vice-versa. Or the high-side switch 304H may include one or more SiC based transistors, while the low-side switch 304L may include one or more GaN based transistors, or vice-versa. In still another embodiment, the number of transistors employed in the high-side switch 304H may be different than the number of transistors in the low-side switch 304L. Combinations of the differences in the high-side and low-side switches mentioned above are also contemplated. For example, the high-side switch 304H may take form in two SiC MOSFETs, while the low-side switch 304L may include three Si IGBTs, or vice-versa.

Packaged Half Bridge 251

Figures 1, 4B:
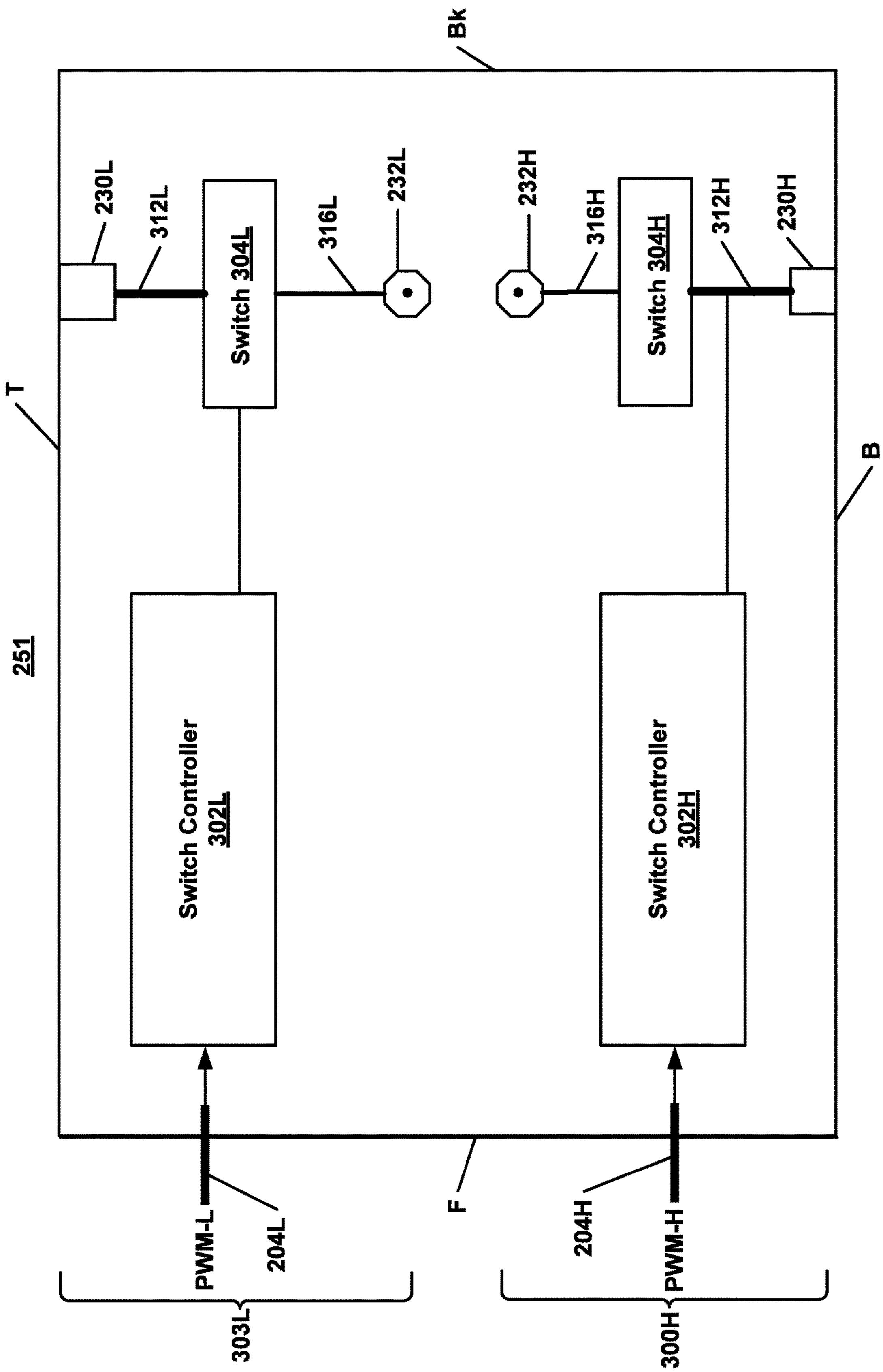
Figures 2, 4B:
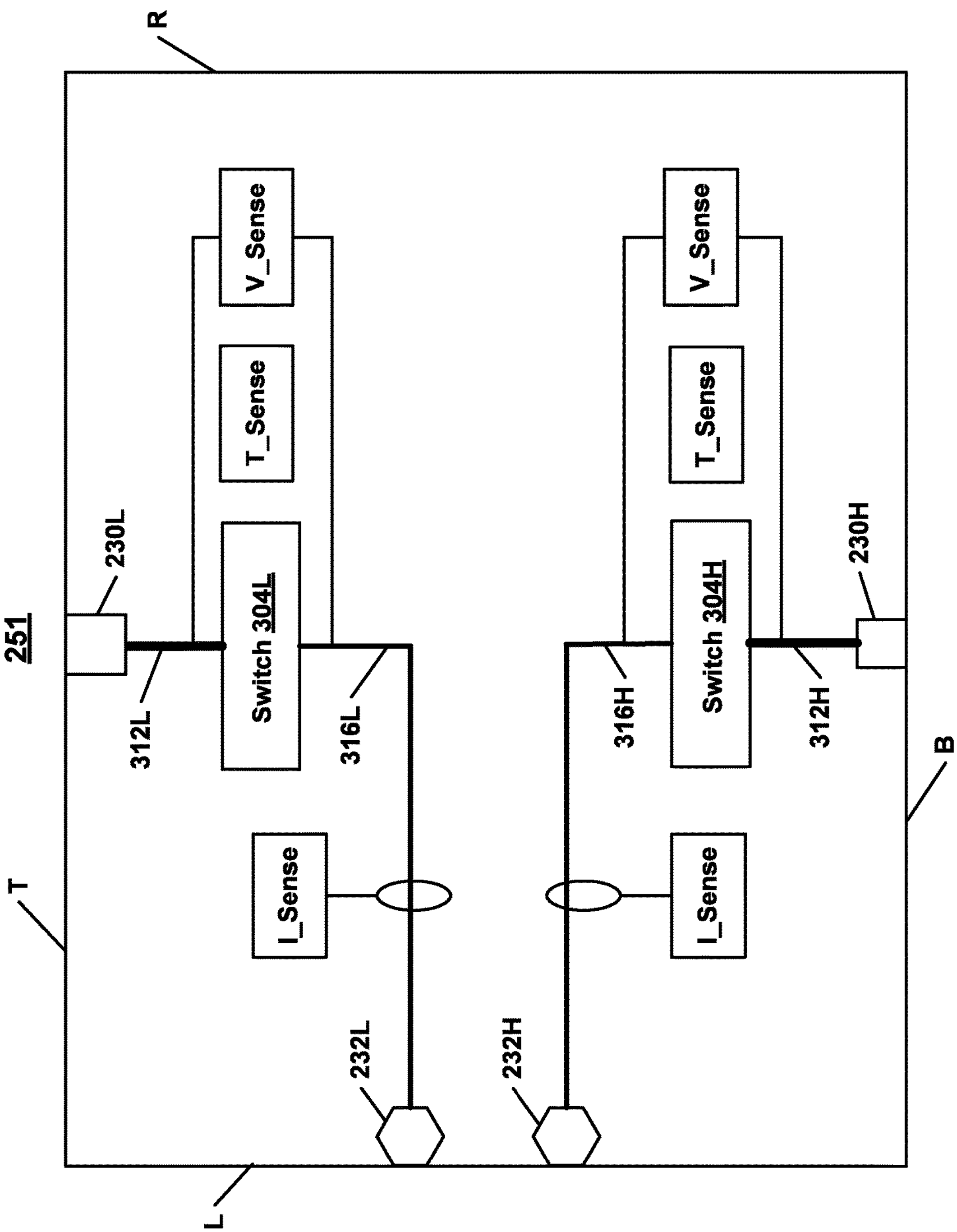
Figures 3, 4B:
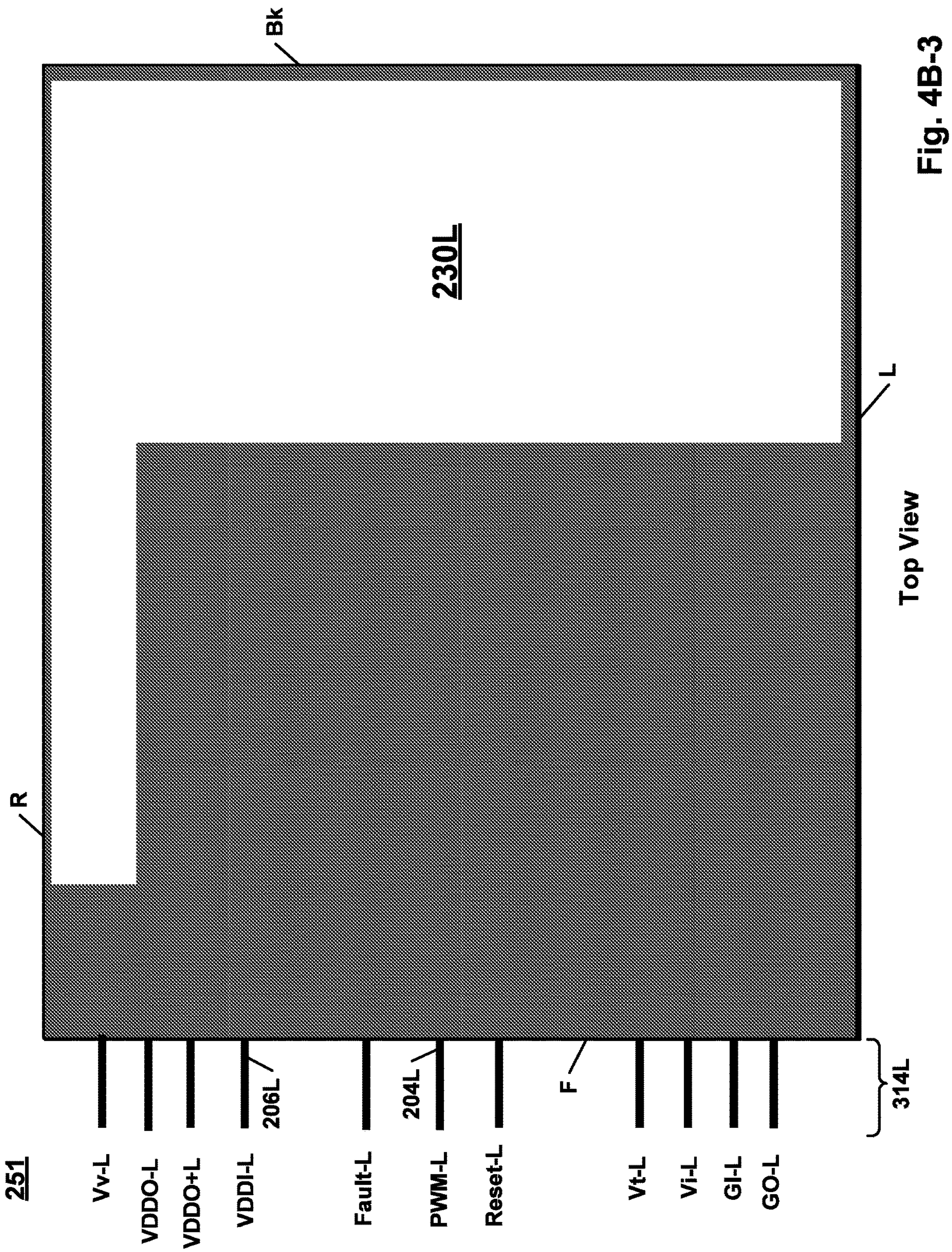

FIGS. 4B-1-4B-3 are quasi-schematic diagrams of an another packaged half bridge 251 that show several components thereof. FIGS. 4B-1 and 4B-2 show relative positions of certain components of packaged half bridge 251 as seen through a transparent case from the side and back, respectively. FIG. 4B-3 shows a top view of packaged half bridge 251 with an opaque case.

Half bridge 251 is similar to packaged half bridge 250 with at least one difference. Packaged half bridge 251 contains a switch module 300 of FIG. 3G-1 or 3I-1, and a switch module 303 of FIG. 3H-1 or 3J-1. FIGS. 4B-1 and 4B-2 show relative positions of certain components of packaged half bridge 251 when seen from the side and back, respectively. FIG. 4B-2 shows low-side die clip terminal 232L and high side die clip terminal 232H positioned to indicate they are flush with the left side surface.

Switch modules 300 and 303 are facing away from each other inside packaged half bridge 251. Switch module 300 is positioned below switch module 303 before the combination is substantially encased in a mold compound such as epoxy resin using, for example, transfer molding. In an alternative embodiment components of switch module 300 are connected to traces provided on one side of a PCB, while components of switch module 303 are connected to traces provided on the opposite side of the PCB.

Packaged Half Bridge 253

Figures 1, 4C:
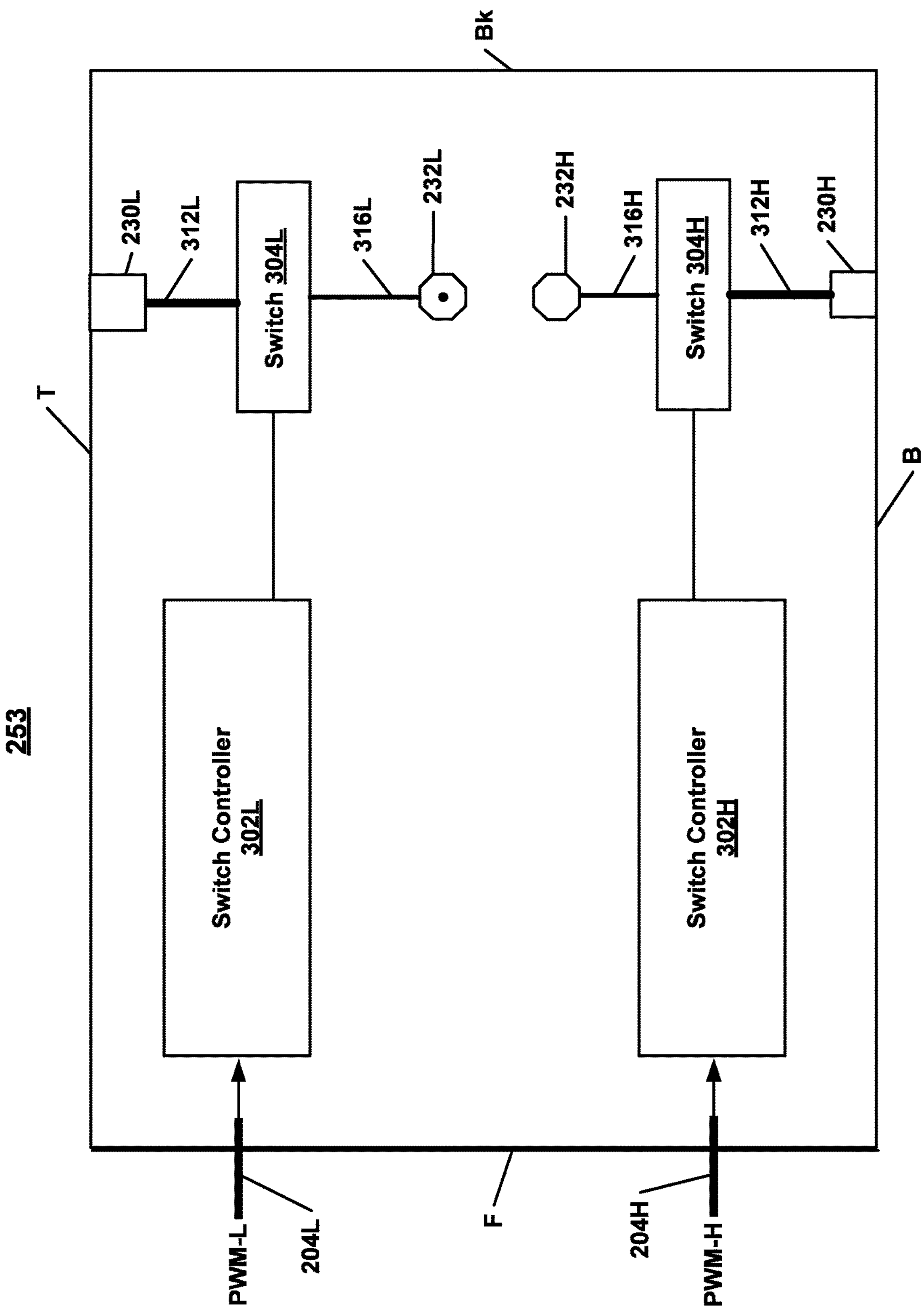
Figures 2, 4C:
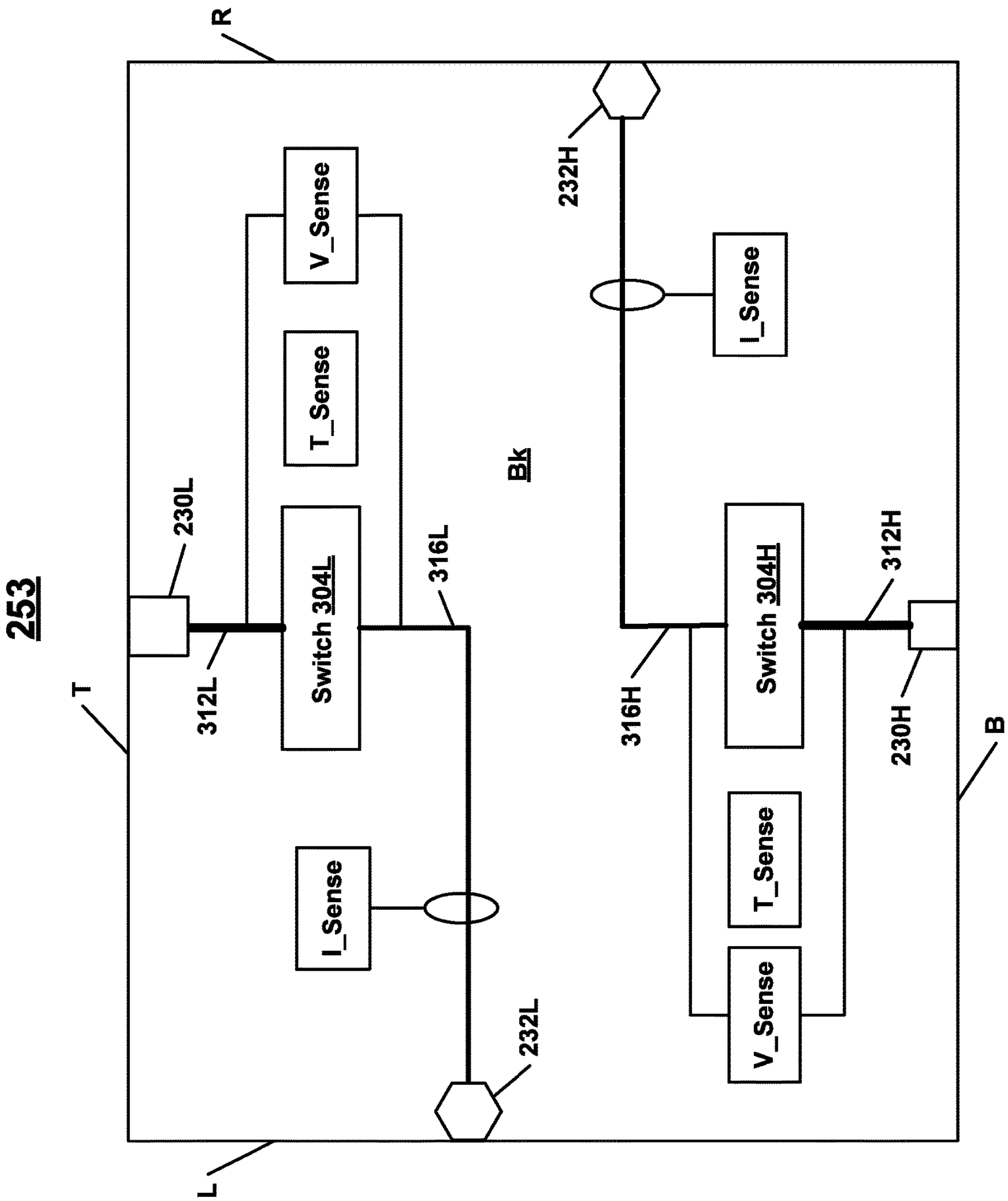
Figures 3, 4C:
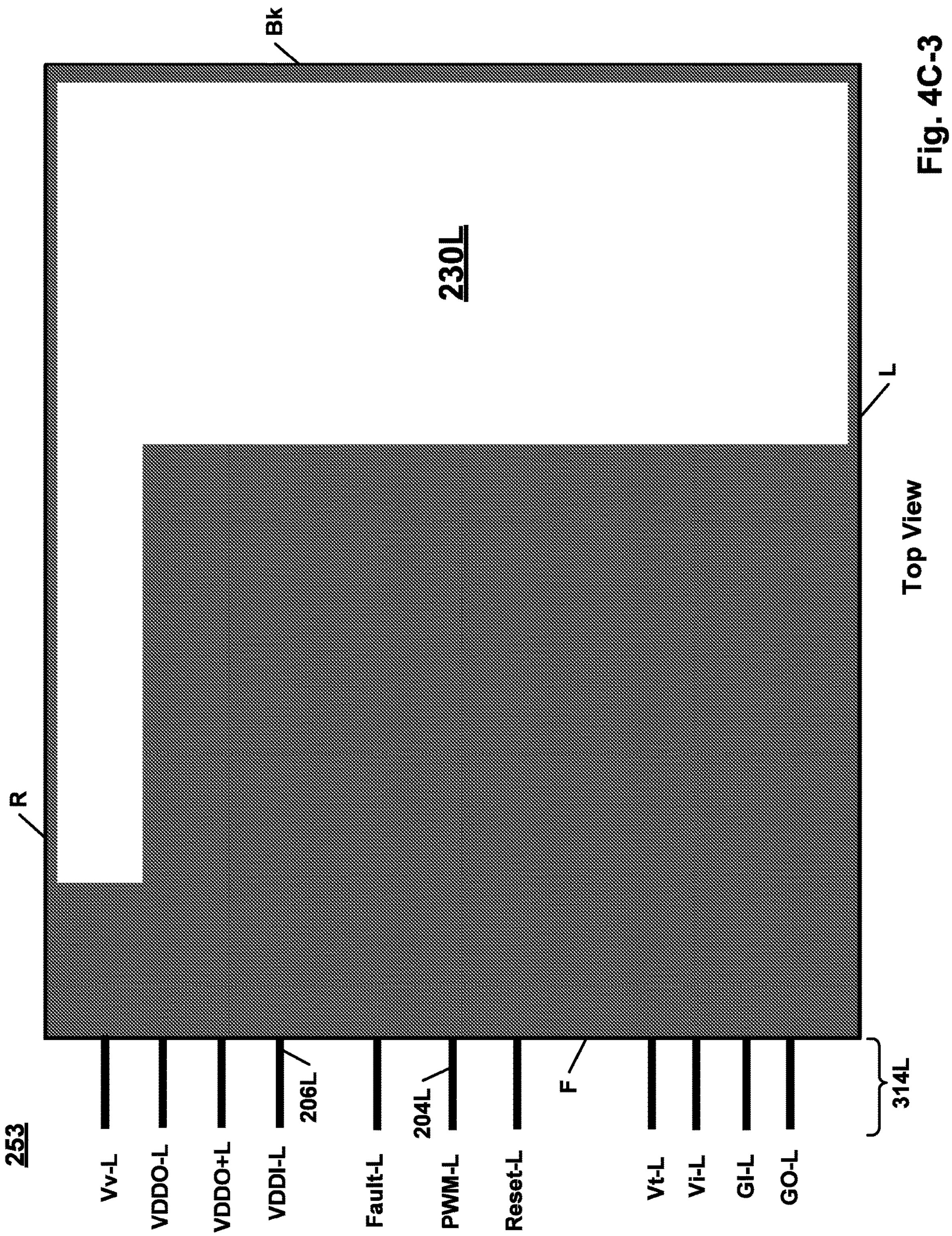

FIGS. 4C-1-4C-3 are quasi-schematic diagrams of another packaged half bridge 253 that show several components thereof. FIGS. 4C-1 and 4C-2 show relative positions of certain components of packaged half bridge 253 with transparent case and as seen from the side and back, respectively. FIG. 4C-3 shows a top view of packaged half bridge 253 with an opaque case.

Packaged half bridge 253 is similar to packaged half bridge 250, but with switch modules 300 replaced by switch modules 303 shown in FIG. 3H-1 or 3J-1. FIG. 4C-2 shows low-side die clip terminal 232L positioned to indicate that it is flush with the right-side surface, and high-side die clip terminal 232H positioned to indicate that it is flush with the left side surface.

The switch modules are facing away from each other inside packaged half bridge 253; high-side switch module 303H is flipped relative to low-side switch module 303L and positioned below it before the combination is substantially encased in a mold compound such as epoxy resin using, for example, transfer molding. In an alternative embodiment components of high-side module 303H are connected to traces provided on one side of a PCB, while components of low-side module 303L are connected to traces provided on the opposite side of the PCB.

Packaged Half Bridge 255

Figures 1, 4D:
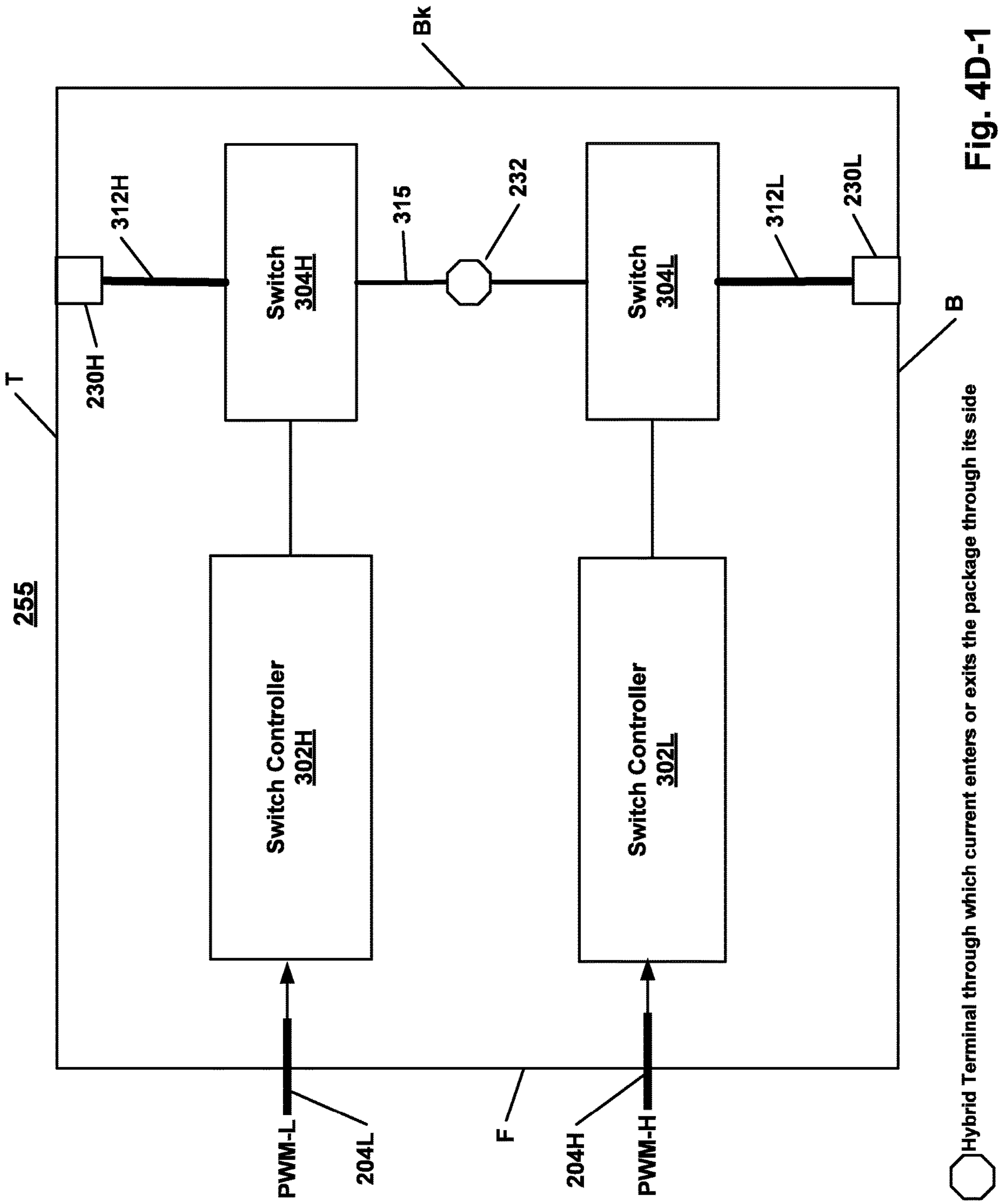
Figures 2, 4D:
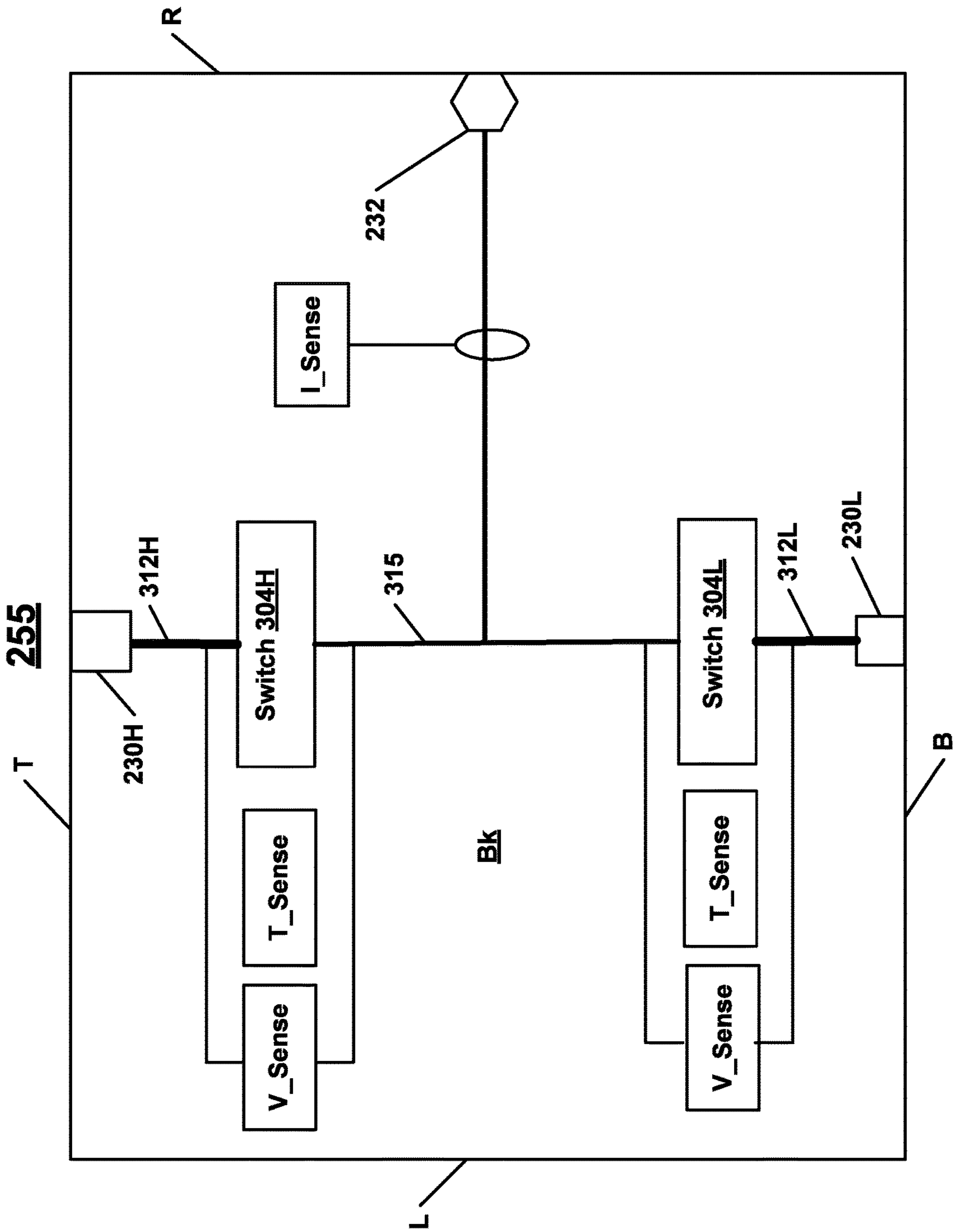
Figures 3, 4D:
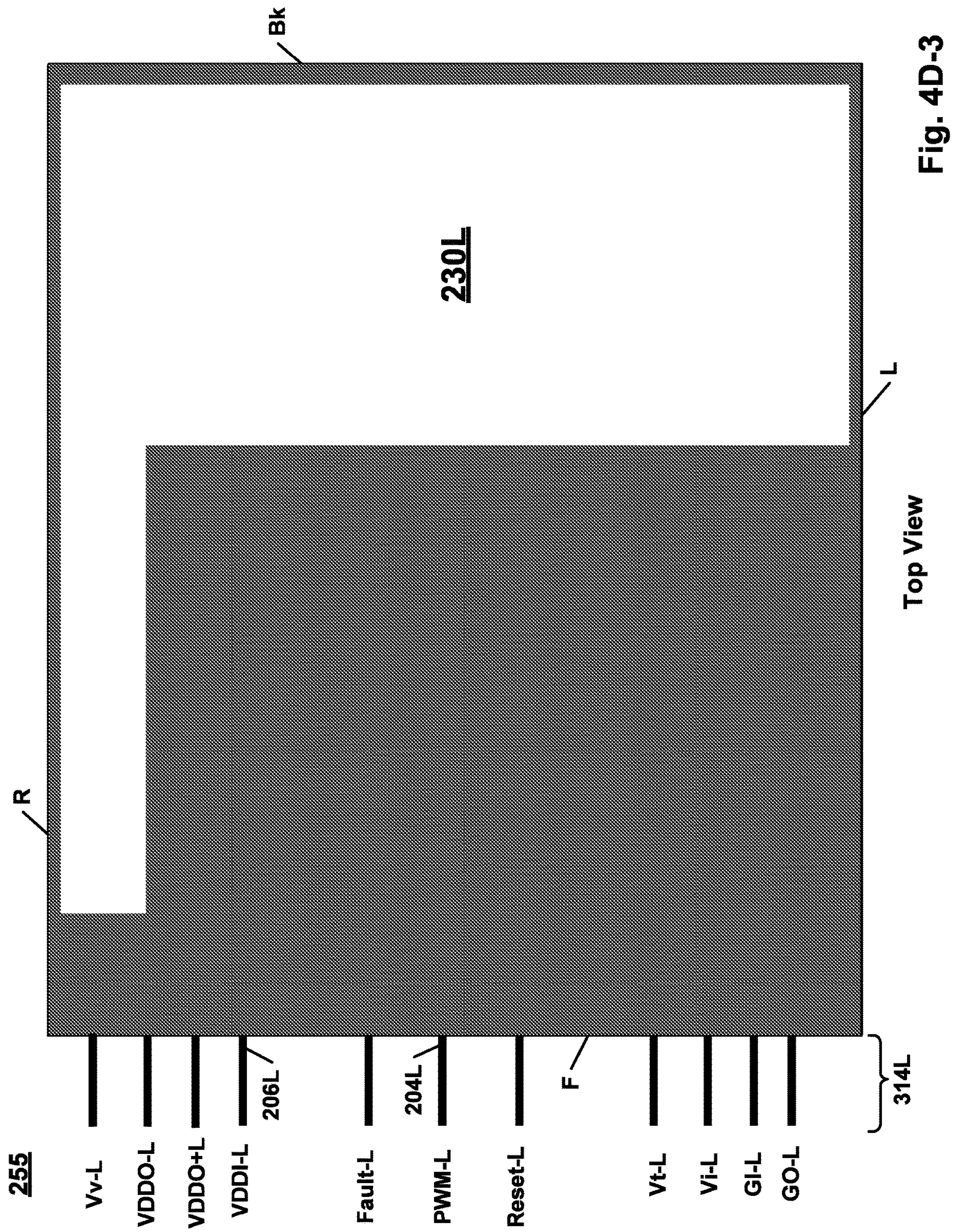

FIGS. 4D-1-4D-3 are quasi-schematic diagrams of still another packaged half bridge 255, which is similar to packaged half bridge 250. FIGS. 4D-1 and 4D-2 show relative positions of certain components of packaged half bridge 255 with transparent case and when seen from the side and back, respectively. FIG. 4D-3 shows a top view of packaged half bridge 255 with an opaque case.

Packaged half bridges 250 and 255 are similar, but at least one substantial difference exists; die clips 316H and 316L of packaged half bridge 250 are replaced by a unified die clip 315, which is attached (e.g., sintered) to switches 304H and 304L. More particularly, the second current terminals of switches 304H and 304L are sintered to unified die clip 315. Die clip 315 has a terminal 232 that is substantially like the die clip terminal 232 of die clip 316. The die clip terminal 232 is positioned in FIG. 4D-2 to indicate that it is flush with the right-side surface.

All switch module components of packaged half bridge 255 may be mounted on a single PCB in one embodiment. For example, switch controller 302H may be connected to traces of one side of the PCB, while switch controller 302L may be connected to traces provided on the opposite side of the PCB. The single PCB may need to be shaped like PCB 223 shown in FIG. 3N-2 to accommodate the unified die clip 315.

Packaged Half Bridge 259

Figures 1, 4E:
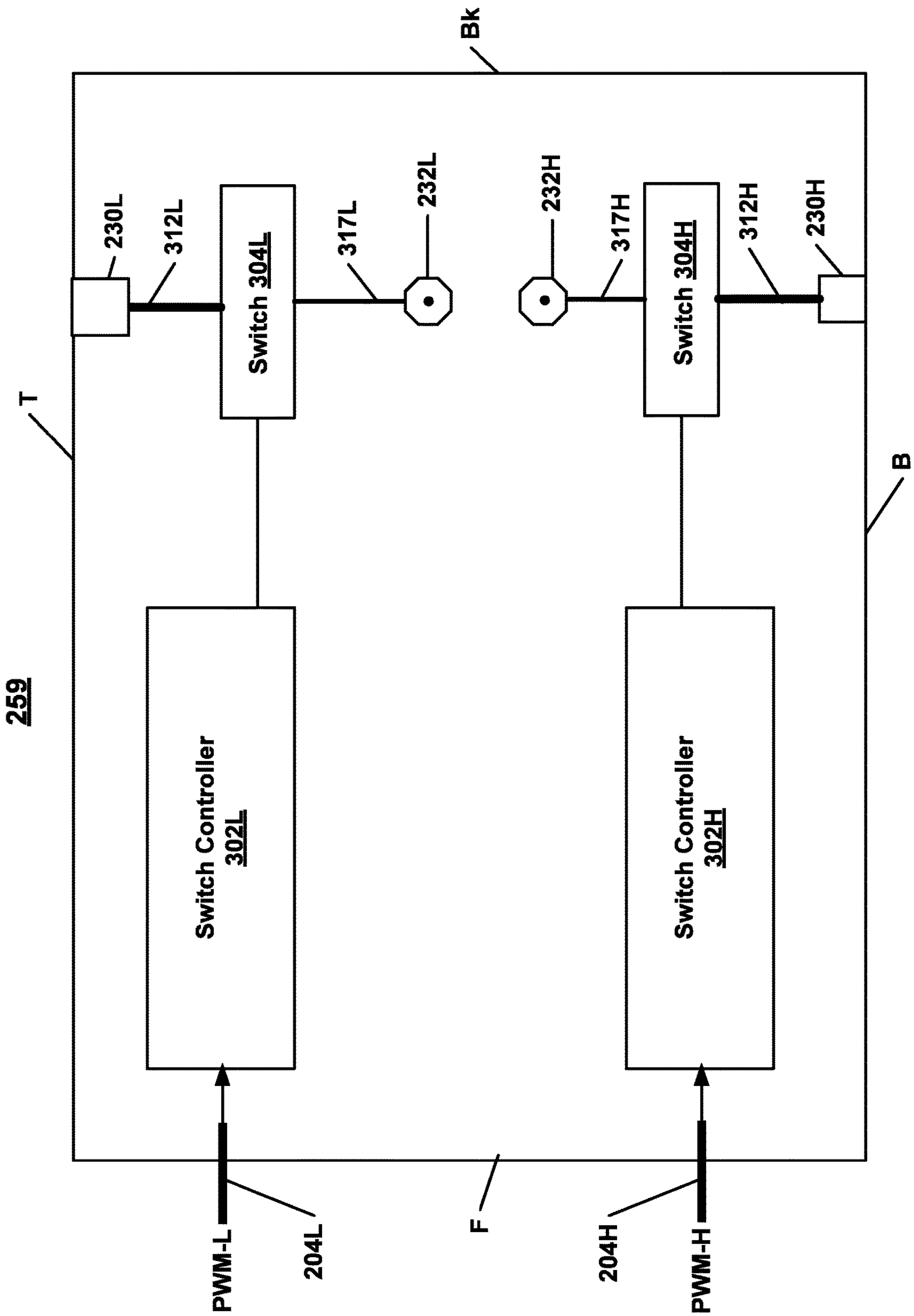
Figures 2, 4E:
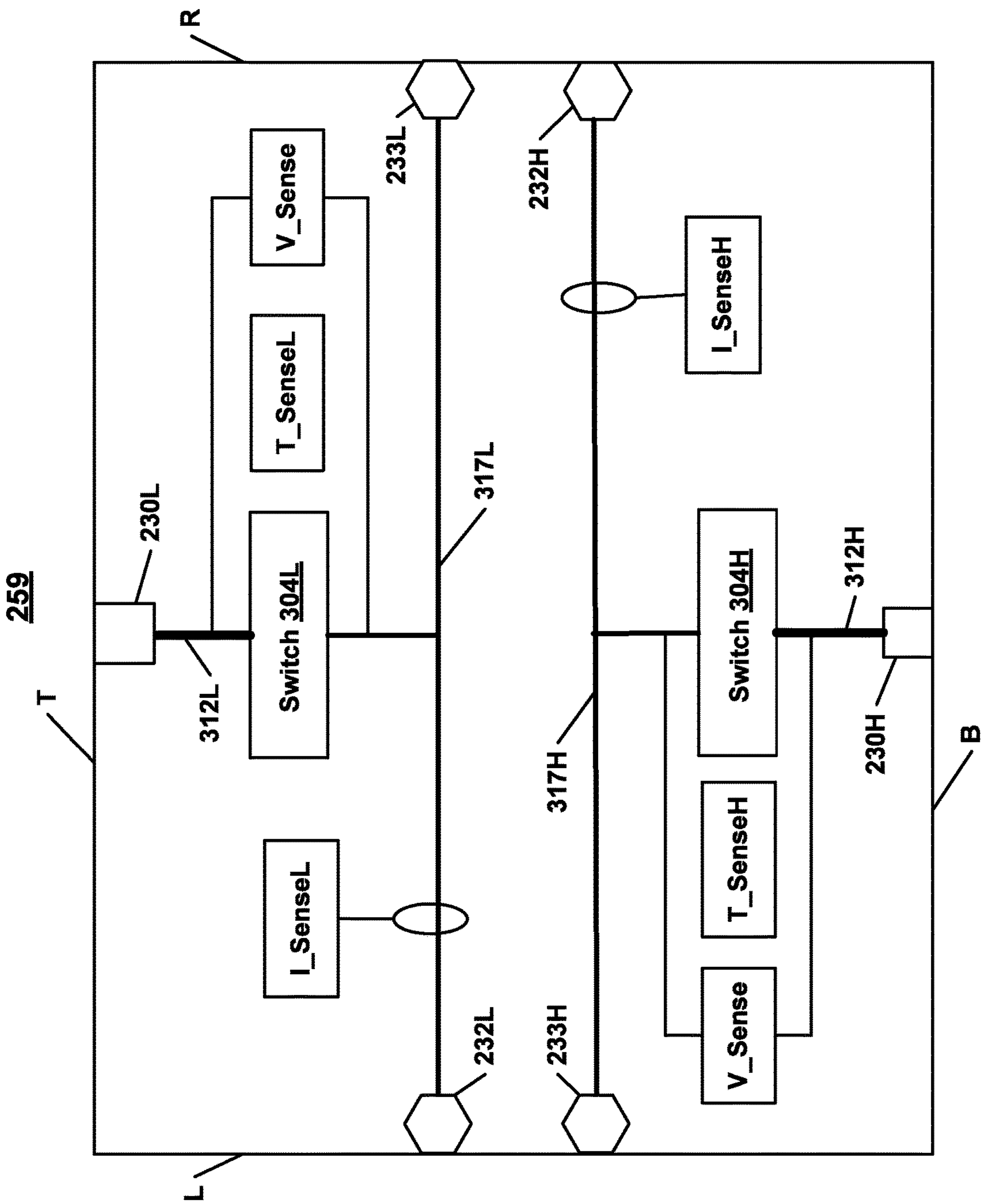
Figures 3, 4E:
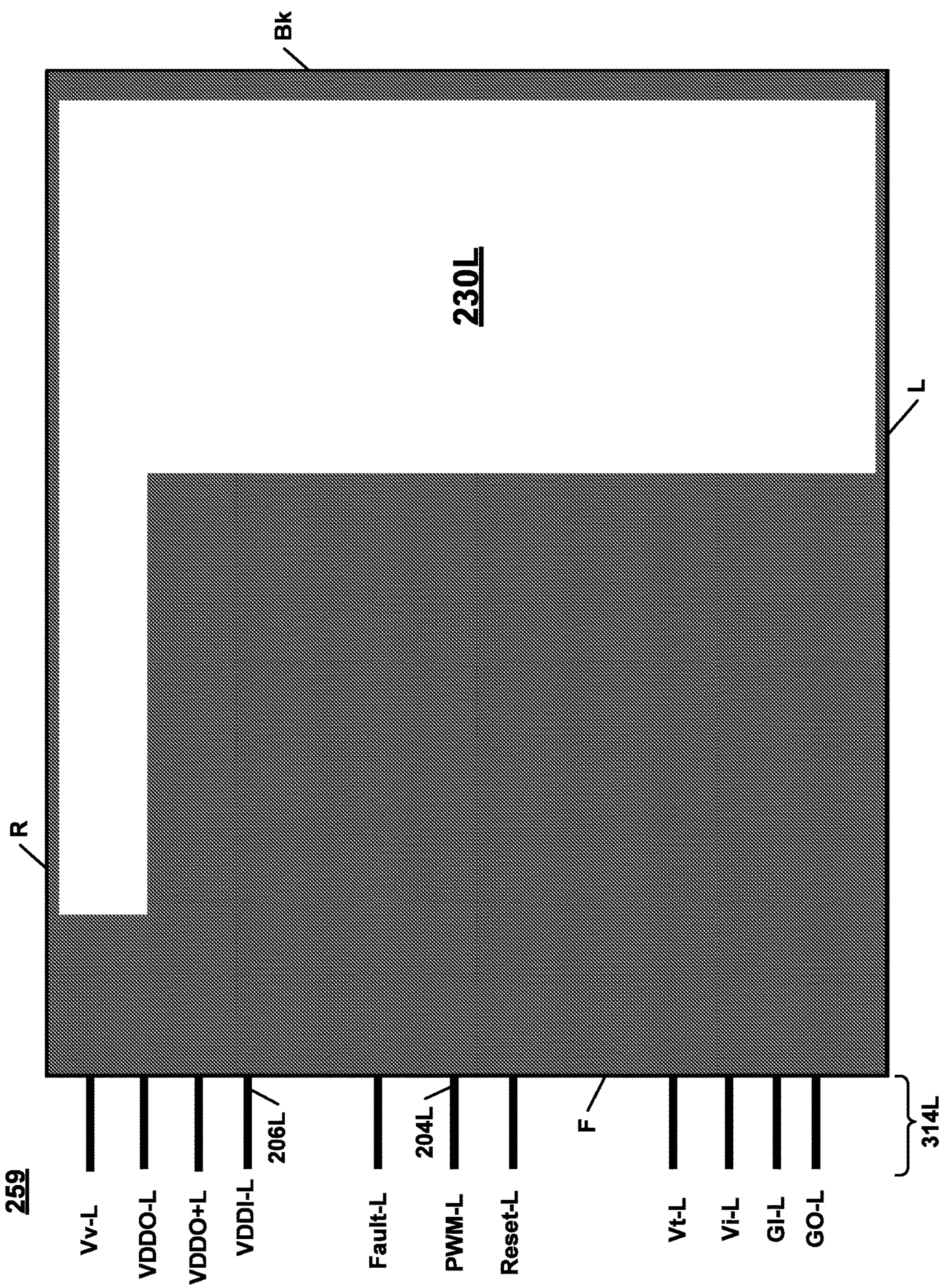

FIGS. 4E-1-4E-3 are quasi-schematic diagrams of another packaged half bridge 259 that show several components thereof. FIGS. 4E-1 and 4E-2 show relative positions of certain components of packaged half bridge 259 as seen through a transparent case and from the side and back, respectively. FIG. 43-3 shows a top view of packaged half bridge 259 with an opaque case.

Half bridge 259 is similar to packaged half bridge 250, but at least one substantial difference exists; die clips 316L and 316H are replaced by die clips 317L and 317H, respectively. FIGS. 4E-1 and 4E-2 show relative positions of certain components of packaged half bridge 259 when seen from the side and back, respectively. FIG. 4E-2 shows low-side die clip terminal 232L and high side die clip terminal 232H positioned to indicate they are flush with the left and right-side surfaces, respectively. Die clips 317 and 316 are similar in many features. For example, like die clip 316, die clip 317 includes horizontal and vertical portions. FIG. 4E-1 shows only the vertical portions of die clips 317. At least one substantial difference exists between die clips 316 and 317; the horizontal portion of die clip 317 is extended and positioned between oppositely facing die clip terminals 232 and 233. Both die clip terminals 232 and 233 are accessible through the case of half bridge package 259. Die clip terminals 232 and 233 are flush with opposite side surfaces of packaged half bridge 259 as shown. Die clip terminals 232 and 233 may be similar in shape and size and configured to transmit high current into or out of packaged half bridge 259.

T_Sense H, I_SenseH, and switch controller 302H may be connected to traces of a first PCB in packaged half bridge 259, while T_Sense L, I_SenseL, and switch controller 302L may be connected to traces of a second PCB in one embodiment. In an alternative embodiment, T_Sense H, I_SenseH, and switch controller 302H are connected to traces provided on one side of a PCB, while T_Sense L, I_SenseL, and switch controller 302L are connected to traces provided on the opposite side of the PCB.

Packaged Half Bridge 261

Figures 1, 4F:
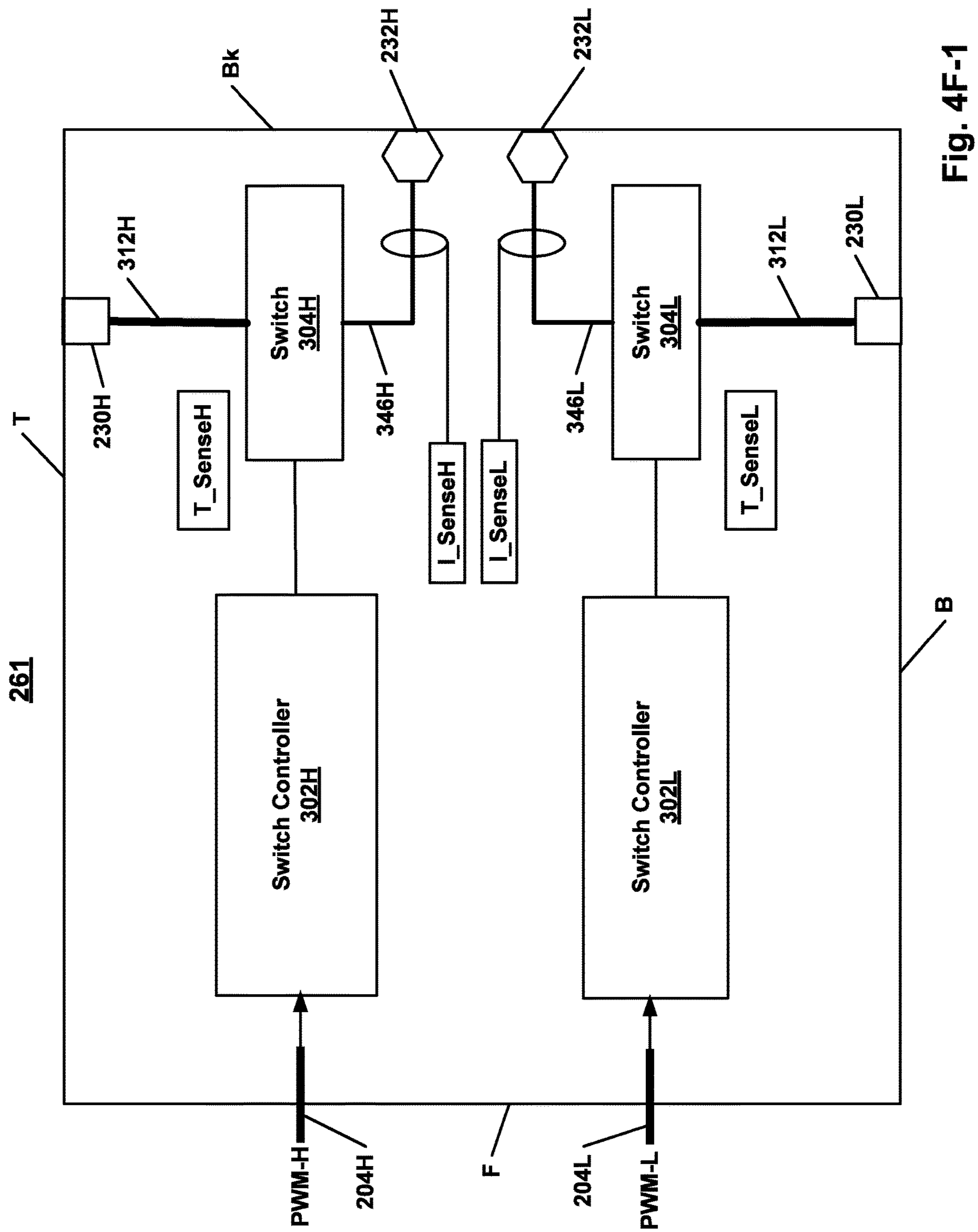
Figures 2, 4F:
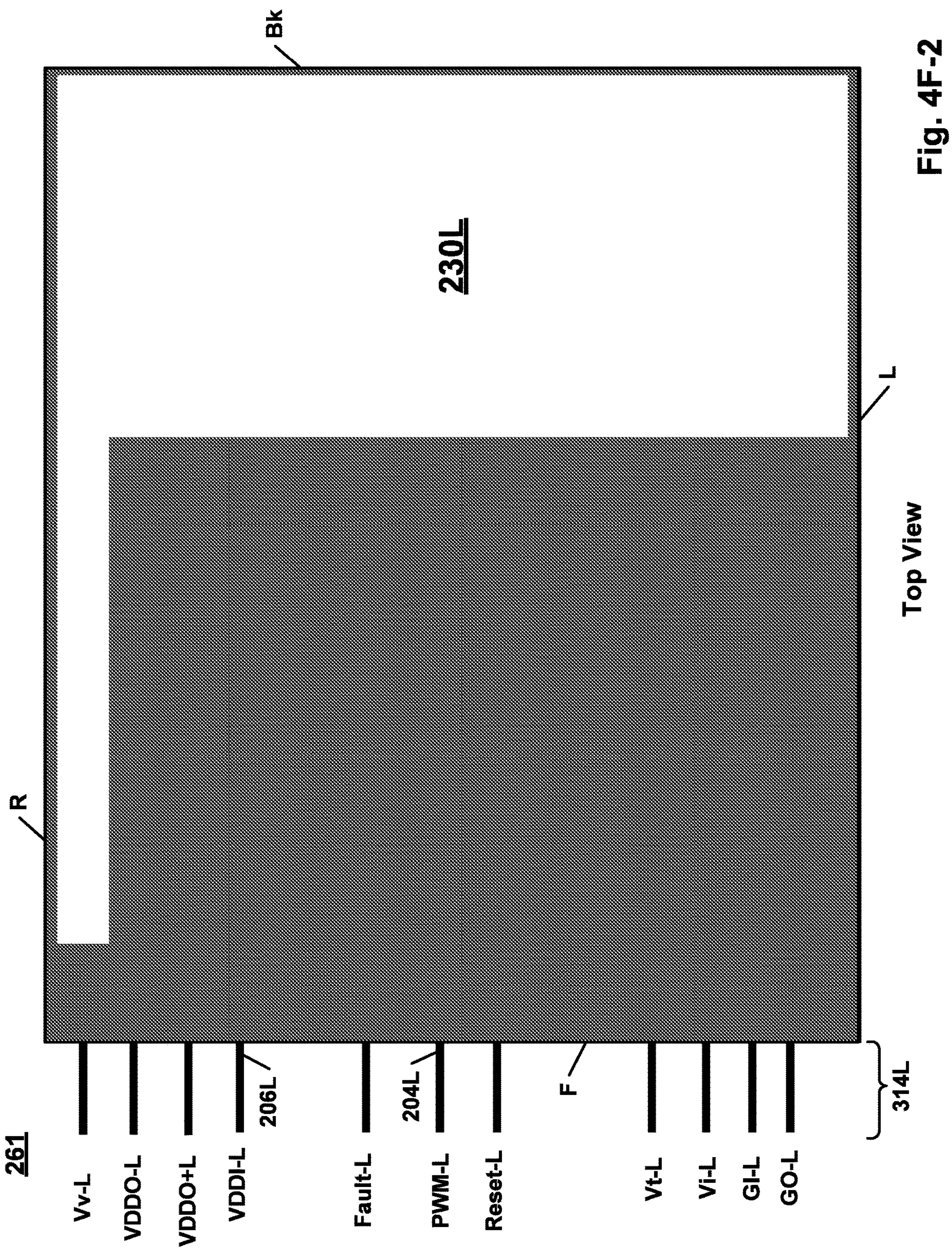

FIGS. 4F-1 and 4F-2 are quasi-schematic diagram of still another packaged half bridge 261 that shows several components thereof. FIGS. 4F-1 shows relative positions of certain components of packaged half bridge 261 as seen through a transparent case and from the side. FIG. 4F-2 shows a top view of packaged half bridge 261 with an opaque case.

Half bridge 261 is similar to packaged half bridge 250, but with die clips 316L and 316H replaced by die clips 347L and 347H, respectively. FIG. 4F-1 shows relative positions of certain components of packaged half bridge 261 when seen from the side. FIG. 4F-1 shows low-side die clip terminal 232L and high side die clip terminal 232H positioned to indicate they are flush with the back surface.

T_Sense H, I_SenseH, I_ and switch controller 302H are connected to traces provided by a first PCB, while T_Sense L, I_SenseL, and switch controller 302L are connected to traces provided by a second PCB. In another embodiment T_Sense H, I_SenseH, and switch controller 302H are connected to traces provided on one side of a PCB, while T_Sense L, I_SenseL, and switch controller 302L are connected to traces provided on the opposite side of the PCB.

Embodiments of Packaged Half Bridges 250 and 253

Figures 1, 4G:
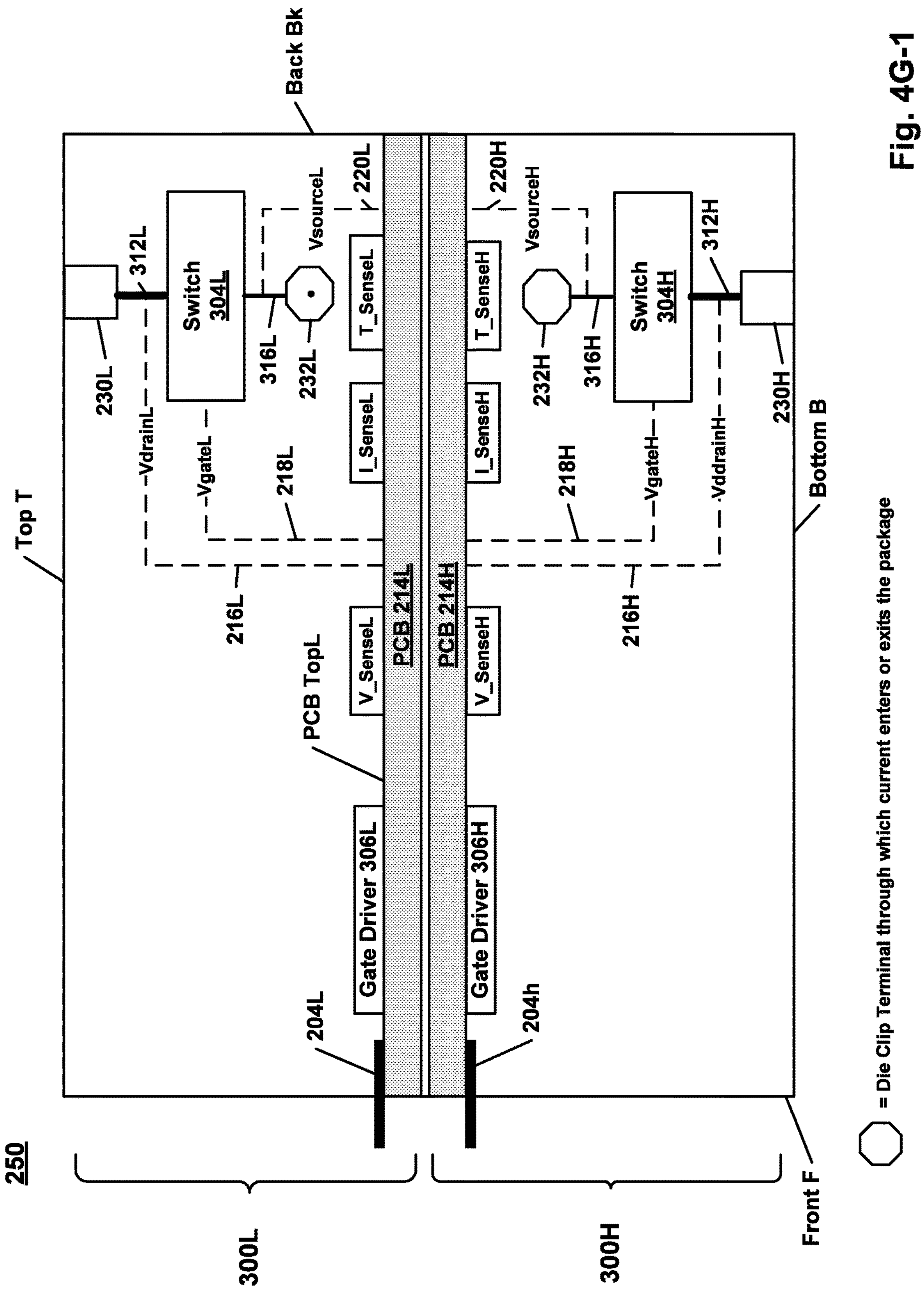
Figures 2, 4G:
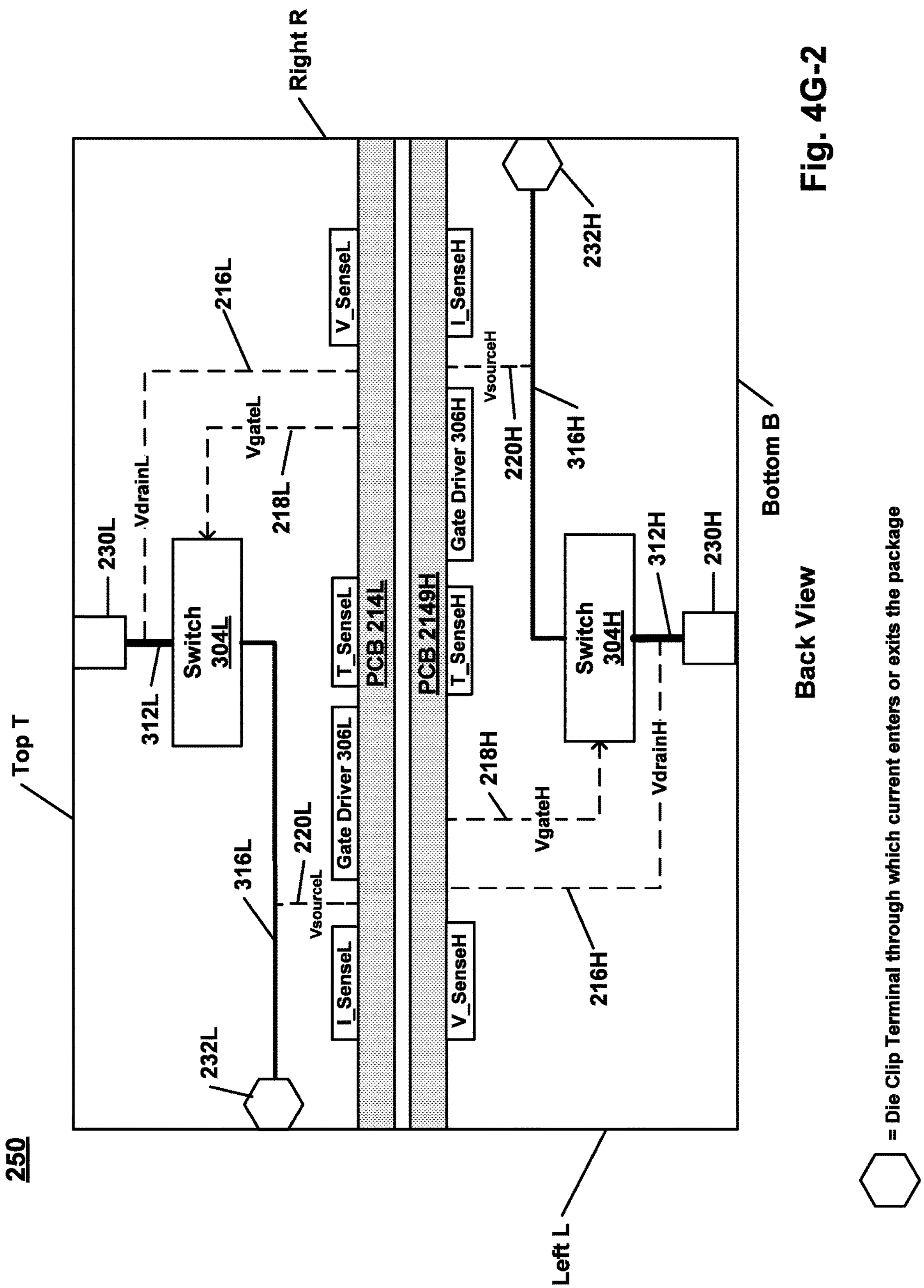

With continuing reference to FIGS. 2B-1 and 2B-2, FIGS. 4G-1 and 4G-2 are quasi-schematic diagrams of an example PCB based packaged half bridge 250 that show several components thereof. FIGS. 4G-1 and 4G-2 show relative positions of certain components of packaged half bridge 250, which is shown with a transparent case, when it is seen from the side and back, respectively. Packaged half bridge 250 contains two switch modules 300 of FIGS. 3G-1-3G-3. More particularly packaged half bridge 250 includes high-side switch module 300H and low-side switch module 300L. The switch modules are facing each other inside packaged half bridge 250; high-side switch module 300H is flipped and positioned below low-side switch module 300L before the combination is encased in a mold compound such as epoxy resin using, for example, transfer molding.

FIGS. 4G-1 and 4G-2 illustrate relative positioning of certain components of half bridge 250 with respect to each other. Die substrates 312, switches 304, and die clips 316 are vertically stacked as shown between the top T and bottom B. Gate drivers 306 are likewise vertically stacked as shown between the top T and bottom B. Gate drivers 306 are positioned near the front F of packaged half bridge 250, while the power stacks, which include respective switches 304, are positioned near the back Bk. Die substrate terminals 230L and 230H are accessible through the top T and bottom B surfaces, respectively, of packaged half bridge 250, and die clip terminals 232L and 232H are accessible through the left and right-side surfaces, respectively, of packaged half bridge 250. Die substrate terminals 230L and 230H are positioned in the figures to indicate they are flush with the top T and bottom B surfaces, respectively, and die clip terminals 232L and 232H are positioned in FIG. 4G-2 to indicate they are flush with the left and right-side surfaces, respectively.

High-side switch 304H is electrically and thermally connected to high-side die substrate 312H, which has die substrate terminal 230H for making an electrical and/or thermal connection to a device external to packaged half bridge 250. For example, terminal 230H can be electrically and/or thermally connected to a V+ bus bar. High-side switch 304H is also electrically and thermally connected to high-side die clip 316H, which has terminal 232H for making an electrical and/or thermal connection to a device external to packaged half bridge 250. For example, terminal 232H can be electrically and/or thermally connected to a V− bus bar. Low-side switch 304L is electrically and thermally connected to low-side die substrate 312L, which has terminal 230L for making an electrical and/or thermal connection to a device external to packaged half bridge 250. For example, the low side die substrate terminal 230L can be electrically and/or thermally connected to a phase bus bar. Low-side switch 304L is electrically and thermally connected to die clip 316L, which has terminal 232L for making an electrical and/or thermal connection to a device external to the packaged half bridge 250. For example, terminal 232L can be electrically and/or thermally connected to a V− bus bar.

Half bridge 250 includes a pair of PCBs 214L and 214H. A dielectric can be inserted between PCBs 214L and 214H, which can take form in electrically isolating tape (e.g., Kapton tape), or the dielectric can be sprayed on one or both surfaces of PCBs 214L and 214H that face each other. In an alternative embodiment, a single PCB 214 can be employed, which includes traces on oppositely facing surfaces. Components of the high side switch module 300H (e.g., gate driver 306H, T_SenseH, I_SenseH, die substrate support 216H, die clip support 220H, etc.) are electrically and mechanically connected to traces on one side of the single PCB 214, while components of the low side switch module 300L (e.g., gate driver 306L, T_SenseL, I_SenseL, die substrate support 216L, die clip support 220L, etc.) are electrically and mechanically connected to traces on the other side of the single PCB 214. In this alternative embodiment, a 4-layer PCB (either 2×2-layer or 1×4-layer scenarios) can be employed. A FR4 dielectric of a 4-layer PCB can provide electrical isolation between signals on different layers.

Figures 1, 4H:
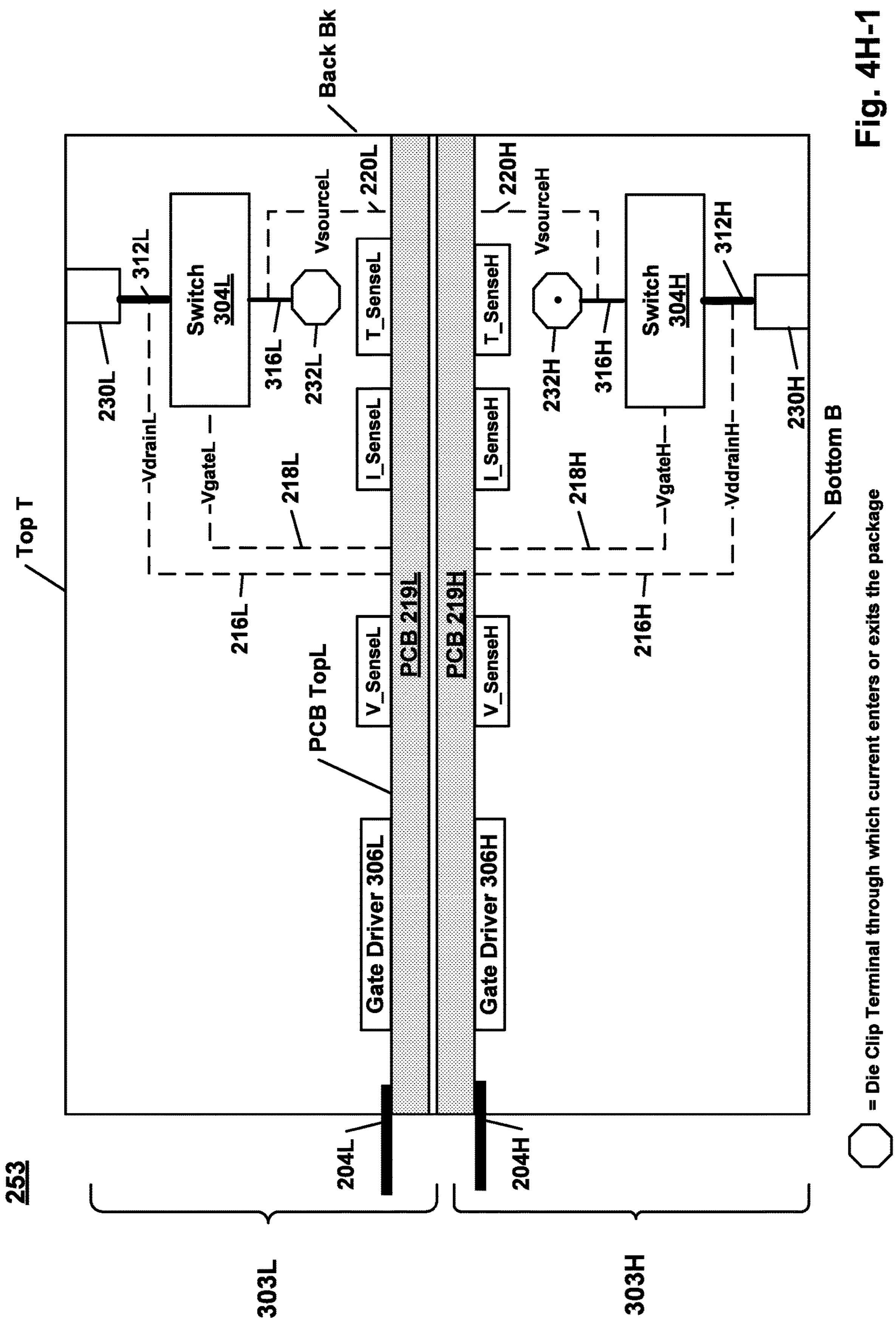
Figures 2, 4H:
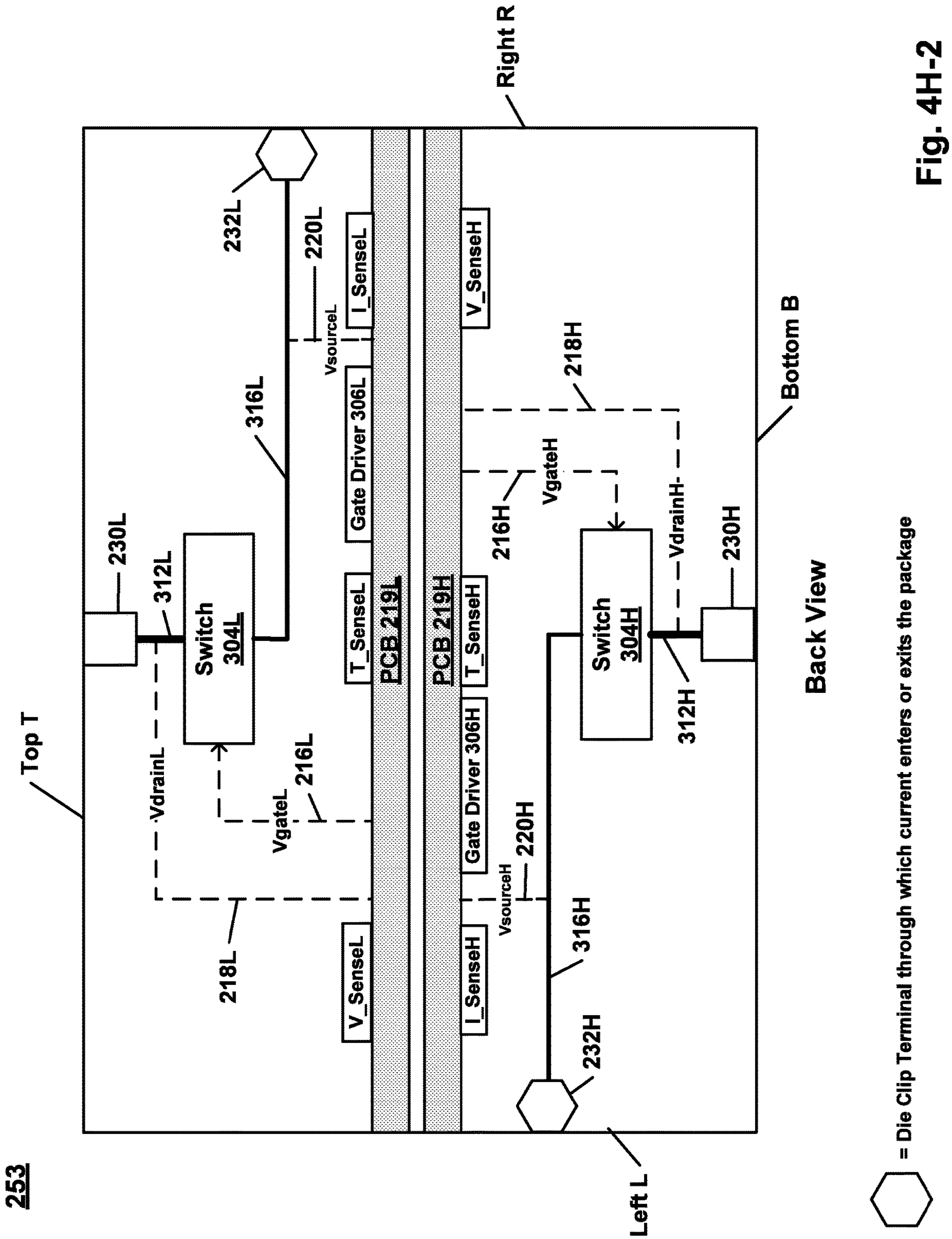

FIGS. 4H-1 and 4H-2 are schematic diagrams of yet another packaged PCB based half bridge 253 that employs switch modules 303. FIGS. 4H-1 and 4H-2 show relative positions of certain components of packaged half bridge 253 when seen from the side and back, respectively. Packaged half bridge 253, which is shown with a transparent case, is similar to packaged half bridge 250. Instead of switch modules 300, packaged half bridge 253 contains a pair of switch modules 303 of FIGS. 3J-1-3J-3. FIG. 4H-2 shows low-side die clip terminal 232L positioned to indicate that it is flush with the right-side surface, and high-side die clip terminal 232H positioned to indicate that it is flush with the left side surface.

Components of the high side switch module 303H (e.g., gate driver 306H, T_SenseH, I_SenseH, die substrate support 216H, die clip support 220H, etc.) are electrically and mechanically connected to traces on one side of the single PCB 214, while components of the low side switch module 303L (e.g., gate driver 306L, T_SenseL, I_SenseL, die substrate support 216L, die clip support 220L, etc.) are electrically and mechanically connected to traces on the other side of the single PCB 214. In this alternative embodiment, a 4-layer PCB (either 2×2-layer or 1×4-layer scenarios) can be employed. A FR4 dielectric of a 4-layer PCB can provide electrical isolation between signals on different layers.

Example Air-Cooled Inverters and Rectifiers

Packaged switches and packaged half bridges can be employed in air-cooled converters including air-cooled inverters and air-cooled rectifiers of this disclosure. Air-cooled power converters, including air-cooled inverters and air-cooled rectifiers of this disclosure, have high power densities. For example, an air-cooled inverter can deliver 400 kW or more of peak power while occupying a volume of 1.0 liter or less. Volume is conserved in part by stacking packaged switches, packaged half bridges, heat sinks, bus bars or bus bars that also act as heat sinks, etc. Volume is also conserved by an elimination of the electro-mechanical pumps and fluid-connecting tubes mentioned above. This disclosure will focus mainly on air-cooled inverters and air-cooled rectifiers, it being understood the present disclosure should not be limited thereto.

Air-Cooled Inverter 502*i*

Figures 1, 5A:
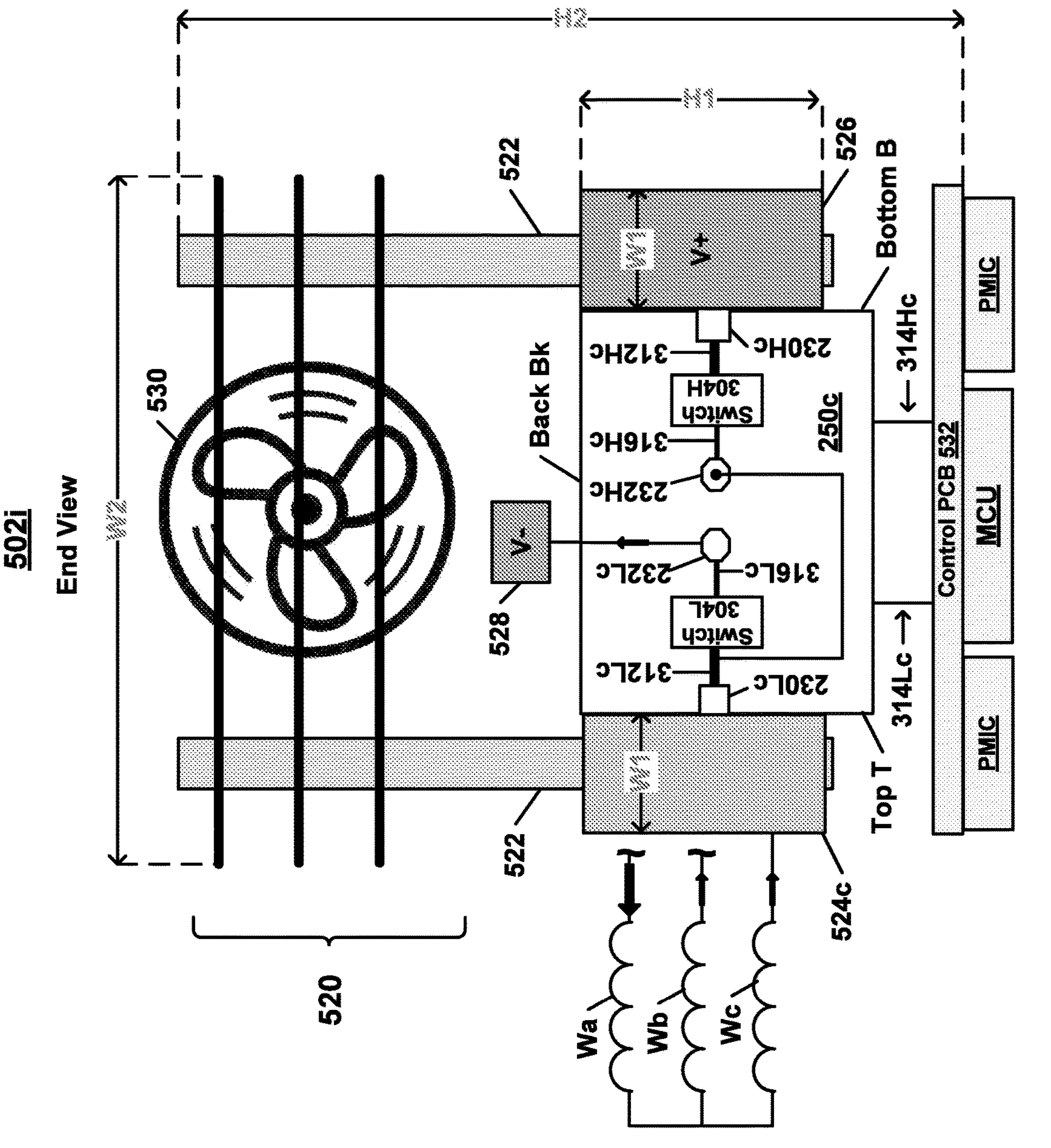
Figures 2, 5A:
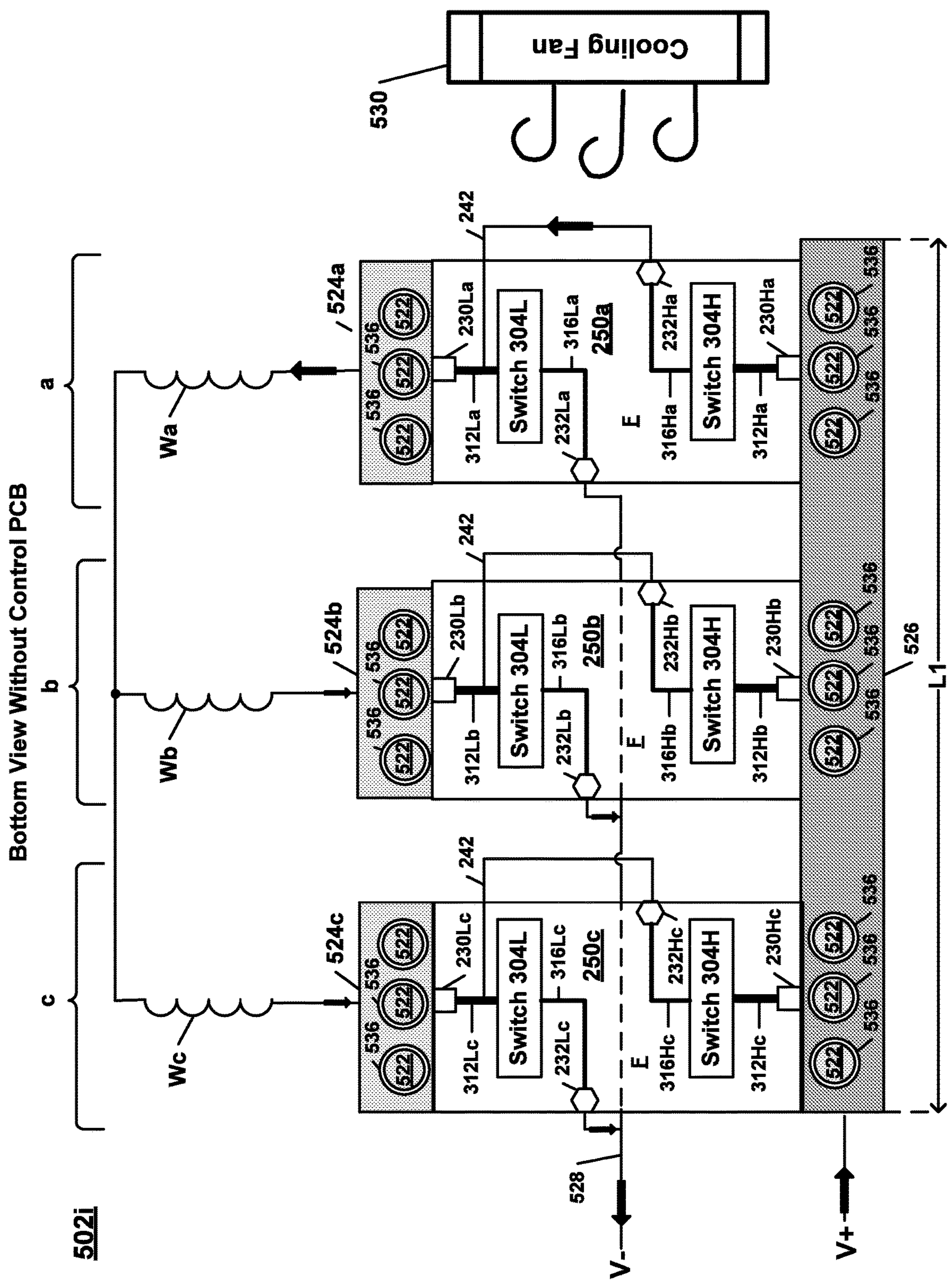
Figures 3, 5A:
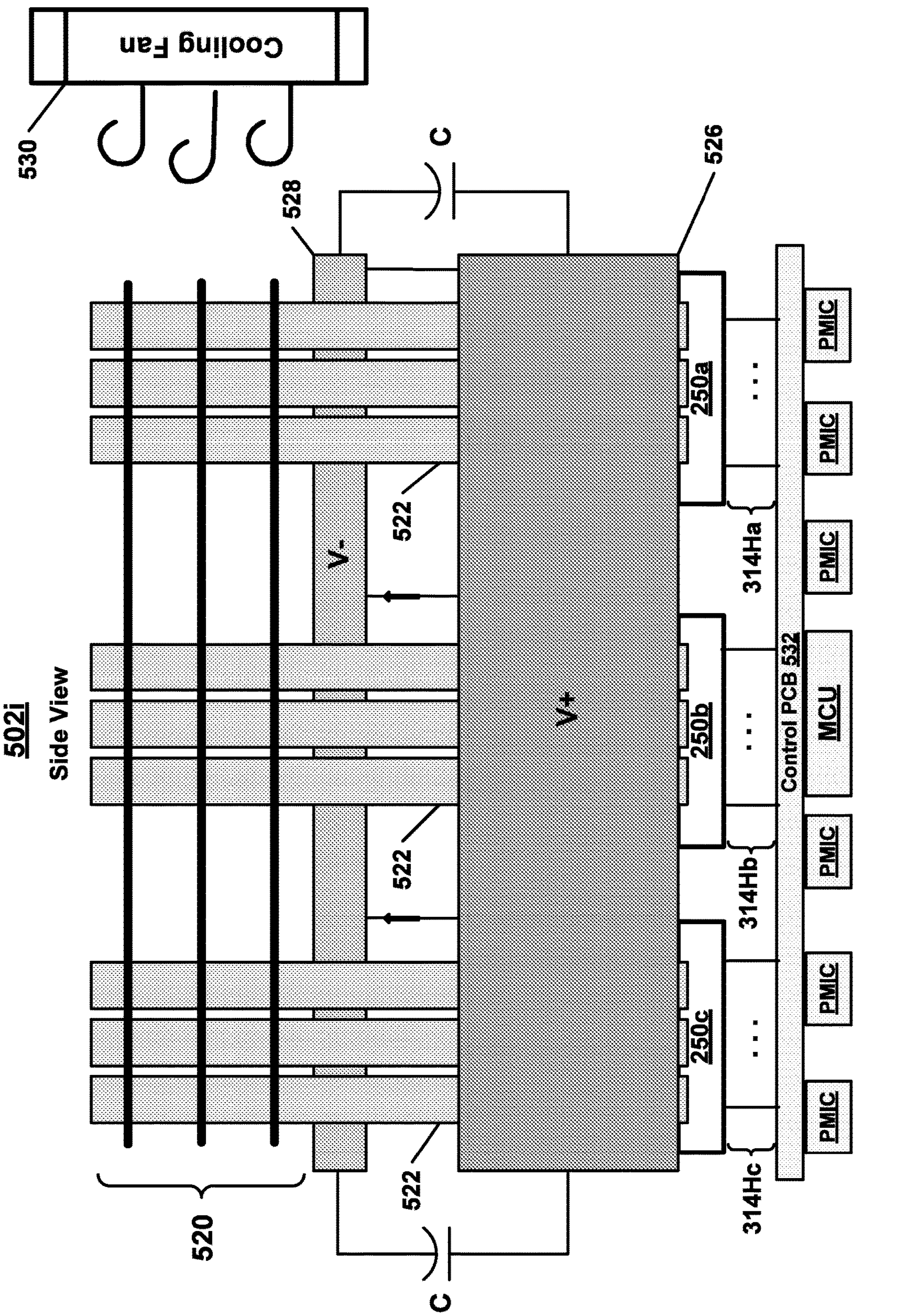
Figures 4, 5A:
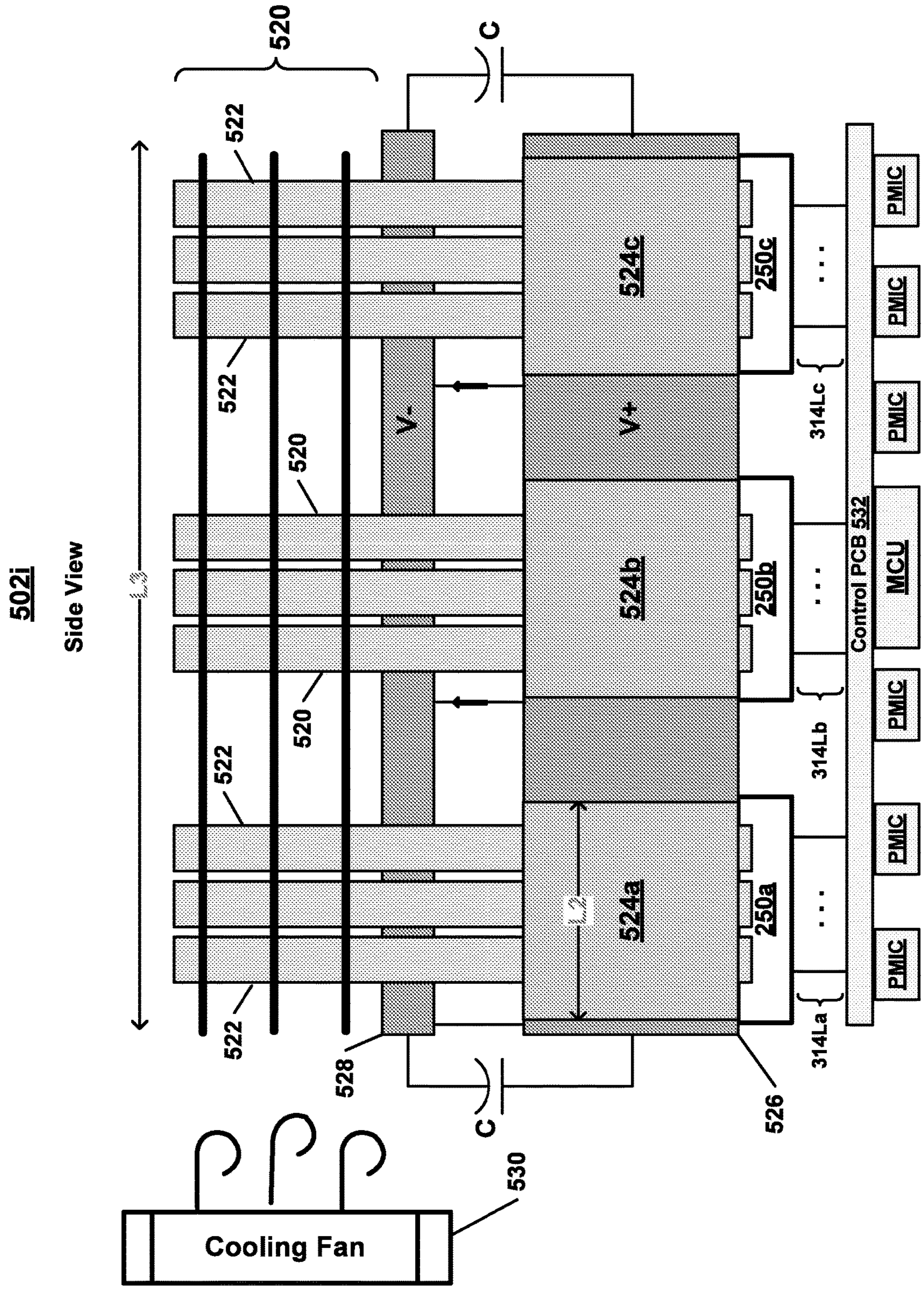
Figures 5, 5A:
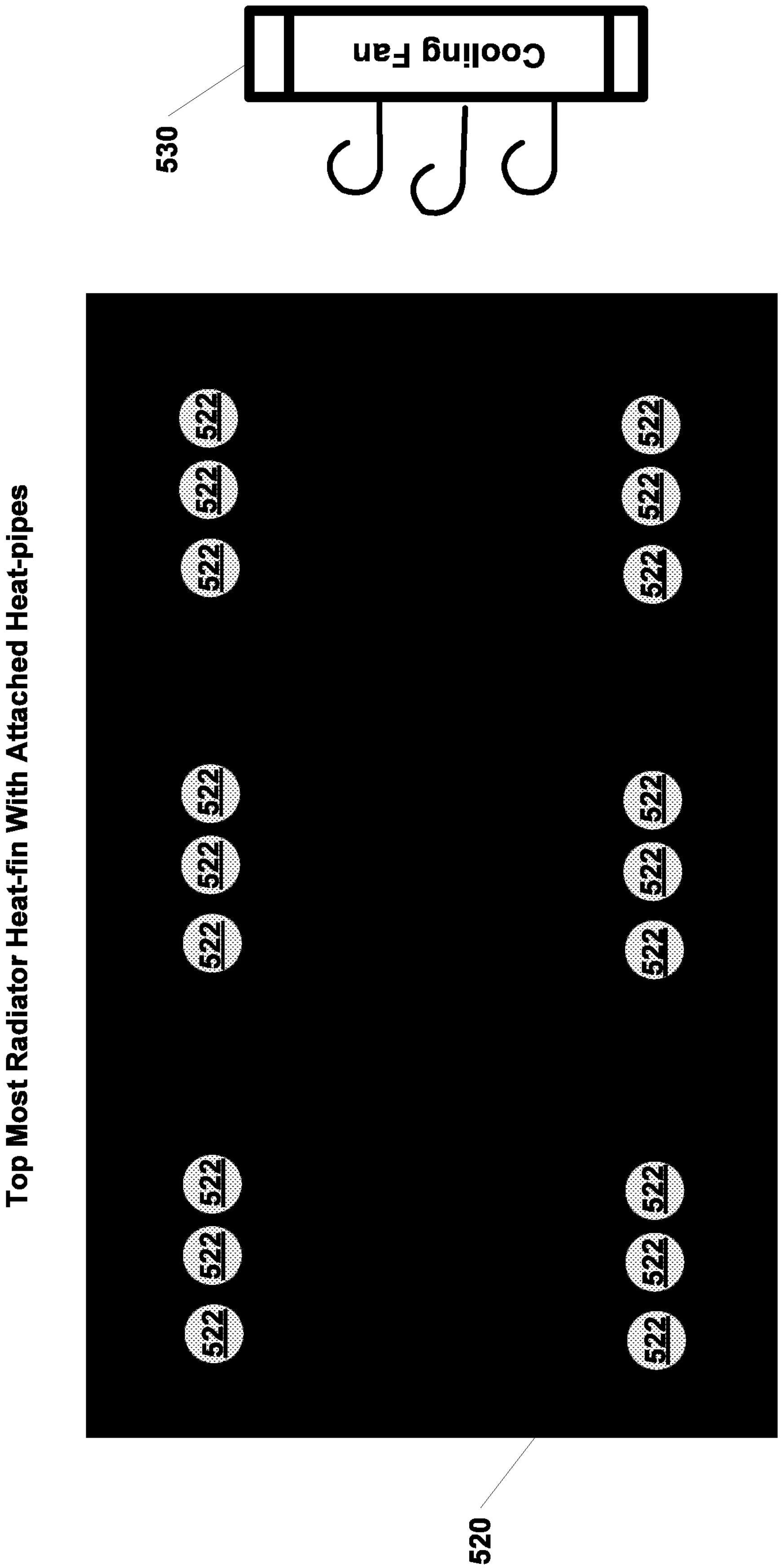
Figures 5, 5A, 6:
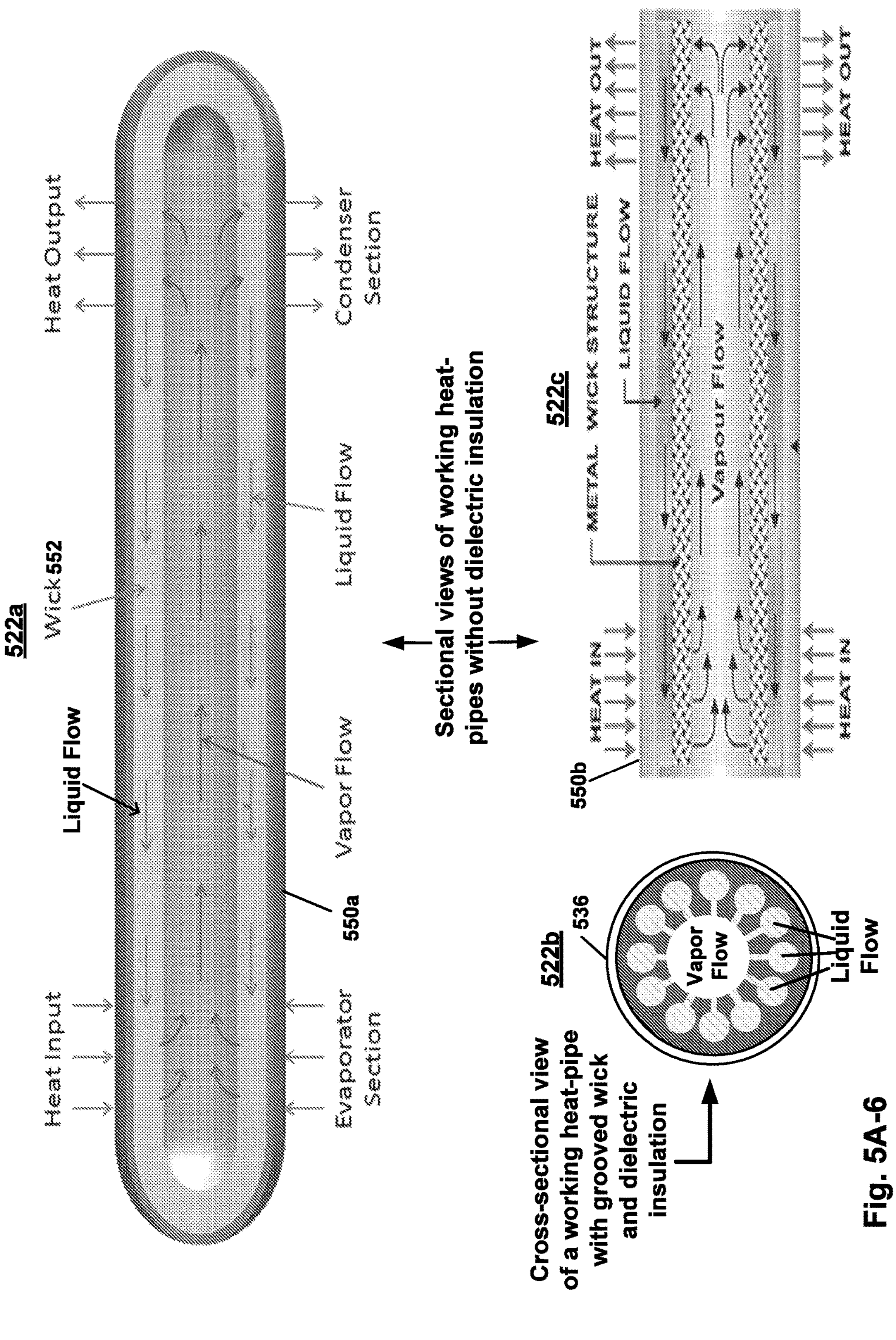
Figures 5, 5A, 6, 7:
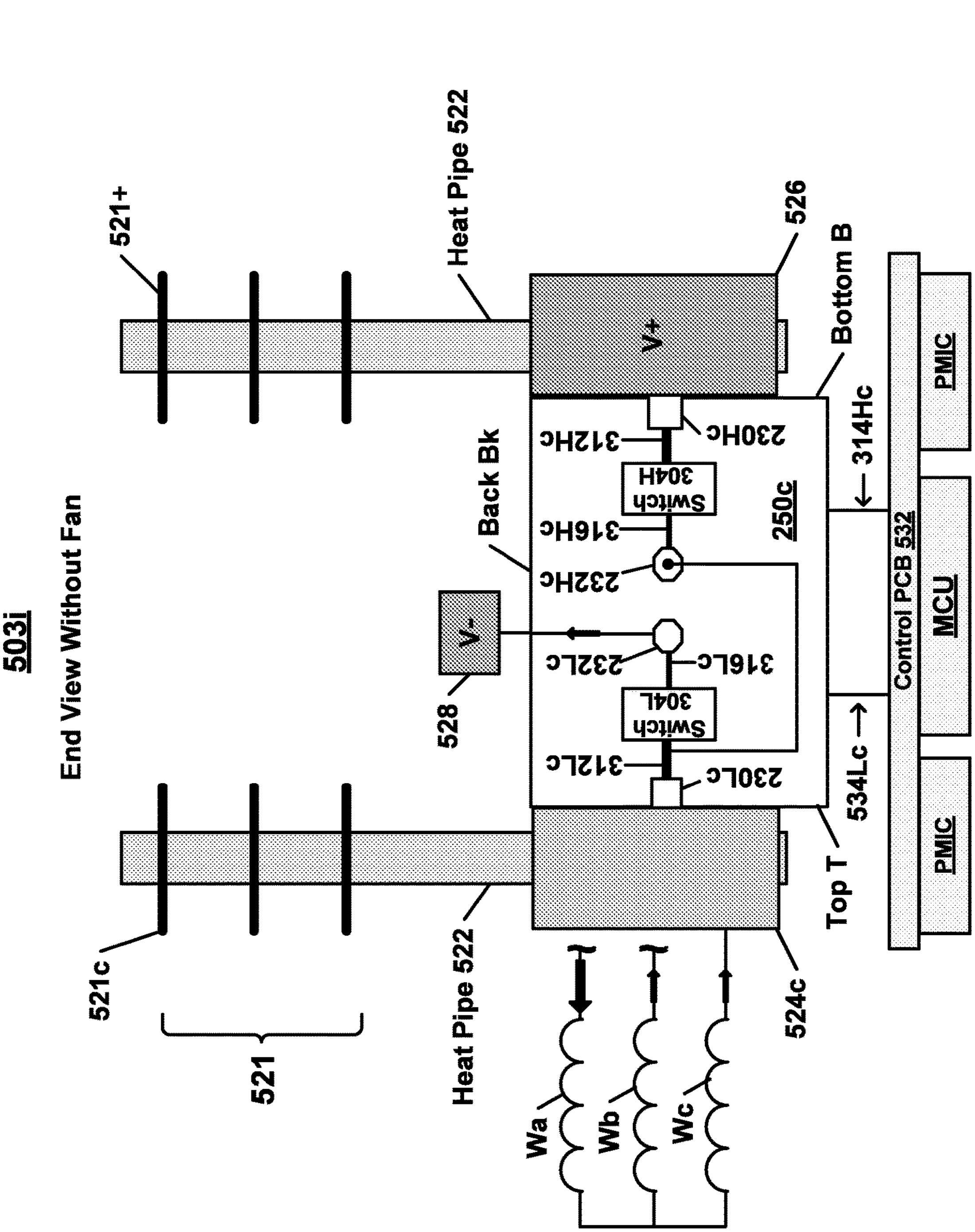
Figures 5, 5A, 6, 7, 8:
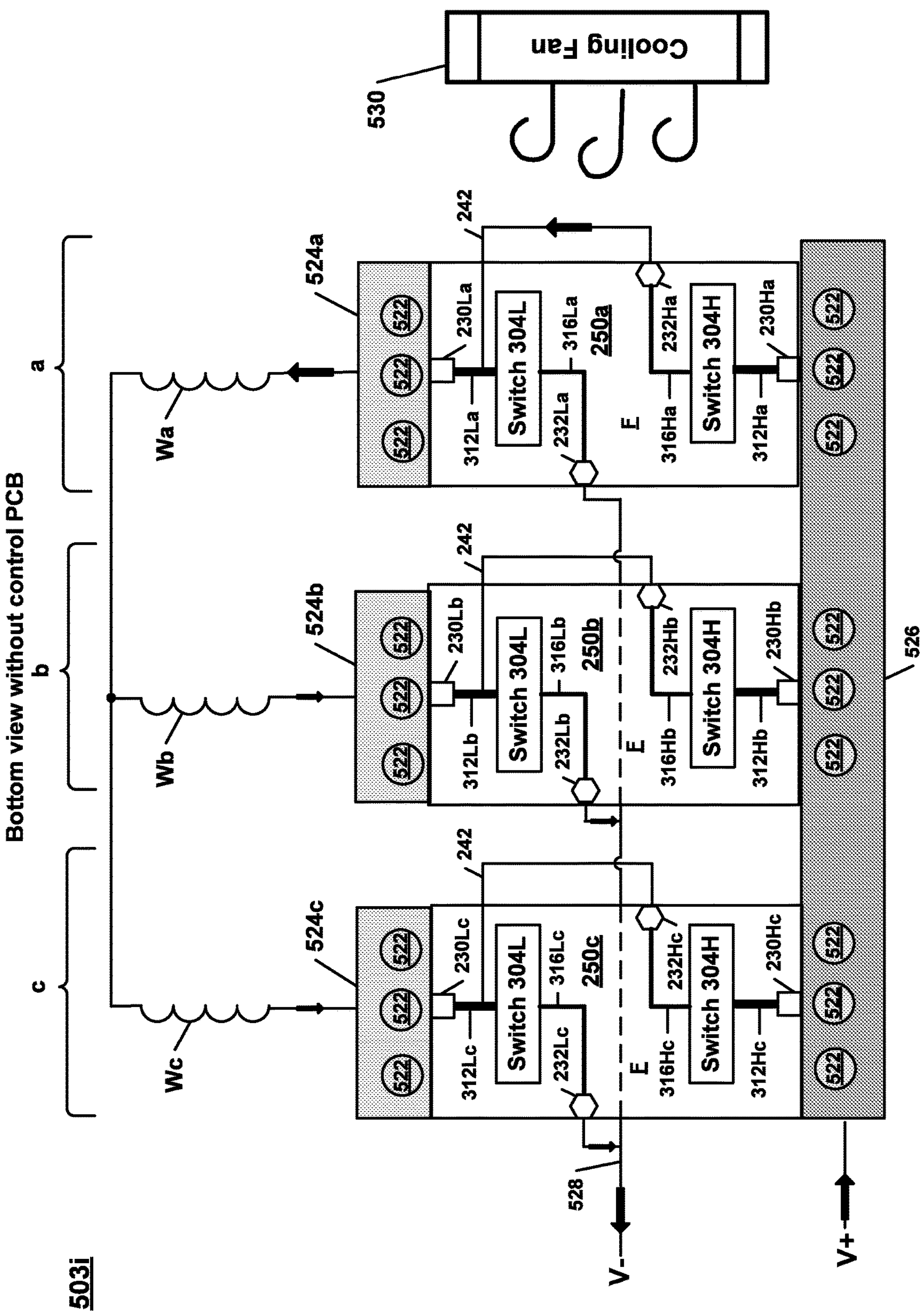
Figures 5, 5A, 6, 7, 8, 9:
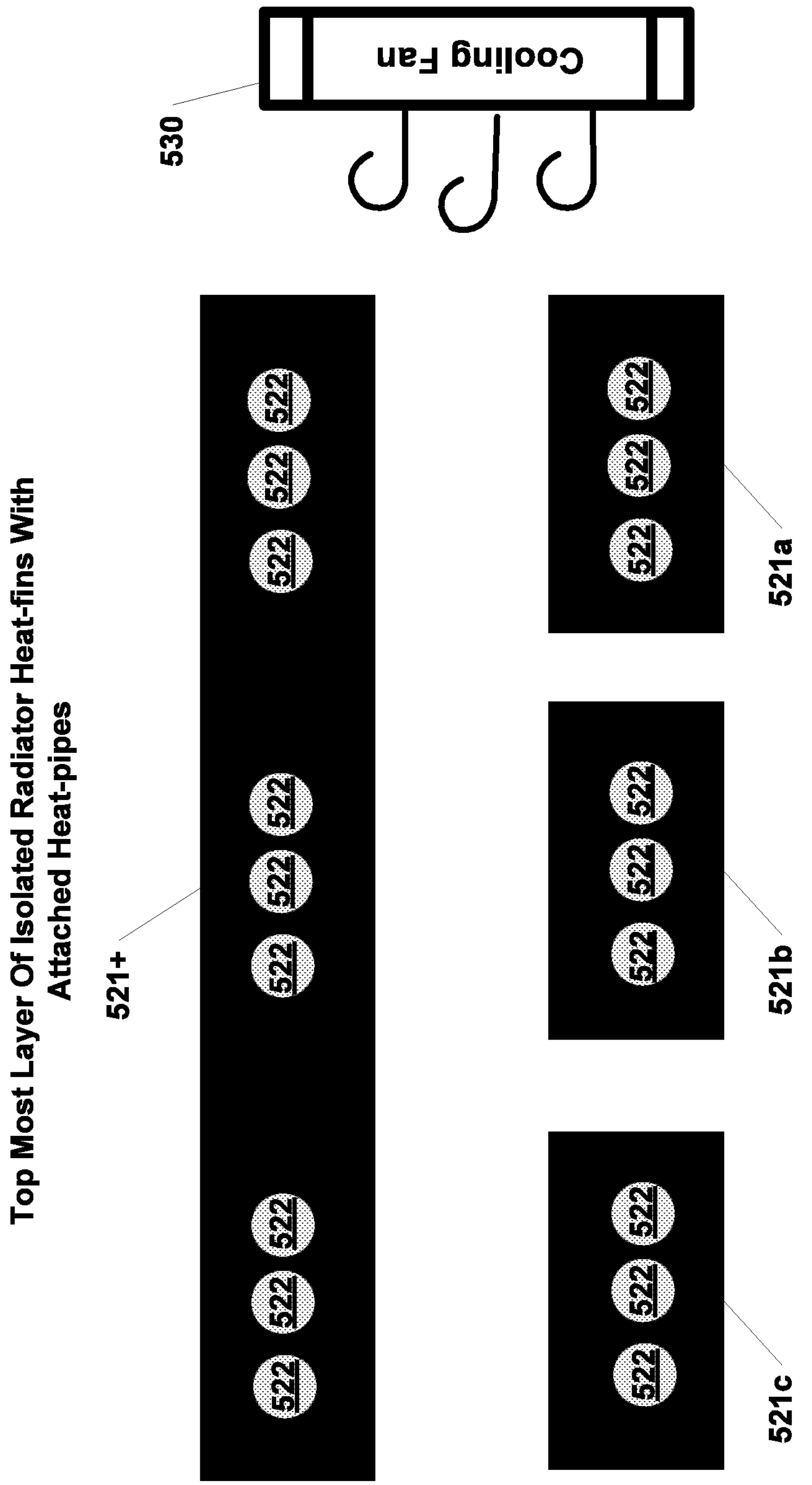
Figures 5, 5A, 6, 7, 8, 9, 10:
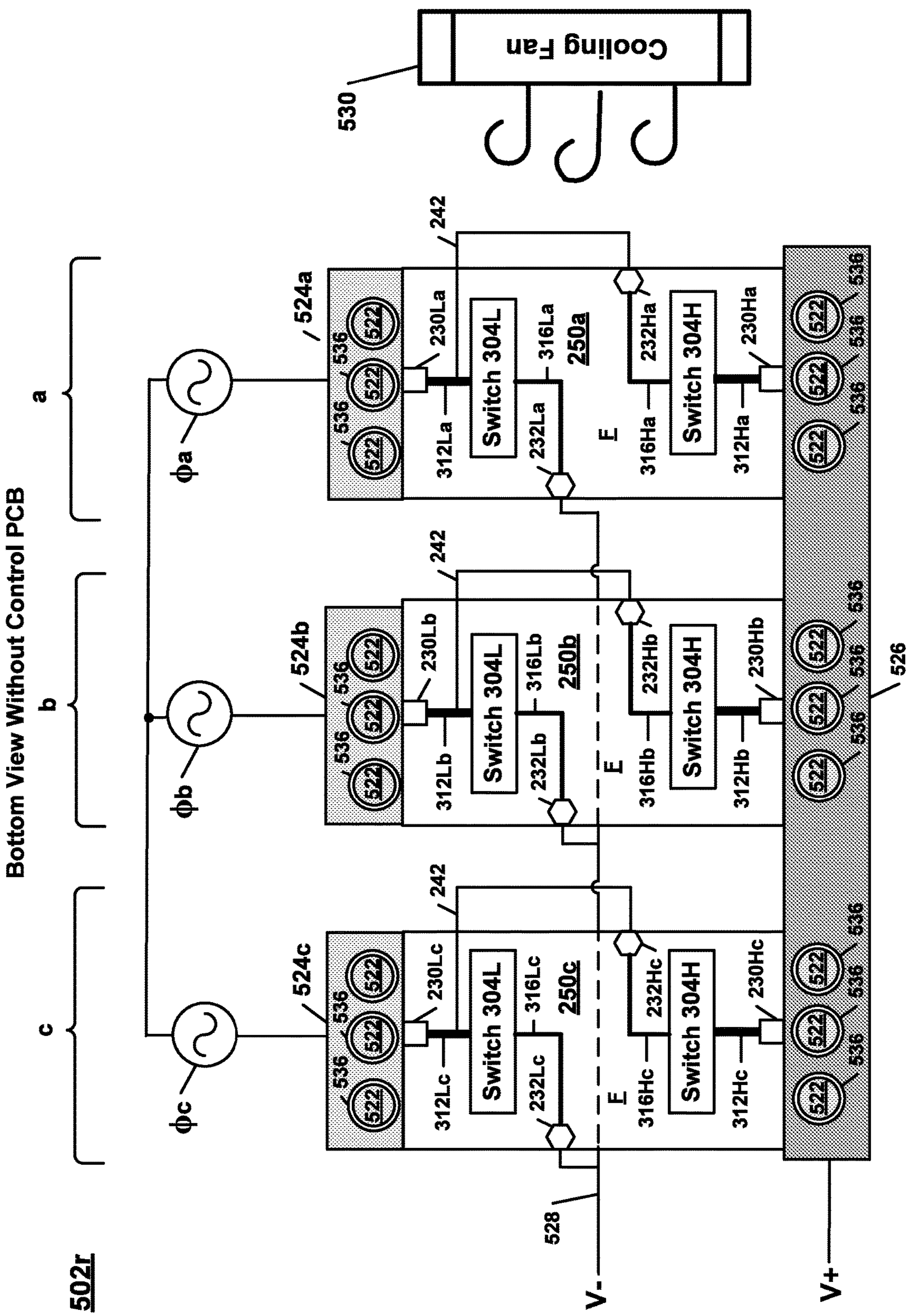
Figures 5, 5A, 6, 7, 8, 9, 10, 11:
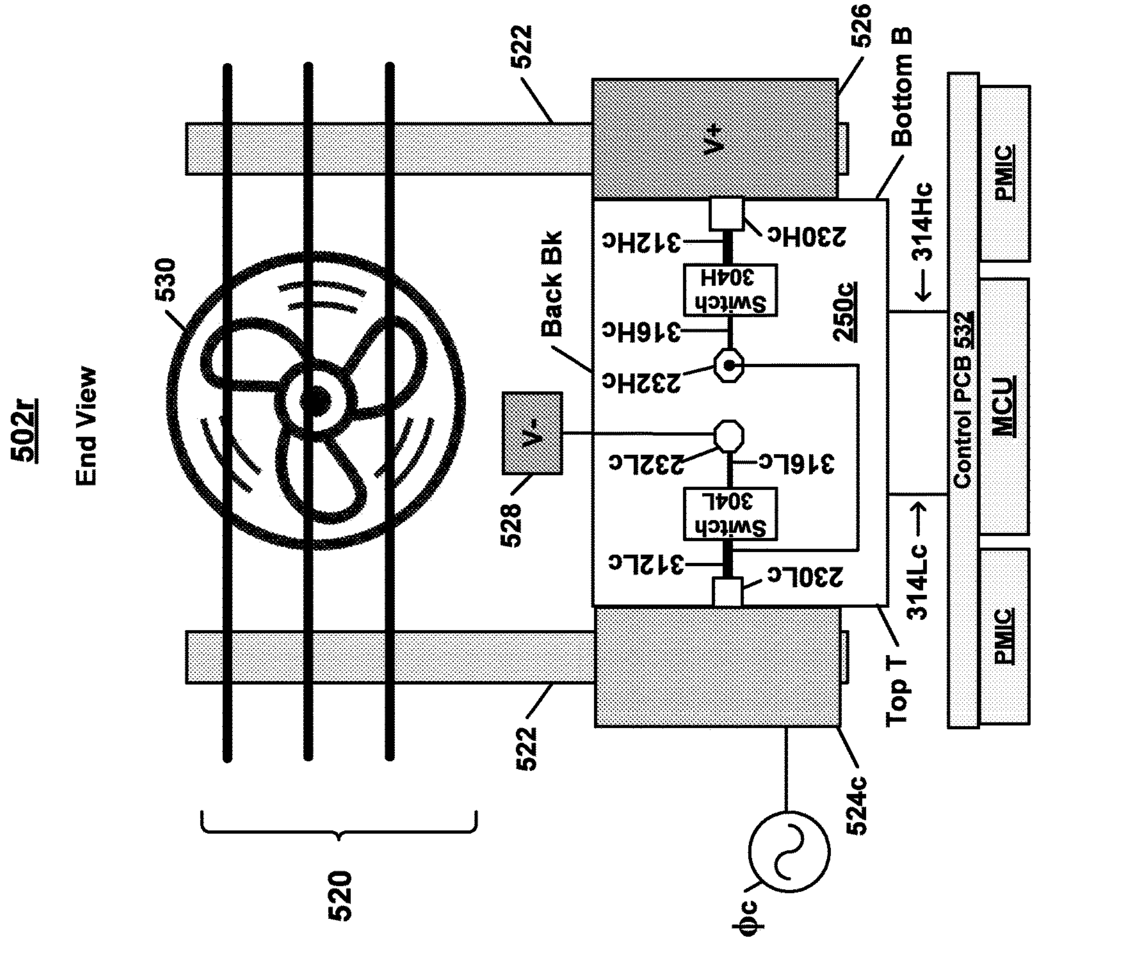

FIGS. 5A-1-5A-5 are quasi-schematic diagrams of an example air-cooled inverter 502*i* when seen from an end, bottom, left side, right side, and top, respectively. Air-cooled rectifiers and air-cooled inverters like inverter 502*i*, employ packaged switches or packaged half bridges like packaged half bridge 250 shown in FIG. 4A-1 or 4G-1. For ease of explanation, packaged switches or packaged half bridges are illustrated with transparent plastic cases in the example air-cooled inverters and air-cooled rectifiers. Although packaged switches or packaged half bridges may include gate drivers and other components, for ease of illustration only power stacks (i.e., switches sandwiched between die clips and die substrates) and connector-leads of packaged switches or packaged half bridges are shown. It is understood that switch modules of some packaged switches include only power stacks and connector-leads (e.g., connector-leads 288). Power stacks are shown symbolically.

In some embodiments, air-cooled inverters or air-cooled rectifiers employ packaged switches or packaged half bridges with multi-transistor switches 304. Switch controllers of these packaged switches or packaged half bridges may include a gate driver like gate driver 306 described above, or alternatively a multi-transistor gate driver, which can independently control transistors of switch 304 with, for example, intentionally staggered gate control voltages, respectively.

With continued reference to FIG. 5A-2, air-cooled inverter system 502*i* has three phases designated a, b, and c. Phases a-c include packaged half bridges 250*a*-250*c*, respectively, which are positioned between and connected to phase bus bars 524*a*-524*c*, respectively, and V+ bus bar 526 as shown.

Switches can be electrically and thermally connected to a heat sink or a bus bar that also acts as a heat sink. For example, switches like switch 304H can be electrically and thermally connected to a bus bar such as V+ bus bar 526, which may also act as a heat sink. The connections can be made by pressing die substrate terminals, such as die substrate terminal 230H to a surface of a bus bar such as V+ bus bar 526. Alternatively, the connections could be made by sintering or soldering the die substrate terminals, such as die substrate terminals 230H to a bus bar such as V+ bus bar 526. Other types of connections are contemplated.

Switches 304L of packaged half bridges 250*a*-250*c* in FIG. 5A-2 are electrically and thermally connected to phase bus bars 524*a*-524*c*, respectively, which also act as heat sinks. These connections can also be made by pressing die substrate terminals 230L to surfaces phase bus bars 524*a*-524*c*. Alternatively, the connections could be made by sintering or soldering the die substrate terminals 230L to surfaces of phase bus bars 524*a*-524*c*. Other types of connections are contemplated.

Phase bus bars, including phase bus bars 524*a*-524*c*, should be electrically isolated from each other. Phase bus bars can be electrically connected to respective devices such as stator windings of an electric motor. Although not shown in FIGS. 5A-1-5A-5, phase bus bars 524*a*-524*c* are electrically connected to stator windings Wa-Wc, respectively. Cases of packaged switches or packaged half bridges, like packaged half bridges 250*a*-250*c*, may be thermally connected to bus bars, like phase bus bars 524*a*-524*c*, respectively, in FIG. 5A-2.

Bus bars in whole or in parts can be made (e.g., extruded, molded, etc.) from a conductive metal like copper or aluminum, and can have different shapes, sizes, and dimensions (e.g., length, width, height, etc.) to accommodate differences in inverter or rectifier design. Phase bus bars 524 and V+ bus bar 526 are rectangular-shaped and have the same width W1=12 mm and height H1=27 mm. Example V+ bus bar 526 has a length L1=100 mm, and example phase bus bars 524 have a length of L2=32 mm.

Example Heat-Pipes

Heat-pipes can be employed in the air-cooled inverters and air-cooled rectifiers of this disclosure. Heat-pipes can draw heat from switches 304 and other devices. Heat-pipes can be connected between bus bars and heat sinks such as heat sinks that include flat metal heat dissipation fins (hereinafter "heat-fins").

FIG. 5A-1 shows air-cooled inverter system 502*i* when seen from an end. This figure shows packaged half bridge 250*c* sandwiched between phase bus bar 524*c* and V+ bus bar 526. Ends of heat-pipes can be embedded in bus bars. FIG. 5A-1 shows example heat-pipes 522 with ends that are embedded in phase bus bar 524*c* and V+ bus bar 526. Heat-pipes, like heat-pipes 522, extend from bus bars and can be connected to flat, metal heat-fins such as heat-fins 520. FIGS. 5A-1-5A-4 show positioning of packaged half bridges 250, phase bus bar 524, heat-fins 520, heat-pipes 522, V− bus bar 528, and V+ bus bar 526 with respect to each other in each phase.

A heat-pipe may include a "wick" and a "working" liquid inside a sealed tube. Typically, a vacuum pump is used to remove air from the tube before it is sealed. Heat-pipes made with rounded tubes (i.e., pipes) are disclosed it being understood that heat-pipes can be made with tubes of other cross-sectional shapes (e.g., rectangular). The tube can be made of a material that is compatible with the working liquid, e.g., copper for water heat-pipes, or aluminum for ammonia heat-pipes. The working liquid quantity is chosen so that the heat-pipe contains both vapor and liquid over an operating temperature range.

FIG. 5A-6 illustrates example heat-pipes 522. Heat-pipe 522*a* contains a wick 552 and liquid, the combination of which is contained within vacuum-sealed tube 550*a* made of a metal such as copper or aluminum. A portion of heat-pipe 522*a* is cut away in FIG. 5A-6 to show wick 552 and the working liquid. Wicks can be directly attached to the inner walls of heat-pipes. FIG. 5A-6 also shows example heat-pipes 522*b* and 522*c* in cross-section. Heat-pipe 522*b* includes a grooved wick, and heat-pipe 522*c* includes a metal wick structure.

Each heat-pipe extends between two end sections. An evaporator end section can be embedded in a bus bar, such as V+ bus bar 526 or phase bus bar 524*c* of FIG. 5A-1. A condenser end section can be attached to a heat sink such as heat-fins 520 using, for example, solder.

Evaporator end sections of heat-pipes are thermally connected to bus bars. Switches 304 are thermally and electrically connected to bus bars. Accordingly, evaporator end sections of heat-pipes can extract heat generated by switches 304 via bus bars. Heat-pipes can also be electrically connected to bus bars in some embodiments.

Condenser end sections of heat-pipes can be thermally connected to heat-fins made of metal or another material with high thermal conductivity such as AlN. These heat-fins can extract heat from condenser end sections of heat-pipes. For purposes of explanation only, heat-fins are made of metal. Heat-pipes can also be electrically connected to metal heat-fins in some embodiments.

In air-cooled inverter system 502*i*, the evaporator end sections of heat-pipes 522 are thermally connected to, but electrically isolated from bus bars 524 and 526, while the condenser end sections are electrically and thermally connected to metal heat-fins 520. Electrical isolation can be provided by a thin layer of dielectric formed on the inner and/or outer cylindrical surfaces of heat-pipes. A wick could be attached to the inner surface of a heat-pipe through a thin layer of dielectric material. For purposes of explanation only, a dielectric material is not formed on inner surfaces of heat-pipes unless otherwise noted.

All, some, or none of the outer surface of a heat-pipe is covered with a thin layer of dielectric material. Evaporator end sections of heat-pipes, such as heat-pipes 522 in inverter 502*i*, can be covered with a thin dielectric layer 536 (see, e.g., FIG. 5A-2) to electrically insulate heat-pipes from the bus bars in which they are contained, while most of the remaining portions of the heat-pipes are naked. To enhance thermal transfer a thin metallization layer, thermal grease or thermal paste can be applied to the dielectric fill air gaps or spaces in the interface between the dielectric layer and the bus bar in which the heat-pipe is embedded. In another embodiment, the evaporator end sections can be thermally and electrically connected to bus bars such as bus bars 524 and 526, while condenser end sections are thermally connected to, but electrically isolated from heat-fins such as metal heat-fins 520. Electrical isolation in this other embodiment can be provided by a thin layer of dielectric formed on the outer surfaces of the condenser end sections, while the remaining portions of the heat-pipes below the heat-fins are naked. To enhance thermal transfer in this other embodiment, a thin metallization layer, a thermal grease or a thermal paste can be applied to fill air gaps or spaces in the interface between the naked sections and the bus bar in which the heat-pipe is embedded.

Working heat-pipes employ phase-transition. More particularly heat from a switch 304 or other device is transmitted to liquid inside heat-pipes at the evaporator end section. The heat vaporizes the liquid, and the vapor travels along the inner cavity of the heat-pipe to the condenser end section. At the condenser end section, heat from the vapor is exchanged with the heat-fins, and the vapor condenses back to liquid, which is absorbed into the wick. The condensed liquid falls back to the evaporator end section, and the cycle continues.

The most common fluids used in heat-pipes include water, ammonia, acetone, and methanol. In moderate temperature range, water is the ideal working fluid due to its high latent heat and boiling point. For low temperature applications, ammonia, acetone, and methanol may be a better option.

The performance of a heat-pipe is mainly determined by its wick, which performs several functions: first, to allow the backflow of the liquid from the condenser end section to the evaporator end section; second, to allow heat transfer to the liquid, and; third, to provide room for the liquid/vapor phase change. Heat-pipes are made with different types of wick structures including; sintered wicks, grooved wicks, and screen mesh wicks. The sintered wick allows high heat transfer and wide working angle. FIG. 5A-6 shows a cross sectional view of example heat-pipe 522*b* that contains a grooved wick. The example wick is "flower" shaped with a ring of small cylindrical sub-channels, which have substantially the same cross section, and which are in fluid communication with a centrally located cylindrical sub-channel that can be larger in cross section when compared to those of cylindrical sub-channels in the ring. A respective spoke sub-channel enables fluid communication between each cylindrical sub-channel in the ring with the centrally located cylindrical sub-channel. Each spoke sub-channel may have any one of many cross-sectional shapes. In the illustrated embodiment, each spoke sub-channel is substantially rectangular in cross section although square or circular cross sections are also contemplated. The grooved wick offers light weight and low cost, but its working angle is limited and often gravity dependent. The screen mesh wick combines the features of both sintered and grooved wicks and is preferable in some applications. The most common screen mesh consists of a woven copper mesh. Screen mesh wicks are created by wrapping a metal fabric or mesh around a forming mandrel, which is then inserted into a tube. After placement, the mandrel is carefully removed leaving behind the wrapped mesh. The mesh tries to unwrap itself leaving the wick held by tension against inner wall of the tube.

Bus bars of this disclosure, including phase bus bars, V− bus bars, and/or V+ bus bars, may contain channels into which heat-pipes are received. More particularly the channels can receive evaporator end sections of heat-pipes. For purposes of explanation, all V+ bus bars are presumed to have channels that receive evaporator end sections of heat-pipes unless otherwise noted. And all V− bus or phase bus bars that also act as heat sinks, are also presumed have channels that receive evaporator end sections of heat-pipes unless otherwise noted. As an aside, channels could be rectangular in cross section to receive and thermally connect to heat-pipes that are similarly shaped in cross-section. Channels of a bus bar, such as phase bus bars 524 and V+ bus bar 526, in which evaporator end sections of heat-pipes are received, may extend perpendicular to the long axis of the bus bar.

In FIGS. 5A-1 and 5A-2 evaporative end sections of heat-pipes 522 are received in respective channels and thermally connected to phase bus bars 524 and V+ bus bar 526. FIG. 5A-2 shows that each heat-pipe 522 is electrically isolated from phase bus bar 524*a*-524*c* or V+ bus bar 526 by a thin layer of dielectric 536. In some embodiments, the dielectric layer should only cover the portions of heat-pipes 522 that are inside bus bars like phase bus bars 524 and V+ bus bar 526. Thermal paste or grease can be used to fill air gaps on the outer surface of dielectrics 536 to enhance thermal transfer with the bus bar.

FIG. **5*a*-1 shows heat-pipes 522 extending through phase bus bar 524*c* and V+ bus bar 526. In an alternative embodiment evaporative end portions of heat-pipes 522 are fully contained within phase bus bars 524*a*-524*c* and V+ bus bar 526. To enhance heat dissipation, heat-pipes 522 like those of FIG. 5*a*-1 can be positioned closer to the surfaces of bus bars, such as phase bus 524 and V+ bus bar 526 that engage die substrate terminals 230**.

The condenser end sections of heat-pipes 522 can be thermally and electrically connected to metal heat-fins such as heat-fins 20 in FIG. 5A-1, which in turn can be cooled by a fan such as fan 530. The figures of this disclosure show three flat, metal heat-fins, it being understood that fewer or more metal heat-fins can be employed in alternative embodiments. The metal heat-fins need not be flat but can take a shape other than that shown within the figures. FIG. 5A-5 is a top view of the topmost heat-fin 520. In one embodiment outer surfaces of heat-pipes 522 are soldered to the cylindrical wall of apertures formed through metal heat-fins such as heat-fins 520.

material (e.g., a TIM). A dielectric layer, such as dielectric layer 536, can be formed by anodization or plasma electrolytic oxidation. A heat-pipe can have multiple dielectric layers. For example, a thin layer of dielectric material (e.g., aluminum nitride) can be applied to the outer surface after an anodized layer is formed on the heat-pipe's outer surface. Other processes for forming a dielectric layer or dielectric layers are contemplated.

A dielectric layer, such as dielectric layer 536, can electrically insulate a heat-pipe from the bus bar, heat sink or other device. The dielectric material can have a dielectric strength in a range up to 10 kV. Dielectric layers, such as dielectric layer 536, are presumed to be 0.2 mm in thickness, although smaller or larger thicknesses are contemplated. The thickness and material of dielectric layer affects heat transfer.

The table below includes calculated heat transfer W for dielectric layer 536 for different dielectric materials and thicknesses. W is proportional to k·A·(T1−T2)/d, where k is the thermal conductivity, A is area, T1−T2=70 is the temperature difference across the dielectric layer, and d is the thickness in micrometers. A voltage of 4 kV is presumed across the dielectric for the calculated heat transfer W.

| | Thermal Conductivity | Dielectric Strength | Thickness Requirement (@4000 V) | | Heat Transfer (W) (@ΔT-° C., area-cm$^2$) | |
|---|---|---|---|---|---|---|
| | (W/mK) | (kV/mm) | (μm) | (mils) | (W) | ΔT = 70 A = 1 |
| $Al_2O_3$ | 24.0 | 16.9 | 236.7 | 9.3 | 710 | |
| $Si_3N_4$ | 90.0 | 12.0 | 333.3 | 13.1 | 1,890 | |
| AlN | 170.0 | 16.7 | 239.5 | 9.4 | 4,968 | |
| BN-Hex | 30.0 | 40.0 | 100.0 | 3.9 | 2,100 | |
| AlN + AO (50/50) | 92.0 | 26.6 | 150.5 | 5.9 | 4,279 | |
| AlN + AO (75/25) | 126.0 | 21.7 | 184.7 | 7.3 | 4,775 | |
| HBN + AO (50/50) | 27.5 | 35.7 | 112.0 | 4.4 | 1,718 | |
| Diamond | 1500.0 | 1000.0 | 4.0 | 0.2 | 2,625,000 | |
| Epoxy | 4.0 | 19.7 | 203.0 | 8.0 | 138 | |
| Teflon | 0.3 | 60.0 | 66.7 | 2.6 | 34 | |
| HDPE | 0.2 | 20.0 | 200.0 | 7.9 | 7 | |
| Nylon | 0.3 | 14.0 | 285.7 | 11.2 | 6 | |
| Rubber | 0.1 | 12.0 | 333.3 | 13.1 | 3 | |
| Phenolic | 0.2 | 6.9 | 579.7 | 22.8 | 2 | |
| Polyamide | 0.3 | 55.0 | 72.7 | 2.9 | 29 | |
| Polycarbonate | 0.2 | 38.0 | 105.3 | 4.1 | 15 | |
| Liquid Crystal Polymer | 1.6 | 25.6 | 156.3 | 6.2 | 72 | |

Outer surfaces of the evaporator end sections of heat-pipes can interface with surfaces of the channels of heat sinks, V+, V−, or phase bus bars in which the heat-pipes are received. The evaporator end section's outer surface of each heat-pipe such as heat-pipes 522 in FIGS. **5*a*-1-5A-4, can be covered with a thin layer (e.g., 0.1-1.0 mm) 536 of dielectric material (e.g., aluminum oxide, aluminum nitride, silicon nitride, etc.). The dielectric layer (e.g., dielectric layer 536) on the outer surface might be the only dielectric in the thermal path between a switch 304 and the liquid in a heat-pipe. The outer surface of a dielectric layer, such as dielectric layer 536**, contacts the inner surface of the channel in which the heat-pipe is received. Some thermal paste or thermal grease can be added between dielectric and the inner surface of the channel to enhance heat transfer.

A dielectric layer, such as dielectric layer 536, can be formed by spraying (e.g., flame spraying or plasma spraying) a dielectric material on the outer surface of the heat-pipe. Alternatively, a dielectric layer, such as dielectric layer 536, can be formed by rolling heat-pipes in a dielectric In one embodiment, plasma electrolytic oxidation or a type II or a type III hardcoat anodizing process can be used to grow a dielectric layer on substantially all of the inner and/or outer surfaces, or on only specific portions of the inner and/or outer surfaces of a heat-pipe. Again, for the purposes of explanation only, dielectrics are not formed on the inner surface of heat-pipes unless otherwise noted.

Type II anodizing is a process that involves placing a metal (e.g., aluminum) piece in an acid (e.g., sulfuric) bath. Type III hardcoat anodizing is done under more exacting process conditions resulting in a thicker dielectric layer.

Anodization is an electrolytic passivation process for creating or increasing the thickness of a natural oxide layer on the surface of metal parts. Anodization builds up an oxide on the surface of the metal part as well as into the metal too, about half and half. The resulting oxide layer is electrically insulating. An oxide layer is grown by passing a direct current through an electrolytic solution, typically sulphuric or chromic acid, in which all or a part of the metal part (e.g., a heat-pipe) is suspended and exposed. The metal part serves as the anode (the positive electrode in an electrolytic cell). Current flow through the electrolytic solution releases hydrogen at the cathode (the negative electrode) and oxygen at the surface of the metal part, creating a build-up of the oxide. The voltage required may range from 1 to 300 V DC. Higher voltages are typically required for thicker oxide coatings formed in sulfuric and organic acid. The anodizing current varies with the overall area of the metal part sections being anodized and typically ranges from 30 to 300 A/m2. Conditions such as electrolyte concentration, acidity, solution temperature, and current can be controlled to allow the formation of a consistent oxide layer. Harder, thicker oxide layers tend to be produced by more concentrated solutions at lower temperatures with higher voltages and currents.

An anodizing process can be used for growing a dielectric layer of oxide on the outer surface of aluminum heat-pipes. The heat-pipe serves as the anode for the process. Current flows through the electrolytic bath solution in which some or most of the heat-pipe is suspended, and releases hydrogen at the cathode and oxygen at the outer surface of heat-pipe, creating a build-up of the oxide. An anodizing process can be used to grow dielectric layer, such as dielectric layer 536, on only the outer surface of evaporator end sections of aluminum heat-pipes, such as heat-pipes 522, employed in rectifiers or inverters, such as inverter 502*i* of FIG. 5A-1. An anodizing process can be used to grow a dielectric layer on only the outer surface of condenser end sections of aluminum heat-pipes. Still further, an anodizing process can be used to grow a dielectric layer on substantially all the outer surface of aluminum heat-pipes.

Plasma electrolytic oxidation (PEO) is another electrochemical surface treatment process for growing insulating layers on metal heat-pipes. It is like anodizing, but it typically employs higher potentials, so that discharges occur, and the resulting plasma modifies the structure of the oxide layer. This process can be used to grow thick (hundreds of micrometers), largely crystalline, oxide coatings on heat-pipes made of metals such as aluminum, magnesium, and titanium. The coating is a chemical conversion of the metal into its oxide and grows both inwards and outwards from the original metal surface. In the plasma electrolytic oxidation of aluminum, at least 200 V should be applied. This locally exceeds the dielectric breakdown potential of the growing oxide film, and discharges occur. These discharges result in localized plasma reactions, with conditions of high temperature and pressure which modify the growing oxide. Processes may include melting, melt-flow, re-solidification, sintering and densification of the growing oxide. One of the most significant effects, is that the oxide is partially converted from amorphous alumina into crystalline forms such as corundum ($\alpha$-Al2O3) which is much harder. The heat-pipe to be coated is immersed in a bath of electrolyte, which usually consists of a dilute alkaline solution such as KOH. It is electrically connected to become one of the electrodes in an electrochemical cell, with the other electrode typically being made from an inert material such as stainless steel, and often consisting of the wall of the bath itself. Potentials over 200 V can be applied between these two electrodes.

Anodization or plasma electrolytic oxidation may provide several advantages when compared to other methods (e.g., spraying a dielectric on the outer surface of heat-pipes) for forming dielectric layer such as dielectric layer 536. For example, anodization may provide a more mechanically robust dielectric layer. The outer surface of an anodized dielectric layer may be smoother when compared to other methods, which may increase heat transfer between the heat sink or bus bar on one side of the dielectric and the heat-pipe on the other side.

Regardless of the method of forming dielectric layer, it can electrically isolate a heat-pipe from a bus bar, heat sink, or other device while transferring heat therebetween. In some embodiments, no dielectric exists between heat-pipes and switches 304. FIGS. 5A-7 and 5A-8 end and bottom views, respectively, of an alternative compact inverter 503*i*, which is like compact inverter 502*i*. FIG. 5A-9 shows the top most electrically isolated heat fins for compact inverter 503*i*. With reference to FIG. 5A-8, compact inverter 503*i* employs heat-pipes 522 that lack a dielectric on the outer surface thereof. With reference to FIGS. 5A-7 and 5A-9 compact inverter system 503*i* includes electrically isolated metal fins 521-*a*-521-*c*, and 521+. Fins 521-*a* 521-*c* are electrically and thermally connected to heat-pipes 522 that are embedded phase bus bars 524*a*-524*c*, respectively, while fin 521+ is electrically and thermally connected to heat-pipes 522 that are embedded in V+ bus bar 526. As shown in FIG. 5A-9, the heat fins are electrically isolated from each other.

In general, the diameters of heat-pipes in a bus bar or heat sink need not be equal. The number, position, and/or diameter of heat-pipes, including its dielectric layer, may depend on one or more variables. For example, the number, position, and/or diameter of the heat-pipes may depend on a desired thermal capacitance of the bus bar or heat sink in which the heat-pipes are contained. Or the number, position, and/or diameter of the heat-pipes may depend on a desired thermal resistance between the switch 304 and fluid internal to the heat-pipes. Or the number, position, and/or diameter may depend on optimizing the thermal capacitance based on a desired thermal resistance, or vice-versa.

Although not shown in the figures of various air-cooled inverters and rectifiers of this disclosure, terminals like die substrate terminal 230 in FIG. 5A-1, or die clip terminals like die clip terminal 344, can be electrically and/or thermally connected to corresponding pedestals on heat sinks or bus bars like V+ bus bar 526 and phase bus bars 524. The pedestals can have substantially flat surfaces that can be electrically and/or thermally connected (e.g., press-fit connected, soldered, sintered, etc.) to die substrate terminals or die clip terminals. A pedestal surface can be substantially similar in size and shape to the die substrate or die clip terminal to which it is connected to maximize the thermal and/or electrical conduction therebetween. Although not required, a thin layer of thermally and/or electrically conductive material (e.g., grease or paste) could be applied between a bus bar pedestal surface and a die substrate terminal or die clip terminal to further enhance thermal and/or electrical conductivity when they are pressed together. Clamps, bolts, and other such fasteners may be used to press packaged switches or packaged half bridges, and thus their die clip or die substrate terminals, against bus bar pedestals.

Bus bar pedestals may create air gaps between plastic cases of packaged switches or packaged half bridges on one side, and V− bus bars, heat sinks, phase bus bars, or V+ bus bars on the other side. In some embodiments, a thermally conductive structure can fill each air gap to create a thermal path through which heat generated by, for example gate driver 306, can be transmitted to a heat sink or bus bar. For example, thermally conductive structures can be positioned adjacent to respective pedestals, and between the V+ bus bar and respective packaged switches or packaged half bridges. The thermally conductive structures transmit heat from the packaged switches or packaged half bridges to the V+ bus bar. The height of the thermally conductive structures may be slightly less than the height of the pedestals in this embodiment. During construction, a thermally-conductive dielectric grease or similar TIM, can be applied to a flat surface opposite the flat surface of each thermally conductive structures that engages the V+ bus bar, to accommodate the differences in height and ensure thermal connection between the bus bar or heat sink, and a corresponding packaged switch or packaged half bridge. Heat generated by, for example, gate drivers 306 can be transferred to the V+ bus bar via the thermal grease and thermally conductive structures.

Phase bus bars like phase bus bars 524*a*-524*c* of FIG. 5A-2, can conduct current between devices. For example phase bus bars 524*a*-524*c* can conduct current between stator windings Wa-Wc and packaged switches or packaged half bridges 250*a*-250*c*, respectively. Phase bus bars such as phase bus bars 524*a*-524*c* can be electrically and thermally connected to terminals like low-side die substrate terminals 230La-230Lc, respectively, of FIG. 5A-2. Phase bus bars such as phase bus bar 524*a*-524*c* can also be electrically connected to terminals such as high-side die clip terminals 232Ha-232Hc, respectively, of FIG. 5A-1. These latter electrical connections can be made through metal straps that are internal or external to a packaged half bridge. FIG. 5A-2 symbolically shows external metal straps 242. The metal straps may directly connect terminals like die clip terminals 232Ha-232Hc to bus bars like phase bus bars 524*a*-524*c*, respectively. Alternatively, external metal straps, like the metal strap 242 shown in FIG. 2B-3, may connect terminals like die clip terminals 232Ha-232Hc to other terminals like side terminals 240 of, for example, low-side die substrates 312La-312-Lc, respectively. Die substrate side-terminals are not shown in the example compact inverter and rectifier systems. Terminals such as low-side die clip terminals 232La-232*c* can be electrically connected to a bus bar such as V− bus bar 528, which in turn can be coupled to a device such as a V− battery terminal. The V− bus bar 528 is symbolically shown in FIG. 5A-2. In FIG. 5A-1 V− bus bar 528 is positioned between rows of heat-pipes 522 and has a rectangular cross-section it being understood that other shapes are contemplated.

FIGS. 5A-1-5A-4 include current symbols that represent current flow through inverter system 502*i* at an instant in time. More particularly, FIG. 5A-2 shows current flow through activated high-side switch 304H of phase-a, while low-side switches 304L of phases b and c are activated and conducting current to the V− battery terminal via the V− bus bar 528. All other switches are deactivated in the figure. Importantly, all die substrate terminals 230 are thermally and electrically connected to V+ bus bar 526, or to phase bus bars 524.

One or more DC link capacitors can be electrically connected between a V+ bus bar like V+ bus bar 526 and a V− bus bar like V− bus bar 528. FIGS. 5A-3 and 5A-4 shows DC link capacitors C electrically connected at both ends of inverter 502*i*. A DC link capacitor can take form in a thin film capacitor, or the DC link capacitor may take form in an array of ceramic capacitors coupled in parallel. Other types of capacitors can be used, including electrolytic capacitors. In still another embodiment each DC link capacitor may include several types of capacitors (e.g., thin film and ceramic) coupled in parallel.

A DC link capacitor like DC link capacitor C may fail during compact inverter or compact rectifier operation and create an electrical short between a V+ bus bar and a V− bus bar. Fuses may be added in series between DC link capacitors and either a V+ bus bar or a V− bus bar as a safety measure. If an electrical short is created across a DC link capacitor, its corresponding fuse can open to prevent additional current flow between the V+ bus bar and the V− bus bar. DC link capacitors can get hot during operation of a power converter.

DC link capacitors like capacitors C may be thermally connected to one or more bus bars like V+ bus bar 526. The thermal connection enables heat extraction from the DC link capacitor.

In some embodiments of compact rectifiers or compact inverters, such as compact inverters 400*i*-502*i*, the number and/or type of transistors in one switch such as switch 304H may be different from the number and/or type of transistors in another switch such as switch 304L. For purposes of explanation only, all switches in an inverter or rectifier are presumed to have the same number and type of transistors unless otherwise noted.

Cases of packaged half bridges 250*a*-250*c* may be thermally connected to phase bus bars 524*a*-524*c*, respectively. Cases of packaged half bridges 250*a*-250*c* may also be thermally connected to V+ bus bar 526.

Inverters and rectifiers may include a control PCB. FIGS. 5A-1, 5A-3, and 5A-4 show a control PCB 532 that is electrically connected to packaged half bridges 250 through respective sets 314 of connector-leads. In one embodiment connector-leads of sets, such as sets 314, extend laterally from cases of packaged half bridges as mentioned above (see, e.g., FIG. 3G-4) or packaged switches. Sets of connector-leads, such as set 314, can be received in connectors, which may be mounted on a control PCB and electrically connected to traces thereon.

A microcontroller or other processor-based control unit, PMICs, and other devices can be connected to traces on a side of a control PCB, such as PCB 532, that is opposite the side that is adjacent to the packaged switches or packaged half bridges. In another embodiment, the devices (e.g., microcontroller, PMICs, etc.) can be mounted on both sides of the control PCB. The microcontroller, PMICs and other devices can be electrically connected to packaged switches or packaged half bridges, such as packaged half bridges 250, through traces and metal vias formed in the control PCB, connectors, and connector-leads such as connector-leads of sets 314. PMICs supply biasing voltages to respective switch modules, such as switch modules 300 of packaged half bridges 250. The microcontroller provides PWM and other signals to switch modules, such as switch modules 300 of packaged half bridges 250. The microcontroller may also receive signals such as Vv, Vt, and Vi from switch modules, such as switch modules 300 of packaged half bridges 250. The height of example compact inverter system 502*i*, including heat-pipes 522 and PCB 532, may be H2=100 mm. In some embodiments, an inverter or rectifier may include a control PCB and a power PCB, the latter of which will be described below.

Air-Cooled Rectifier 502*r*

Packaged switches and packaged half bridges can be employed in air-cooled rectifiers and other power converters. FIGS. 5*a*-10 and FIG. 5A-11 are quasi-schematic diagram of an example air-cooled rectifier system 502*r* that employs packaged half bridges 250. FIG. 5A-10 shows air-cooled rectifier system 502*r* when seen from the bottom. FIG. 5*a*-11 shows air-cooled rectifier system 502*r* when seen from an end. Air-cooled rectifiers like rectifier 502*r* can be employed in DC fast chargers, variable frequency drive controllers, etc.

Air-cooled rectifiers like rectifier 502*r* can be electrically connected to an LCL filter like LCL filter 162 of FIG. 1C. On its other side the LCL filter can be electrically connected to a three-phase AC power system like system 164 shown in FIG. 1C. For ease of illustration only, an LCL filter is not shown in the figures for air-cooled rectifiers of this disclosure. Rather, sources ϕa-ϕc of a three-phase AC power system are shown as inputs to the air-cooled rectifiers. Accordingly, phase bus bars of the rectifiers are electrically connected to AC sources ϕa-ϕc in the figures, it being understood that other devices like LCL filters can be connected therebetween.

Rectifier system 502*r* and inverter system 502*i* are substantially similar. Some differences may exist. The microcontroller mounted on control PCB 532 in rectifier system 502*r* may be different than the microcontroller mounted on control PCB 532 in inverter system 502*i*, or the CPU executable instructions stored in memory of microcontroller mounted on control PCB 532 in rectifier system 502*r* may be different than CPU executable instructions stored in memory of the microcontroller mounted on control PCB 532 in inverter system 502*i*. Control PCB 532 of rectifier 502*r* may also include a phase-lock loop (PLL) and other components for synchronizing the control of switches 304 to the frequency (e.g., 60 Hertz) of the three-phase AC input voltages provided by the AC sources ϕa-ϕc. Control PCB 532 may also include components for power factor correction. It should be noted that air-cooled inverters of this disclosure may also include PLLs and other devices that enable them to operate in reverse as rectifiers.

Air-Cooled Inverter System 504*i*

Each phase of example compact inverter system 502*i* in FIG. 5A-2 has one packaged half bridge. Compact inverter systems should not be limited thereto. Air-cooled inverters or rectifiers can have two, three, four or more packaged switches or packaged half bridges per phase. The power throughput of air-cooled inverters or rectifiers can increase with an increase in the number of packaged switches or packaged half bridges per phase.

Figures 1, 5B:
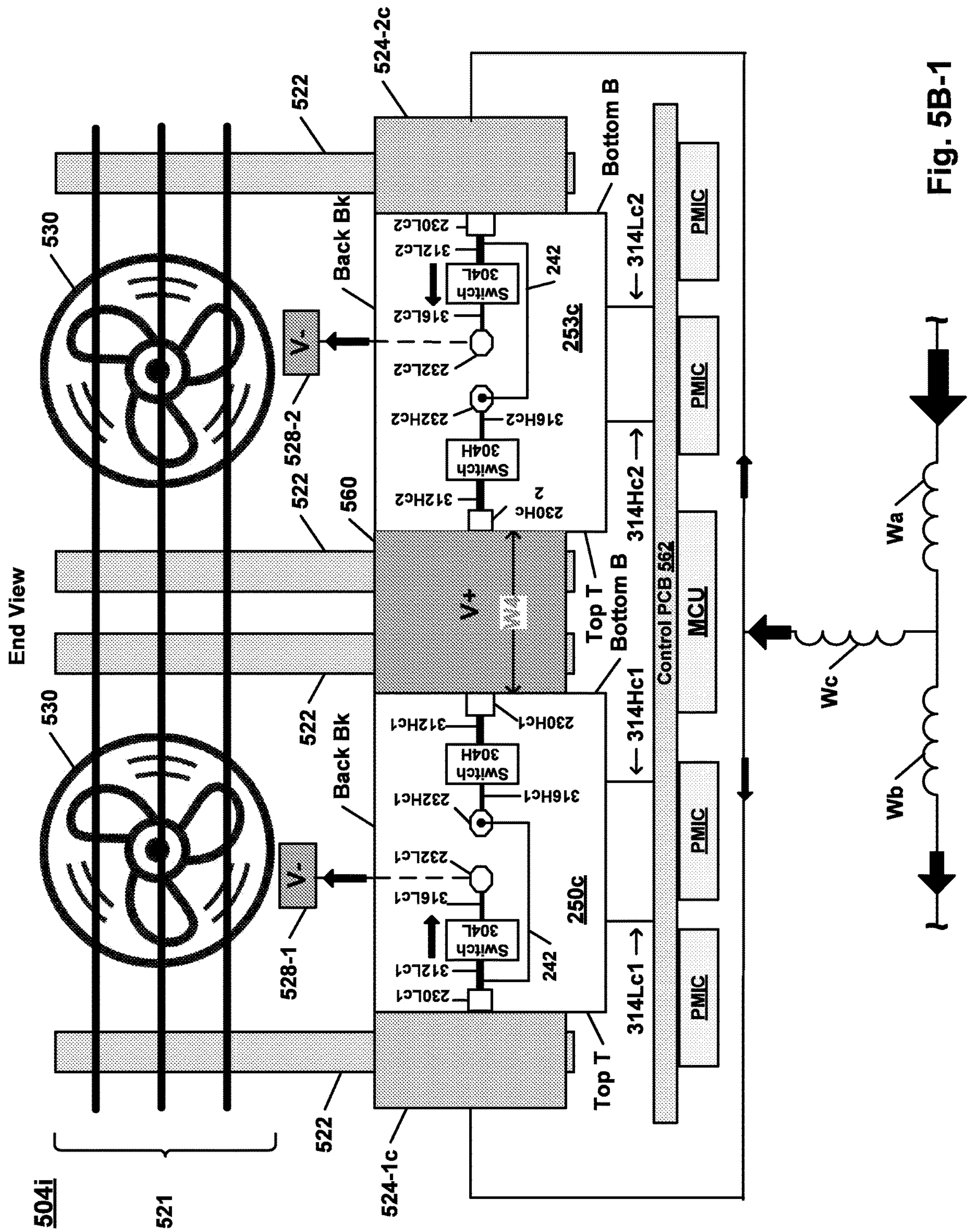
Figures 2, 5B:
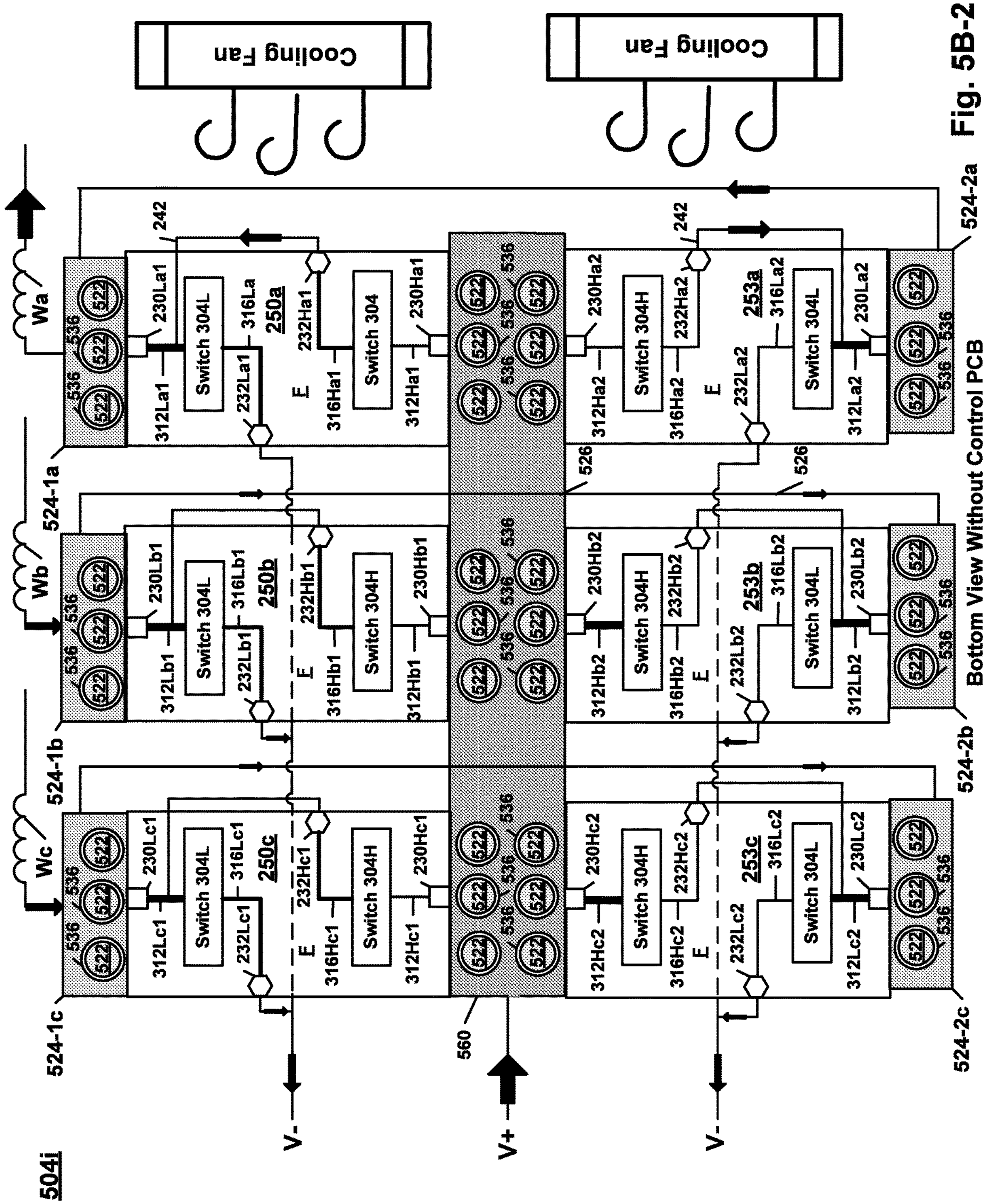
Figures 3, 5B:
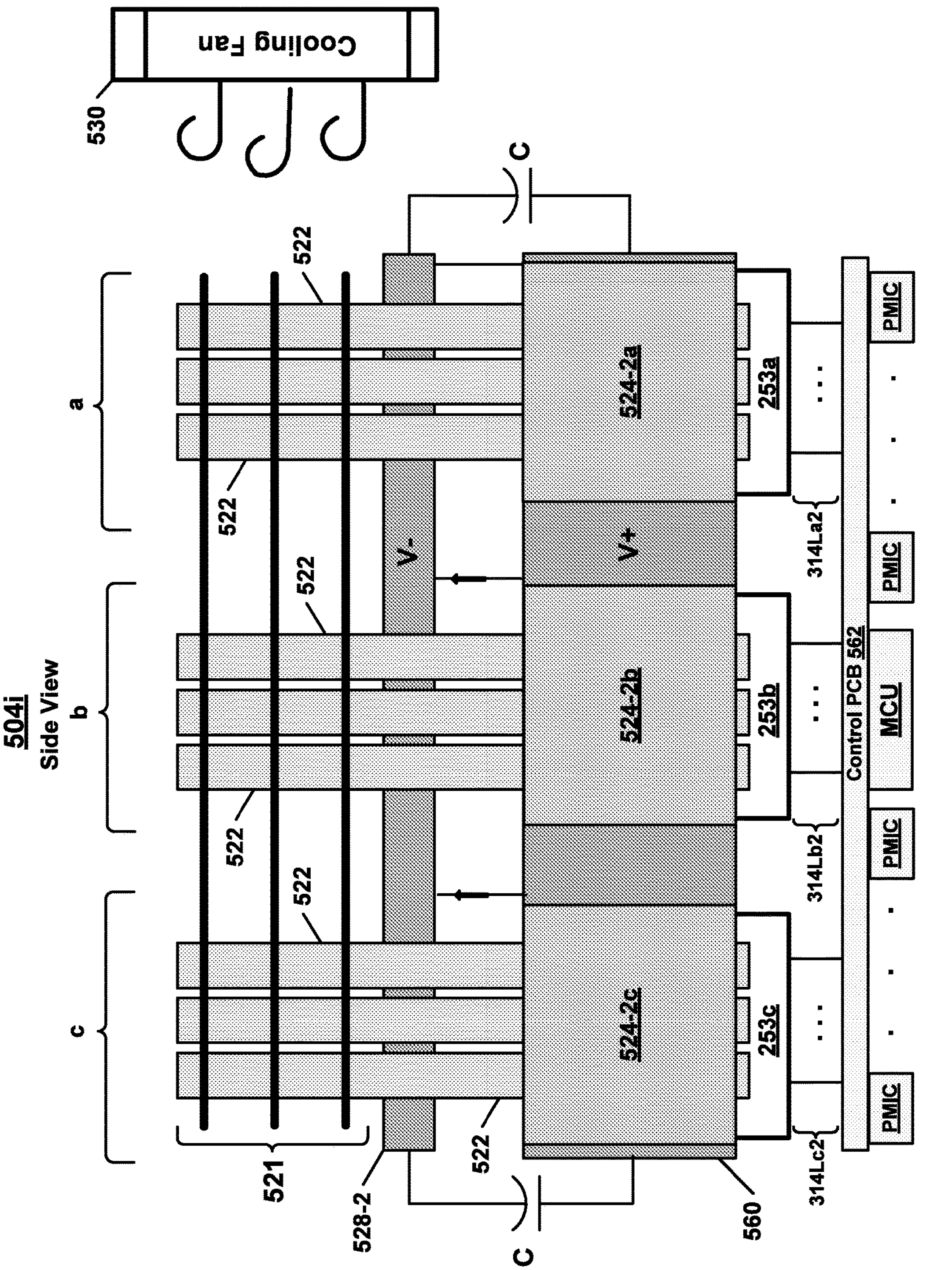
Figures 4, 5B:
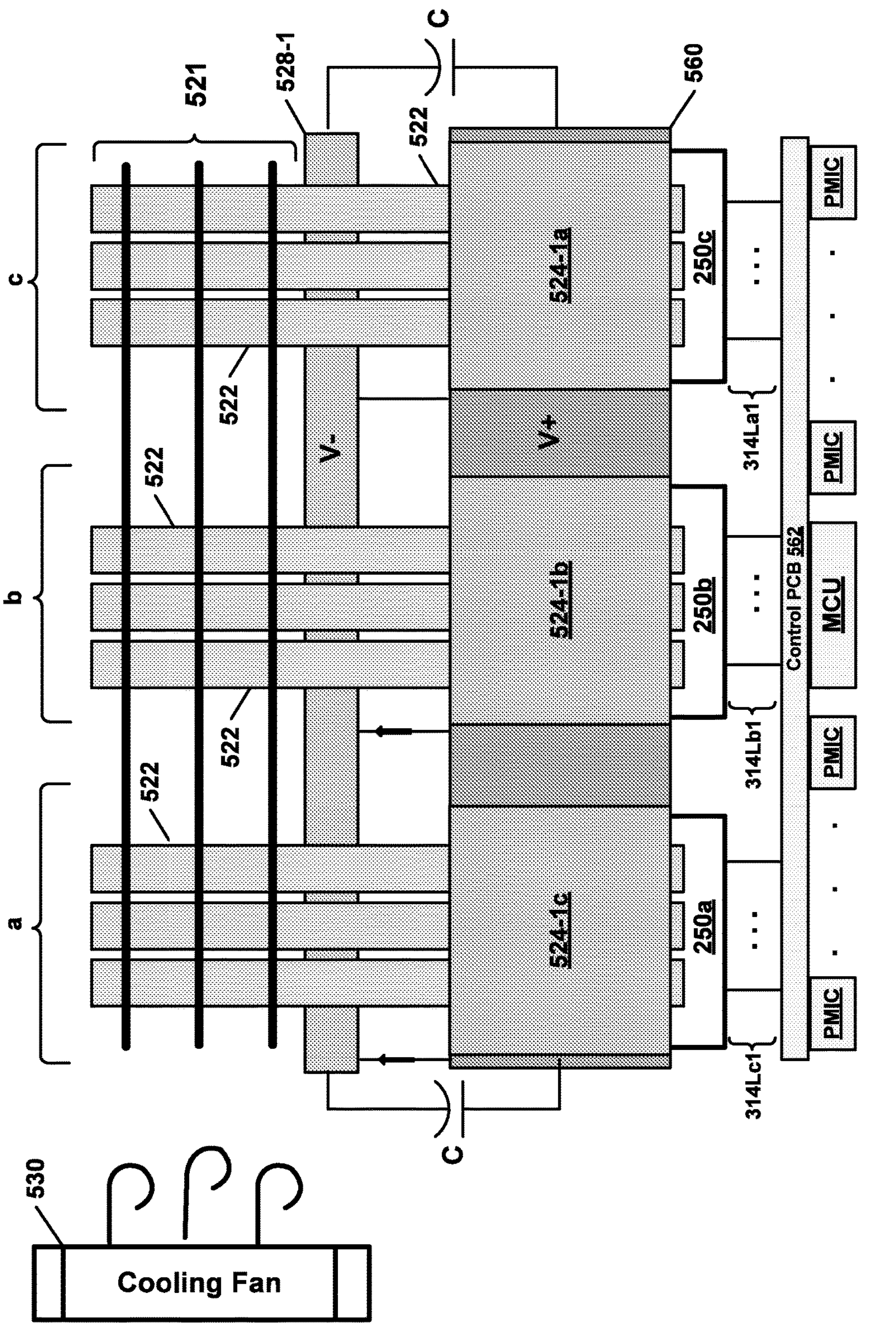
Figures 5, 5B:
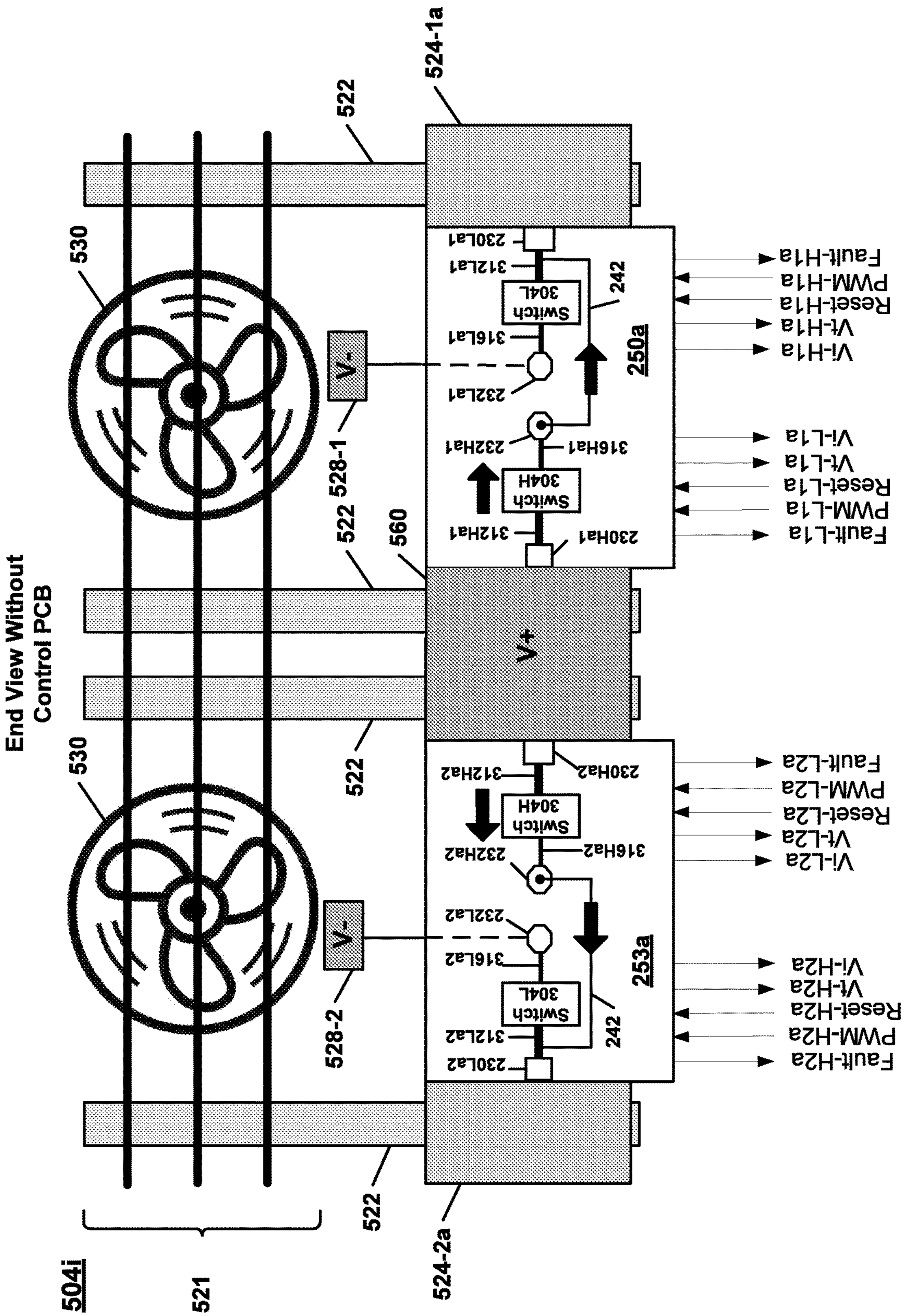
Figures 5, 5B, 6:
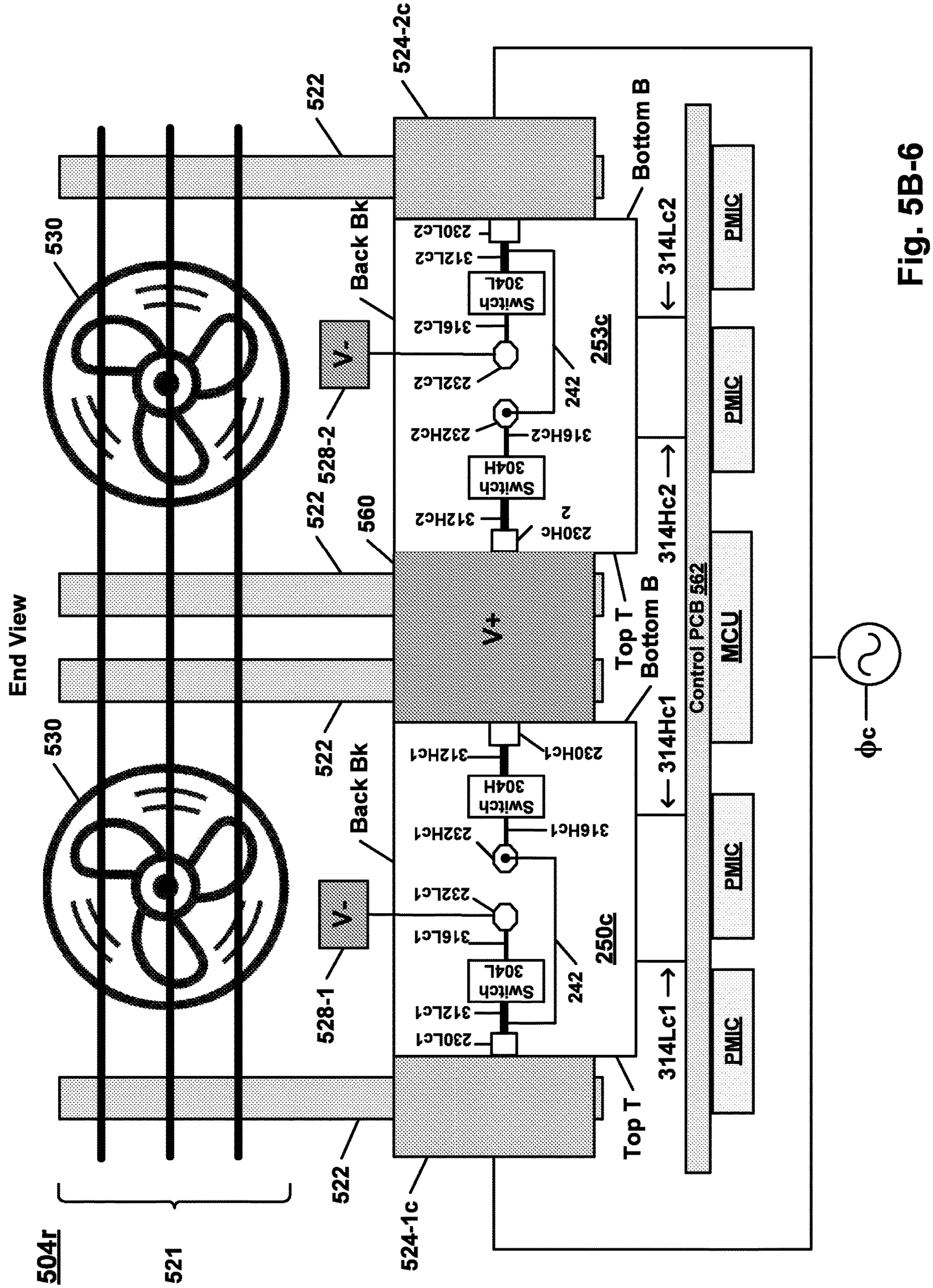
Figures 5, 5B, 6, 7:
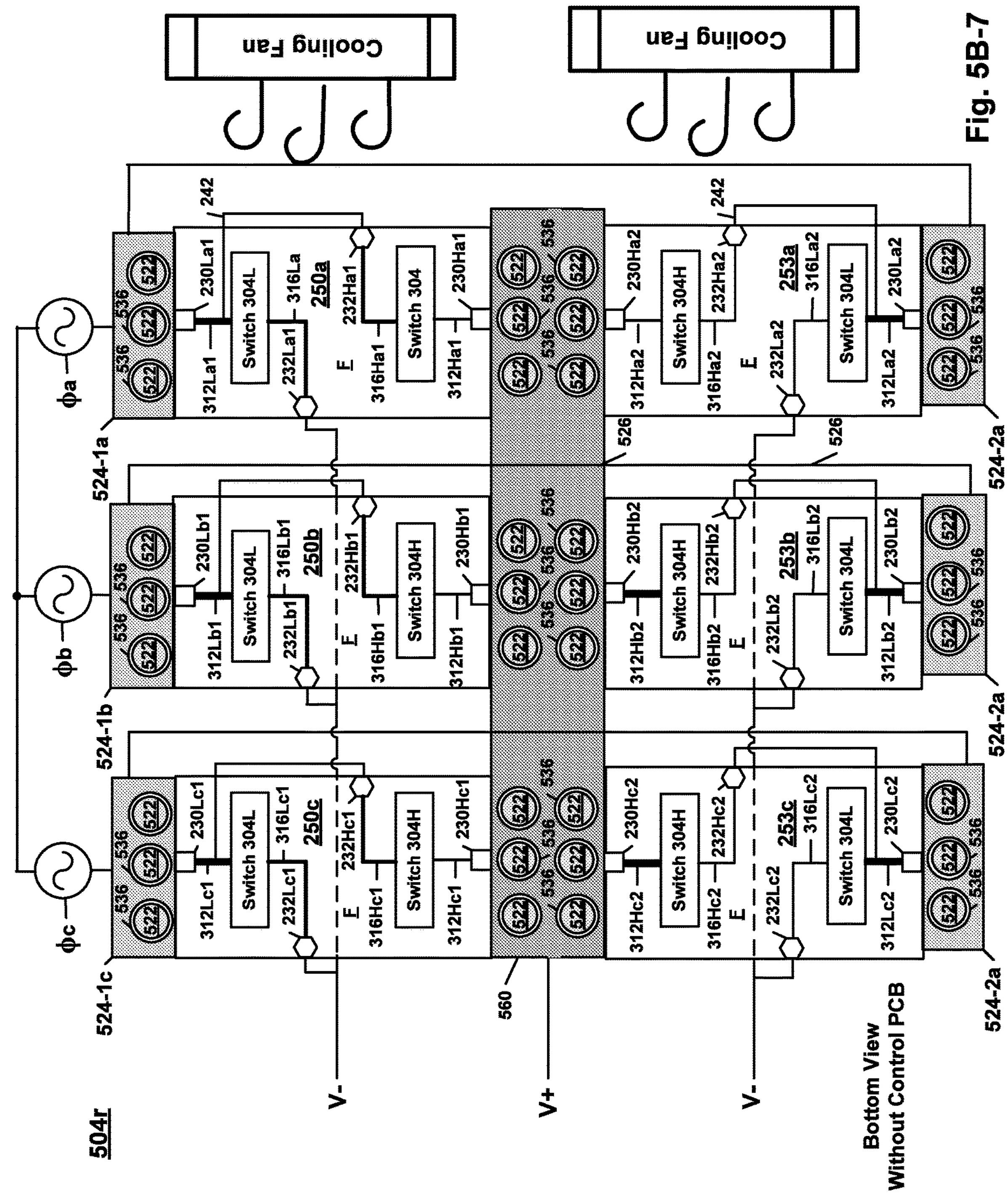

FIGS. 5B-1-5B-4 are quasi-schematic diagrams showing another air-cooled inverter system 504*i* when seen from an end, bottom, left side, and right side. Similarities exist between compact inverters 504*i* and 502*i*. Compact inverter system 504*i* may have the same height and length as compact inverter system 502*i*, but compact inverter system 504*i* is substantially wider.

With reference to FIG. 5B-2, compact inverter system 504*i* has three phases a-c, each of which includes a packaged half bridge 250 like that shown in FIG. 4A-1 or 4G-1. Packaged half bridges 250*a*-250*c* are thermally and electrically connected to and positioned between phase bus bars 524-1*a*-524-1*c*, respectively, and V+ bus bar 560. Each phase a-c of compact inverter 504*i* also includes a packaged half bridge 253 like that shown in FIG. 4C-1 or FIG. 4H-1. Packaged half bridges 253*a*-253*c* are thermally and electrically connected to and positioned between V+ bus bar 560 and phase bus bars 524-2*a*-524-2*c*, respectively. In one embodiment of compact inverter 504*i*, the number and/or type of transistors in switch 304 of packaged half bridge 250 may be different from the number and/or type of transistors in switch 304 of packaged half bridge 253. For purposes of explanation only, all switches 304 in inverter 504*i* are presumed to have the same number and type of transistors.

Ends of heat-pipes 522 are embedded in V+ bus bar 560 and phase bus bars 524 and thermally connected thereto. FIGS. 5B-1-5B-5 show how packaged half bridges 250 and 253, phase bus bars 524, heat-pipes 522, fins 521, and V+ bus bar 560 of each phase are laterally positioned with respect to each other. V+ bus bar 560 may have a width W4=24 mm a height of 27 mm, and a length of 100 mm.

Switches 304H of packaged half bridges 250 and 253 are electrically and thermally connected to V+ bus bar 560, which also acts as a heat sink. The connections can be made by pressing die substrate terminals 230H to V+ bus bar 560. Alternatively, the connections can be made by sintering or soldering die substrate terminals 230H to V+ bus bar 560. Other connection types are contemplated. Cases of packaged half bridges 250 and 253 may be thermally connected to V+ bus bar 560. Cases of packaged half bridges 250 and 253 in each phase may also be thermally connected to phase bus bars 524-1 and 524-2, respectively.

Switches 304L of packaged half bridges 250*a*-250*c* are electrically and thermally connected to phase bus bars 524-1*a*-524-1*c*, respectively. The connections can be made by pressing die substrate terminals 230La1-230Lc1 to surfaces of phase bus bars 524-1*a*-524-1*c*, respectively. Alternatively, the connections can be made by sintering or soldering die substrate terminals 230La1-230Lc1 to phase bus bars 524-1*a*-524-1*c*, respectively. Other connection types are contemplated. Phase bus bars 524-1*a*-524-1*c* are electrically isolated from each other and act as heat sinks to respective switches 304L of packaged half bridges 250. Phase bus bars 524-1*a*-524-1*c* are electrically connected to stator windings Wa-Wc, respectively Switches 304L of packaged half bridges 253*a*-253*c* are electrically and thermally connected to phase bus bars 524-2*a*-524-2*c*, respectively. The connections can be made by pressing die substrate terminals 230La2-230Lc2 to surfaces of phase bus bars 524-2*a*-524-2*c*, respectively. Alternatively, the connections can be made by sintering or soldering die substrate terminals 230La2-230Lc2 to phase bus bars 524-2*a*-524-2*c*, respectively. Other connection types are contemplated. Phase bus bars 524-2*a*-524-2*c* are electrically isolated from each other and act as heat sinks to respective switches 304L of packaged half bridges 253. Phase bus bars 524-2*a*-524-2*c* are electrically connected to stator windings Wa-Wc, respectively.

FIG. 5B-I shows air-cooled inverter system 504*i* when seen from an end. FIG. 5B-I shows packaged half bridge 250*c* sandwiched between phase bus bar 524-1*c* and V+ bus bar 560 and packaged half bridge 253*c* sandwiched between phase bus bar 524-2*c* and V+ bus bar 560. This view also shows heat-pipes 522 embedded within phase bus bars 524 and V+ bus bar 560.

As seen in FIG. 5B-I evaporative end portions of heat-pipes 522 are received in and thermally connected to respective channels formed in phase bus bars 524 and V+ bus bar 560. FIG. 5B-2 is a view of air-cooled inverter 504*i* when seen from the bottom. With continuing reference to FIG. 5B-1, FIG. 5B-2 shows that each heat-pipe 522 is electrically isolated from phase bus bar 524 or V+ bus bar 560 by dielectric 536. FIG. 5B-2 shows heat-pipes 522 extending slightly through phase bus bar 524-1*c*, phase bus bar 524-2*c*, and V+ bus bar 526. To enhance heat dissipation, the heat-pipes 522 are positioned closer to the surfaces in phase bus bars 524 and V+ bus bar 560 that engage die substrate terminals 230.

Channels of phase bus bars 524 and V+ bus bar 560 in which ends of heat-pipes 522 are received, are cylindrical and extend perpendicular to the long axes of phase bus bars 524 and V+ bus bar 560. In an alternative embodiment, the channels may be rectangular in cross section to receive similarly shaped heat-pipes. The condenser end sections of heat-pipes 522 are thermally and electrically connected to metal heat-fins 521, which may be wider than the metal fins 520 shown in FIG. 5A-1. Packaged half bridges 250 and 253 are not drawn to scale in the example converter systems of this disclosure. The figures show two fans 530 only because half bridges 250 and 253, which are shown schematically, are drawn with dimensions that are disproportionate to the dimensions of the phase bus bars 524 and V+ bus bar 560 in the figures. Air-cooled inverter 504*i* may need only one fan 530 to cool fins 521.

Returning to FIGS. 5B-1 and 5B-2, phase bus bars 524-1*a*-524-1*c* can conduct current between stator windings Wa-Wc, respectively, and packaged half bridges 250*a*-250*c*, respectively. Phase bus bars 524-1*a*-524-1*c* are electrically and thermally connected to low-side die substrate terminals 230La1-230Lc1, respectively. Phase bus bars 524-1*a*-524-1*c* are also electrically connected to high-side die clip terminals 232Ha1-232Hc1, respectively. High-side die clip terminals 232Ha1-232Hc1 can be electrically connected to phase bus bars 524-1*a*-524-1*c* via respective metal straps that are internal or external to the packaged half bridges 250*a*-250. The metal straps may connect die clip terminals 232Ha1-232Hc1 to phase bus bars 524-1*a*-524-1*c*, respectively. Alternatively, and as shown, external metal straps may connect die clip terminals 232Ha1-232Hc1 to small side-terminals (not shown) of low-side die substrates 312La1-312Lc1, respectively. Metal straps 242 are shown symbolically and referenced only in phase c.

The low-side die clip terminals 232La1-232*cl* are electrically connected to a V− bus bar 528-1, which has a rectangular cross section as shown in FIG. 5B-1, and which is coupled to a V− battery terminal or other DC source.

Phase bus bars 524-2*a*-524-2*c* can conduct current between stator windings Wa-Wc, respectively, and packaged half bridges 253*a*-253*c*, respectively. Phase bus bars 524-2*a*-524-2*c* are electrically and thermally connected to low-side die substrate terminals 230La2-230Lc2, respectively. Phase bus bars 524-2*a*-524-2*c* are also electrically connected to high-side die clip terminals 232Ha2-232Hc2, respectively. High-side die clip terminals 232Ha2-232Hc2 can be electrically connected to phase bus bars 524-2*a*-524-2*c* via respective metal straps that are internal or external to the packaged half bridges 253*a*-253. The metal straps may directly connect die clip terminals 232Ha2-232Hc2 to phase bus bars 524-2*a*-524-2*c*, respectively. Alternatively, and as shown, external metal straps may connect die clip terminals 232Ha2-232Hc2 to side terminals (not shown) of low-side die substrates 312La2-312Lc2, respectively.

The low-side die clip terminals 232La2-232*c*2 are electrically connected to a V− bus bar 528-2, which has a rectangular cross section as shown in FIG. 5B-1, and which is coupled to a V− battery terminal or other DC source.

FIGS. 5B-1-5B-5 show how packaged half bridge 250, packaged half bridge 253, phase bus bars 524, and V+ bus bar 560 of each phase are laterally positioned with respect to each other. The V− bus bar 528 is symbolically shown in FIG. 5A-2. FIG. 5A-1 shows V− bus bar 528-1 positioned between rows of heat-pipes 522, and V− bus bar 528-2 positioned between another pair of rows of heat-pipes 522.

FIGS. 5B-1-5B-5 include current symbols that represent current flow through inverter system 504*i* at an instant in time. More particularly, FIG. 5B-2 shows current flow through activated high-side switches 304H of phase-a, while low-side switches 304L of phases b and c are activated and conducting current to the V− battery terminal via the V− bus bars 528-1 and 528-2. All other switches are deactivated in the figure. Importantly, all die substrate terminals 230 are thermally and electrically connected to V+ bus bar 560, or phase bus bars 524. DC link capacitors C can be electrically connected between V+ bus bar 560 and V− bus bars 528 at the end sides of inverter 504*i* as shown in FIGS. 5B-3 and 5B-4. Capacitors C may also be thermally connected to V+ bus bar 560.

FIGS. 5B-1, 5B-3, and 5B-4 show a control PCB 562 that is electrically connected to packaged half bridges 250 and 253 through respective sets 314-1 and 314-2, respectively, of lead-conductors in each phase. A microcontroller or other processor-based control unit, PMICs and other devices can be mounted to traces on a side of the PCB 532 that is opposite the side that is adjacent to the packaged half bridges 250 and 253. The microcontroller and PMICs are electrically connected to packaged half bridges 250 and 253 through traces and metal vias formed in control PCB 562, connectors, and sets 314 of conductor-leads. The PMICs supply biasing voltages to respective switch modules of packaged half bridges 250 and 253. The microcontroller provides PWM and other signals to the packaged half bridges 250 and 253, and the microcontroller receives feedback signals from the gate driver 306, V_Sense, T_Sense, and I_Sense circuits of the packaged half bridges. The height of example air-cooled inverter system 504*i*, including heat-pipes 522 and PCB 532, may be H2=65 mm.

With continuing reference to FIG. 5B-1, FIG. 5B-5 shows PWM and Reset signals received by phase-a of air-cooled inverter system 504*i* from the microcontroller of control PCB 562. FIG. 5B-5 also shows Fault, Vi, and Vt outputs from phase-a. Each packaged half bridge 250 or 253 in a phase can be controlled by independent sets of PWM and Reset signals generated by a microcontroller or other processor-based device. The microcontroller can provide independent sets of PWM and Reset signals in accordance with processor executable instructions stored in memory. For example, the PWM signals provided a microcontroller to the high-side gate drivers of packaged half bridges 250 and 253 in each phase may be intentionally staggered in time (e.g., the rising edge of PWM-H1*a* leads the rising edge of PWM-H2*a*, and/or the falling edge of PWM-H1*a* leads the falling edge of PWM-H2*a*, or; the rising edge of PWM-H1*a* leads the rising edge of PWM-H2*a*, and/or the falling edge of PWM-H2*a* leads the falling edge of PWM-H1*a*), and the PWM signals provided to the low-side gate drivers of packaged half bridges 250 and 253 in each phase may be intentionally staggered in time (e.g., the rising edge of PWM-L1*a* leads the rising edge of PWM-L2*a*, and/or the falling edge of PWM-L1*a* leads the falling edge of PWM-L2*a*, or; the rising edge of PWM-L1*a* leads the rising edge of PWM-L2*a*, and/or the falling edge of PWM-L2*a* leads the falling edge of PWM-L1*a*). In an alternative embodiment, the high-side gate drivers of packaged half bridges 250 and 253 in a phase, may be commonly controlled by a first high-side PWM signal from the microcontroller, and the low-side gate drivers of packaged half bridges 250 and 253 may be commonly controlled by a first low-side PWM signal from the microcontroller. In still another embodiment, one of packaged half bridges 250 and 253 in each phase may be active while the other of the of packaged half bridges 250 and 253 in each phase is inactive.

Air-Cooled Rectifier 504*r*

FIG. 5B-6 is quasi-schematic diagram of an example air-cooled rectifier system 504*r* when seen from an end. FIG. 5B-7 is quasi-schematic diagram of example air-cooled rectifier system 504*r* when seen from the bottom. Phase bus bars 524 are electrically connected to AC voltage sources ϕa-ϕc. Rectifier system 504*r* and inverter system 504*i* are substantially similar. Some differences exist. The microcontroller mounted on control PCB in rectifier system 504*r* may be different than the microcontroller mounted on control PCB in inverter system 504*i*, or the CPU executable instructions stored in memory of microcontroller mounted on the control PCB in rectifier system 504*r* may be different than CPU executable instructions stored in memory of the microcontroller mounted on the control PCB in inverter system 504*i*. Control PCB of rectifier 504*r* may also include a phase-lock loop (PLL) and other components for synchronizing the control of switches 304 to the frequency (e.g., 60 Hertz) of the three-phase AC input voltages provided by the AC sources ϕa-ϕc.

Air-Cooled Inverter 506*i*

Figures 1, 5C:
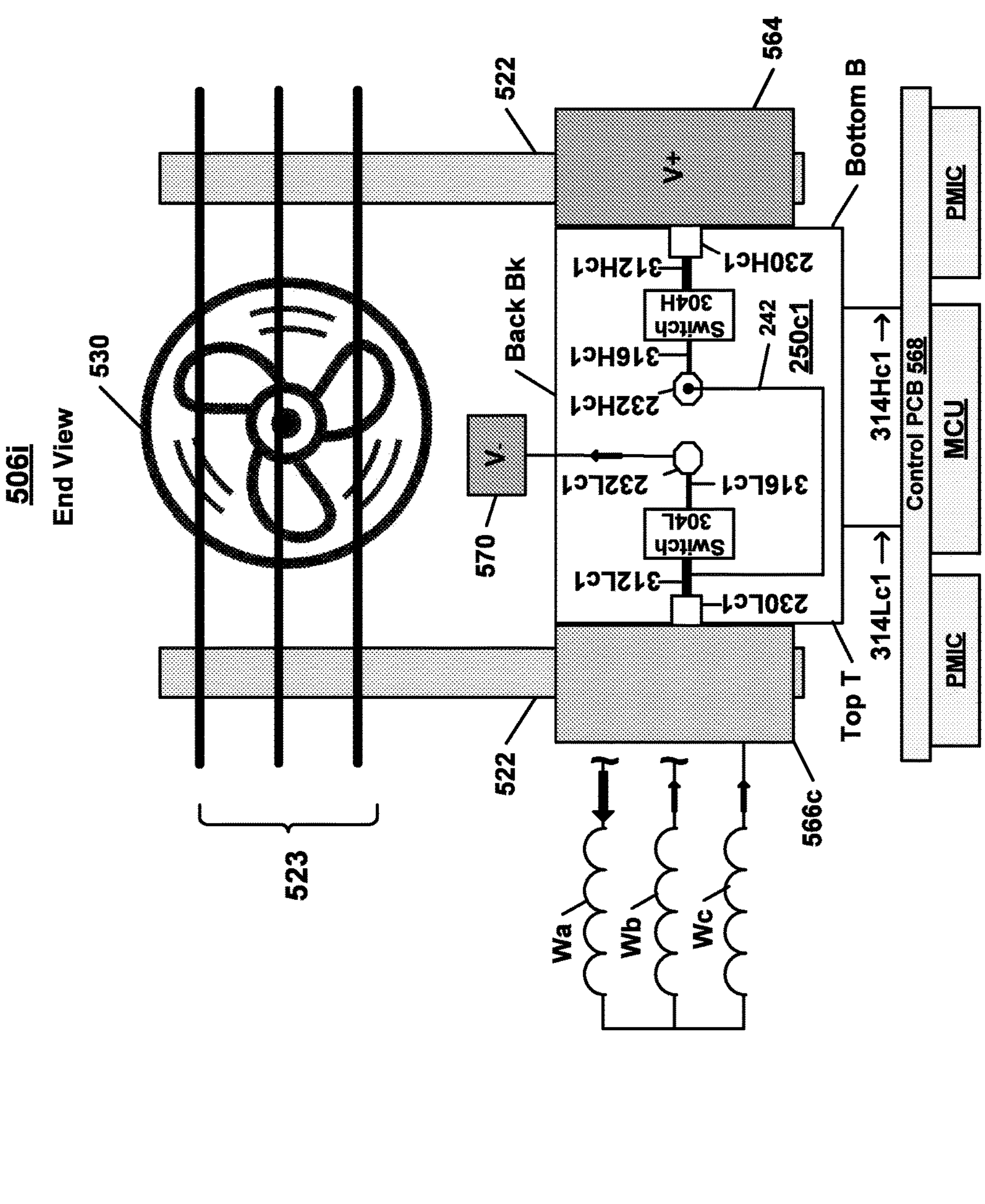
Figures 2, 5C:
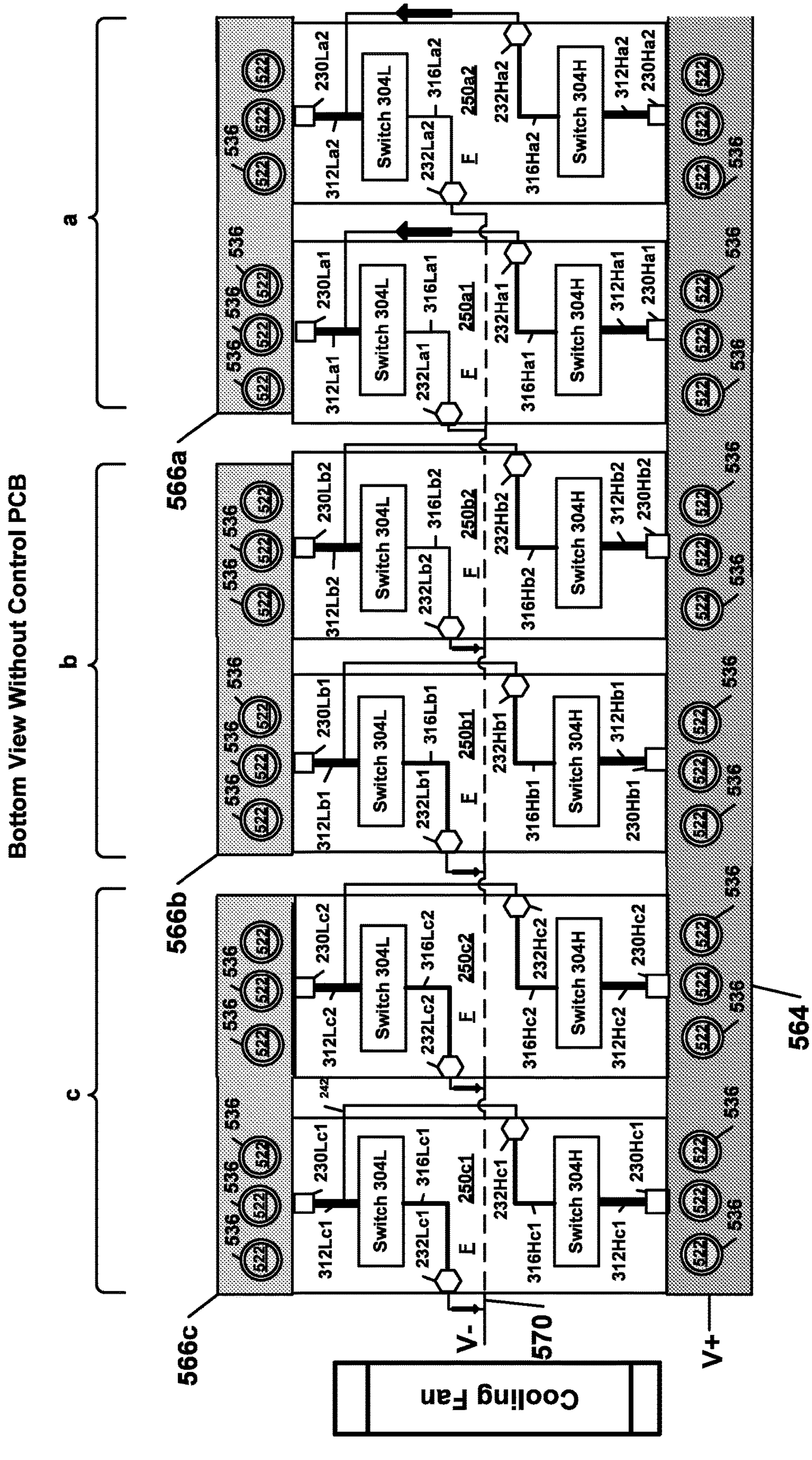
Figures 3, 5C:
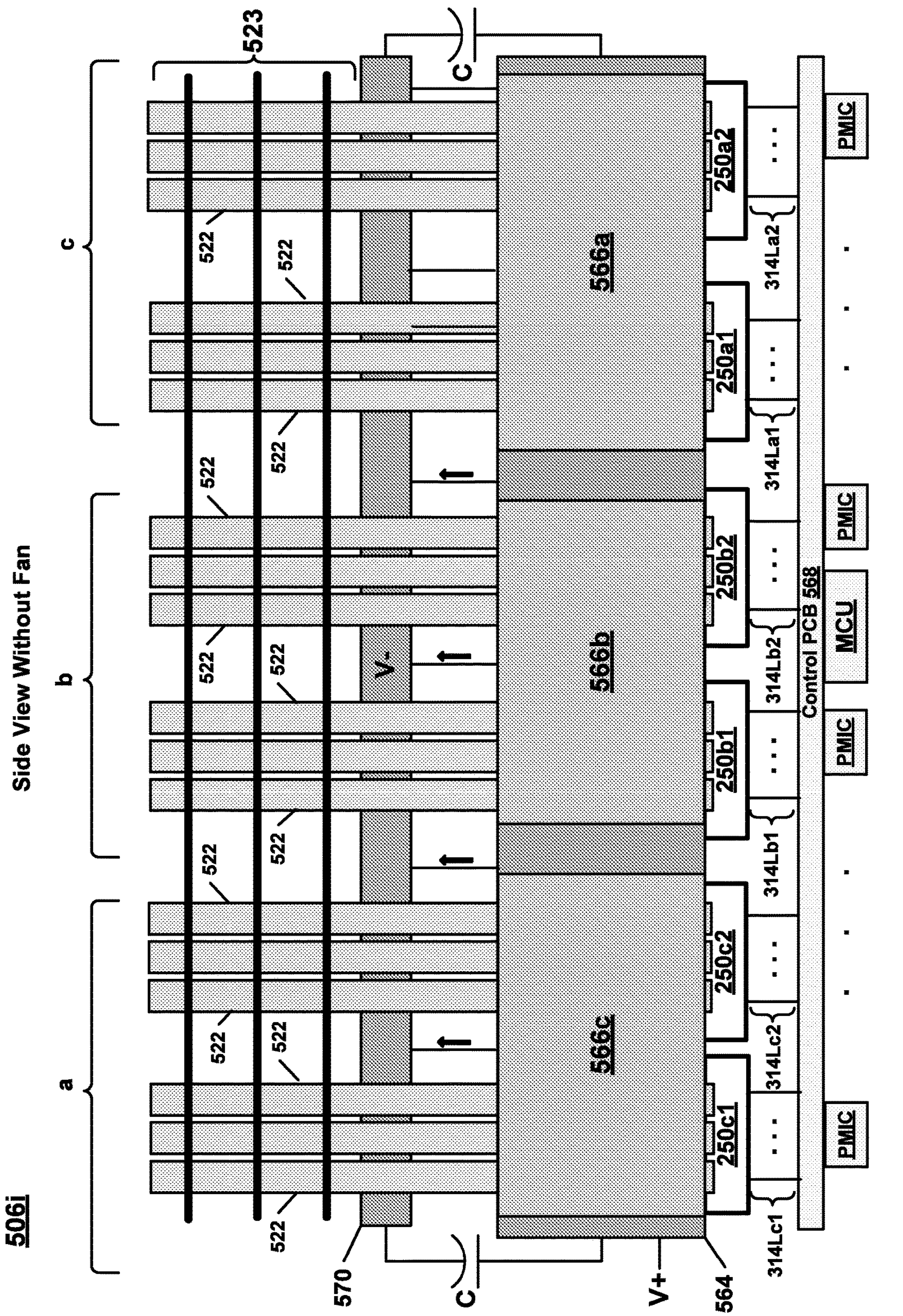
Figures 4, 5C:
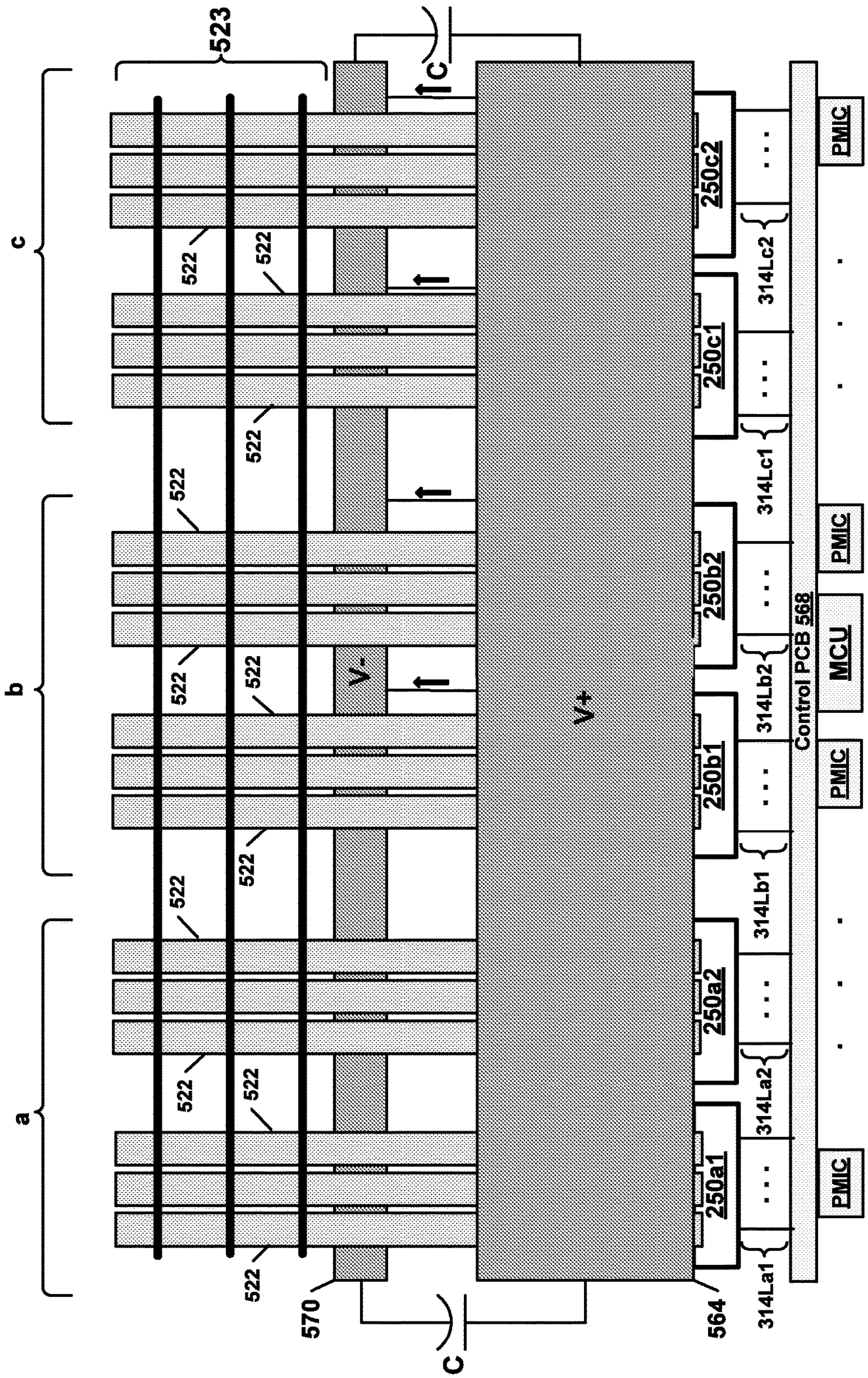

FIGS. 5C-1-5C-4 are quasi-schematic diagrams of an example air-cooled inverter system 506*i* when seen from an end, bottom, left side, and right side, respectively. Similarities exist between air-cooled inverters 506*i* and 502*i*. Air-cooled inverter system 506*i* may have the same height and width as air-cooled inverter system 502*i*, but air-cooled inverter system 504*i* may be twice as long.

With reference to FIG. 5C-2, the bottom view, air-cooled inverter system 506*i* employs packaged half bridges 250 like that shown in FIG. 4G-1. Alternatively, air-cooled inverter system 506*i* can employ packaged half bridges 253 shown in FIG. 4C-1.

With continued reference to the bottom view of FIG. 5C-2, air-cooled inverter system 506*i* has three phases designated a-c. Phase a includes packaged half bridges 250*a*1 and 250*a*2, which are positioned between phase bus bar 566*a* and V+ bus bar 564. Phase b includes packaged half bridges 250*b*1 and 250*b*2, which are positioned between phase bus bar 566*b* and V+ bus bar 564. Phase c includes packaged half bridges 250*c*1 and 250*c*2, which are positioned between phase bus bar 566*c* and V+ bus bar 564. FIGS. 5C-1-5C-4 show the relative positions of packaged half bridges 250, phase bus bar 560, heat-pipes 522, fins 523, V− bus bar 570 and V+ bus bar 564 with respect to each other.

Switches 304H of all packaged half bridges 250 are electrically and thermally connected to V+ bus bar 564, which also acts as a heat sink. The connections can be made by pressing die substrate terminals 230H to the surface of V+ bus bar 564. The connection could also be made by sintering or soldering the die substrate terminals 230H to V+ bus bar 564.

Switches 304L of packaged half bridges 250*a* are electrically and thermally connected to phase bus bar 566*a*, which in turn is electrically connected to stator windings Wa. The connections can be made by pressing die substrate terminals 230L to the surface of phase bus bar 566*a*. The connection could also be made by sintering or soldering the die substrate terminals 230L to phase bus bar 566*a*.

Switches 304L of packaged half bridges 250*b* are electrically and thermally connected to phase bus bar 566*b*, which in turn is electrically connected to stator windings Wb. The connections can be made by pressing die substrate terminals 230L to the surface of phase bus bar 566*b*. The connection could also be made by sintering or soldering the die substrate terminals 230L to phase bus bar 566*b*.

Switches 304L of packaged half bridges 250*c* are electrically and thermally connected to phase bus bar 566*c*, which in turn is electrically connected to stator windings Wc. The connections can be made by pressing die substrate terminals 230L to the surface of phase bus bar 566*c*. The connection could also be made by sintering or soldering the die substrate terminals 230L to phase bus bar 566*c*.

Phase bus bars 566*a*-566*c* are electrically isolated from each other and act as heat sinks to respective switches 304L.

FIG. 5C-1 shows air-cooled inverter system 506*i* when seen from an end. Like FIG. 5C-2, FIG. 5C-1 shows packaged half bridge 250*c*1 sandwiched between phase bus bar 566*c* and V+ bus bar 564. This view also shows metal heat-pipes 522 embedded in phase bus bars 566 and V+ bus bar 564. Heat-pipes 522 extract heat from bus bars and cool switches 304 thermally connected thereto. In FIGS. 5C-1 and 5C-2 evaporative end portions of heat-pipes 522 are received in and thermally connected to respective channels formed in phase bus bars 566 and V+ bus bar 564. FIG. 5C-2 shows heat-pipe 522*s* electrically isolated from phase bus bars 566 or V+ bus bar 564 by a thin layer of dielectric 536. FIG. 5C-1 shows heat-pipes 522 extending slightly through phase bus bar 566*c*1 and V+ bus bar 564.

Channels of phase bus bars 564 and V+ bus bars 566 in which evaporator end sections of heat-pipes 522 are received, are cylindrical and extend perpendicular to the long axis of the bus bars. The condenser end sections of heat-pipes 522 are thermally and electrically connected to metal heat-fins 523, which in turn are cooled by fan 530. The figures of this disclosure show three flat, metal heat-fins 523, it being understood that fewer or more metal heat-fins 523 can be employed in alternative embodiments.

Returning to FIGS. 5C-1 and 5C-2, phase bus bar 566*a* conducts current between stator winding Wa and packaged half bridges 250*a*1 and 250*a*2. Phase bus bar 566*a* is electrically and thermally connected to low-side die substrate terminals 230La1 and 230La2. Phase bus bar 566*a* is also electrically connected to high-side die clip terminals 232Ha1 and 232Ha2. These electrical connections can be made through respective metal straps that are internal or external to the packaged half bridges 250*a*1 and 250*a*2. The metal straps may directly connect die clip terminals 232Ha1 and 232Ha2, respectively, to phase bus bar 566*a*. Alternatively and as shown in phase a, respective external metal straps connect die clip terminals 232Ha1 and 232Ha2 to side-terminals (not shown) of low-side die substrates 312La1 and 312La2, respectively. The low-side die clip terminals 232La1 and 232La2 are electrically connected to a V− bus bar 570, which in turn is coupled to a V− battery terminal. The V− bus bar 570 is symbolically shown in FIG. 5A-2. In FIG. 5A-1 V− bus bar 570 is positioned between rows of heat-pipes 522.

Phase bus bar 566*b* is electrically and thermally connected to low-side die substrate terminals 230Lb1 and 230*b*2. Phase bus bar 566*b* is also electrically connected to high-side die clip terminals 232Hb1 and 232Hb2. These electrical connections can be made through respective metal straps that are internal or external to the packaged half bridges 250*b*1 and 250*b*2. The metal straps may directly connect die clip terminals 232Hb1 and 232Hb2, respectively, to phase bus bar 566*b*. Alternatively and as shown in phase b, respective external metal straps connect die clip terminals 232Hb1 and 232Hb2 to side-terminals (not shown) of low-side die substrates 312Lb1 and 312Lb2, respectively. The low-side die clip terminals 232Lb1 and 232Lb2 are electrically connected to V− bus bar 570.

Phase bus bar 566*c* is electrically and thermally connected to low-side die substrate terminals 230Lc1 and 230*c*2. Phase bus bar 566*c* is also electrically connected to high-side die clip terminals 232Hc1 and 232Hc2. These electrical connections can be made through respective metal straps that are internal or external to the packaged half bridges 250*c*1 and 250*c*2. The metal straps may directly connect die clip terminals 232Hc1 and 232Hc2, respectively, to phase bus bar 566*c*. Alternatively and as shown, respective external metal straps connect die clip terminals 232Hc1 and 232Hc2 to side-terminals (not shown) of low-side die substrates 312Lc1 and 312Lc2, respectively. The low-side die clip terminals 232Lc1 and 232Lc2 are electrically connected to a V− bus bar 570.

FIGS. 5C-1-5C-4 include current symbols that represent current flow through inverter system 506*i* at an instant in time. More particularly, FIG. 5C-2 shows current flow through activated high-side switches 304H of phase-a, while low-side switches 304L of phases b and c are activated and conducting current to the V− battery terminal via the V− bus bar 570, which as a rectangular cross section in FIG. 5C-1. All other switches are deactivated in the figure. Importantly, all die substrate terminals 230 are thermally and electrically connected to V+ bus bar 564, or phase bus bars 566. DC link capacitors C are electrically connected between V+ bus bar 564 and V− bus bar 570 at the front and back sides as shown in FIGS. 5C-3 and 5C-4. Capacitors C may also be thermally connected to bus bars V+ bus bar 564.

FIGS. 5C-1, 5C-3, and 5C-4 show a control PCB 568 electrically connected to packaged half bridges 250 through respective sets 314 connector-leads. A microcontroller or other processor-based control unit, PMICs, and other devices can be mounted to traces on a side of the PCB 568 that is opposite the side that is adjacent to the packaged half bridges 250. The microcontroller and PMICs are electrically connected to packaged half bridges 250 through sets of connector-leads, traces and metal vias formed in control PCB 232. The PMICs supply biasing voltages to respective switch modules of packaged half bridges 250. The microcontroller provides PWM and other signals to the packaged half bridges 250. The signals and supply voltages can be transmitted between the packaged half bridges 250 and the microcontroller and PMICs through sets 314 of connector-leads, the PCB traces, and the metal vias.

Air-Cooled Inverter 508*i*

Figures 1, 5D:
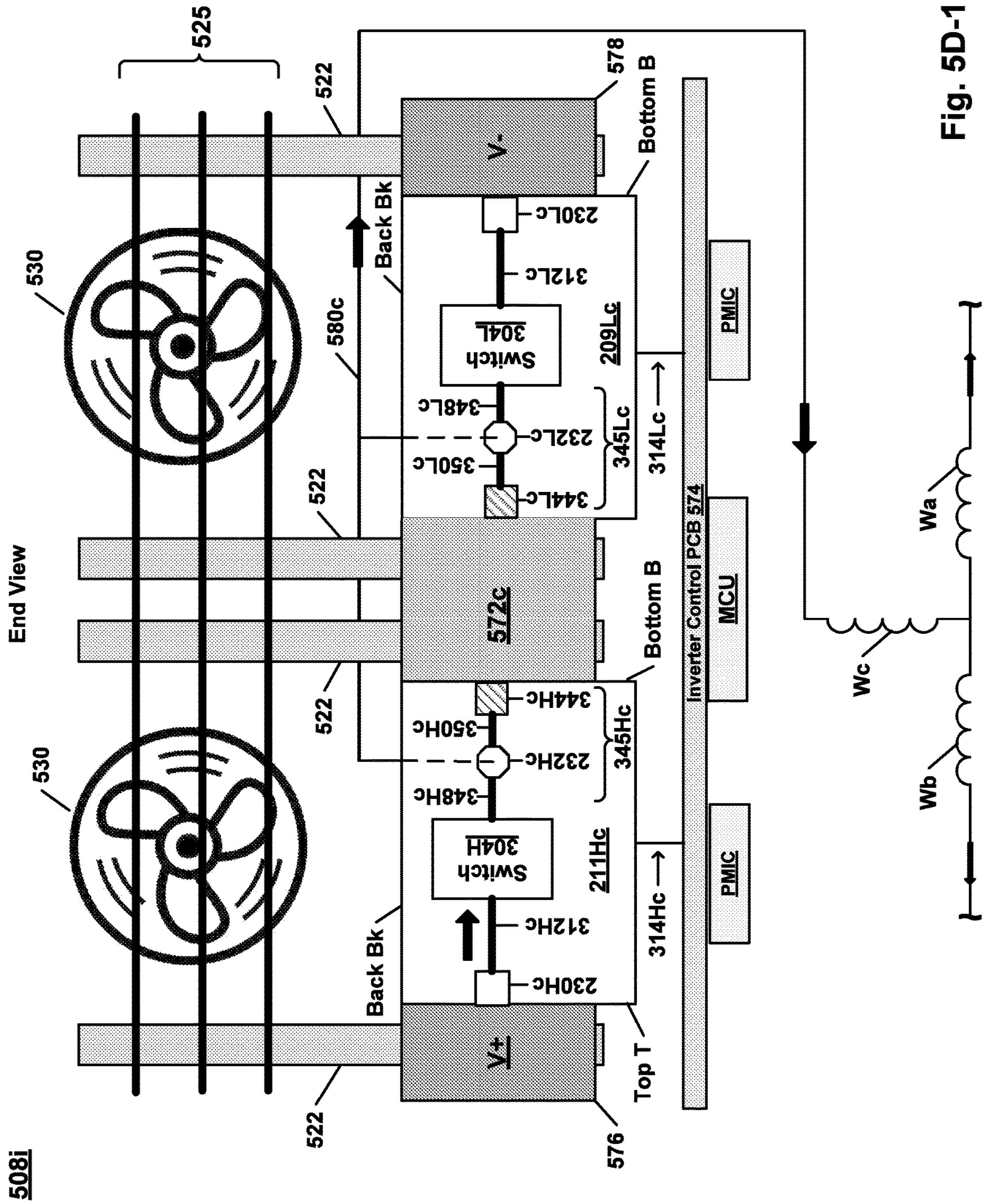
Figures 2, 5D:
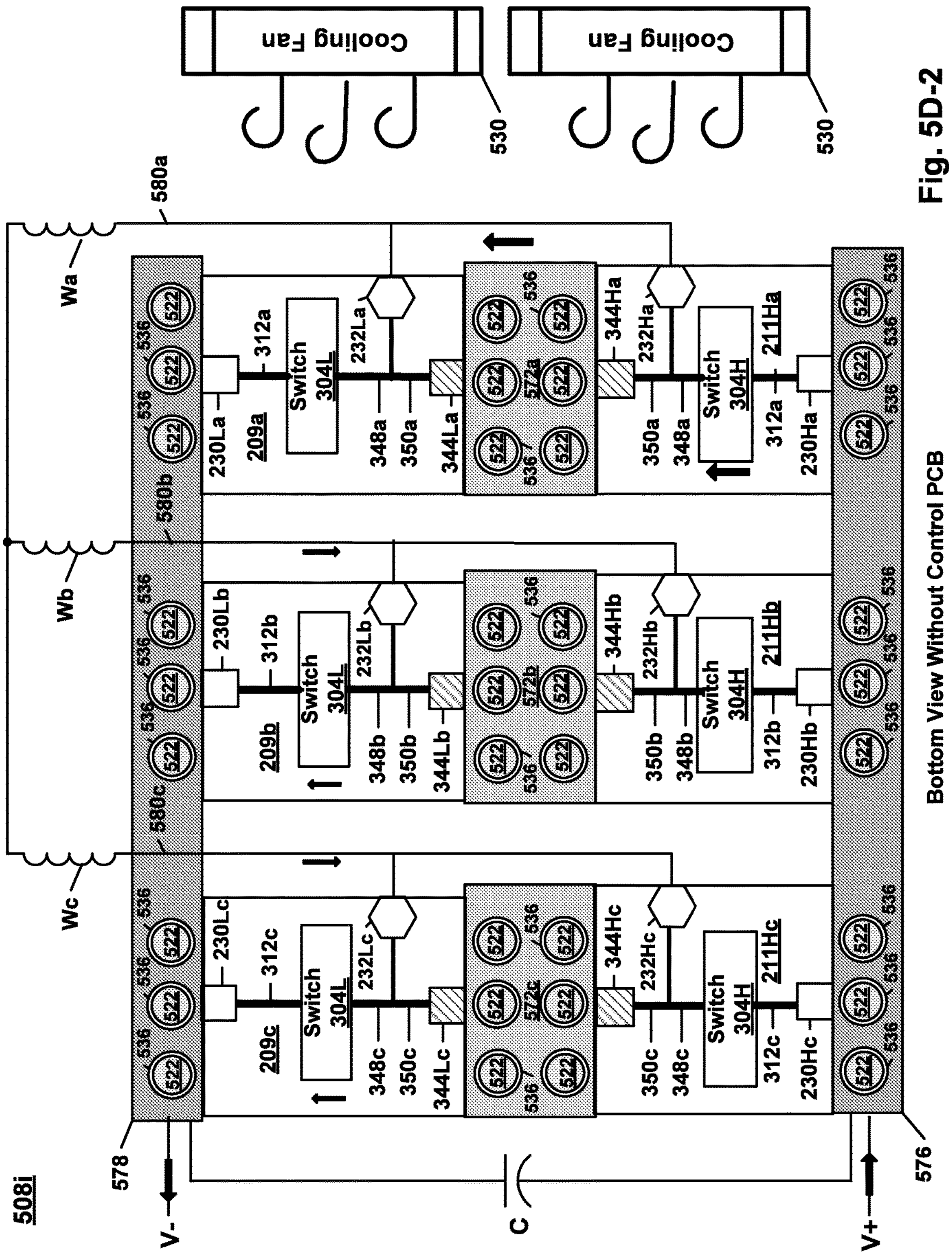
Figures 3, 5D:
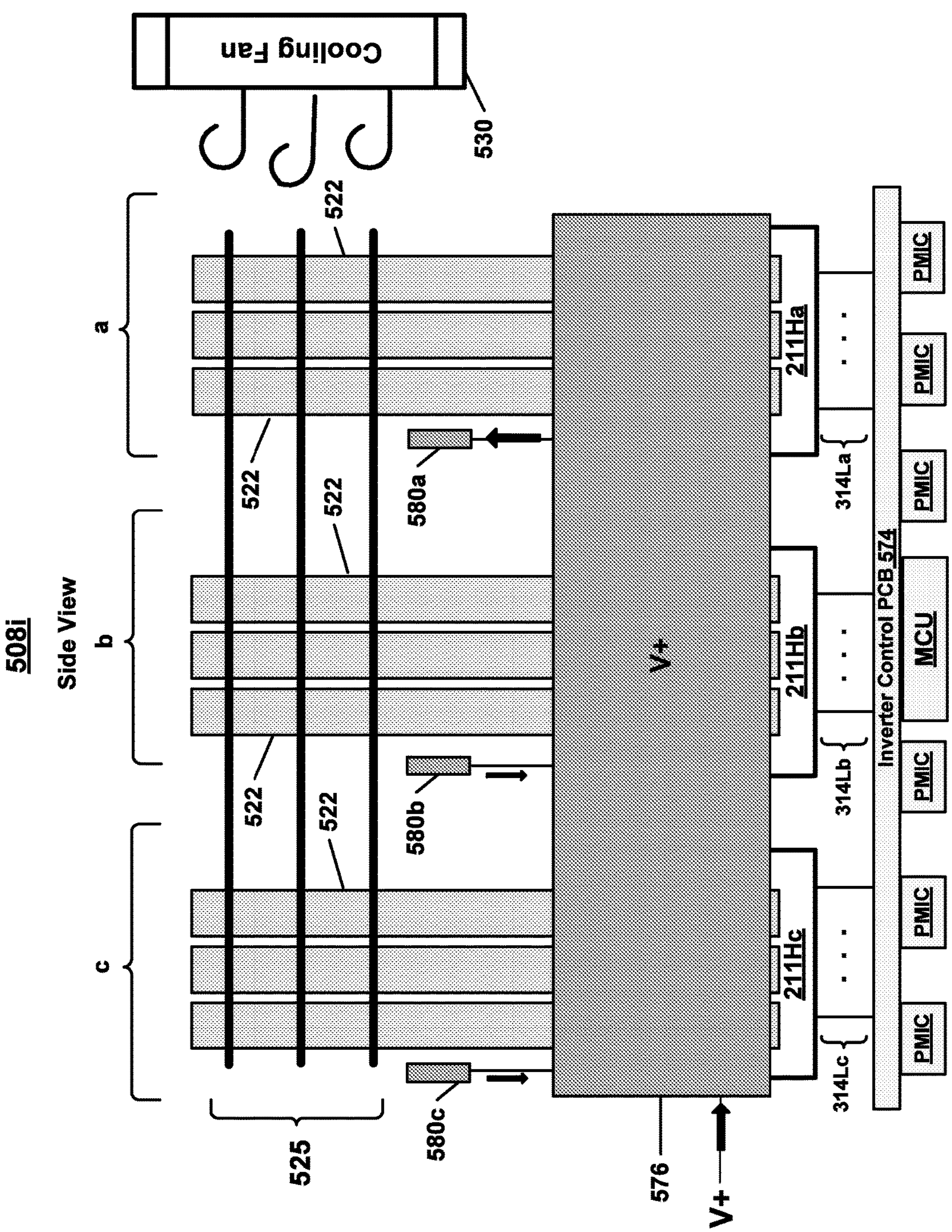
Figures 4, 5D:
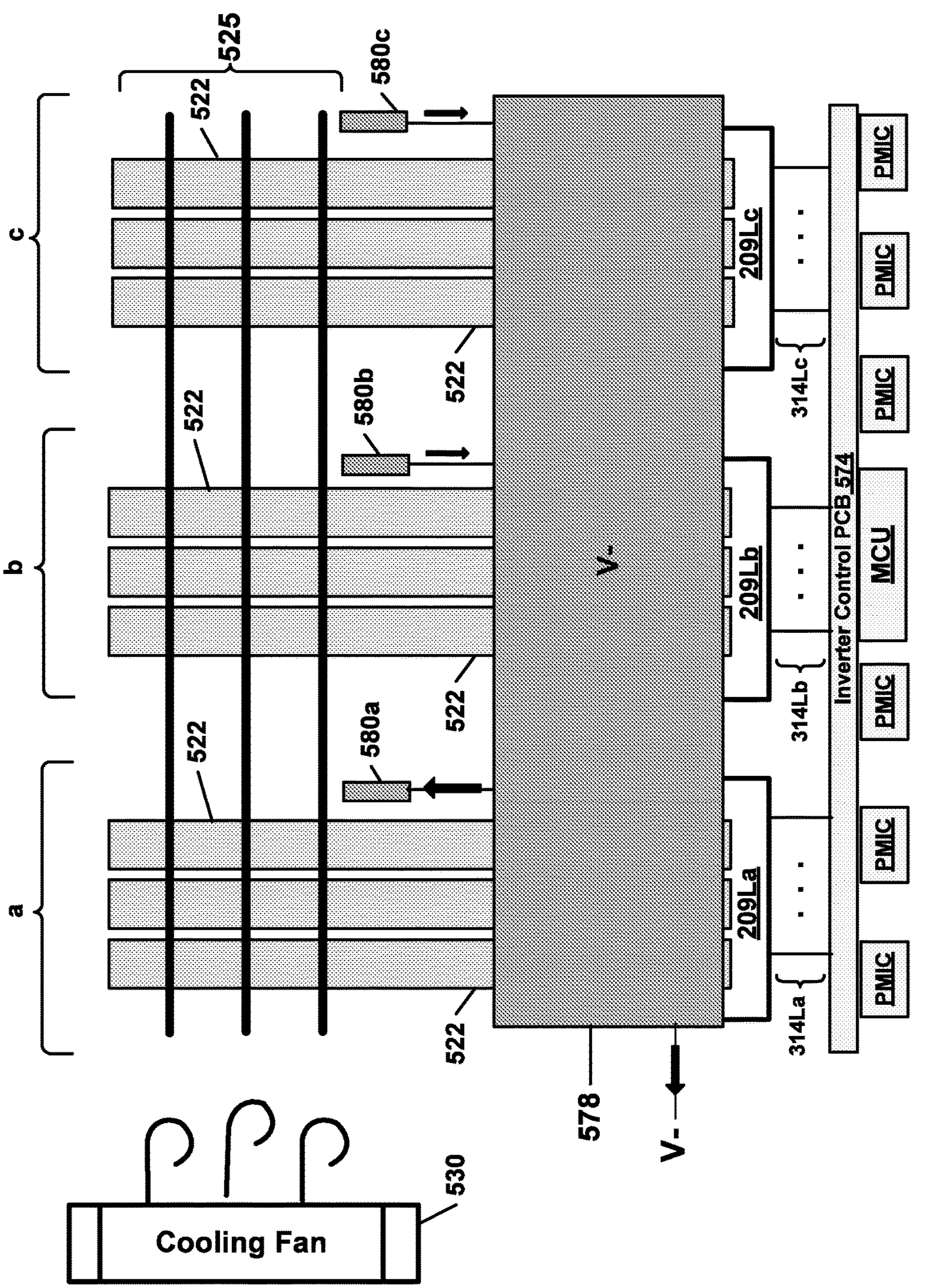
Figures 5, 5D:
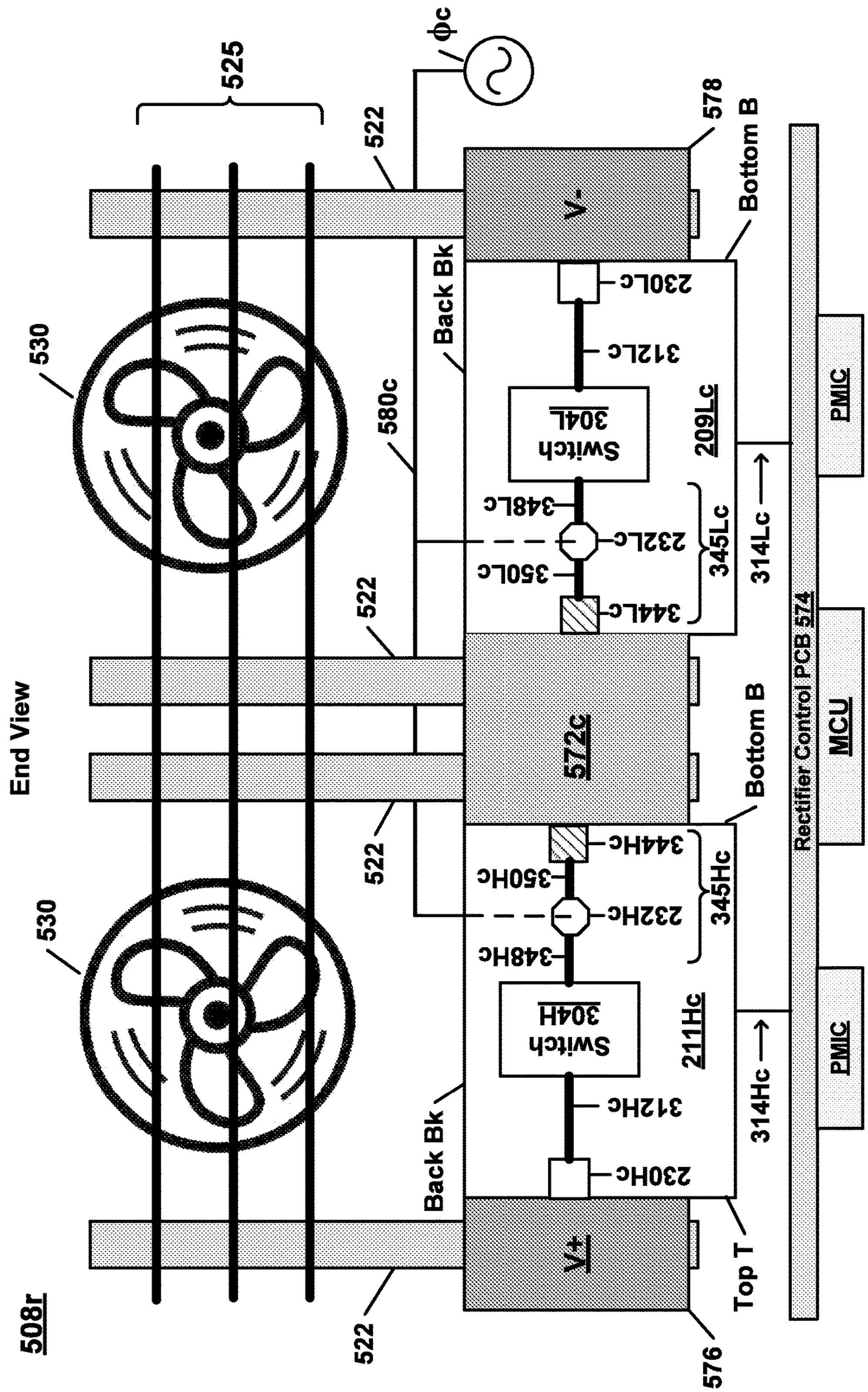
Figures 5, 5D, 6:
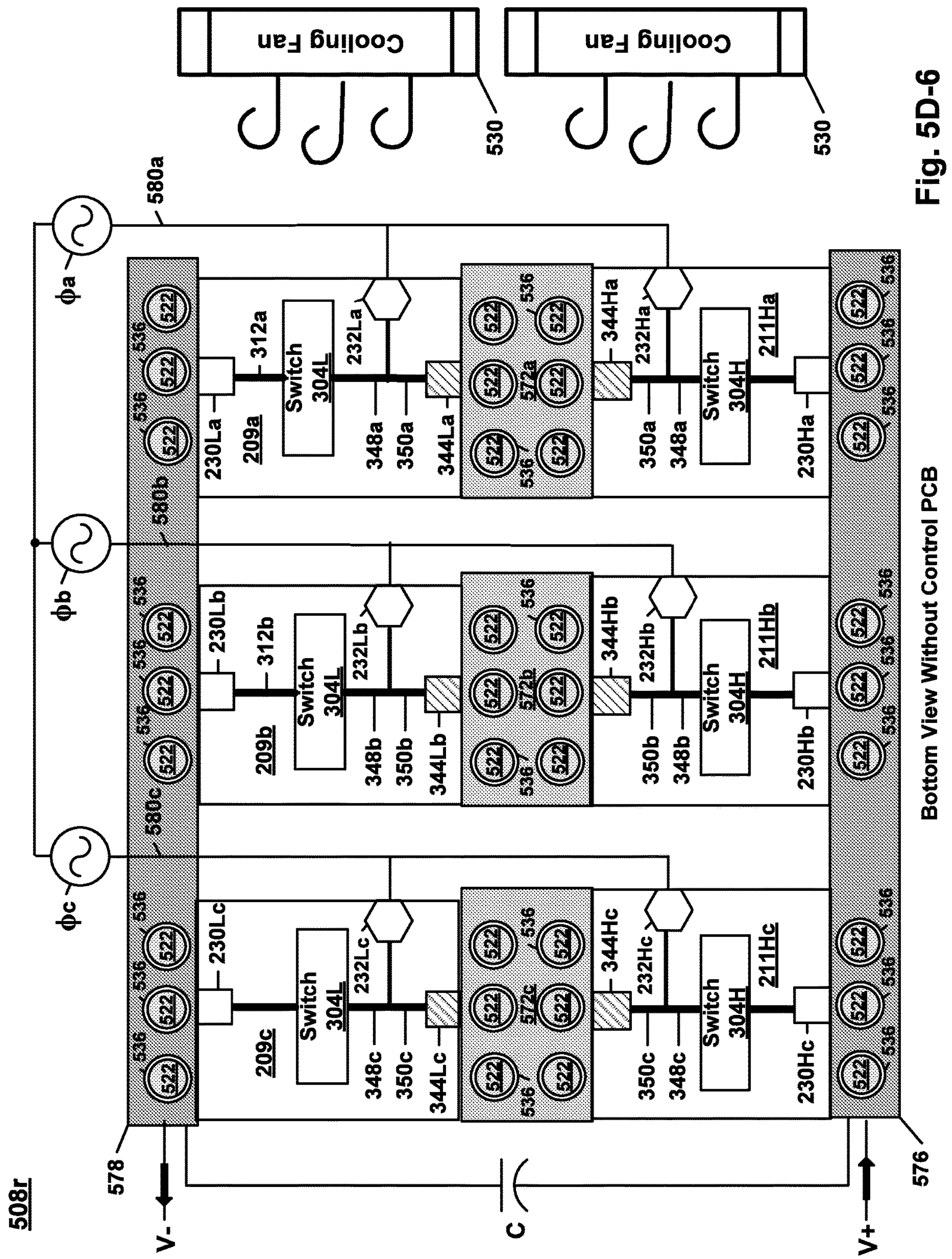

Air-cooled inverter systems 502*i*-506*i* and air-cooled rectifier systems 502*r*-506*r* include switches that are primarily cooled on one side. FIGS. 5D-1-5D-4 are quasi-schematic diagrams of an example air-cooled inverter system 508*i* with switches that are cooled on both sides. Air-cooled inverter system 508*i* may have the same height and length as air-cooled inverter system 502*i*, but air-cooled inverter system 508*i* may be wider.

FIGS. 5D-1-5D-4 show air-cooled inverter system 508*i* when seen from an end, bottom, left side, and right side respectively. With reference to the bottom view in FIG. 5D-2, air-cooled inverter system 508*i* uses packaged switches 211 shown in FIG. 3E-1, and packaged switches 209 shown in FIG. 3F-1. Packaged switches 211 may employ switch module 305 of FIG. 3K-1 or switch module 319 of FIG. 3M-1, and packaged switches 209 may employ switch module 307 of FIG. 31-1 or switch module 321 of FIG. 3N-1.

With continued reference to FIG. 5D-2, air-cooled inverter system 508*i* has three phases a-c that include packaged switches 211*a*-211*c*, respectively, which are positioned between heat sinks 572*a*-572*c*, respectively, and V+ bus bar 576. Phases a-c also include packaged switches 209*a*-209*c*, respectively, which are positioned between heat sinks 572*a*-572*c*, respectively, and V− bus bar 578 as shown. V− bus bar 578 also acts as a heat sink with embedded heat-pipes 522. FIGS. 5D-1-5D-4 show laterally positioning of packaged switches 211 and 209, heat sinks 572, V+ bus bar, heat-pipes 522, heat-fins 525, and 576 V− bus bar 578 with respect to each other in each phase.

Switches 304H of packaged switches 211*a*-211*c* are electrically and thermally connected to V+ bus bar 576 and heat sinks 572*a*-572*c*, respectively. The connections can be made by pressing die substrate terminals 230H to the surface of V+ bus bar 576, while also pressing die clip terminals 344Ha-344Hc to surfaces of heat sinks 572*a*-572*c*, respectively. Alternatively, the connections can be made by sintering or soldering die substrate terminals 230H and die clip terminals 344H to V+ bus bar 576 and heat sinks 572, respectively. Other types of connections are contemplated.

Switches 304L of packaged switches 209*a*-209*c* are electrically and thermally connected to V− bus bar 578 and heat sinks 572*a*-572*c*. The connections can be made by pressing die clip terminals 230L to V− bus bar 578, while also pressing die substrate terminals 344La-344Lc to heat sinks 572*a*-572*c*, respectively. Alternatively, the connections can be made by sintering or soldering die substrate terminals 230L and die clip terminals 344L to V− bus bar 578 and heat sinks 572, respectively. Other types of connections are contemplated.

FIG. 5D-1 shows air-cooled inverter system 508*i* when seen from an end. Like FIG. 5D-2, FIG. 5D-1 shows packaged switch 211Hc sandwiched between heat sink 572*c* and V+ bus bar 576, and packaged switch 209*c* sandwiched between heat sink 572*c* and V− bus bar 578. This view also shows heat-pipes 522 embedded within heat sinks 572*c*, V+ bus bar 576, and V− bus bar 578.

As seen in FIG. 5D-1 evaporative end portions of heat-pipes 522 are received in and thermally connected to respective channels formed in heat sinks 572, V+ bus bar 576, and V− bus bar 578. FIG. 5D-2 is a view of air-cooled inverter 508*i* when seen from the bottom. With continuing reference to FIG. 5D-1, FIG. 5D-2 shows each heat-pipe 522 is electrically isolated from heat sinks 572, V+ bus bar 579 or V− bus bar 578 by dielectric 536. FIG. 5D-2 shows heat-pipes 522 extending slightly through heat sinks 572, V+ bus bar 579 and V− bus bar 578. To enhance heat dissipation, the heat-pipes 522 are positioned closer to the surfaces of heat sinks 572, V+ bus bar 579 and V− bus bar 578 that engage die substrate terminals 230 or die clip terminals 344.

Channels of heat sinks 572, V+ bus bar 579 or V− bus bar 578 in which evaporator end sections of heat-pipes 522 are received, are cylindrical and extend perpendicular to the long axes of heat sinks 572, V+ bus bar 579 or V− bus bar 578. In an alternative embodiment, the channels may be rectangular in cross section to receive similarly shaped heat-pipes. The condenser end sections of heat-pipes 522 are thermally and electrically connected to metal heat-fins 525, which may be slightly larger than the metal fins 520 shown in FIG. 5A-1. Packaged switches 211 and 209 are not drawn to scale. The figures show two fans 530 only because packaged switches 211 and 209, which are shown schematically, are drawn with dimensions that are disproportionate to the dimensions of the heat sinks 572, V+ bus bar 579 or V− bus bar 578 in the figures. When built, air-cooled inverter 508*i* may need only one fan 530 to cool fins 525.

Returning to FIGS. 5D-1 and 5D-2, switches 304H when activated can conduct current from V+bus bar 576 to respective stator windings Wa-Wc through die clip terminals 232*a*-232*c*, respectively, and switches 304L when activated can conduct current received from respective stator windings Wa-Wc to V-bus bar 578 through die clip terminals, 232La-232Lc, respectively. Heat sinks 572*a*-572*c* are electrically and thermally connected to die clip terminals 344Ha-344Hc, respectively, and to die clip terminals 344La-344Lc, respectively. Die substrate terminals 230L are electrically and thermally connected to V-bus bar 578, which in turn is electrically coupled to the negative terminal of a battery or other DC source. Die substrate terminals 230H are electrically and thermally connected to V+bus bar 576, which in turn is electrically coupled to the positive terminal of the battery or other DC source.

FIGS. 5D-1-5D-4 include current symbols that represent current flow through inverter system 508*i* at an instant in time. More particularly, FIG. 5D-2 shows current flow through activated high-side switch 304H of phase-a, while low-side switches 304L of phases b and c are activated and conducting current to the V− battery terminal via the V− bus bar 578. All other switches are deactivated in the figure. Importantly, all die substrate terminals 230 and all die clip terminals 344 are thermally and electrically connected to V+ bus bar 576, V− bus bar 578 or heat sinks 572. Although not shown, one or more DC link capacitors C can be electrically connected between V+ bus bar 576 and V− bus bar 578. The capacitor C may also be thermally connected to V+ bus bar 576 and/or V− bus bar 578.

FIGS. 5D-1, 5D-3, and 5D-4 show a control PCB 574 that is electrically connected to packaged switches 211 and 209 through respective sets 314 of connector-leads. A microcontroller or other processor-based control unit, PMICs, and other devices can be mounted to traces on a side of the PCB 574 that is opposite the side that is adjacent to the packaged switches 211 and 209. The microcontroller and PMICs are electrically connected to the packaged switches through traces and metal vias formed in control PCB 574, connectors, and sets 314 of connector-leads. The PMICs supply biasing voltages to respective packaged switches 211 and 209. The microcontroller provides PWM and other signals to packaged switches 211 and 209. The height of example air-cooled inverter system 508*i*, including heat-pipes 522 and PCB 574, may be H2=65 mm.

Air-Cooled Rectifier 508*r*

FIG. 5D-5 is quasi-schematic diagram of an example air-cooled rectifier system 508*r* when seen from an end. FIG. 5D-6 is quasi-schematic diagram of example air-cooled rectifier system 508*r* when seen from the bottom. Die clip terminals 232 are electrically connected to AC sources ϕa-ϕc. Rectifier system 508*r* and inverter system 508*i* are substantially similar. Some differences exist. The microcontroller mounted on control PCB in rectifier system 508*r* may be different than the microcontroller mounted on control PCB in inverter system 508*i*, or the CPU executable instructions stored in memory of microcontroller mounted on the control PCB in rectifier system 508*r* may be different than CPU executable instructions stored in memory of the microcontroller mounted on the control PCB in inverter system 508*i*. Control PCB of rectifier 508*r* may also include a phase-lock loop (PLL) and other components for synchronizing the control of switches 304 to the frequency (e.g., 60 Hertz) of the three-phase AC input voltages provided by the AC sources ϕa-ϕc.

Air-Cooled Full-Bridge Inverter 510

Figures 1, 5E:
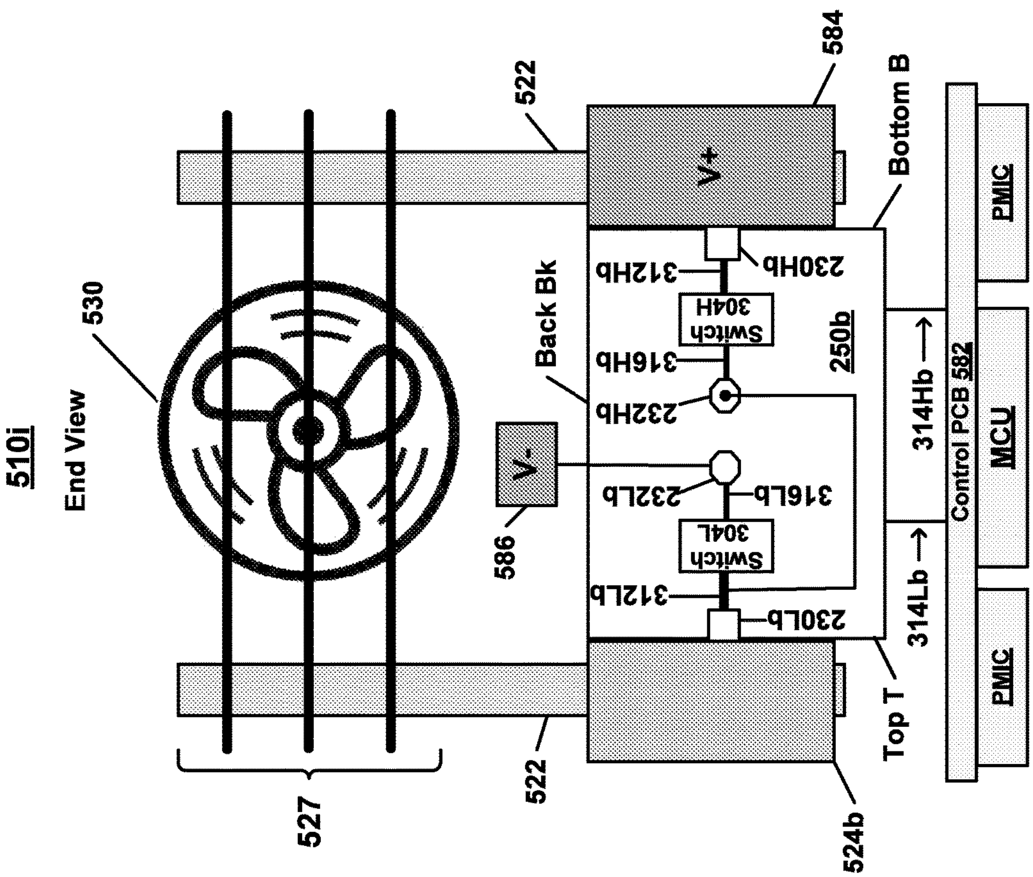
Figures 2, 5E:
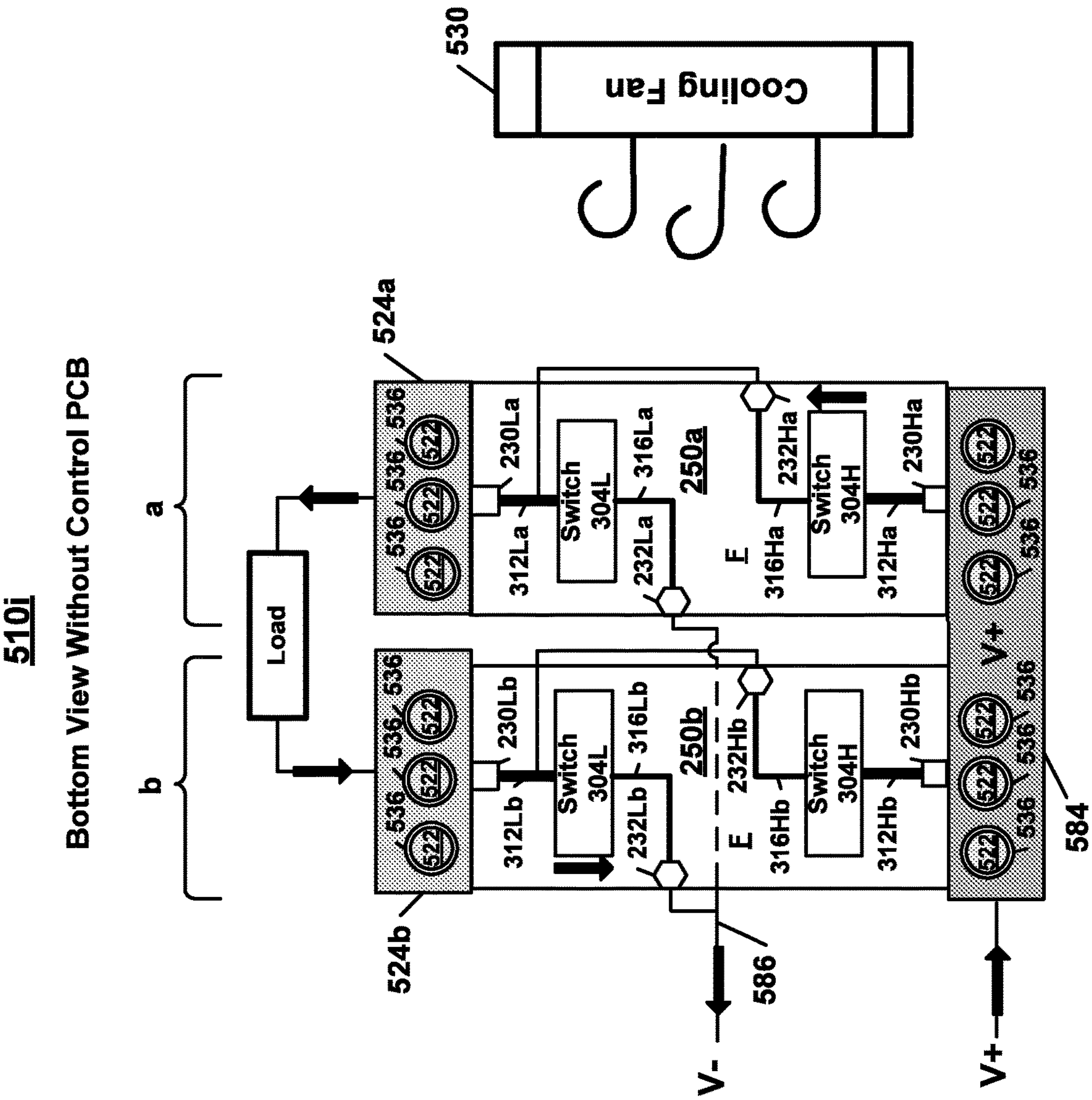
Figures 3, 5E:
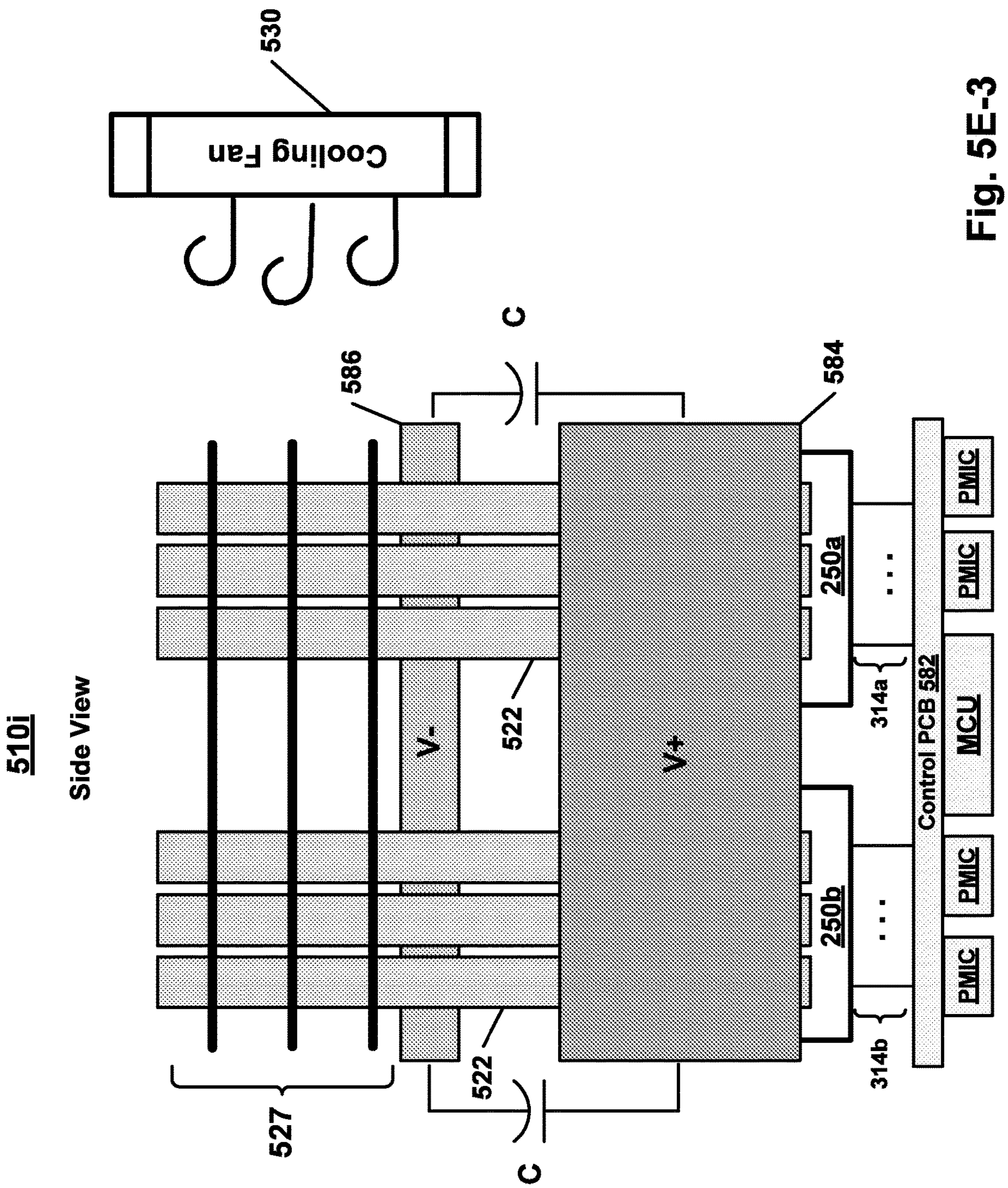
Figures 4, 5E:
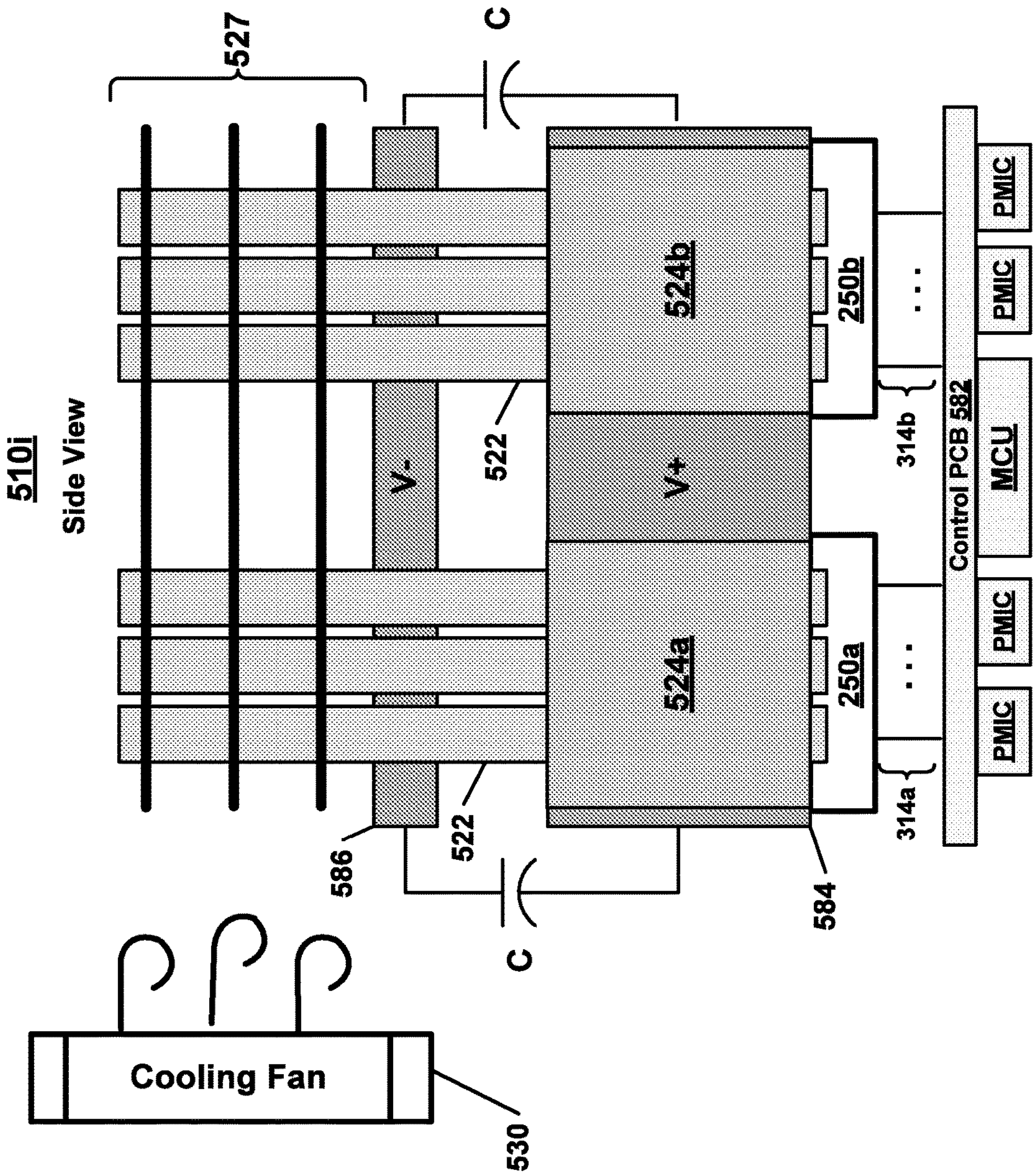
Figures 5, 5E, 6:
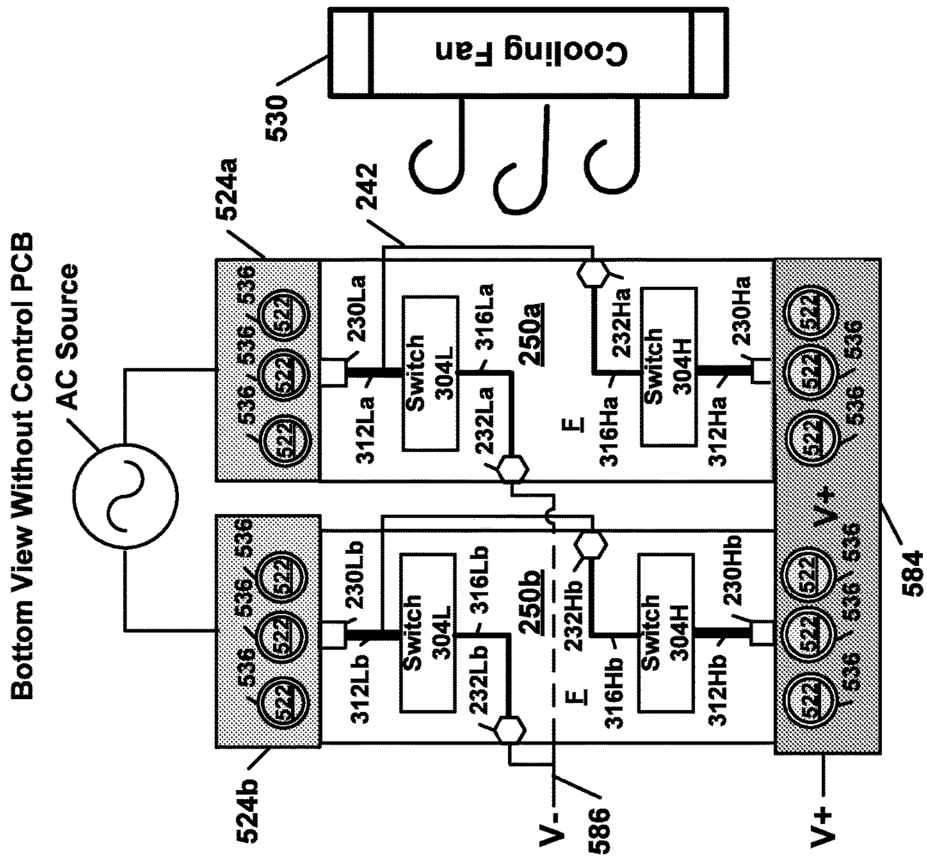
Figures 5, 5E:
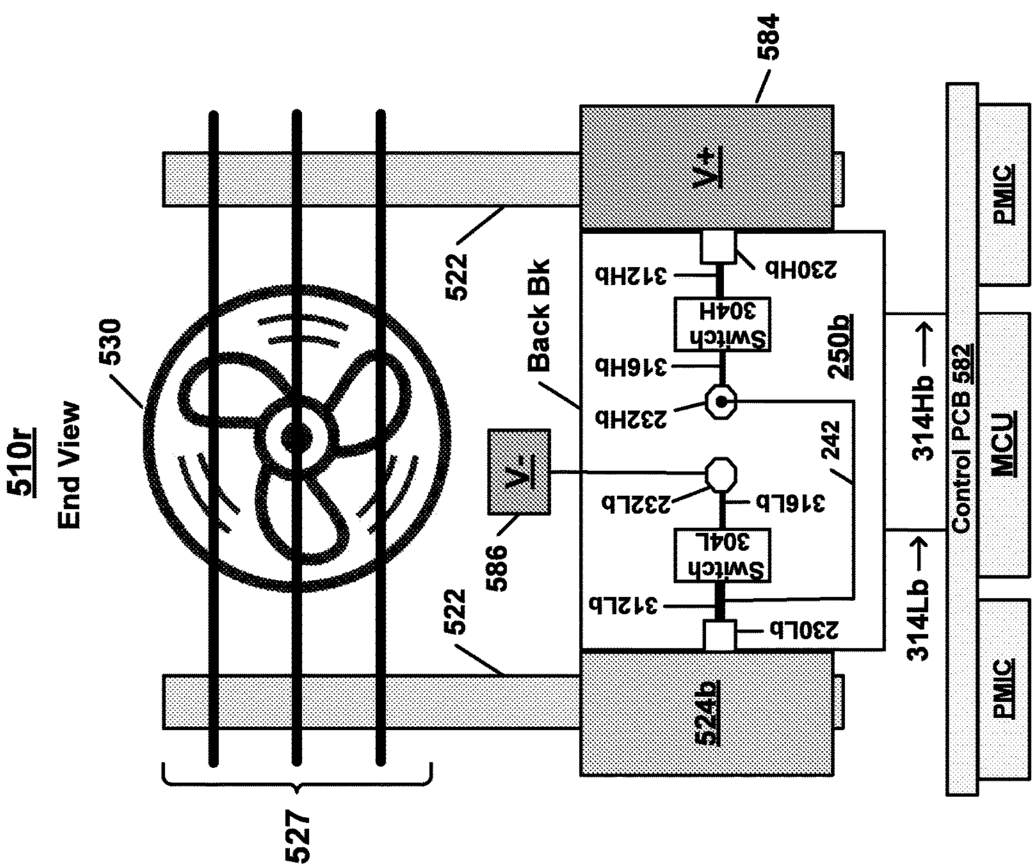

Air-cooled inverter systems 502*i*-508*i* are examples of three-phase air cooled inverter systems that could be employed in EVs. FIGS. 5E-1-5E-4 are quasi-schematic diagrams of an example of an air-cooled, full-bridge inverter system 510*i* when seen from an end, bottom, left side, right side, and top, respectively. Air-cooled full-bridge inverter system 504*i* may have the same height and width as air-cooled inverter system 502*i*, but full-bridge inverter system 504*i* is shorter in length.

With continued reference to FIG. 5E-2, air-cooled inverter system 510 has two phases designated a and b. Phases a and b include packaged half bridges 250*a* and 250*b*, respectively, which are connected to and positioned between phase bus bars 524*a* and 524*b*, respectively, and V+ bus bar 584 as shown. FIGS. 5A-1-5A-4 show how packaged half bridges 250, phase bus bar 524, heat-pipes 522, heat-fins 527, and V+ bus bar 584 of each phase are positioned with respect to each other.

Switches 304H are electrically and thermally connected to V+ bus bar 584, which also acts as a heat sink. The connections can be made by pressing die substrate terminals 230H to the surface of V+ bus bar 584. The connections could also be made by sintering or soldering the die substrate terminals 230H to V+ bus bar 584. Switches 304L of packaged half bridges 250*a* and 250*b* are electrically and thermally connected to phase bus bars 524*a* and 524*b*, respectively, which in turn are electrically connected to respective terminals of a load (e.g., an electrical panel of a household, which in turn is connected to a washing machine, refrigerator, or other devices that needs single phase AC power) as shown in FIG. 5E-2. The connections can be made by pressing die substrate terminals 230L to surfaces of respective phase bus bars 524*a* and 524*b*. The connections could also be made by sintering or soldering the die substrate terminals 230L to respective phase bus bars 524*a* and 524*b*. Phase bus bars 524*a* and 524*b* are electrically isolated from each other and act as heat sinks to respective switches 304L. A filter may be added to smooth the output of air-cooled inverter 510 before it is provided to the load.

FIG. 5E-1 shows air-cooled inverter system 510 when seen from an end. Like FIG. 5E-2, FIG. 5E-1 shows packaged half bridge 250*b* sandwiched between phase bus bar 524*b* and V+ bus bar 584. This view also shows metal heat-pipes 522 embedded in phase bus bars 524 and V+ bus bar 584. Cases of packaged half bridges 250*a* and 250*b* may be thermally connected to phase bus bars 524*a* and 524*c*, respectively. Cases of packaged half bridges 250*a* and 250*b* may be thermally connected to V+ bus bar 584.

In FIGS. 5E-1 and 5E-2 evaporative end portions of heat-pipes 522 are received in and thermally connected to respective channels formed in phase bus bars 524 and V+ bus bar 584. FIG. 5E-2 shows each heat-pipe 522 is electrically isolated from phase bus bar 524*a* and 524*b* or V+ bus bar 584 by a thin layer of dielectric 536. FIG. 5E-1 shows heat-pipes 522 extending slightly through phase bus bar 524*b* and V+ bus bar 526. To enhance heat dissipation, heat-pipes 522 are positioned closer to the surfaces in phase bus bars 524 and V+ bus bar 584 that engage die substrate terminals 230.

Channels of phase bus bars 524 and V+ bus bar 584 in which evaporator end sections of heat-pipes 522 are received, are cylindrical and extend perpendicular to the long axes of phase bus bars 524 and V+ bus bar 584. The condenser end sections of heat-pipes 522 are thermally and electrically connected to metal heat-fins 527, which in turn are cooled by fan 530. The figures of this disclosure show three flat, metal heat-fins 527, it being understood that fewer or more metal heat-fins 527 can be employed in alternative embodiments. The metal heat-fins need not be flat but can take a shape other than that shown within the figures. In one embodiment outer surfaces of cylindrical heat-pipes 522 are soldered to the cylindrical wall of apertures formed through metal heat-fins 527.

Returning to FIGS. 5E-1 and 5E-2, phase bus bars 524*a* and 524*b* conduct current to and from the terminals of the load, and packaged half bridges 250*a* and 250*b*, respectively. Phase bus bars 524*a* and 524*b* are electrically and thermally connected to low-side die substrate terminals 230La and 230Lb, respectively. Phase bus bars 524*a* and 524*b* are also electrically connected to high-side die clip terminals 232Ha and 232Hb, respectively. These electrical connections can be made through metal straps that are internal or external to the packaged half bridges 250*a* and 250*b*. The metal straps may directly connect die clip terminals 232Ha and 232Hb to phase bus bars 524*a* and 524*c*, respectively. Alternatively, and as shown, the external metal straps connect die clip terminals 232Ha and 232H to side terminals (not shown) of low-side die substrates 312La and 312Lb, respectively. The low-side die clip terminals 232La and 232Lb are electrically connected to a V− bus bar 586, which in turn is coupled to a V− battery terminal or other DC source (e.g., a solar panel array of photo-voltaic modules). The V− bus bar 586 is symbolically shown in FIG. 5E-2. In FIG. 5E-1 V− bus bar 528 is positioned between heat rows of heat-pipes 522.

FIG. 5E-2 include current symbols that represent current flow through inverter system 510 at an instant in time. More particularly, FIG. 5E-2 shows current flow through activated high-side switch 304H of phase-a, while low-side switch 304L of phase b is activated and conducting current to the V− battery terminal via the V− bus bar 586. The two other switches are deactivated in the figure. Importantly, all die substrate terminals 230 are thermally and electrically connected to V+ bus bar 584, or phase bus bars 524. DC link capacitors C are electrically connected between V+ bus bar 584 and V− bus bar 586 at the front and back sides as shown in FIGS. 5E-3 and 5E-4. Capacitors C may also be thermally connected to bus bars V+ bus bar 584.

FIGS. 5E-1, 5E-3, and 5E-4 show a control PCB 582 that is electrically connected to packaged half bridges 250 through respective sets 314 of connector-leads. A microcontroller or other processor-based control unit, PMICs, and other devices can be mounted to traces on a side of the PCB 582 that is opposite the side that is adjacent to the packaged half bridges 250. The microcontroller and PMICs are electrically connected to the packaged half bridges 250 through traces and metal vias formed in control PCB 582, connectors, and sets 314 of connector-leads. The PMICs supply biasing voltages to respective switch modules of packaged half bridges 250. The microcontroller provides PWM and other signals to packaged half bridges 250. The height of example air-cooled inverter system 510, including heat-pipes 522 and PCB 582, may be H2=65 mm.

Air-Cooled Rectifier 510*r*

FIG. 5E-5 is quasi-schematic diagram of an example air-cooled rectifier system 510*r* when seen from an end. FIG. 5E-6 is quasi-schematic diagram of example air-cooled rectifier system 510*r* when seen from the bottom. Rectifier system 510*r* and inverter system 510*i* are substantially similar. Some differences exist. Die clip terminals 232H are electrically connected an AC source through respective phase bus bars 524 as shown. The microcontroller mounted on control PCB in rectifier system 510*r* may be different than the microcontroller mounted on control PCB in inverter system 510*i*, or the CPU executable instructions stored in memory of microcontroller mounted on the control PCB in rectifier system 510*r* may be different than CPU executable instructions stored in memory of the microcontroller mounted on the control PCB in inverter system 510*i*. Control PCB of rectifier 510*r* may also include a phase-lock loop (PLL) and other components for synchronizing the control of switches 304 to the frequency the AC input voltage provided AC source.

Air-Cooled Inverter 514*i*

Figures 1, 5F:
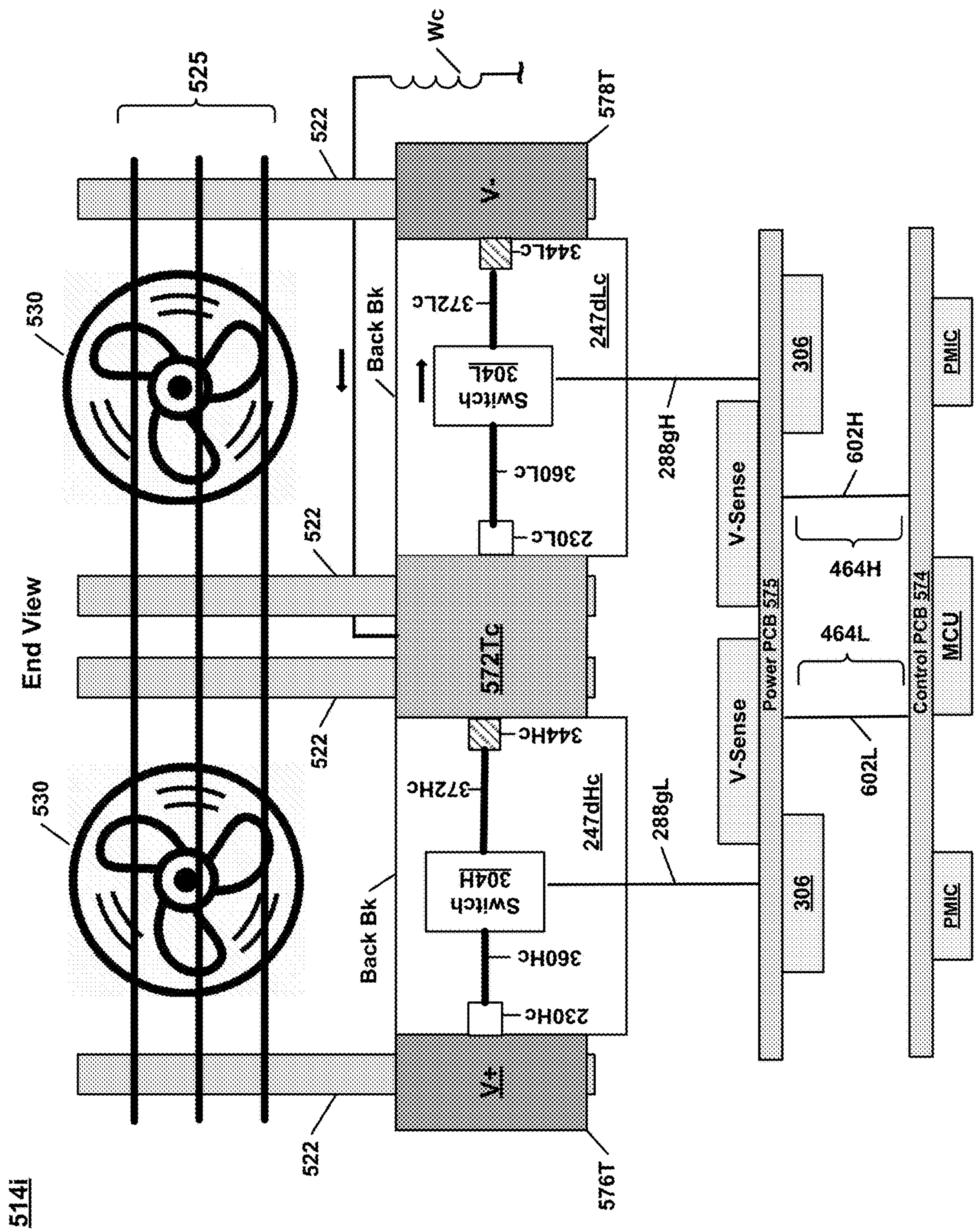
Figures 2, 5F:
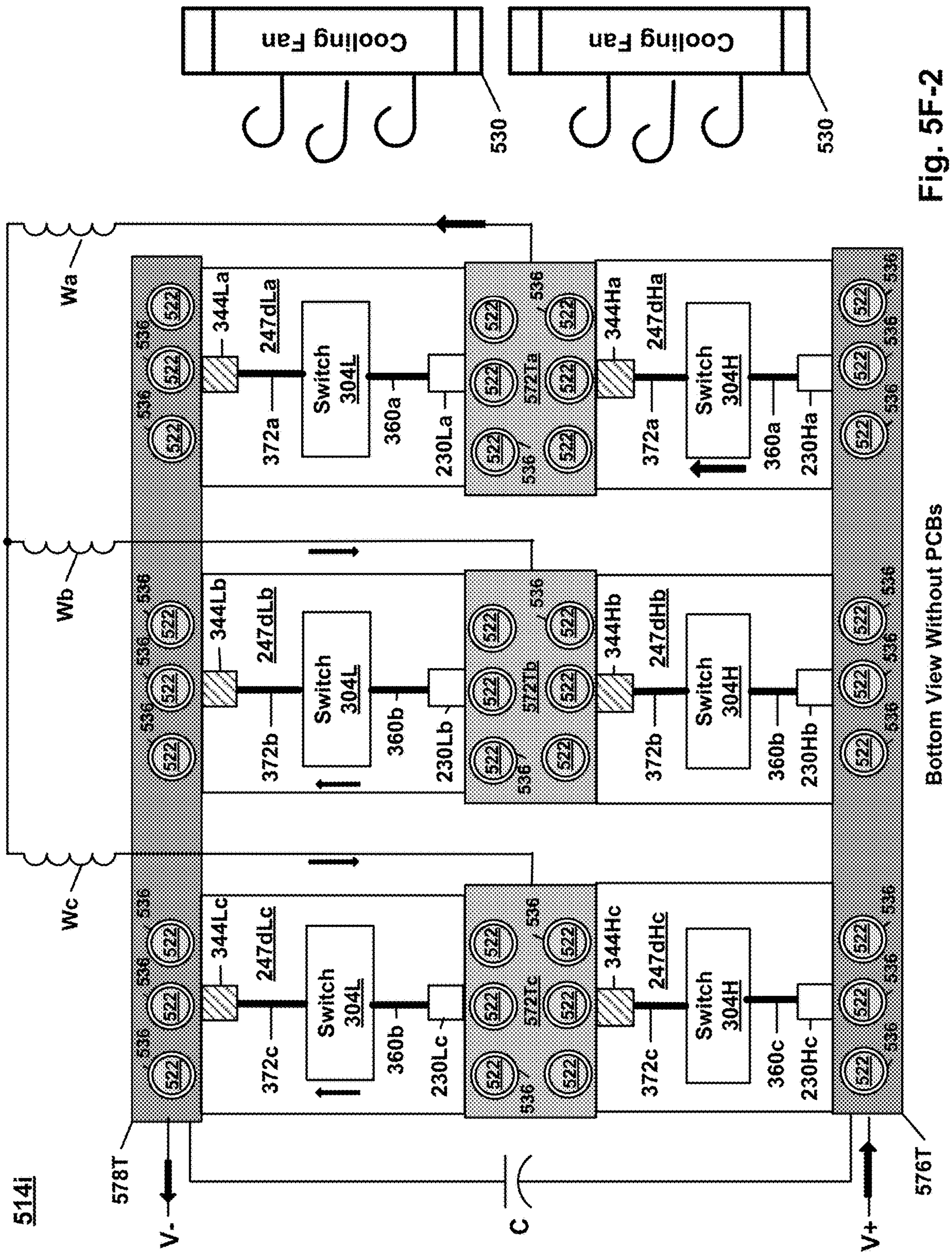
Figures 3, 5F:
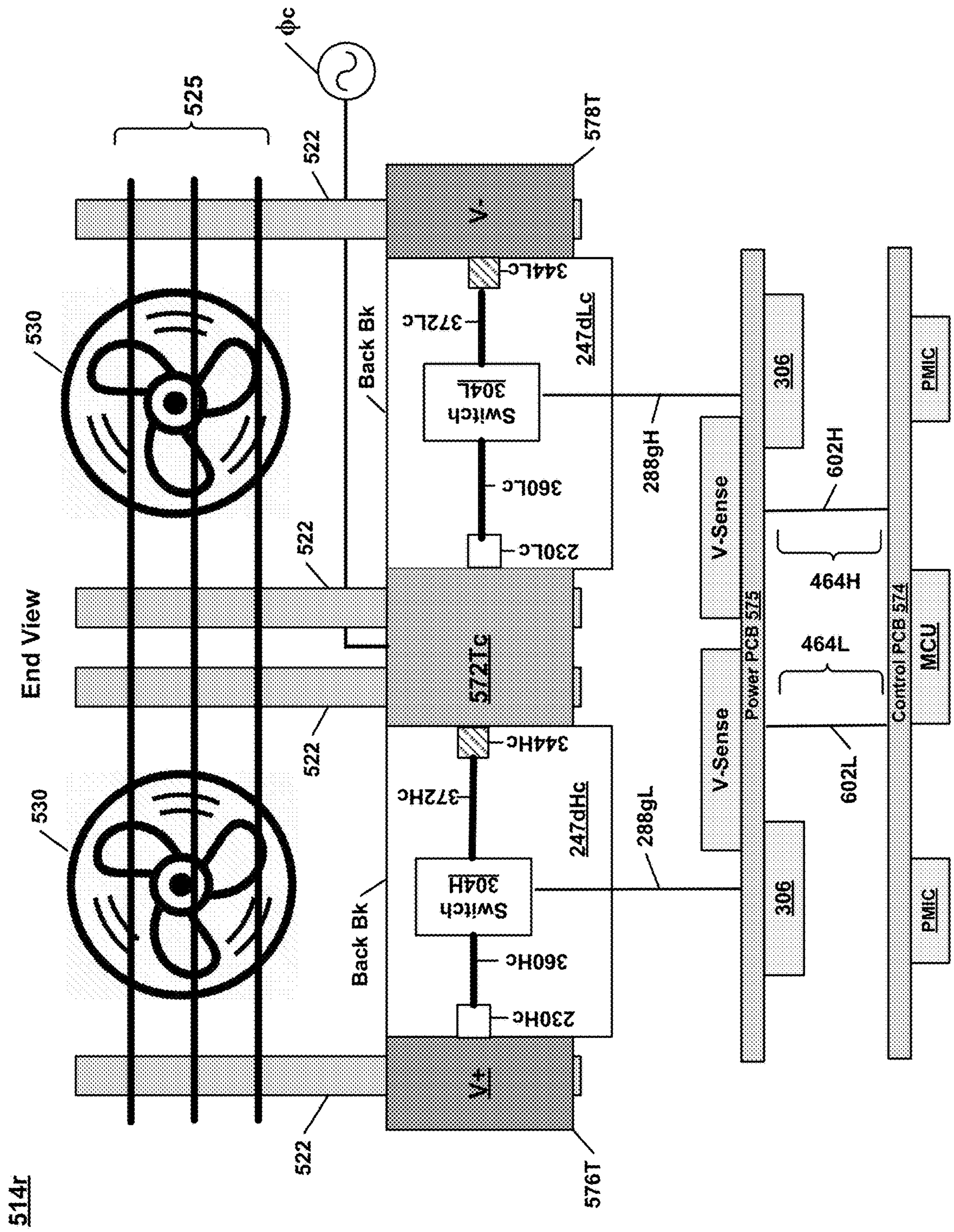
Figures 4, 5F:
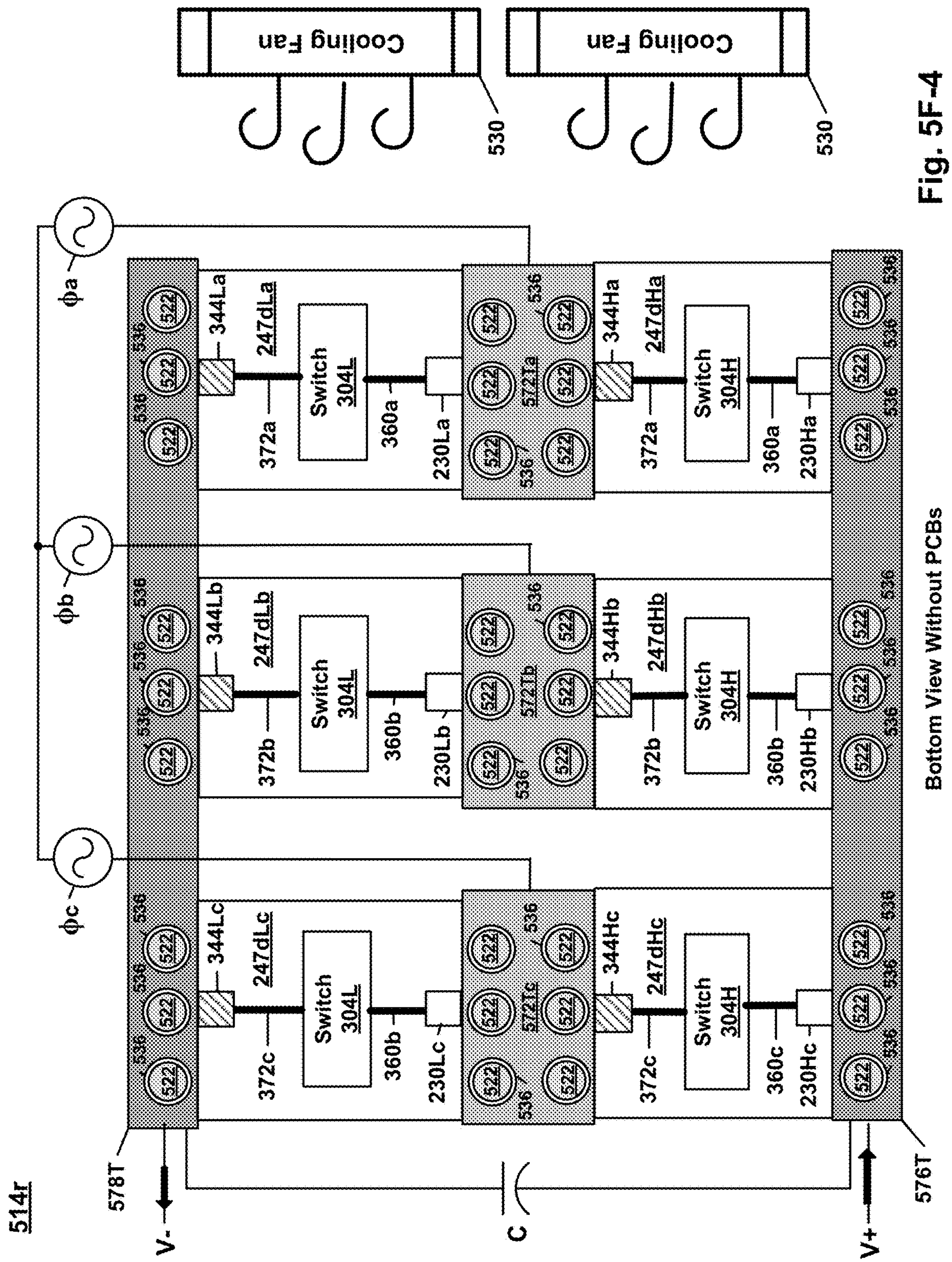
Figures 5, 5F:
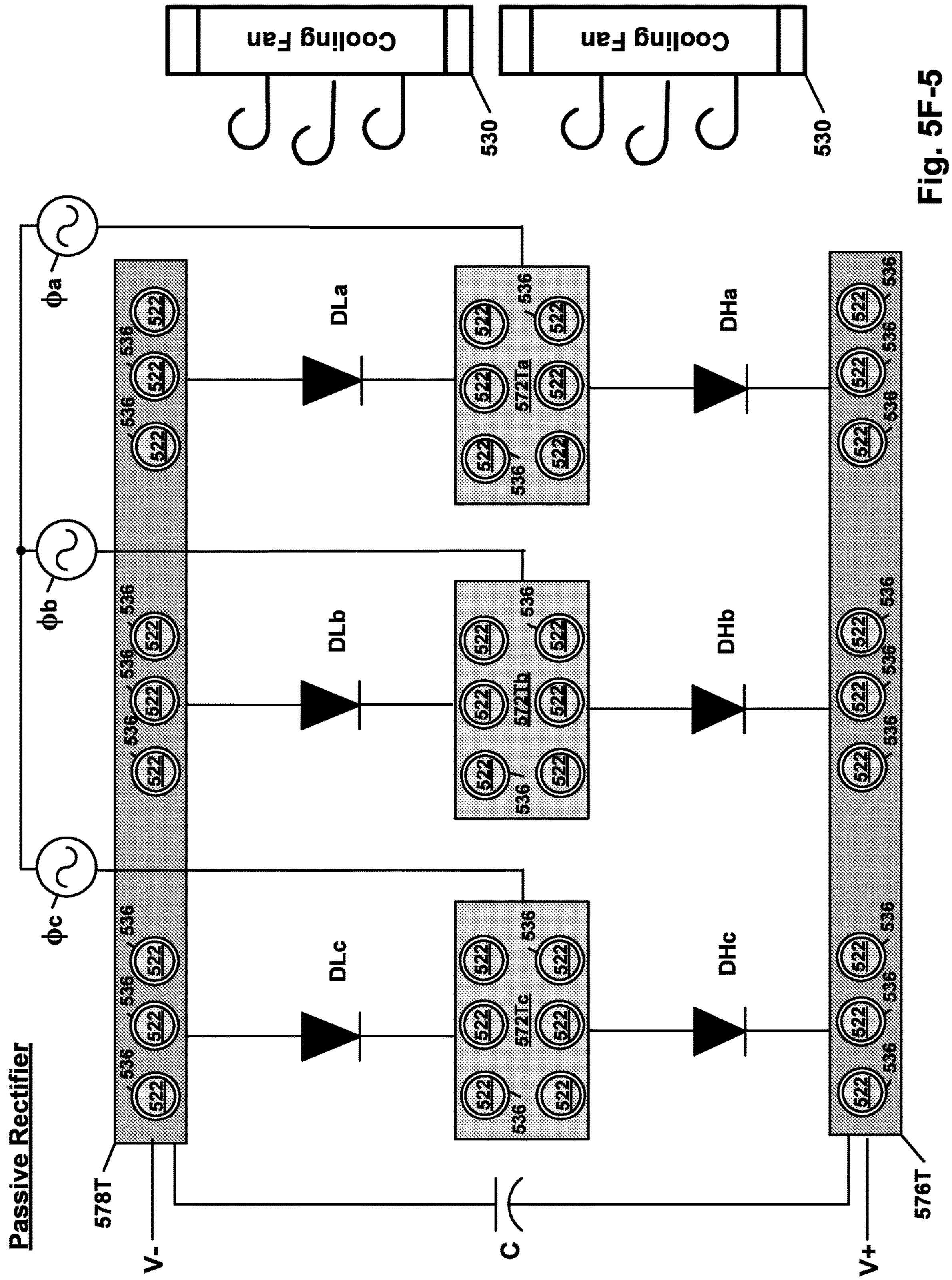
Figures 5, 5F, 6:
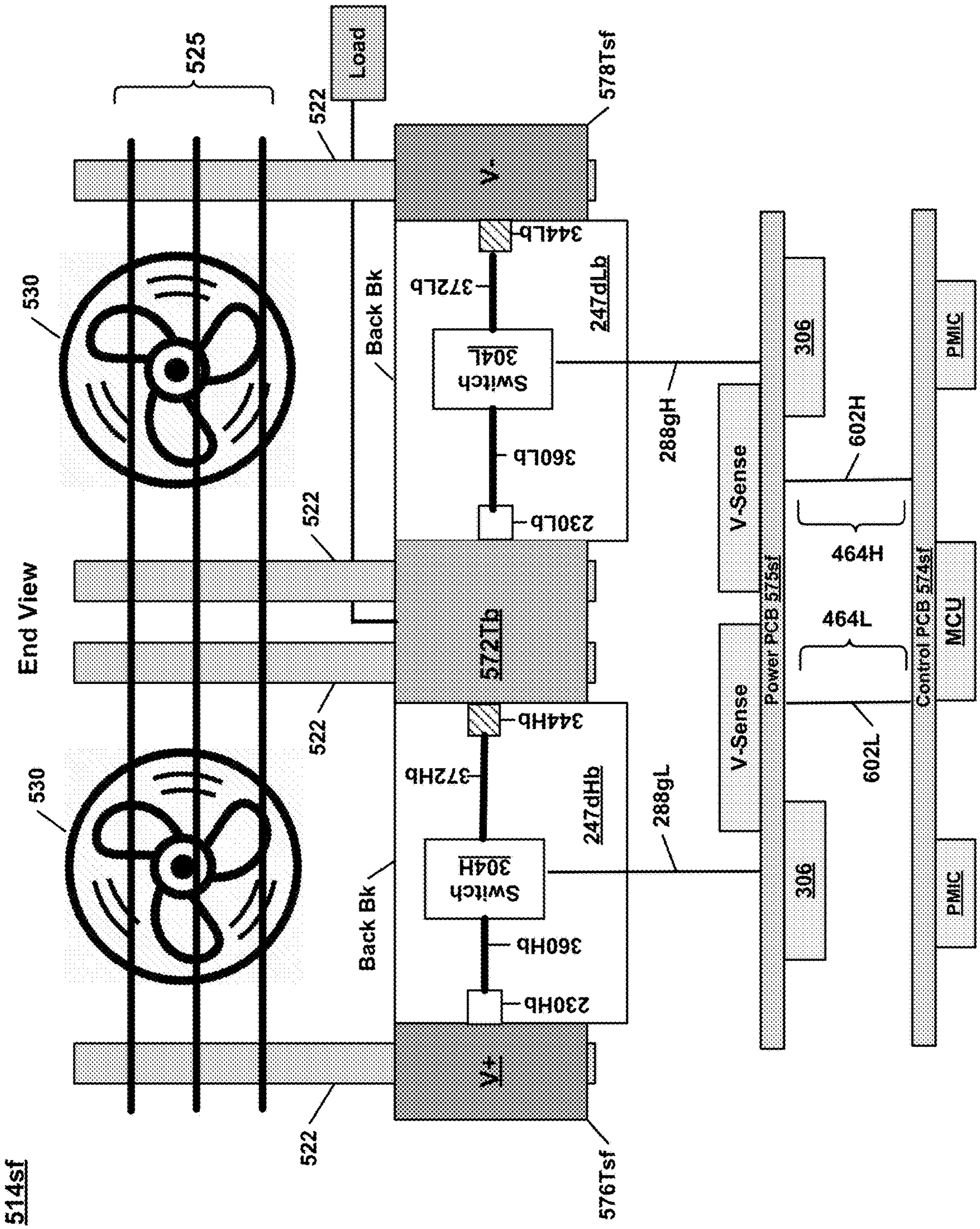
Figures 5, 5F, 6, 7:
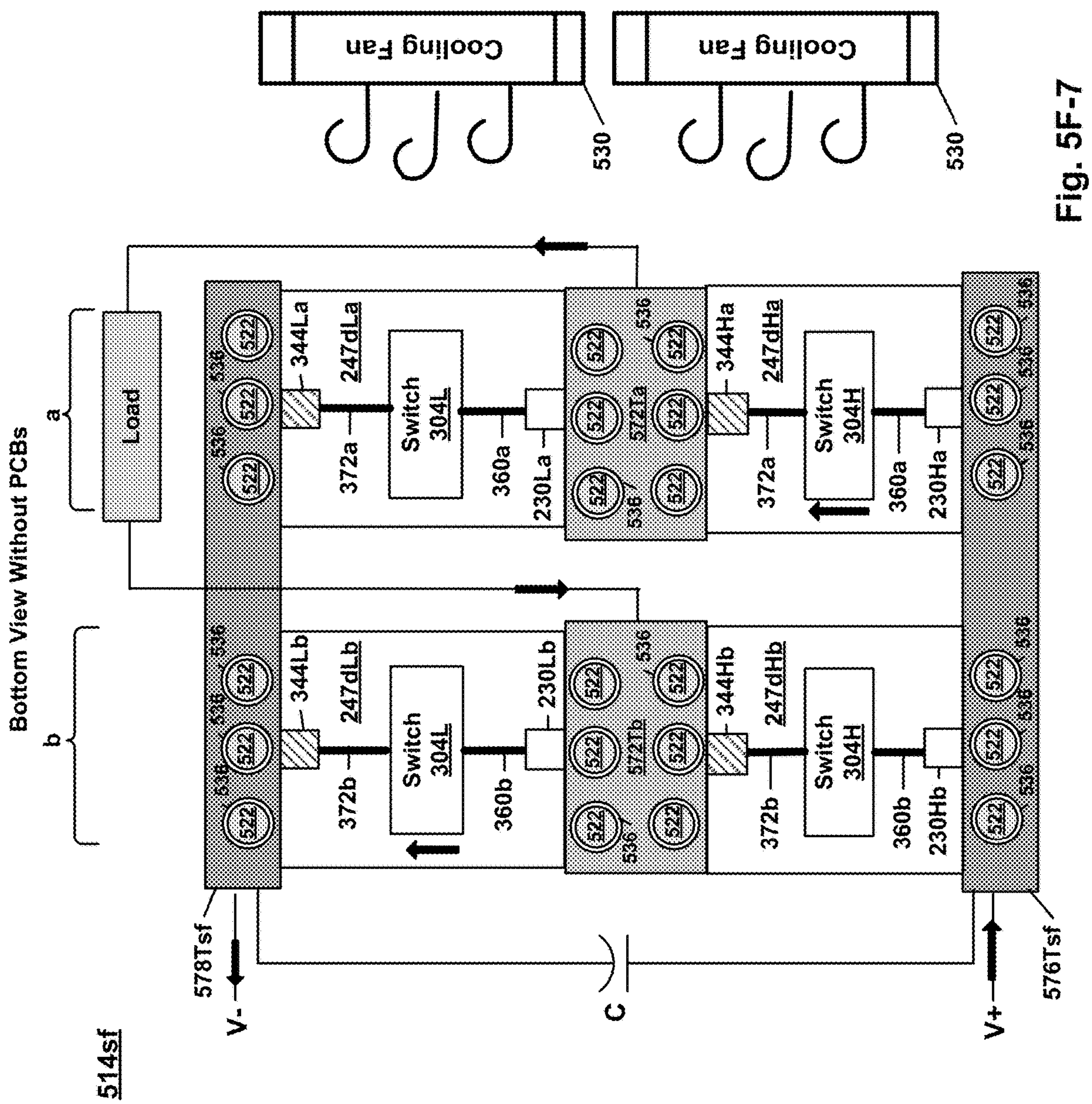

Air-cooled inverters 502*i*-510*i* and air-cooled rectifiers 502*r*-510*r* employ packaged switches or packaged half bridges with switch modules that contain switch controllers and other components. FIGS. 5F-1 and 5F-2 are quasi-schematic diagrams that show relevant aspects of another air-cooled inverter system 514*i* that employs a packaged switch like packaged switch 247*d*, which lacks a switch controller. FIGS. 5F-1 and 5F-2 show air-cooled inverter system 514*i* when seen from an end and bottom, respectively.

With reference to FIG. 5F-2 inverter system 514*i* includes three phases a-c. Each of phases a-c includes two packaged switches 247*d* like that shown in FIGS. 2E-1 connected to phase bus bars 572T, the combination of which is sandwiched between V+ bus bar 576T and V− bus bar 578T. The figure illustrates the vertical positioning of packaged switches 247*d*, V+ bus bar 576T, phase bus bars 572T, and V− bus bar 578T with respect to each other. Ends of heat-pipes 522 are embedded in and thermally connected to V+ bus bar 576T, V− bus bar 578T, and phase bus bars 572T. Phase bus bars 572T may have a height, width, and length of 8 mm, 29 mm, and 35 mm, respectively, in one embodiment. V+ bus bar 576T and V− bus bar 578T may have a height, width, and length of 8 mm, 29 mm, and 100 mm, respectively, in one embodiment. Packaged switches 247*d* employ switch module 376 of FIG. 3P-7. Bridges 368 are not shown in FIG. 5F-1 or 5F-2.

Air-cooled inverter system 514*i* enables double side cooling of switches 304 in packaged switches 247*d*. Cases of packaged switches 247*d* may be thermally connected to V+ bus bar 576T and phase bus bars 572T, or thermally connected to phase bus bars 572T and V− bus bar 578T.

Phase bus bars 572Ta-572Tc are electrically connected to stator windings Wa-Wc, respectively. In FIG. 5F-2, Phase bus bars 572Ta-572Tc are electrically isolated from each other. Die substrate terminals 230 of packaged switches 247*d*H in each phase are pressed-fitted, soldered, sintered, or connected by other means to corresponding flat surfaces of V+bus bar 576T to establish thermal and electrical connectivity therebetween. Die clip terminals 344 of packaged switches 247*d*Ha-247*d*Hc are pressed-fitted, soldered, sintered, or connected by other means to corresponding flat surfaces of phase bus bars 572Ta-572*c*, respectively, to establish thermal and electrical connectivity therebetween. Die substrate terminals 230 of packaged switches 247*d*La-247*d*Lc are pressed-fitted, soldered, sintered, or connected by other means to corresponding flat surfaces of phase bus bars 572Ta-572Tc, respectively, to establish thermal and electrical connectivity therebetween. Die clip terminals 344 of packaged switches 247*d*L are electrically connected to V-bus bar 578T. Each of the bus bars 576T, 578T and 572T includes channels that hold respective heat-pipes 522. One or more DC link capacitors C can be electrically connected in parallel and between V+bus bar 576T and V-bus bar 578T. In one embodiment, the DC link capacitors C may also be thermally connected to V+bus bar 576T and/or V-bus bar 578T.

FIGS. 5F-1 and 5F-2 include current symbols that represent current flow through inverter system 514*i* at an instant in time. More particularly, FIG. 5F-1 shows current flow through inverter system 514*i* when switch 247*d*H of phase-a is activated and conducting current from V+ bus bar 576T, while switches 247*d*L of phases b and c are activated and conducting current to V− via V− bus bar 578T. All other switches are deactivated.

Returning to FIG. 5F-1 inverter 514*i* includes a control PCB 577 with oppositely facing surfaces, and a power PCB 575 with oppositely facing surfaces. Components can be mounted to traces on each side of PCBs 575 and 577. FIG. 5F-1 shows an MCU, and PMICs for respective packaged switches 247*d* of phase c, all mounted on the side of control PCB 577 that faces away from packaged switches 247*d*. Additional components can be mounted to traces on this side of PCB 577 and the side that faces packaged switches 247*d*. Vias can connect traces on opposite sides of control PCB 577. FIG. 5F-1 also shows gate drivers 306 and V_Sense circuits for respective packaged switches 247*d* of phase c, mounted to traces on opposite sides of power PCB 575. Additional components such as connectors, diodes, resistors, etc., can be mounted to traces on both sides of power PCB 575. Vias can connect traces on opposite sides of power PCB 575.

Control PCB 577 is electrically connected to power PCB 575 through respective sets 464 of connector-leads. FIG. 5F-2 shows only connector-leads 602 of respective sets 464 for phase c that connect control PCB 577 to power PCB 575. Control PCB 577 sends signals (e.g., PWM signals, Reset) to, and receives signals (e.g., Fault, Vv, etc.) from power PCB 575 through respective conductive paths that include PCB traces and connector-leads in sets 464. Control PCB 577 also provides supply biasing voltages to power PCB 575 through respective conductive paths that include PCB traces and connector-leads in sets 464.

Although not shown, ends of each set 464 of connector-leads can be received in respective connectors mounted to traces on respective sides of PCBs 575 and 577 that face each other. Additional connectors, not shown, can be mounted to traces on the side of power PCB 575 that faces packaged switches 247*d*. These additional connecters received ends of respective sets of connector-leads 288. FIG. 5F-1 only shows connector-leads 288*g* for each set in phase c.

Air-Cooled Rectifier 514*r*

FIG. 5F-3 is quasi-schematic diagram of an example air-cooled rectifier system 514*r* when seen from the bottom. FIG. 5F-4 is quasi-schematic diagram of example air-cooled rectifier system 514*r* when seen from an end. Phase bus bars 572Ta-572Tc are electrically connected to AC sources ϕa-ϕc. Rectifier system 514*r* and inverter system 514*i* are substantially similar. The microcontroller mounted on the control PCB in rectifier system 514*r* may be different than the microcontroller mounted on the control PCB 577 in inverter system 514*i*, or the CPU executable instructions stored in memory of microcontroller mounted on the control PCB 577 in rectifier system 514*r* may be different than CPU executable instructions stored in memory of the microcontroller mounted on the control PCB 577 in inverter system 514*i*. Control PCB 577 of rectifier 514*r* may also include a phase-lock loop (PLL) and other components for synchronizing the control of switches 304 to the frequency (e.g., 60 Hertz) of the three-phase AC input voltages provided by the AC sources ϕa-ϕc.

The foregoing example air-cooled rectifiers employ packaged switches or packaged half bridges. These air-cooled rectifiers are examples of active devices. Passive air-cooled rectifiers are also contemplated. Passive rectifiers do not employ switches. Rather, passive rectifiers can employ diodes. The air-cooled rectifier 514*r* shown in FIGS. 5F-3 and 5F-4 can be converted into a passive rectifier by replacing packaged switches 347*d* with diodes (e.g., trench diodes). FIG. 5*f*-5 shows an example in which packaged switches 247*d* of FIG. 5F-4 are replaced by respective diodes D. Anodes of diodes DL are electrically and thermally connected to V− bus bar 578T, and cathodes of diodes DL are electrically and thermally connected to respective phase bars 572T. Cathodes of diodes DH are electrically and thermally connected to V+ bus bar 576T, and anodes of diodes DH are electrically and thermally connected to respective phase bars 572T. The anodes and cathodes can be directly sintered, soldered, or connected by another means to respective bus bars. Or each of the diodes D can be connected (e.g., sintered) to and between a pair of metal conductors like die substrates, each having oppositely facing flat surfaces. The sandwiched combination of diode and connected metal conductors in turn can be directly sintered, soldered, or connected by another means to and between adjacent bus bars. This alternative increases the gap between adjacent bus bars between which the diodes are connected. The following air-cooled rectifiers are active devices.

Air-Cooled Full-Bridge Inverter 514*sf*

Single-phase inverters can also be made using packaged switches 247*d* like that shown in FIGS. 2*f*-1 and 5F-2. FIGS. 5F-6 and 5F-7 are quasi-schematic diagrams that show relevant aspects of another air-cooled inverter system 514*sf* that employs a packaged switch like packaged switch 247*d*, which lacks a switch controller. FIGS. 5F-6 and 5F-7 show air-cooled inverter system 514*i* when seen from an end and bottom, respectively.

With reference to FIG. 5F-7 inverter system 514*sf* includes two phases a and b. Each of phases a and b includes two packaged switches 247*d* like that shown in FIGS. 2E-1 connected to phase bus bars 572T, the combination of which is sandwiched between V+ bus bar 576Tsf and V− bus bar 578Tsf. The figure illustrates the vertical positioning of packaged switches 247*d*, V+ bus bar 576Tsf, phase bus bars 572T, and V− bus bar 578Tsf with respect to each other. Ends of heat-pipes 522 are embedded in and thermally connected to V+ bus bar 576Tsf, V− bus bar 578T, and phase bus bars 572Tsf V+ bus bar 576Tsf and V− bus bar 578Tsf may have a height, width, and length of 8 mm, 29 mm, and 40 mm, respectively, in one embodiment. Packaged switches 247*d* employ switch module 376 of FIG. 3P-7. Bridges 368 are not shown in FIG. 5F-1 or 5F-2.

Air-cooled inverter system 514*sf* enables double side cooling of switches 304 in packaged switches 247*d*. Cases of packaged switches 247*d* may be thermally connected to V+ bus bar 576Tsf and phase bus bars 572T, or thermally connected to phase bus bars 572T and V− bus bar 578Tsf.

Phase bus bars 572Ta and 572Tb are electrically connected to a load, which may take form in a winding on a primary side of an isolation transformer. Phase bus bars 572Ta and 572Tb are electrically isolated from each other. Die substrate terminals 230 of packaged switches 247*d*H in each phase are pressed-fitted, soldered, sintered, or connected by other means to corresponding flat surfaces of V+bus bar 576Tsf to establish thermal and electrical connectivity therebetween. Die clip terminals 344 of packaged switches 247*d*Ha and 247*d*Hb are pressed-fitted, soldered, sintered, or connected by other means to corresponding flat surfaces of phase bus bars 572Ta and 572*b*, respectively, to establish thermal and electrical connectivity therebetween. Die substrate terminals 230La and 230 Lb of packaged switches 247*d*L are pressed-fitted, soldered, sintered, or connected by other means to corresponding flat surfaces of phase bus bars 572Ta and 572*b*, respectively, to establish thermal and electrical connectivity therebetween. Die clip terminals 344 of packaged switches 247*d*L are electrically connected to V-bus bar 578*sf*. Each of the bus bars 576Tsf, 578Tsf and 572T includes channels that hold respective heat-pipes 522. One or more DC link capacitors C can be electrically connected in parallel and between V+bus bar 576Tsf and V-bus bar 578Tsf. In one embodiment, the DC link capacitors C may also be thermally connected to V+bus bar 576Tsf and/or V-bus bar 578Tsf. Another capacitor (not shown) may be electrically connected between phase bus bars 572T. Further this other capacitor may be thermally connected to one or both phase bus bars 572.

FIG. 5F-7 includes current symbols that represent current flow through inverter system 514*sf* at an instant in time. More particularly, FIG. 5F-7 shows current flow through inverter system 514*sf* when switch 247*d*H of phase-a is activated and conducting current from V+ bus bar 576Tsf, while switch 247*d*L of phase b is activated and conducting current to V− via V− bus bar 578T. All other switches are deactivated.

Returning to FIG. 5F-6 inverter 514*i* includes a control PCB 577*sf* with oppositely facing surfaces, and a power PCB 575*sf* with oppositely facing surfaces. Components can be mounted to traces on each side of PCBs 575*sf* and 577*sf* FIG. 5F-6 shows an MCU, and PMICs for respective packaged switches 247*d* of phase b, all mounted on the side of control PCB 577*sf* that faces away from packaged switches 247*d*. Additional components can be mounted to traces on this side of PCB 577*sf* and the side that faces packaged switches 247*d*. Vias can connect traces on opposite sides of control PCB 577*sf* FIG. 5F-6 also shows gate drivers 306 and V_Sense circuits for respective packaged switches 247*d* of phase b, mounted to traces on opposite sides of power PCB 575*sf* Additional components such as connectors, diodes, resistors, etc., can be mounted to traces on both sides of power PCB 575*sf* Vias can connect traces on opposite sides of power PCB 575*sf*.

Control PCB 577*sf* is electrically connected to power PCB 575*sf* through respective sets 464 of connector-leads. FIG. 5F-6 shows only connector-leads 602 of respective sets 464 for phase b that connect control PCB 577*sf* to power PCB 575*sf* Control PCB 577*sf* sends signals (e.g., PWM signals, Reset) to, and receives signals (e.g., Fault, Vv, etc.) from power PCB 575*sff* through respective conductive paths that include PCB traces and connector-leads in sets 464. Control PCB 577*sf* also provides supply biasing voltages to power PCB 575*sf* through respective conductive paths that include PCB traces and connector-leads in sets 464.

Although not shown, ends of each set 464 of connector-leads can be received in respective connectors mounted to traces on respective sides of PCBs 575*sf* and 577*sf* that face each other. Additional connectors, not shown, can be mounted to traces on the side of power PCB 575*sf* that faces packaged switches 247*d*. These additional connecters received ends of respective sets of connector-leads 288. FIG. 5F-6 only shows connector-leads 288*g* for each set in phase b.

Air-Cooled Vienna Rectifier 516*vr*1

Figures 1, 5G:
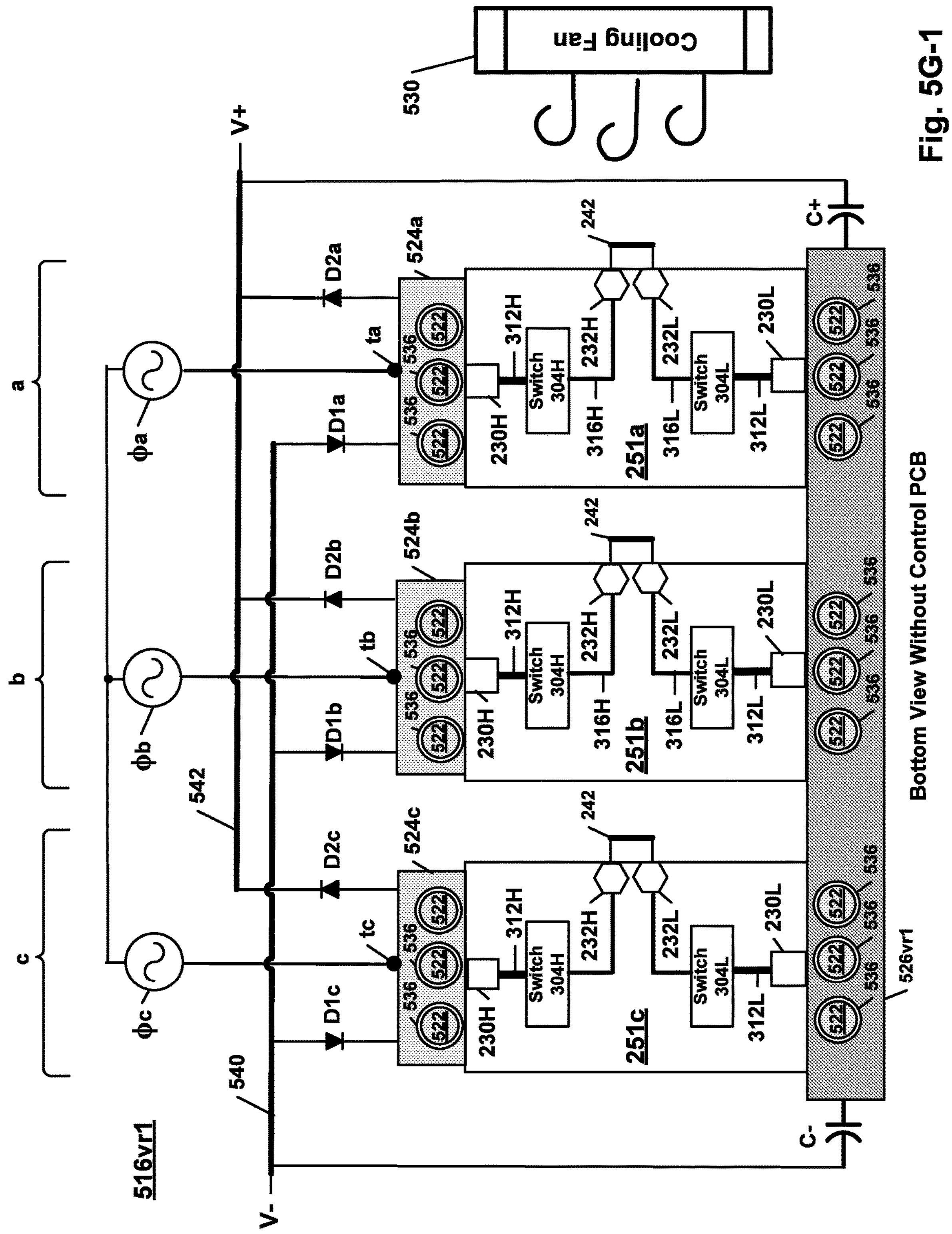
Figures 2, 5G:
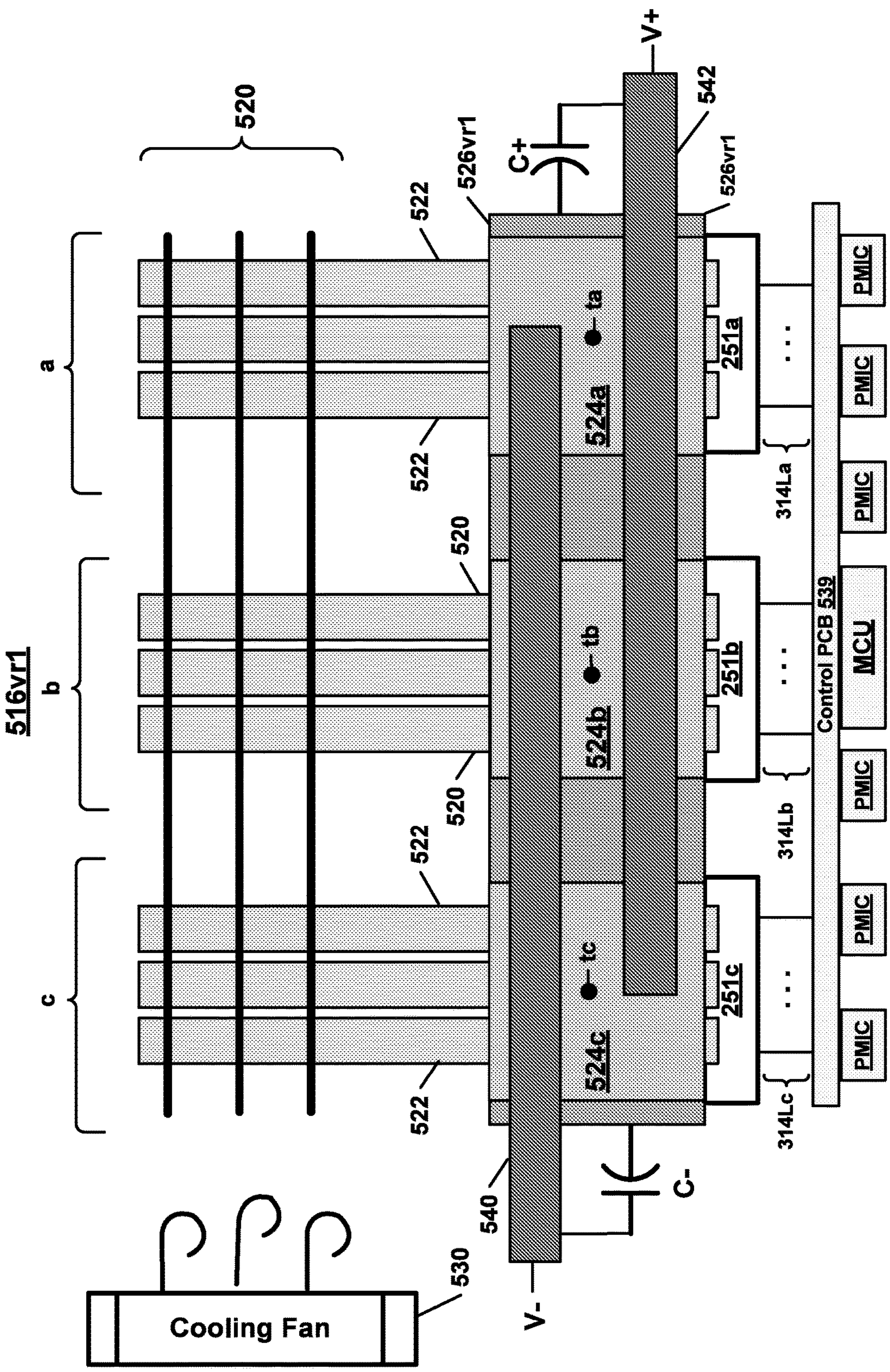
Figures 3, 5G:
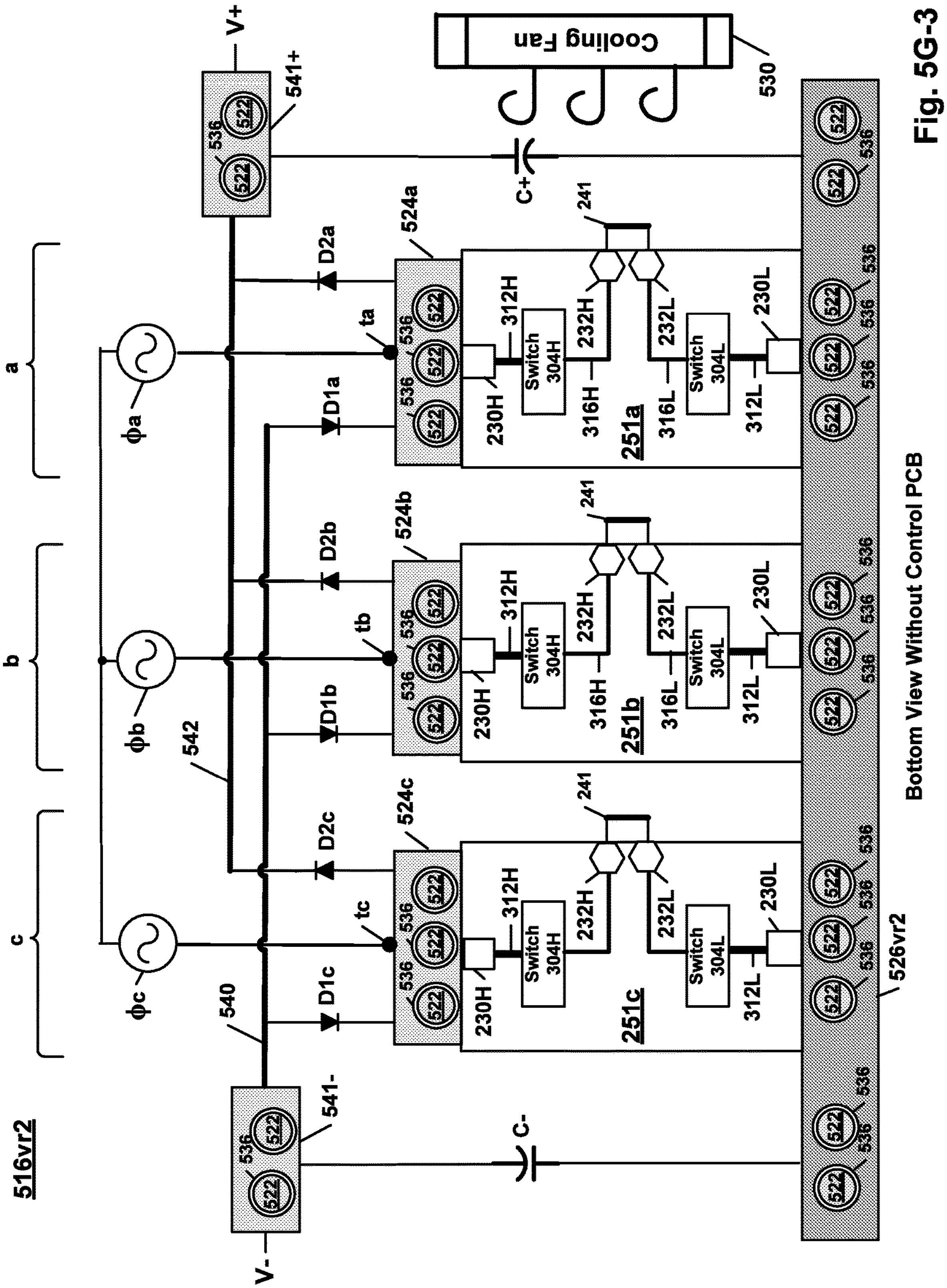
Figures 4, 5G:
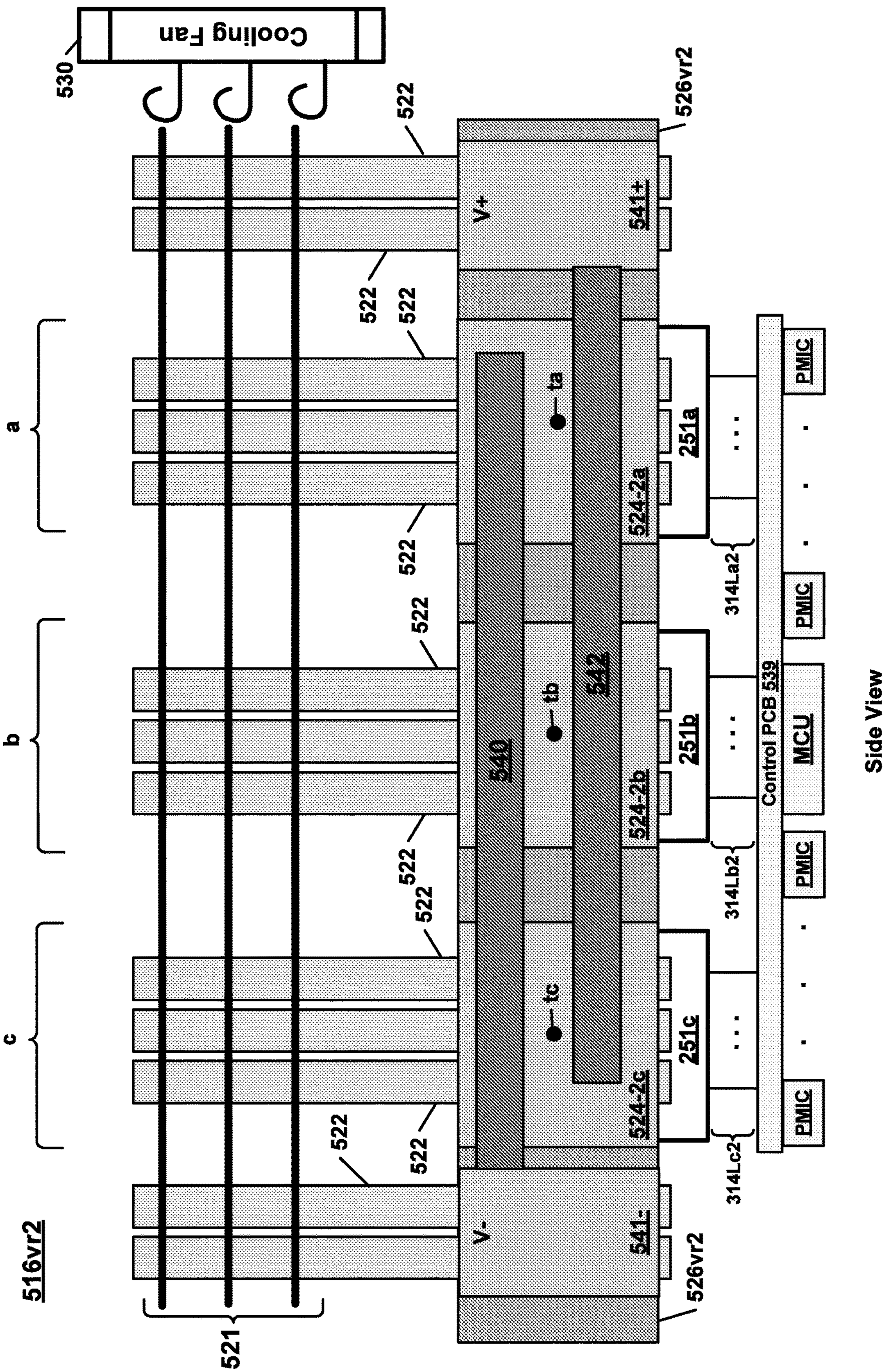

FIG. 5G-1 is quasi-schematic diagram of an example air-cooled rectifier system 516*vr*1 when seen from the bottom. FIG. 5G-2 is quasi-schematic diagram of example air-cooled rectifier system 516*vr*1 when seen from a side. Air-cooled rectifier system 516*vr*1 is an example of a three-phase "Vienna" style rectifier. Air-cooled rectifier system 516*vr*1 cannot operate bi-directionally.

Similarities exist between air-cooled rectifier 516*vr*1 and air-cooled rectifier 502*r*. However, several differences exist. For example, air-cooled rectifier system 516*vr*1 employs packaged half bridges 251 like that shown in FIG. 4B-1, which in turn may contain switch modules of FIGS. 3I-1 and 3J-1. Other differences may exist between air-cooled rectifiers 516*vr*1 and 502*r*. In an alternative embodiment, packaged half bridges 255 of FIG. 4D-1 could be employed.

With continued reference to FIG. 5G-2, air-cooled rectifier system 516*vr*1 has three phases designated a-c. Phases a-c include packaged half bridges 251*a*-251*c*, respectively. Die substrate terminals 230H are electrically and thermally connected to phase bus bars 524*a*-524*c*, respectively, which in turn have terminals ta-tc, respectively, that electrically connected to AC sources ϕa-ϕc, respectively. Phase bus bars 524*a*-524*c* conduct AC current between AC sources ϕa-ϕc, respectively, and packaged half bridges 251*a*-251*c*, respectively. They also act as heat sinks. Each of the phase bus bars 524 may have a height, width, and length of 8 mm, 29 mm, and 30 mm, respectively, in one embodiment. Cases of packaged half bridges 251*a*-251*c* may be thermally connected to phase bus bars 524*a*-524*c*, respectively, in some embodiments.

Air-cooled rectifier system 516*vr*1 has a bus bar 526*vr*1, which also acts as a heat sink. Ends of heat-pipes 522 are embedded in and thermally connected to bus bar 526*vr*1 and phase bus bars 524. Die substrate terminals 230L are sintered, soldered, press-fitted, or connected by other means to bus bar 526*vr*1. Die substrate terminals 230 are sintered, soldered, press-fitted, or connected by other means to respective phase bus bars 524.

Bus bar 526*vr*1 is electrically connected to terminals of capacitors C− and C+ as shown. Capacitors C− and C+ may also be thermally connected to bus bar 526*vr*1. In one embodiment, terminals of capacitors C− and C+ are sintered, soldered, press-fitted, or connected by other means to bus bar 526*vr*1. Opposite terminals of capacitors C− and C+ are electrically connected to V− bus 540 and V+ bus bar 542, respectively. Bus bars 540 and 542 are shown symbolically in FIG. 5G-1. Bus bars 540 and 542 may have a rectangular cross section. FIG. 5G-2 shows a top view of example bus bars 540 and 542. In another embodiment, heat-pipes may be embedded in bus bars 540 and 542. If bus bars 540 and 542 are coplanar, bus bars 540 and 542 may have to share some of the heat-pipes. Assuming the outer surfaces of the shared heat-pipes are coated with a dielectric, the shared heap-pipes will not electrically connect bus bars 540 and 542.

Diodes D have oppositely facing flat surfaces that contain cathodes and anodes. With reference to FIG. 5G-1, diodes D may be electrically and thermally connected to respective phase bus bars 524. Diodes D1 may be electrically and thermally connected to V− bus bar 540, and diodes D2 may be electrically and thermally connected to V+ bus bar 542. The diodes D are hidden from view in FIG. 5G-2.

The connections may be direct. For example, the cathode and anode of diodes Dla and D2*a*, respectively, may be sintered, soldered, or connected by other means to bus bar 524*a*, the cathode and anode of diodes D1*b* and D2*b*, respectively, may be sintered, soldered, or connected by other means to phase bus bar 524*b*, and the cathode and anode of diodes D1*c* and D2*c*, respectively, may be sintered, soldered, or connected by other means to phase bus bar 524*c*. And the anode and cathode of diodes D1 and D2, respectively, may be sintered, soldered, or connected by other means to V− and V+ bus bars 540 and 542, respectively. Or the connections may be indirect. For example each of the diodes D can be connected (e.g., sintered) to and between a pair of metal conductors like die substrates, each having oppositely facing flat surfaces. The sandwiched combination of diode and connected metal conductors in turn can be directly sintered, soldered, or connected by another means to and between adjacent bus bars (e.g., V− bus bar 540 and phase bus bar 524*c*). This alternative increases the gap between adjacent bus bars, between which the diodes are connected.

Bus bar 526*vr*1 may have a height, width, and length of 8 mm, 29 mm, and 100 mm, respectively, in one embodiment. Cases of packaged half bridges 251 may be thermally connected to bus bar 526*vr*1. FIG. 5G-2 shows the positioning of half bridge 251, phase bar 524, and V+ bus bar 526*vr*1 of each phase with respect to each other.

Metal straps 242, which are shown symbolically, can be external to the packaged half bridges 251 and electrically connect high side die clip terminals 232H to low side die clip terminals 232L.

Additional differences can exist between air-cooled rectifier 516*vr*1 and air-cooled rectifier 502*r*. With reference FIG. 5G-2, a microcontroller is mounted on a control PCB 539 in rectifier system 516*vr*1, which may be different than the microcontroller mounted on control PCB 532 in rectifier system 502*r*, or the CPU executable instructions stored in memory of microcontroller in rectifier system 516*vr*1 may be different than CPU executable instructions stored in memory of the microcontroller mounted on control PCB 532 in rectifier system 502*r*. The control PCB of rectifier 516*vr*1 and 502*r* may include a phase-lock loop (PLL) and other components for synchronizing the control of switches 304 to the frequency (e.g., 60 Hertz) of the three-phase AC input voltages provided by the AC sources ϕa-ϕc.

Air-Cooled Vienna Rectifier 516*vr*2

FIG. 5G-3 is quasi-schematic diagram of an alternative air-cooled Vienna rectifier system 516*vr*2 when seen from the bottom. FIG. 5G-4 is quasi-schematic diagram of alternative air-cooled Vienna rectifier system 516*vr*1 when seen from a side. Air-cooled rectifier systems 516*vr*1 and 515*vr*2 are substantially similar. However, several differences exist. For example, air-cooled rectifier system 516*vr*2 employs an extended bus bar 526*vr*2, and heat sinks 541− and 541+. V− and V+ bus bars 540 and 542 are electrically connected to heat sinks 541− and 541+, respectively. Capacitors C− and C+ can be electrically and thermally connected to bus bar 526*vr*2 and respective heat sinks 541− and 541+. Extended bus bar 526*vr*2 and heat sinks 541− and 541+ can accommodate capacitors C− and C+ (e.g., thin film capacitors contained in a cylindrical packages) with long lengths.

Bus bar 526*vr*2 may have a height, width, and length of 8 mm, 29 mm, and 180 mm, respectively, in one embodiment. Heat sinks 541− and 541+ may have a height, width, and length of 8 mm, 29 mm, and 40 mm, respectively, in one embodiment.

Air-Cooled Inverter 518*i* for Switched Reluctance Motor

Figures 1, 5H:
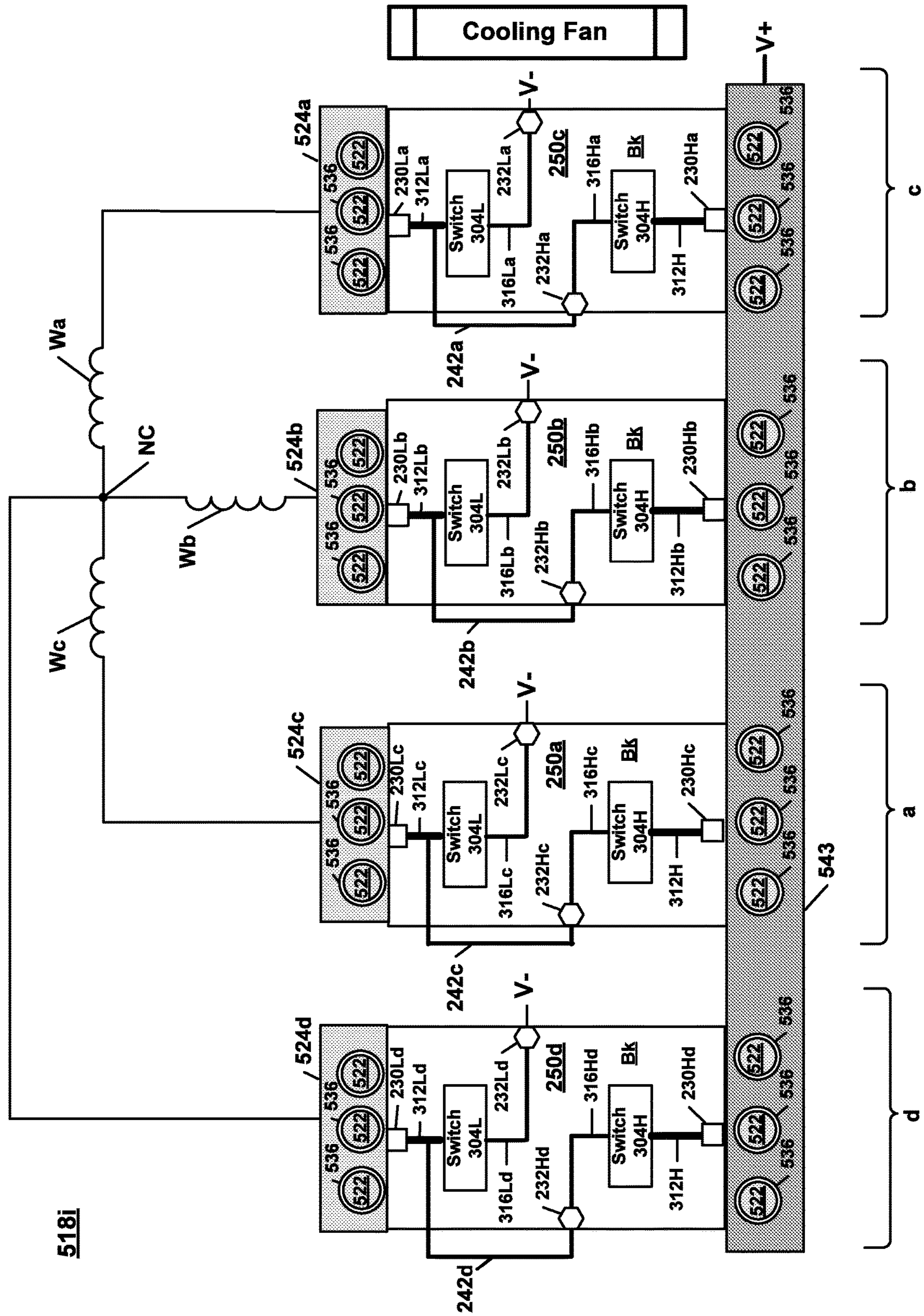
Figures 2, 5H:
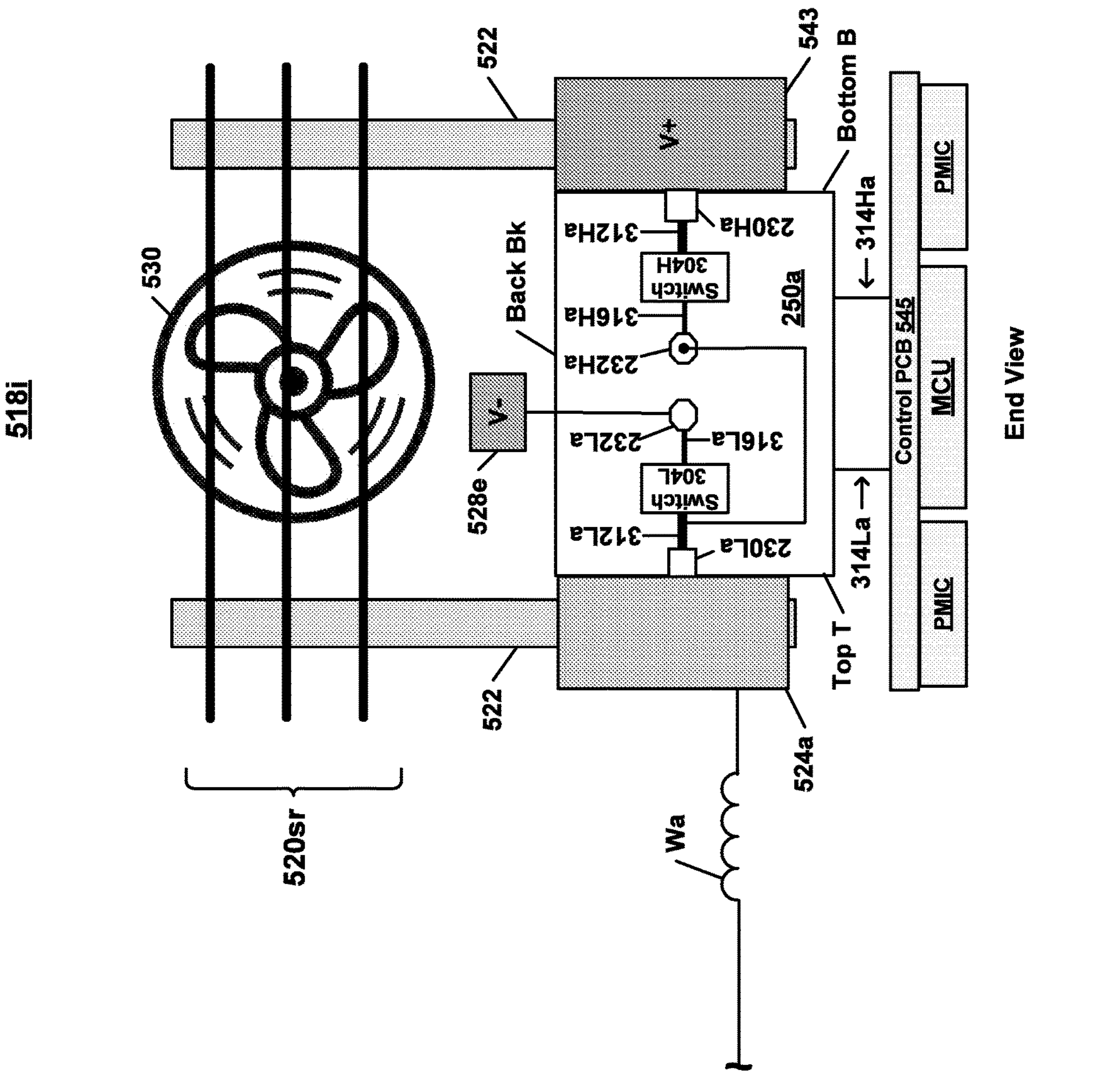

Inverters described above can be used to drive electric motors like asynchronous induction motors. FIGS. 5H-1 and 5H-2 illustrate an inverter 518*i* that can be used to drive a switched reluctance motor. Unlike the three-phase inverters above, inverter 518*i* includes an additional packaged half bridge 250*d* that is electrically connected to a common node NC to which windings Wa-Wc are also connected as shown in FIG. 5H-1.

Inverter 518*i* is like inverter 502*i* shown in FIG. 5A-1. FIG. 5H-1 is quasi-schematic diagram of an example air-cooled inverter system 518*i* when seen from an end. FIG. 5H-2 is quasi-schematic diagram of example air-cooled inverter system 518*i* when seen from the bottom.

Air-cooled inverter system 518*i* employs packaged half bridges 250 like that shown in FIG. 4A-1 or FIG. 4G-1. With continued reference to FIG. 5H-1, air-cooled inverter system 518*i* has four phases designated a-d. Phases a-d include packaged half bridges 250*a*-250*d*, respectively, with die substrate terminals 230L that are electrically and thermally connected to phase bus bars 524*a*-524*d*, respectively, which in turn have terminals that are electrically connected to stator windings Wa-Wc and common node NC, respectively. Phase bus bars 524*a*-524*d* also act as heat sinks. Each of the phase bus bars 524 may have a height, width, and length of 8 mm, 29 mm, and 30 mm, respectively, in one embodiment. Cases of packaged half bridges 250*a*-250*d* may be thermally connected to phase bus bars 524*a*-524*d*, respectively.

Air-cooled inverter system has a V+ bus bar 543 that also acts as a heat sink. Die substrate terminals 230H are electrically and thermally connected to V+ bus bar 543, which has a V+ input terminal, which in turn is electrically connected to a battery or other DC voltage supply. V+ bus bar 543 may have a height, width, and length of 8 mm, 29 mm, and 180 mm, respectively, in one embodiment. Cases of packaged half bridges 250 may be thermally connected to V+ bus bar 543.

FIG. 5H-1 shows the positioning of half bridge 250, phase bar 524, and V+ bus bar 543 of each phase with respect to each other. Metal straps 242 are external to the packaged half bridges 250 and electrically connect high side die clip terminals 232H to side-terminals (not shown) of low side die substrates 312L.

The low-side die clip terminals 232La-232Ld are electrically connected to a V− bus bar, which has a V− input terminal, which in turn is electrically connected of a battery or other DC voltage source. FIG. 5H-2 shows an example V− bus bar 528*e* with a rectangular cross-section. One or more DC link capacitors (not shown) are electrically connected in parallel and between V+ bus bar 543 and V− bus bar 528*e*. The one or more of the DC link capacitors may also be thermally connected to V+ bus bar 543.

Die substrate terminals 230La-230Ld are pressed-fitted, soldered, sintered, or connected by other means to corresponding flat surfaces of phase bus bars 524*a*-524*d*, respectively, to establish thermal and electrical connectivity therebetween. Each of the die substrate terminals 230H is pressed-fitted, soldered, sintered, or connected by other means to corresponding flat surfaces of the V+ bus bar 543 to establish thermal and electrical connectivity therebetween.

A mechanical structure (not shown in FIG. 5H-1 or 5H-2) can press-fit die substrate terminals 230La-230Ld against flat surfaces of phase bus bars 524*a*-524*d*, respectively, and the die substrate terminals 230H against flat surfaces the V+ bus bar 446. Press-fitting should reduce or eliminate problems related to mismatched CTEs. Ideally, the surfaces of components that are pressed together should be smooth to optimize the electrical and/or thermal connection.

Returning to FIG. 5H-2 inverter 518*i* also includes a control PCB 545 that has oppositely facing surfaces. Control PCB 545 is electrically connected to packaged half bridges 250 through respective sets 314 of connector-leads. Although not shown, ends of each set 314 of connector-leads can be received in a respective connector, which in turn can be mounted on one side of control PCB 545 and electrically connected to traces thereon. Additional components can be connected to traces on that side. A microcontroller or other processor-based control unit, PMICs, or other devices are connected to traces on a side of the PCB 545 that faces away from packaged half bridges 250. The microcontroller and PMICs are electrically connected to packaged half bridges 250 through electrical paths consisting of traces and metal vias formed in control PCB 545, connectors, and sets of connector-leads. PMICs supply biasing voltages to respective switch modules of packaged half bridges 250. The microcontroller provides PWM and other signals to or receives signals from the packaged half bridges 250.

Air-Cooled Inverter 531*i*

Figures 1, 5I:
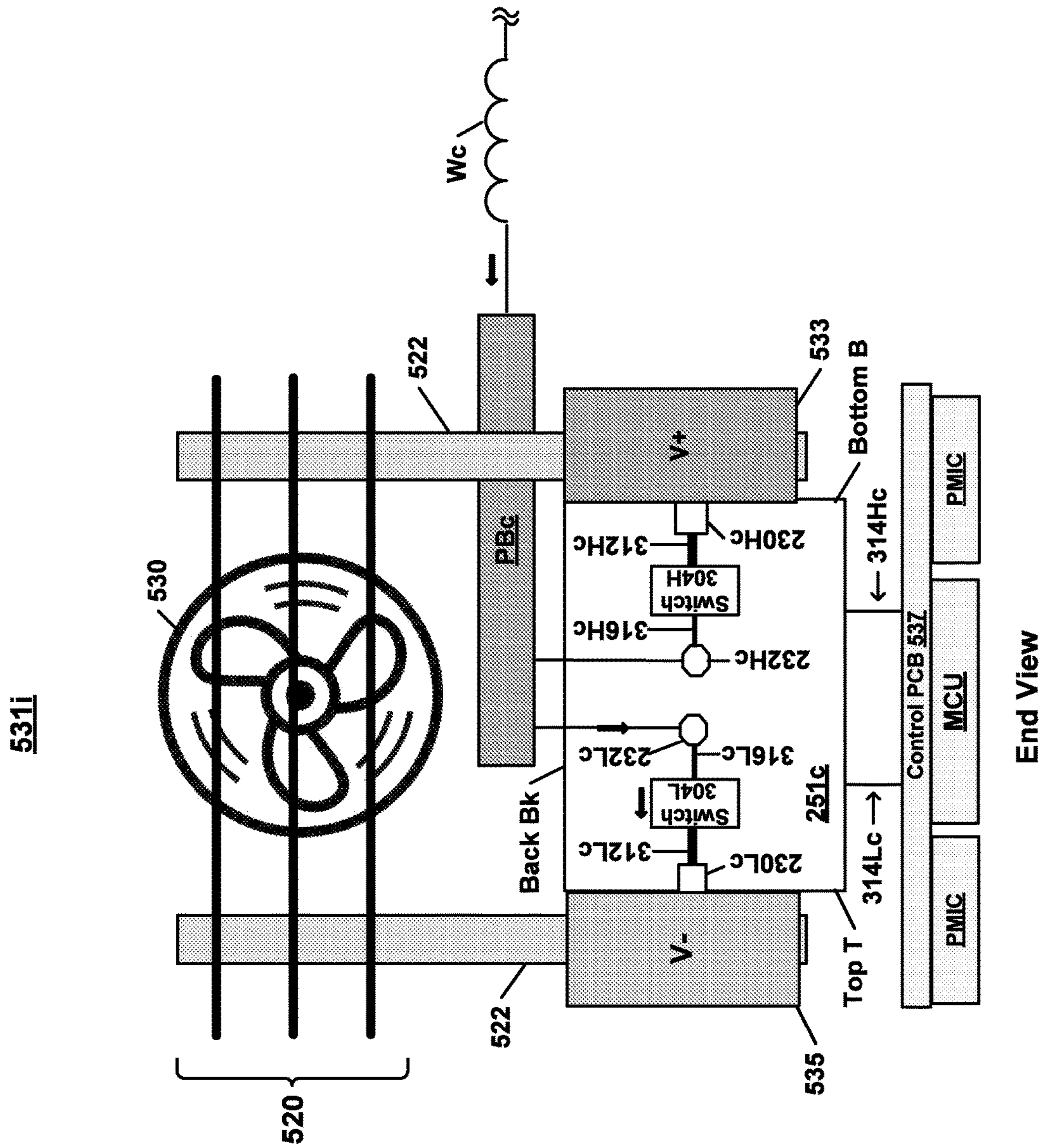
Figures 2, 5I:
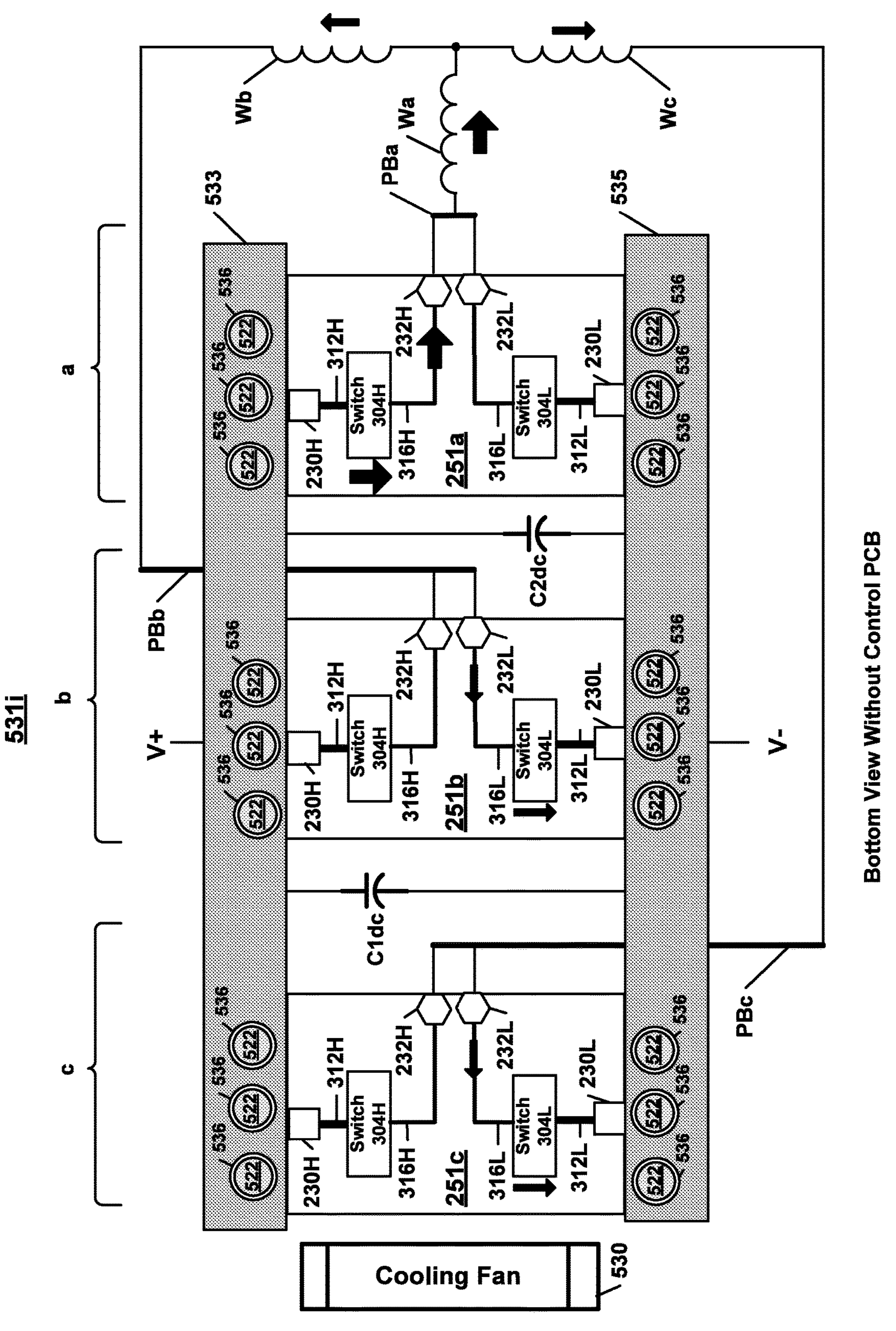
Figures 3, 5I:
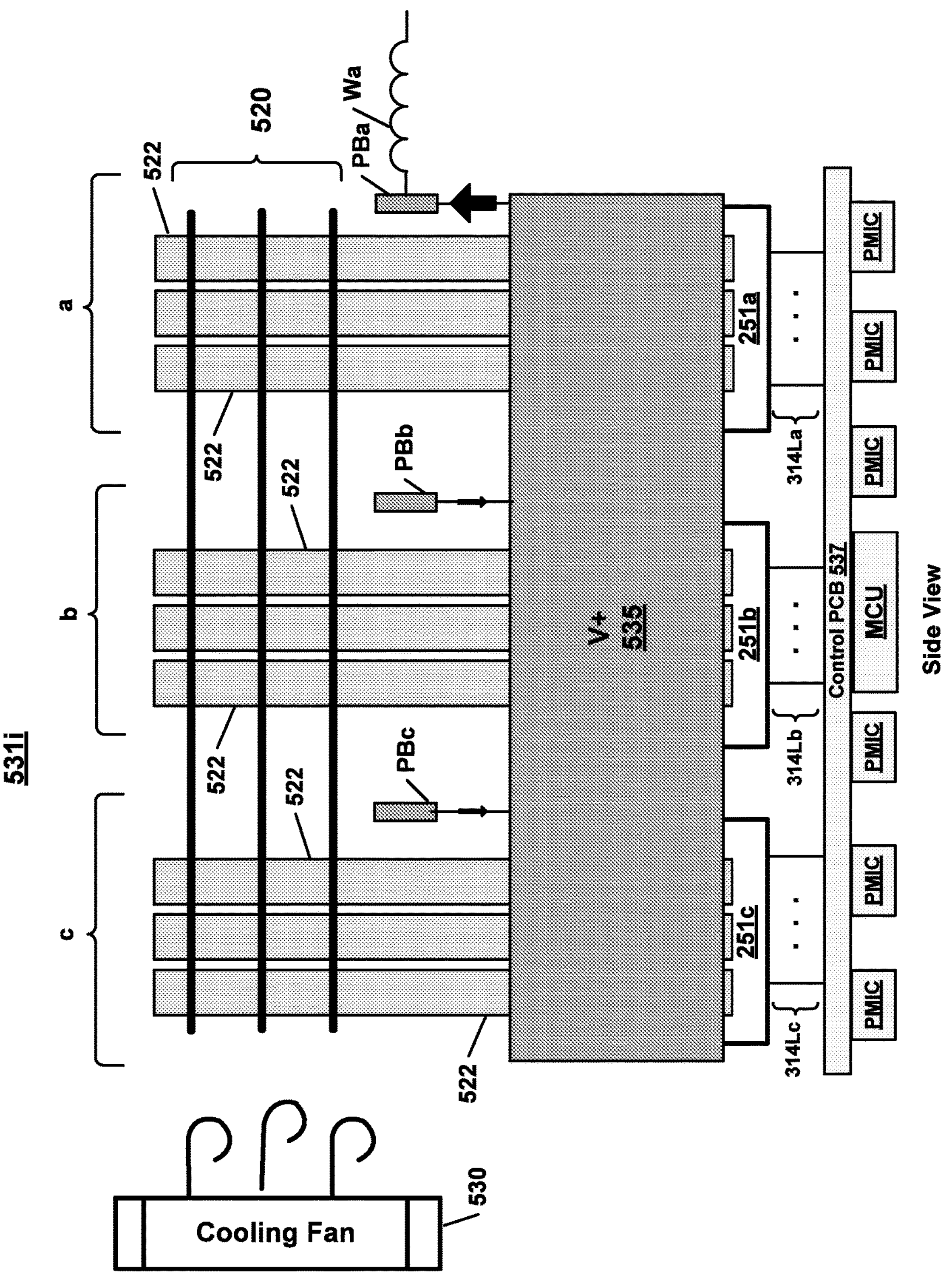
Figures 4, 5I:
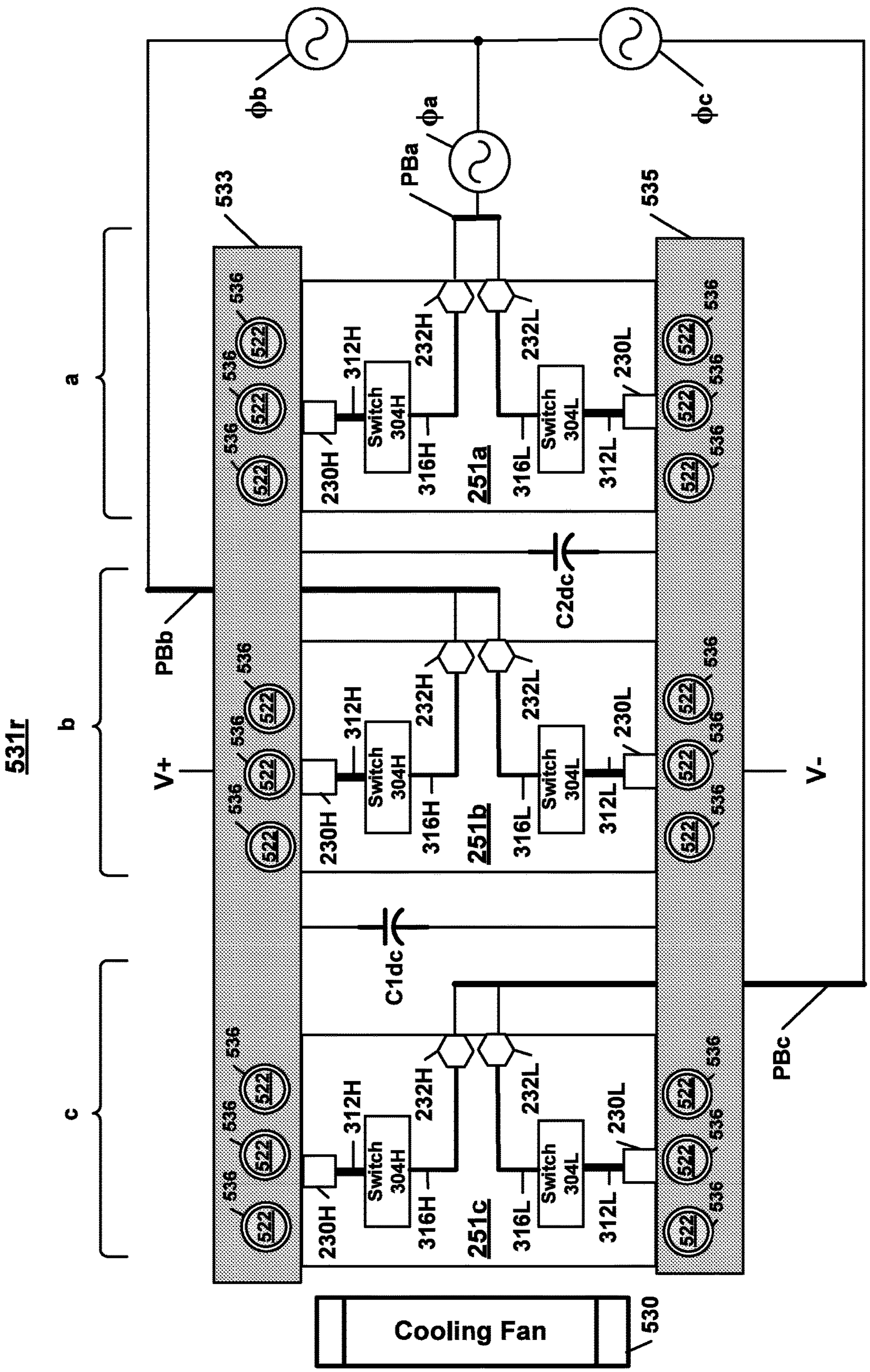
Figures 5, 5I:
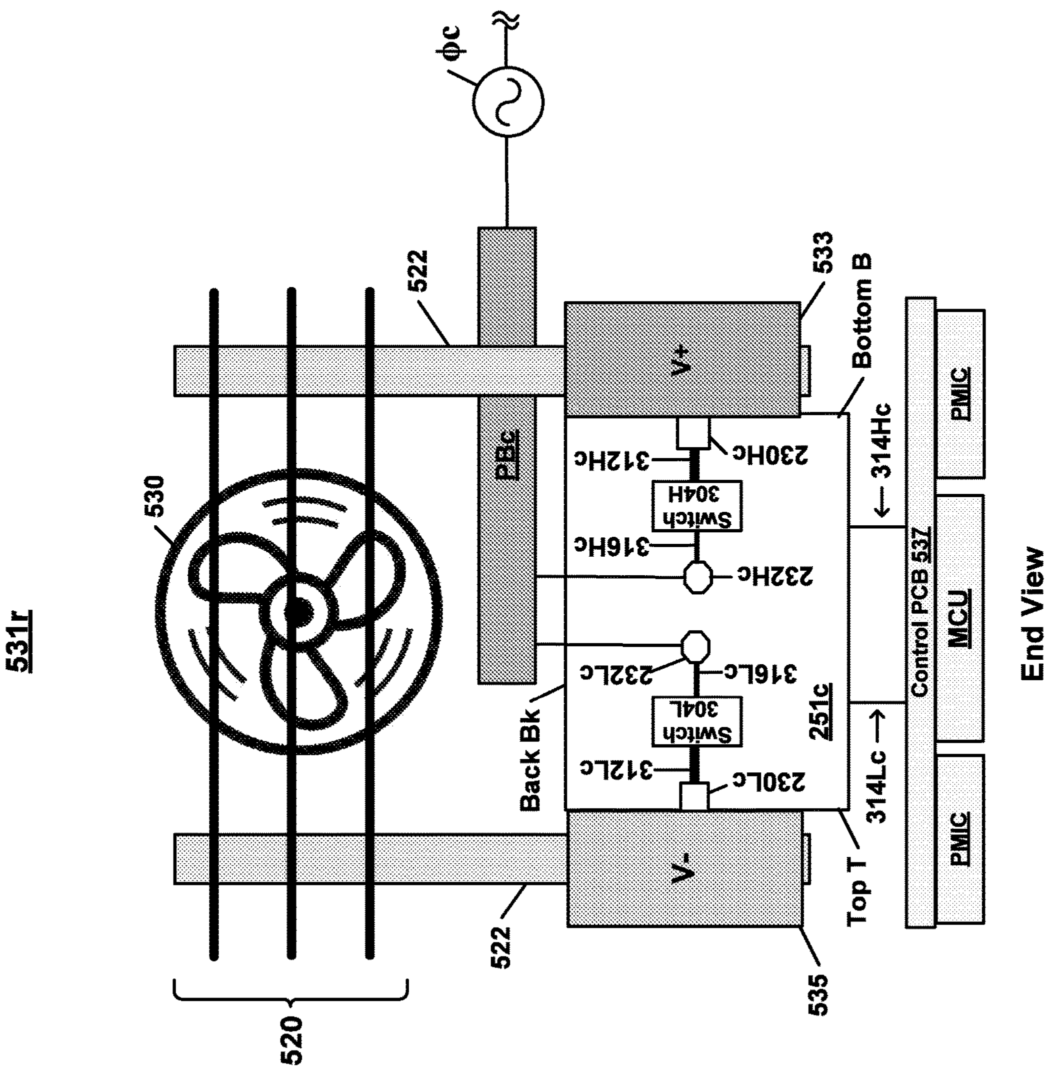

FIGS. 5I-1-5I-3 are quasi-schematic diagram showing end, bottom, and side views of yet another air-cooled inverter system 53 li that uses packaged half bridges 251 shown in FIG. 4B-1, which in turn may contain switch modules of FIGS. 3I-1 and 3J-1. More specifically, phases a-c include packaged half bridges 251*a*-251*c*, respectively, and phase bus bars PBa-PBc, respectively. Air-cooled inverter system 53 li also includes V+bus bar 533 and V-bus bar 535, both of which also act as heat sinks with channels that hold heat-pipes 522. FIG. 51-2 shows the vertical positioning of half bridge 251, V+bus bar 533, and V-bus bar 535 with respect to each other in each phase. In an alternative embodiment of air-cooled inverter 531*i*, packaged half bridges 251 can be replaced by packaged half bridges 261 shown in FIGS. 4F-1 and 4F-2. In still another embodiment, packaged half bridges 251 can be replaced by packaged half bridges 255 of FIG. 4D-1.

The dimensions of V+ bus bar 533, and V− bus bar 535 are substantially similar. V+ bus bar 533 has a height, width, and length of 8 mm, 29 mm, and 120 mm, respectively, in one embodiment. Cases of packaged half bridges 251 may be thermally connected to V+ bus bar 533 and V− bus bar 535.

Low-side die substrate terminals 230L and high-side die substrate terminals 230H are pressed-fitted, soldered, sintered, or connected by other means to corresponding flat surfaces of V-bus bar 535 and V+bus bar 533, respectively, to establish thermal and electrical connectivity therebetween. A grease or similar material can be applied in an embodiment in which the terminals and bus bars are pressed together to ensure better thermal and/or electrical connectivity.

One or more DC link capacitors C can be electrically connected in parallel and between V+ bus bar 533 and V− bus bar 535. In the embodiment shown, one or more DC link capacitors C1*dc* are electrically connected between the V+ bus bar 533 and V− bus bar 535 and positioned between packaged half bridges 251*c* and 251*b*, while one or more DC link capacitors C2*dc* are electrically connected between the V+ bus bar 533 and V− bus bar 535 and positioned between packaged half bridges 251*b* and 251*a*. In this configuration, DC link capacitors C1*dc* and C2*dc* may also be thermally connected to both V+ bus bar 533 and V− bus bar 535, or DC link capacitors C1*dc* and C2*dc* may also be thermally connected to only one of V+ bus bar 533 and V− bus bar 535. For example, DC link capacitors C1*dc* may be electrically connected to both V+ bus bar 533 and V− bus bar 535, but only be thermally connected to V+ bus bar 533, while DC link capacitors C2*dc* are electrically connected to both V+ bus bar 533 and V− bus bar 535, but only thermally connected to V− bus bar 535. The thermal connection can cool capacitors C1*dc* and C2*dc*. In still another embodiment, capacitors C1*dc* and C2*dc* are electrically and/or thermally connected between V+ bus bar 533 and V− bus 212 at ends thereof. In this later embodiment, capacitors C1*dc* and C2*dc* can be positioned adjacent to ends of V+ bus bar 533 and V− bus 212, rather than positioned between packaged half bridges 251*c* and 251*b* and between packaged half bridges 251*b* and 251*a*.

Phase bus bars PBa-PBc are electrically connected to die clip terminals 232 in phases a-c, respectively, as shown. Phase bus bars PBa-PBc are symbolically shown in FIG. 5I-2. FIG. 5I-1 shows an example phase bus bar PBc formed from metal. Example phase bus bar PBc has a rectangular shape and extends from first and second ends. The first end is electrically connected to die clip terminals 232, and the second end is electrically connected to a terminal of winding Wc. Phase bus bars PB have a rectangular cross-sectional shape as shown in FIG. 5I-3.

FIGS. 5I-1-5I-3 include current symbols that represent current flow through inverter system 531*i* at an instant in time. For example, FIG. 5I-2 shows current flow through inverter system 531*i* when the high-side switch 304H of phase-a is activated and conducting current, while low-side switches 304L of phases b and c are activated and conducting current. All other switches are deactivated in the figure. Importantly, the activated switches are thermally connected to V+ bus bar 533 or V− bus bar 535.

Returning to FIG. 5I-1 inverter 531*i* includes a control PCB 537 with oppositely facing surfaces. Control PCB 537 is electrically connected to packaged half bridges 251 through respective sets 314 of lead connectors. Although not shown, ends of each set 314 of connector-leads can be received in a respective connector, which in turn can be mounted on a side of control PCB 537 and electrically connected to traces thereon. Additional components can also be connected to traces on the side of PCB 537 that faces the packaged half bridges. A microcontroller or other processor-based control unit, PMICs, or other devices are connected to traces on a side of the PCB 537 that faces away from packaged half bridges 251. The microcontroller and PMICs can be electrically connected to packaged half bridges 251 through electrical paths consisting of traces and vias formed in control PCB 537, connectors, and sets of connector-leads. PMICs supply biasing voltages to respective switch modules of packaged half bridges 251. The microcontroller provides PWM and other signals to or receives signals from the packaged half bridges 251.

Air-Cooled Rectifier 531*r*

Figures 1, 5J:
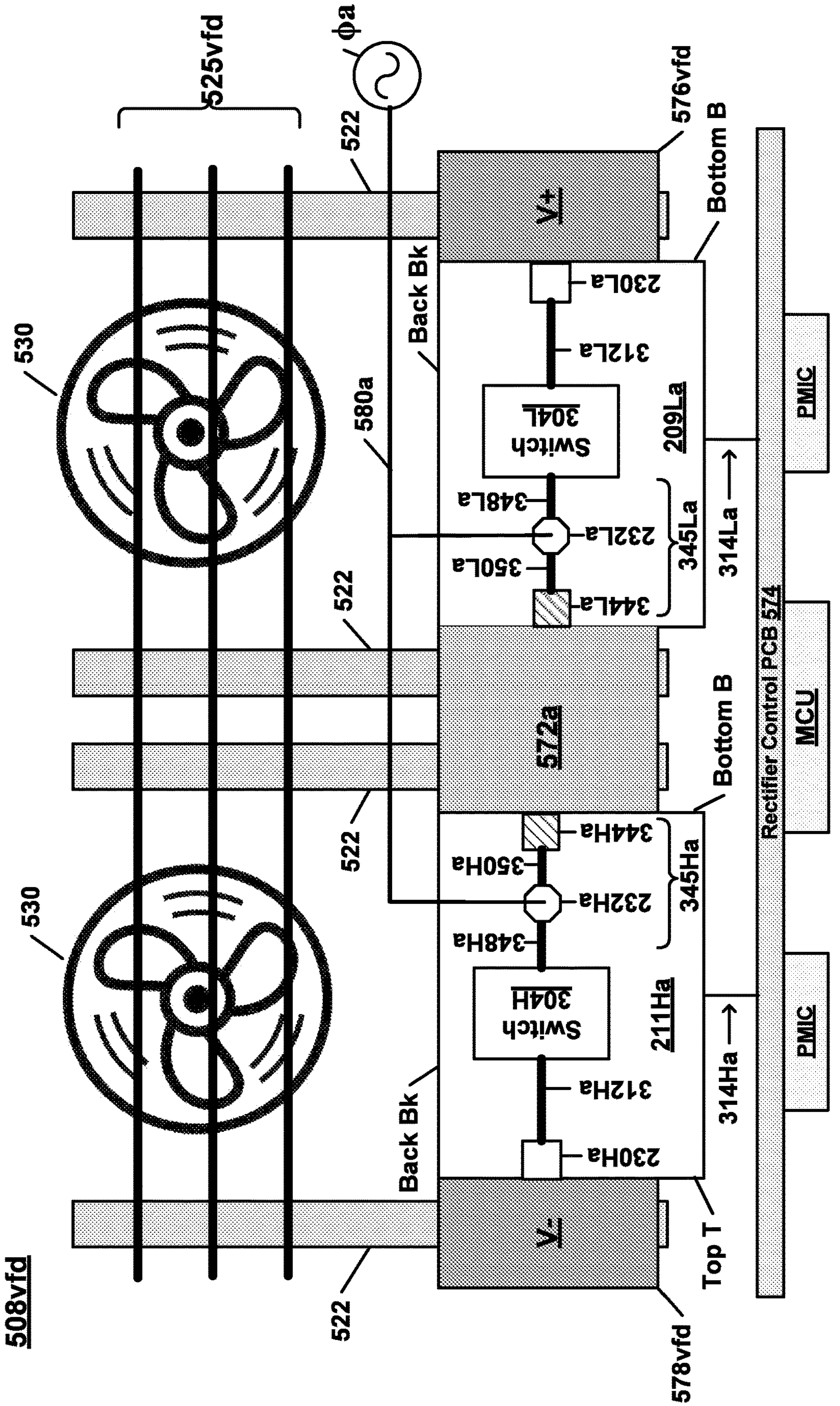
Figures 2, 5J:
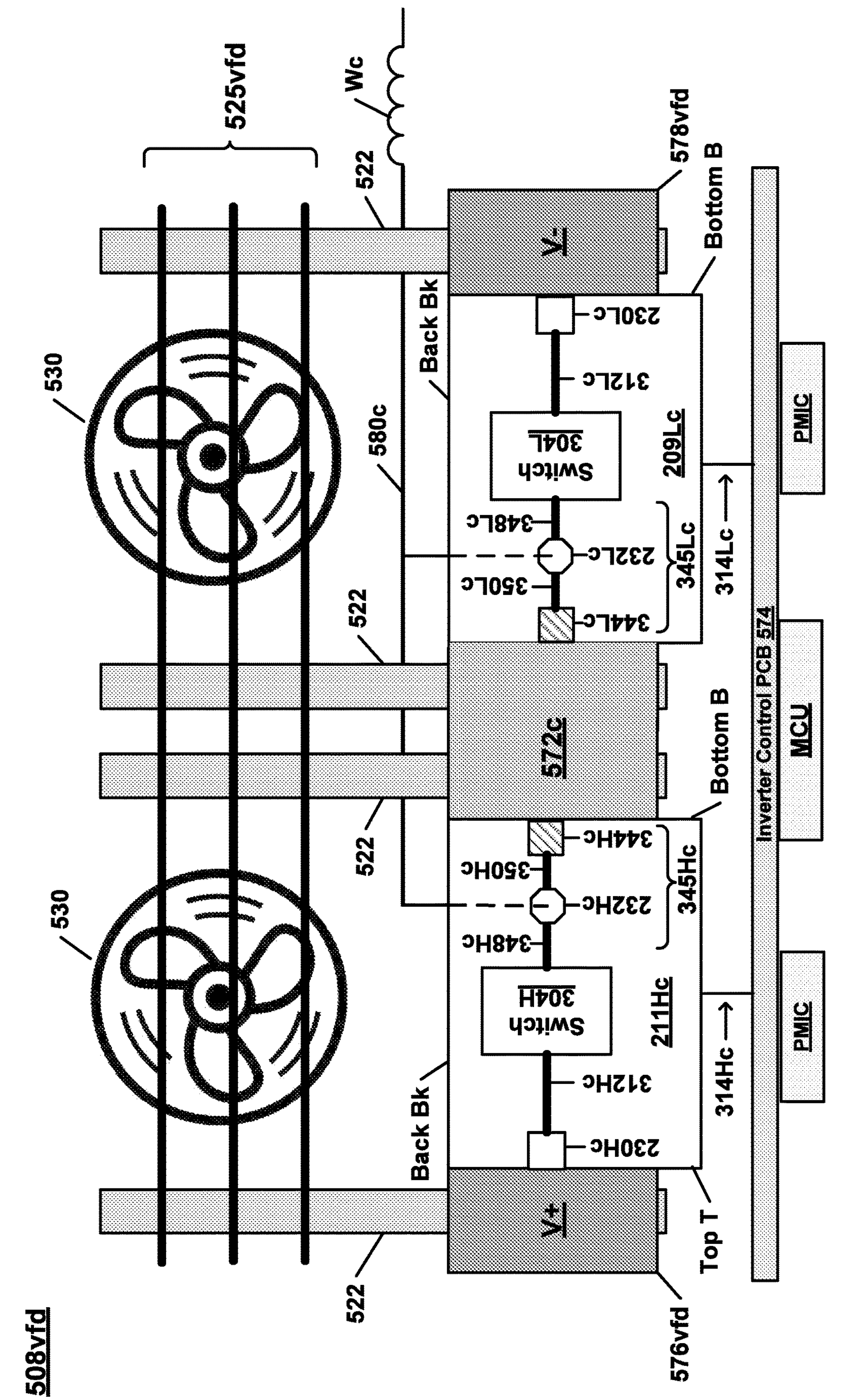
Figures 3, 5J:
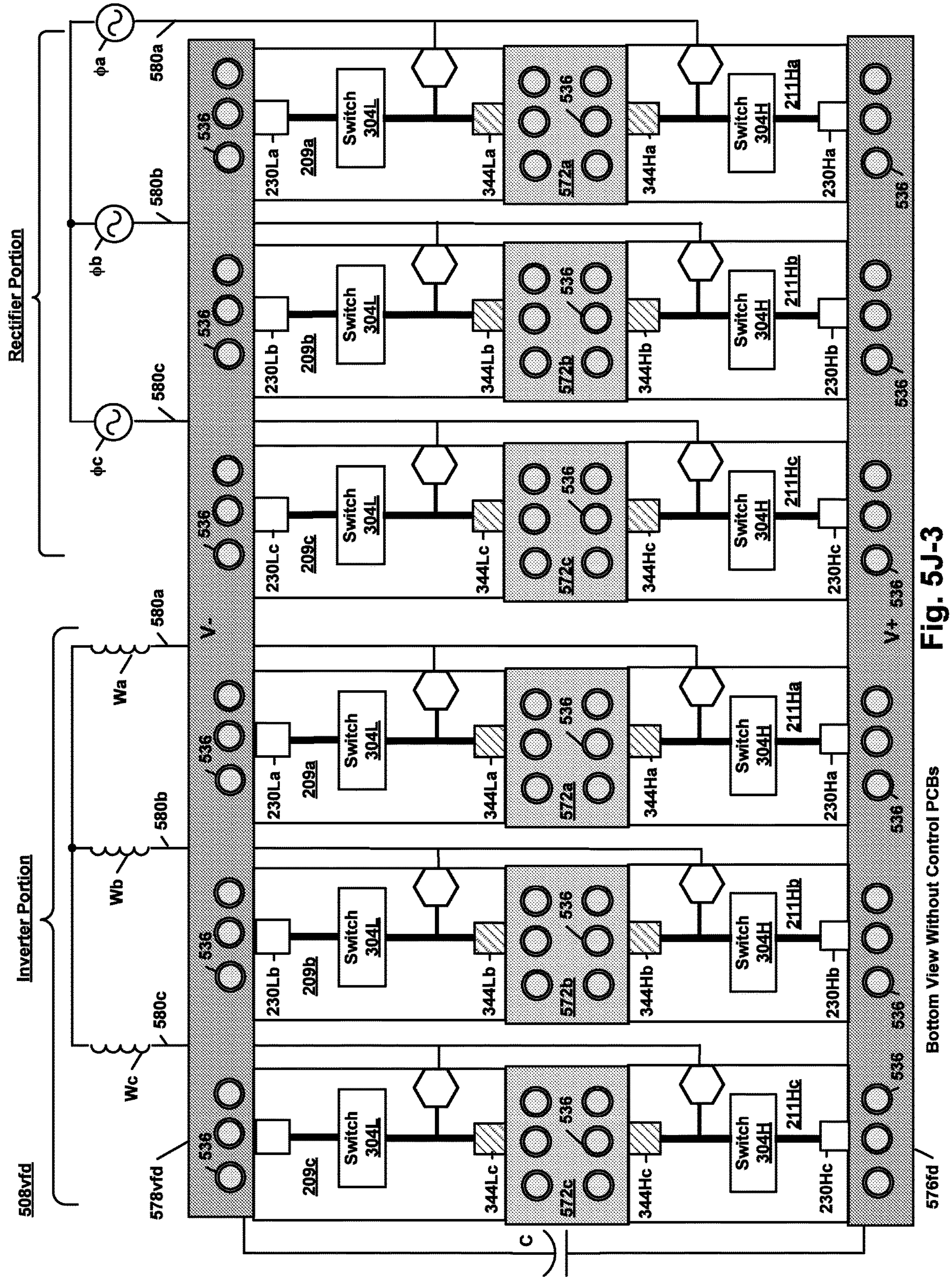
Figures 4, 5J:
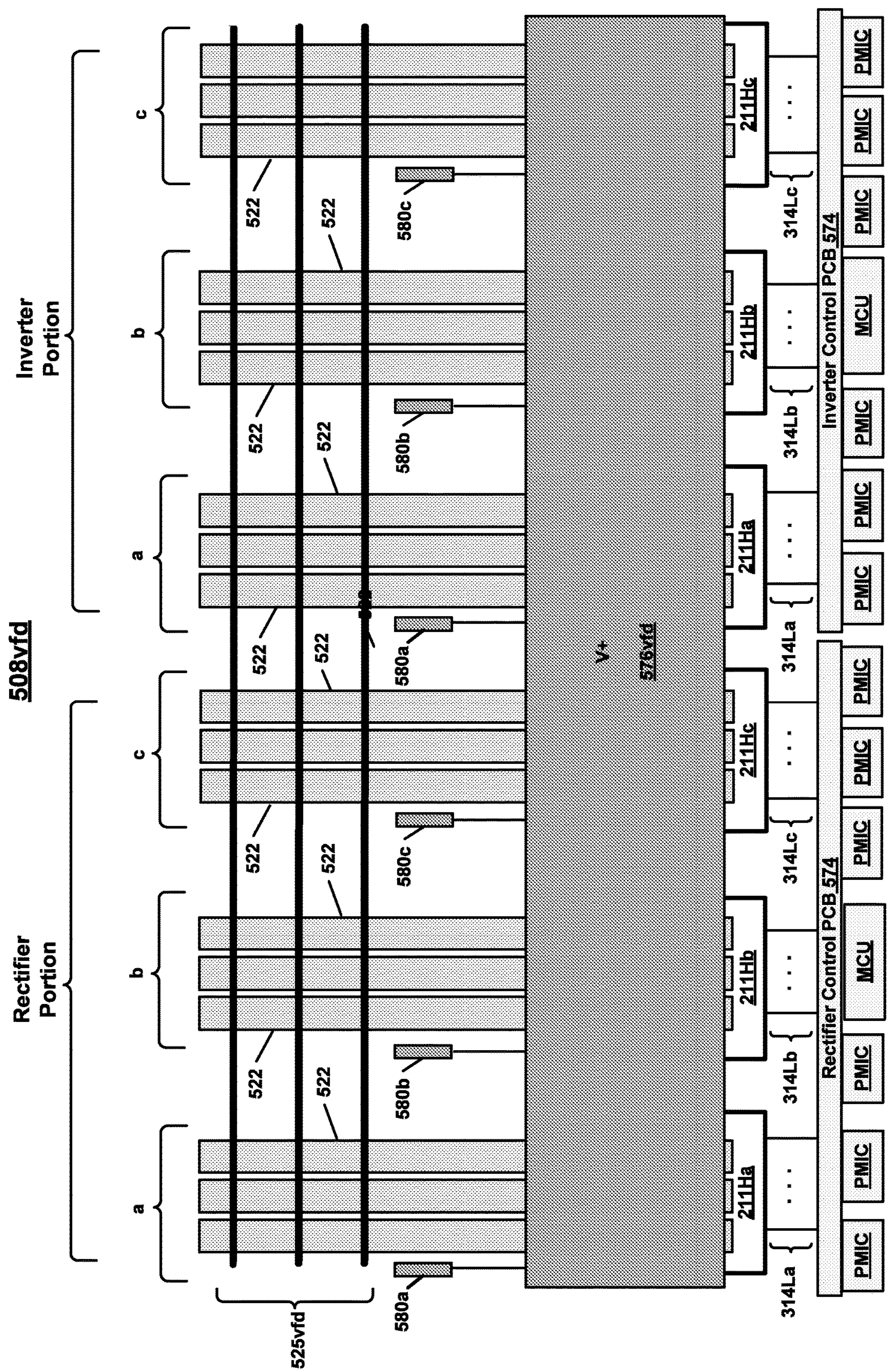
Figures 5, 5J:
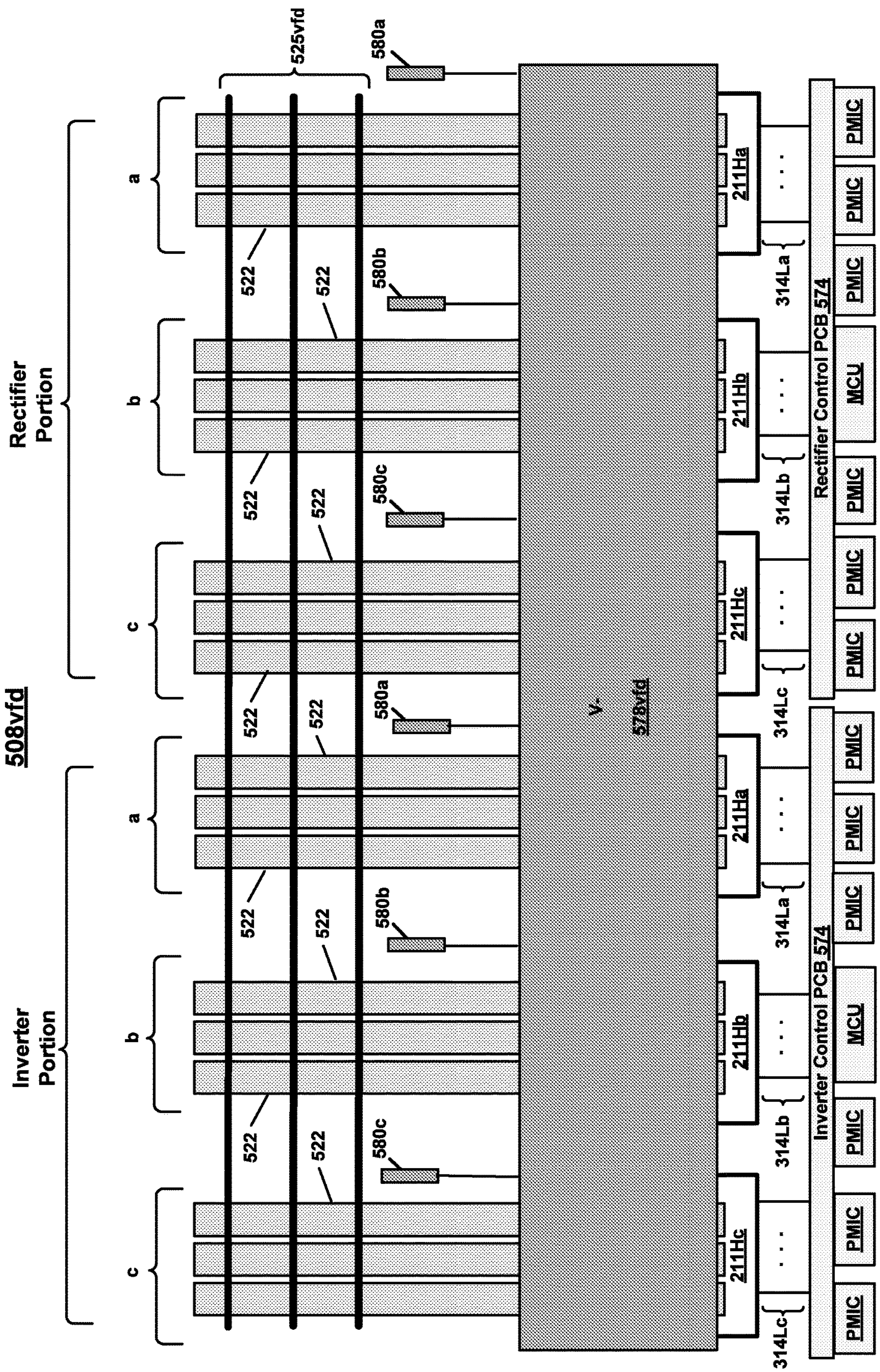
Figure 5K:
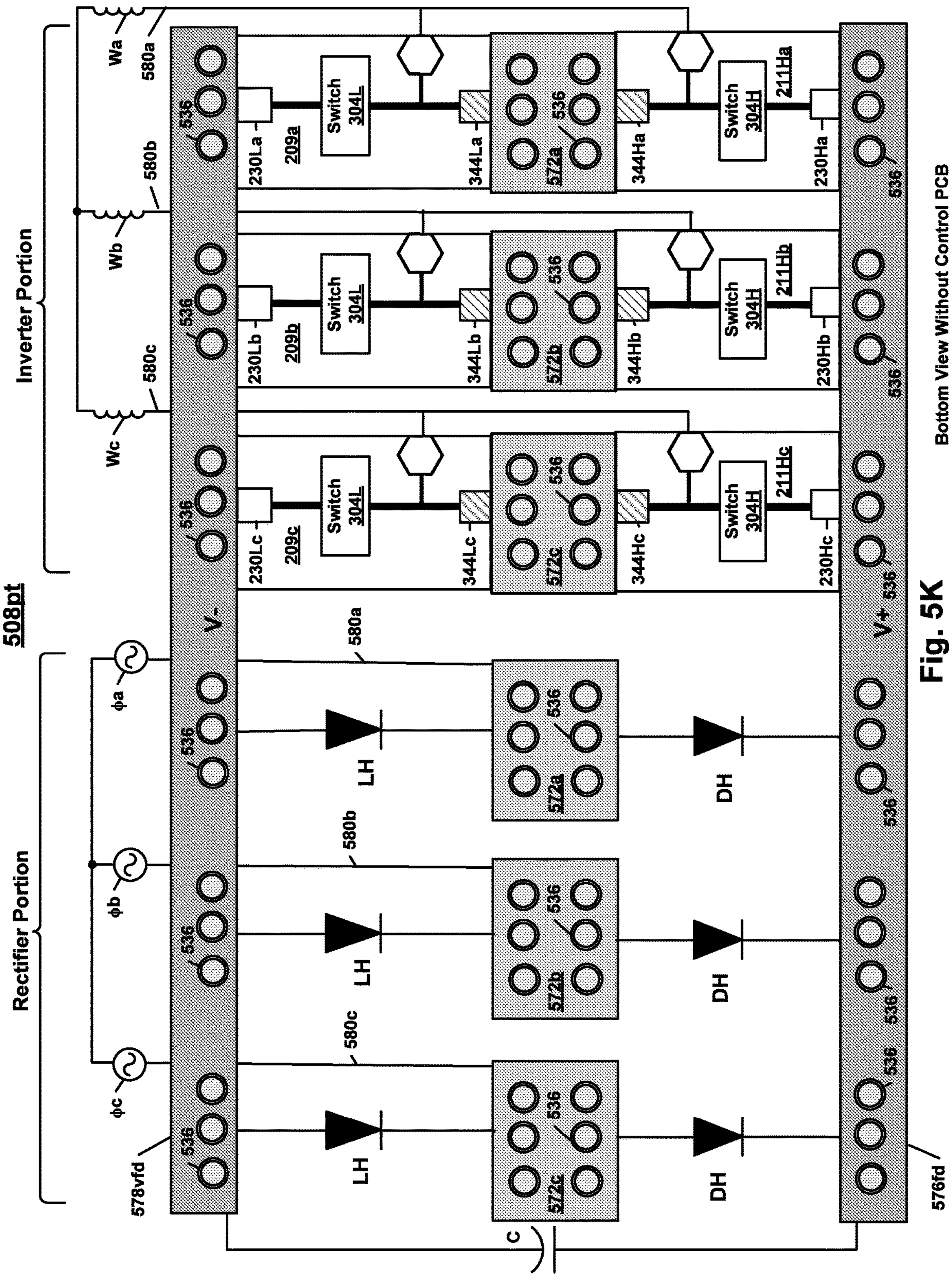
Figure 5L:
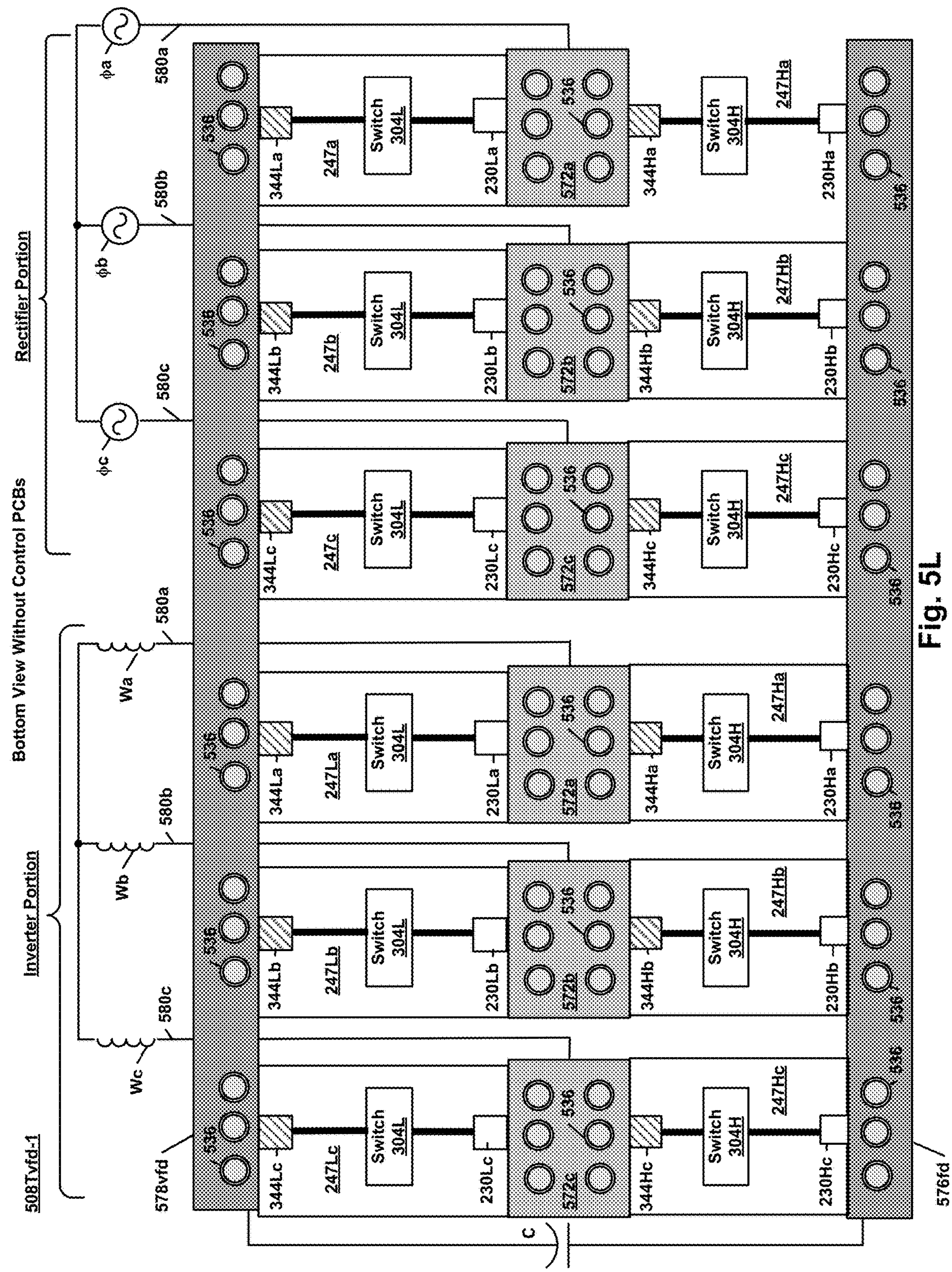
Figure 5M:
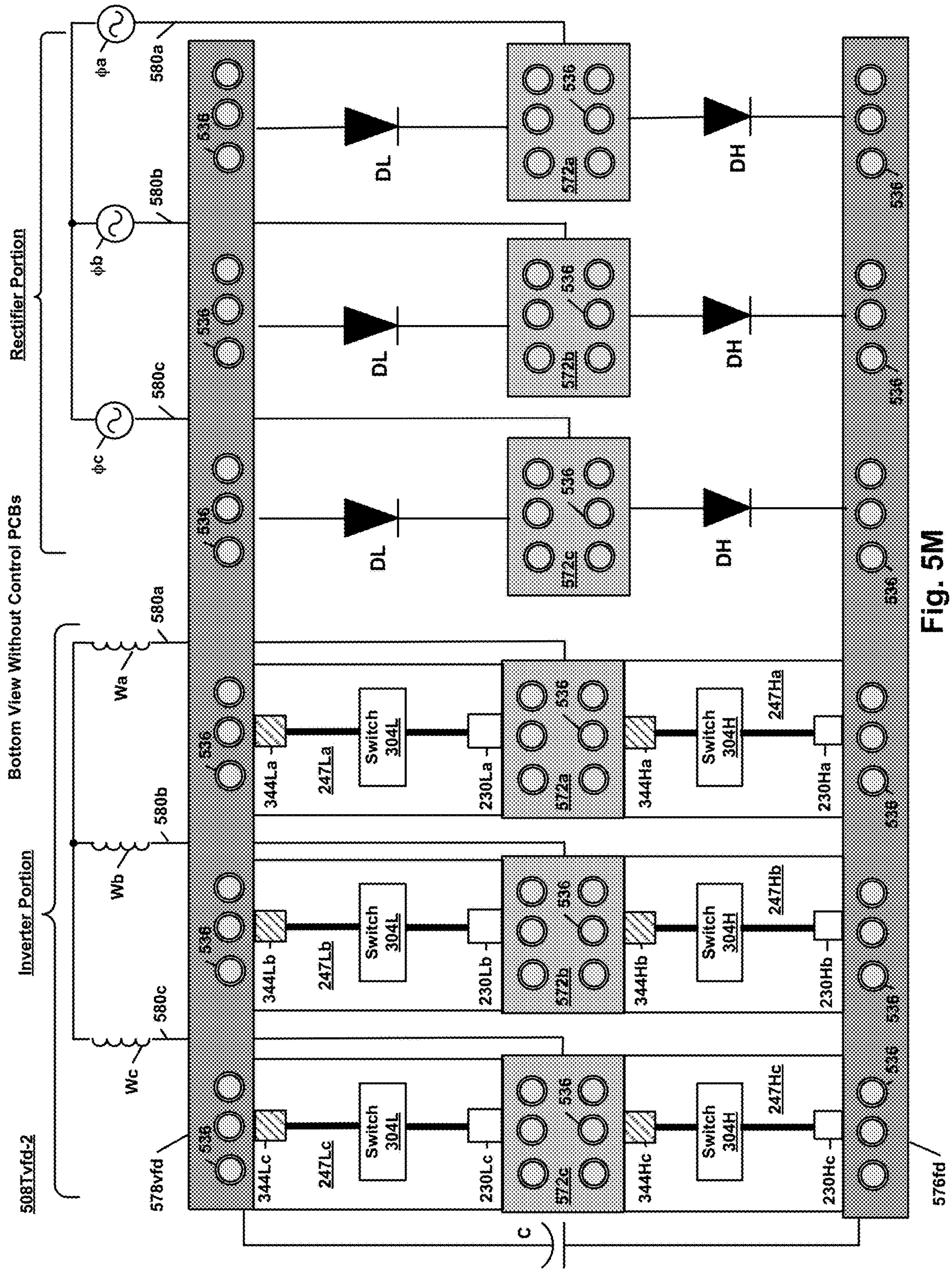
Figure 5N:
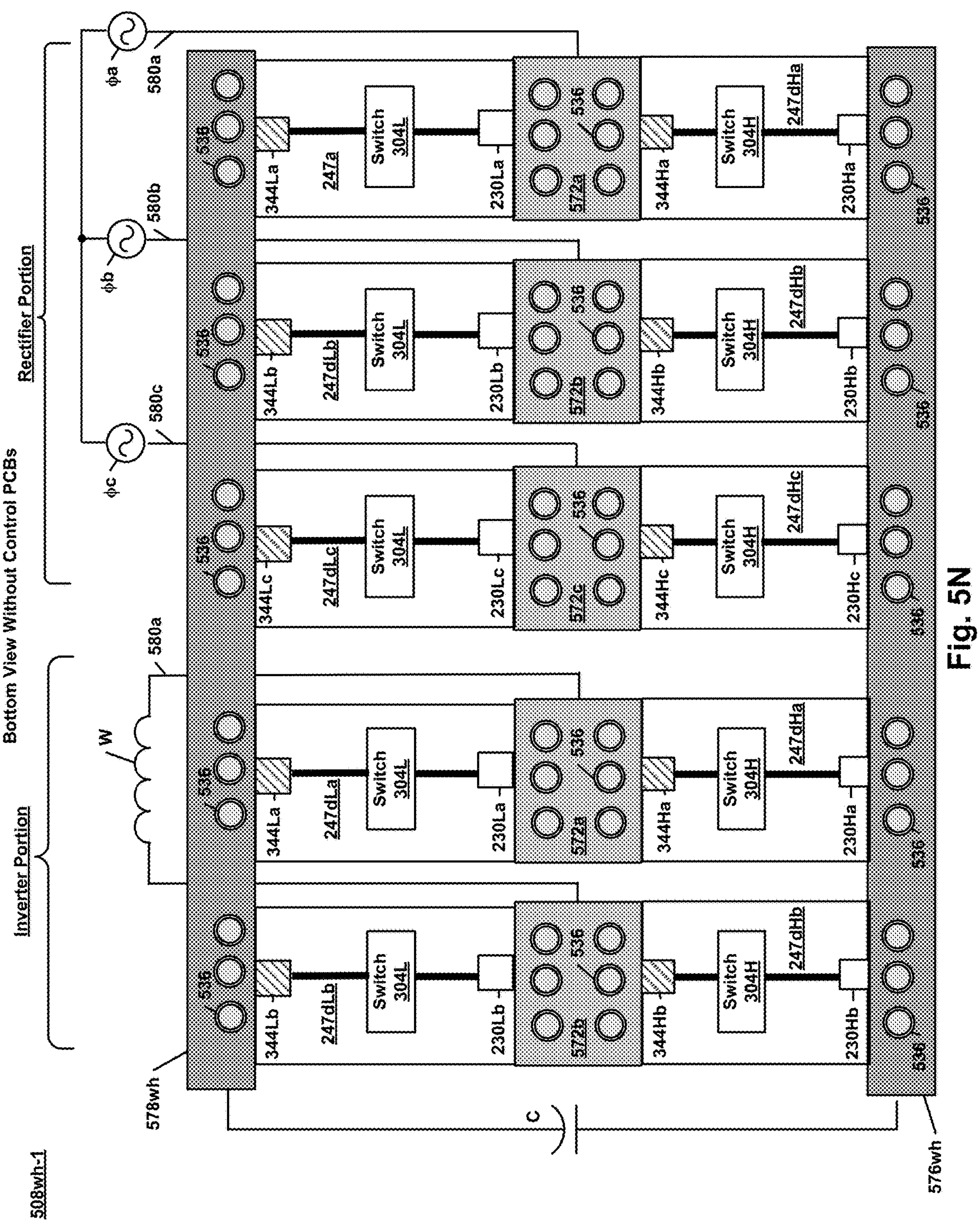

Other air-cooled power converters can be integrated through common bus bars in similar fashion. For example, inverter 504*i* and rectifier 504*r* can be combined to create an air-cooled VFDC with common, extended V-bar 528-1 and 528-2, and extended V+bar 560, or inverter 514*i* and rectifier 514*r* can be combined to create an air-cooled VFCD with common, extended V-bus bar 578T and extended V+bus bar 576T. FIG. 5K illustrates an integration of inverter 508*i* of FIG. 5D-2 and the passive rectifier of FIG. 5F-5 to create VFDC 508 pt. FIG. 5L illustrates an integration of inverter 514*i* of FIG. 5F-2 and rectifier 514*r* of FIG. 5F-4 through common bus bars 576vfd and 578vfd to create power converter 508Tvfd-1. FIG. 5M illustrates an integration of inverter 514*i* of FIG. 5F-2 and the passive rectifier of FIG. 5F-5 through common bus bars 576vfd and 578vfd to create power converter 508Tvfd-2. FIG. 5N illustrates an integration of rectifier 514*r* of FIG. 5F-4 and inverter 514*sf* of FIG. 5F-7 through common DC bus bars 578*wh* and 576*wh* to create power converter 508*wh*-1, which is electrically connected to winding W of, for example, an isolation transformer. FIG. 50 illustrates an integration of the passive rectifier of FIG. 5F-5 and inverter 514*sf* of FIG. 5F-7 through common DC bus bars 578*wh* and 576*wh* to create power converter 508*wh*-2, which is electrically connected to winding W of, for example, an isolation transformer.

Other Air-Cooled Power Converters

Power converters of this disclosure can be integrated through common bus bars. For example, AC/AC converters can be created by integrating air-cooled inverters and rectifiers through common bus bars. AC/AC converters (e.g., variable frequency drive controllers) convert AC power in one form into AC power in another form. Some AC/AC converters, which may include a DC link electrically connected to a rectifier and an inverter, convert input AC power of one frequency into output AC power of another frequency. Air-cooled rectifiers and air-cooled inverters can be integrated through common bus bars to create air-cooled variable frequency drive controllers (VFDCs). FIGS. 5J-1-5J-5 illustrate end, bottom, and side views of an example VFDC 508*vfd* with shared bus bars. VFDC 508*vfd* integrates inverter 508*i* and rectifier 508*r* of FIGS. 5D-1 and 5D-5, respectively through shared V+ bus bar 576*vfd* and V− bus bar 578*vfd*. Switches 304 of the inverter portion and the rectifier portion are electrically and thermally connected to shared V+ and V− bus bars 576*vfd* and 578*vfd* as shown. VFDC 508*vfd* is shown connected to windings Wa-Wb of an electric motor in machine such as an industrial pump or compressor.

Figure 5O:
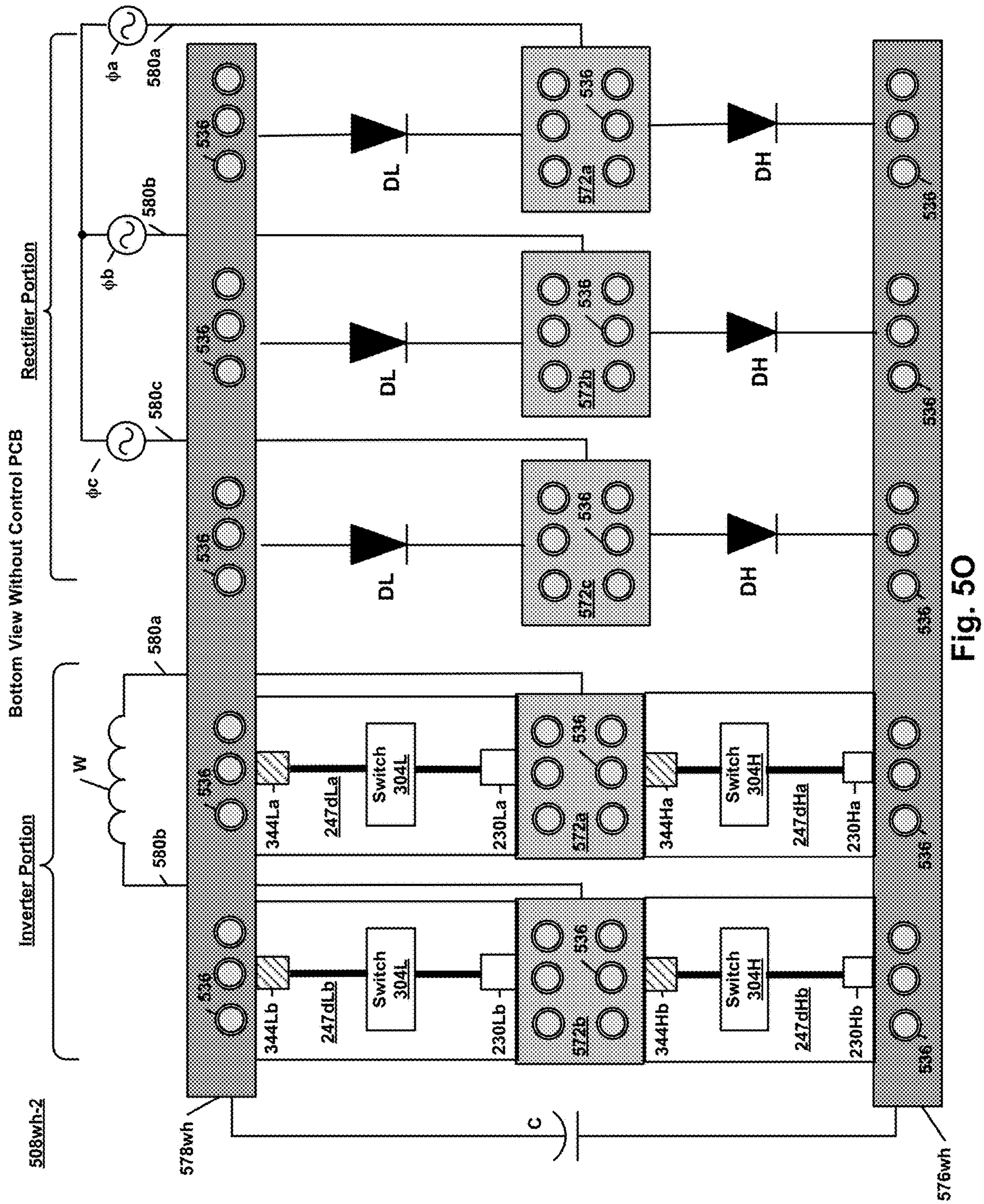

Other air-cooled power converters can be integrated through common bus bars in similar fashion. For example, inverter 504*i* and rectifier 504*r* can be combined to create an air-cooled VFDC with common, extended V− bar 528-1 and 528-2, and extended V+ bar 560, or inverter 514*i* and rectifier 514*r* can be combined to create an air-cooled VFCD with common, extended V− bus bar 578T and extended V+ bus bar 576T. FIG. 5K illustrates an integration of inverter 514*i* of FIG. 5F-2 and the passive rectifier of FIG. 5F-5 to create VFDC 508*pt*. FIG. 5L illustrates an integration of inverter 514*i* of FIG. 5F-2 and rectifier 514*r* of FIG. 5F-4 through common bus bars 576*vfd* and 578*vfd* to create power converter 508Tvfd-1. FIG. 5M illustrates an integration of inverter 514*i* of FIG. 5F-2 and the passive rectifier of FIG. 5F-5 through common bus bars 576*vfd* and 578*vfd* to create power converter 508Tvfd-2. FIG. 5N illustrates an integration of rectifier 514*r* of FIG. 5F-4 and inverter 514*sf* of FIG. 5F-7 through common DC bus bars 578*wh* and 576*wh* to create power converter 508*wh*-1, which is electrically connected to winding W of, for example, an isolation transformer. FIG. 5*o* illustrates an integration of the passive rectifier of FIG. 5F-5 and inverter 514*sf* of FIG. 5F-7 through common DC bus bars 578*wh* and 576*wh* to create power converter 508*wh*-2, which is electrically connected to winding W of, for example, an isolation transformer.

The air-cooled inverter 510*i* and air-cooled rectifier 510*r* can connected by a transformer to create an isolated, air-cooled DC/DC converter. For example, the output terminals of inverter 510*i* can be electrically connected to respective terminals on the primary side of a transformer (not shown), and respective terminals on the secondary side of the transformer can be electrically connected to phase bars 524*a* and 524*b* of rectifier 510*r*. The isolated DC/DC converter can be connected to other devices such as a three-phase rectifier. For example, the V− and V+ input terminals of inverter 510*i* in the isolated DC/DC converter can be electrically connected to the V− and V+ output terminals of Vienna rectifier 516*vr*1, the combination of which may be employed in a DC fast charger. A single fan can be used to cool the three-phase rectifier and the inverter portion of the DC/DC converter.

Although the present disclosure has been described in connection with several embodiments, the disclosure is not intended to be limited to the embodiments set forth herein.

What is claimed is:

1. A power converter comprising:

a first bus bar comprising a channel;

a first transistor, which comprises first and second terminals between which current is transmitted when the first transistor is activated, and a first gate terminal for controlling the first transistor, wherein the first terminal is thermally and electrically connected to the first bus bar;

a first heat-pipe received in the channel and thermally connected to the first bus bar, and;

a dielectric that electrically insulates the first heat-pipe from the first bus bar.

2. The power converter of claim 1 further comprising:

a second bus bar;

a second heat-pipe thermally connected to the second bus bar;

wherein the second terminal is electrically connected to the second bus bar.

3. The power converter of claim 2 further comprising a first heat sink thermally connected to the first and second heat-pipes.

4. The power converter of claim 2 further comprising:

a second metal conductor comprising oppositely facing first and second surfaces;

wherein the second terminal is sintered to the first surface of the second metal conductor;

wherein the second surface of the second metal conductor is electrically and thermally connected to the second bus bar.

5. The power converter of claim 1 further comprising:

a second bus bar;

a second heat-pipe thermally connected to the second bus bar;

a second transistor, which comprises first and second terminals between which current is transmitted when the second transistor is activated, and a second gate terminal for controlling the second transistor, wherein the first terminal of the second transistor is thermally and electrically connected to the second bus bar;

wherein the first and second transistors are positioned in first and second planes, respectively;

wherein the first and second planes are parallel to each other and positioned between the first and second bus bars.

6. The power converter of claim 5 further comprising a first heat sink thermally connected to the first and second heat-pipes.

7. The power converter of claim 1 further comprising a first heat sink thermally connected to the first heat-pipe.

8. The power converter of claim 7 wherein the first heat sink comprises a plurality of heat-fins thermally connected to the first heat-pipe.

9. The power converter of claim 7 wherein the first heat sink comprises a plurality of heat-fins thermally and electrically connected to the first heat-pipe.

10. The power converter of claim 1 further comprising:

a second bus bar electrically connected to the second terminal;

wherein the second bus bar is not thermally connected to a heat-pipe.

11. The power converter of claim 1 wherein the first bus bar is configured for electrical connection to a first terminal of a direct current (DC) source.

12. The power converter of claim 1 wherein the first transistor is configured to transmit 1 amp or more of current between the first and second terminals when activated.

13. The power converter of claim 1 further comprising:

a first metal conductor comprising oppositely facing first and second surfaces;

wherein the first terminal is sintered to the first surface;

wherein the second surface is electrically and thermally connected to the first bus bar.

14. The power converter of claim 1 wherein the first bus bar is configured for electrical connection to a first terminal of an alternating current (AC) source.

15. The power converter of claim 1 further comprising a second transistor, which comprises first and second terminals between which current is transmitted when the second transistor is activated, and a second gate terminal for controlling the second transistor, wherein the first terminal of the second transistor is thermally and electrically connected to the first bus bar.

16. The power converter of claim 15 further comprising a third transistor, which comprises first and second terminals between which current is transmitted when the third transistor is activated, and a third gate terminal for controlling the third transistor, wherein the first terminal of the third transistor is thermally and electrically connected to the first bus bar.

17. The power converter of claim 16, wherein the second terminal of the first transistor, the second terminal of the second transistor, and the second terminal of the third transistor are electrically connected to first, second, and third stator windings, respectively, of an electrical motor.

18. The power converter of claim 16, wherein the second terminal of the first transistor, the second terminal of the second transistor, and the second terminal of the third transistor are electrically connected to first, second, and third stator windings, respectively, of a three-phase alternating (AC) current source.

19. The power converter of claim 1 further comprising a gate driver circuit configured to control a volage on the first gate terminal.

* * * * *